United States Patent [19]
Ema et al.

[11] Patent Number: 5,946,334
[45] Date of Patent: Aug. 31, 1999

[54] SEMICONDUCTOR LASER CONTROL SYSTEM

[75] Inventors: Hidetoshi Ema, Yokohama; Masaaki Ishida, Yokosuka; Naruhiro Masui, Yokohama, all of Japan

[73] Assignee: Ricoh Company, Inc., Tokyo, Japan

[21] Appl. No.: 08/825,300

[22] Filed: Mar. 27, 1997

[30] Foreign Application Priority Data

| Mar. 27, 1996 | [JP] | Japan | 8-072005 |
|---|---|---|---|
| Mar. 28, 1996 | [JP] | Japan | 8-074496 |
| Mar. 28, 1996 | [JP] | Japan | 8-074497 |
| Jun. 19, 1996 | [JP] | Japan | 8-157791 |
| Jun. 19, 1996 | [JP] | Japan | 8-157792 |
| Jul. 11, 1996 | [JP] | Japan | 8-181818 |
| Jul. 11, 1996 | [JP] | Japan | 8-181819 |
| Jul. 11, 1996 | [JP] | Japan | 8-181820 |
| Jul. 12, 1996 | [JP] | Japan | 8-182920 |
| Jul. 12, 1996 | [JP] | Japan | 8-182921 |
| Jul. 25, 1996 | [JP] | Japan | 8-196142 |
| Jul. 26, 1996 | [JP] | Japan | 8-197569 |

[51] Int. Cl.$^6$ ............................................. H01S 3/10
[52] U.S. Cl. ........................................ 372/38; 372/26
[58] Field of Search .............................. 372/50, 25, 26, 372/38

[56] References Cited

U.S. PATENT DOCUMENTS

| 5,036,519 | 7/1991 | Ema et al. | 372/38 |
|---|---|---|---|
| 5,050,177 | 9/1991 | Ema | 372/38 |
| 5,138,623 | 8/1992 | Ema et al. | 372/38 |
| 5,237,579 | 8/1993 | Ema et al. | 372/31 |
| 5,511,087 | 4/1996 | Sato et al. | 372/38 |
| 5,604,757 | 2/1997 | Liang et al. | 372/29 |
| 5,859,862 | 1/1999 | Hikasa et al. | 372/38 |

FOREIGN PATENT DOCUMENTS

| 2-205086 | 8/1990 | Japan . |
|---|---|---|
| 5-67833 | 3/1993 | Japan . |
| 6-347852 | 12/1994 | Japan . |

*Primary Examiner*—James W. Davie
*Attorney, Agent, or Firm*—Oblon, Spivak, McClelland, Maier & Neustadt, P.C.

[57] ABSTRACT

A pulse width modulation and intensity modulation signal generating unit, based on input data, performs pulse width modulation and intensity modulation and generates a light emission instruction signal. An error amplifier forms a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal. A current driving unit causes a driving current, according to the light emission instruction signal, to flow through the semiconductor laser as the forward current thereof, the driving current being generated so as to control driving of the semiconductor laser with a current of the difference or sum with the control current of the negative feedback loop. The pulse width modulation and intensity modulation signal generating unit, the error amplifier and the current driving unit are formed as one chip of an integrated circuit.

106 Claims, 52 Drawing Sheets

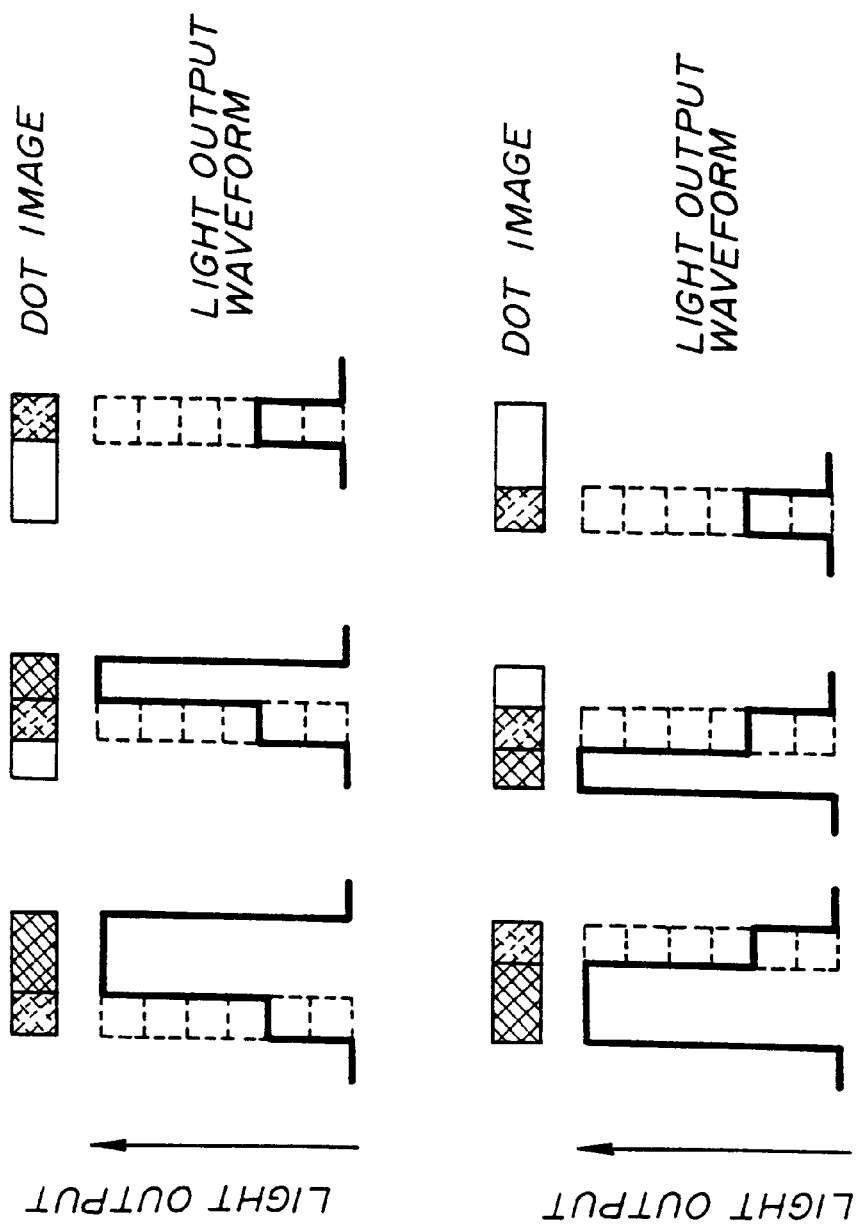

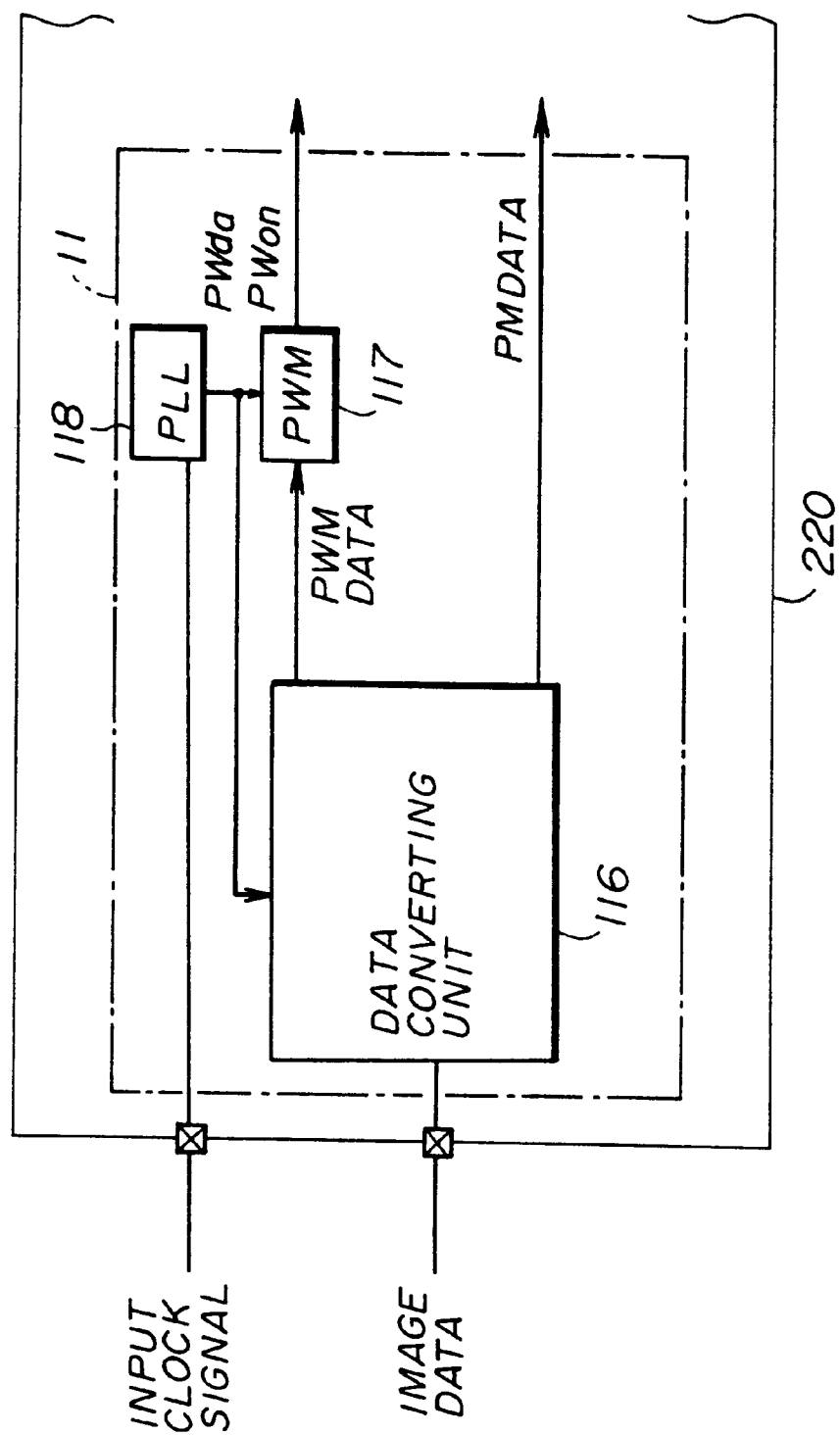

SEMICONDUCTOR LASER CONTROL SYSTEM

BACKGROUND OF THE INVENTION

1. Field of the Invention

The present invention relates to a semiconductor laser control system for driving and controlling a semiconductor laser which is used as a light source in each of a laser printer, a digital copier, an optical disc drive device, an optical communications apparatus and so forth.

2. Description of Related Art

A semiconductor laser is very small, and it is possible to modulate a light output at high speed through a driving current. Therefore, a semiconductor laser is widely used recently as a light source of a laser printer or the like.

However, because the relationship between a driving current and a light output of a semiconductor laser varies greatly due to temperature change, it may be difficult to precisely set the light output of a semiconductor laser to a desired value. In order to solve this problem and to effectively use the advantages of a semiconductor laser, various APC (Automatic Power Control) electric circuits have been proposed.

The APC electric circuits can be broadly divided into the following three systems:

In a first system, the light output of a semiconductor laser is monitored through a light reception device. A negative feedback loop always controls the forward current of the semiconductor laser so that a signal in proportion to a light reception current which occurs in the light reception device and is in proportion to the light output of the semiconductor laser may be equal to a light emission instruction signal. Thus, the light output of the semiconductor laser may be controlled to be a desired value. (Throuout the present application, the 'negative feedback loop' includes electricity-to-light conversion at a portion where a semiconductor laser emits light and light-to-electricity conversion at a portion where a light reception device receives the light emitted by the semiconductor laser.)

In a second system, during a power setting period, the light output of a semiconductor laser is monitored through a light reception device; and a negative feedback loop always controls the forward current of the semiconductor laser so that a signal in proportion to a light reception current which occurs in the light reception device and is in proportion to the light output of the semiconductor laser may be equal to a light emission instruction signal. During the time other than the power setting period, the forward current which has been set during the power setting period is maintained, and thus, the light output of the semiconductor laser is controlled to a desired value. Further, during a time other than the power setting period, the forward current which has been set during the power setting period is modulated based on information, and thereby, the information is carried on the light output of the semiconductor laser.

In a third system, the temperature of a semiconductor laser is measured, and thus, a temperature signal is obtained. Through the temperature signal, the forward current of the semiconductor laser is controlled, or the temperature of the semiconductor is controlled to be fixed. Thereby, the light output of the semiconductor laser is controlled to a desired value.

In order to obtain a desired value of light output, the first system is preferable. However, in the first system, a control speed has a limit due to the limits of the operation speed of the light reception device, the operation speed of an amplifying device which is used in the negative feedback loop and so forth. For example, when the cutoff frequency $f_0$ of the negative feedback loop in the open loop condition is considered, the step response characteristics of the semiconductor laser can be approximated, as follows:

$$P_{out}=P_0\{1-\exp(-2\pi f_0 t)\},$$

where:

$P_{out}$ represents light output of the semiconductor laser;

$P_0$ represents a set light intensity of the semiconductor laser; and t: represents time.

In many cases, it is required that the total light quantity (the integral value of the light output: $\int P_{out} \cdot dt$) until a set time $\tau_0$ has passed immediately after a light intensity of the semiconductor laser was changed should be a predetermined value, where:

$$\int P_{out} \cdot dt = P_0 \tau_0 \{1-[1/(2\pi f_0 \tau_0)][1-\exp(-2\pi f_0 \tau_0)]\}.$$

Assuming that $\tau_0=50$ (ns) and an error allowance is 0.4%, it should be that $f_0>800$ (MHz), and it is very difficult to satisfy this condition.

In the second system, the above-described problem occurring in the first system does not occur, and thus, it is possible to modulate the light output of the semiconductor laser at high speed. Therefore, the second system is widely used. However, according to the second system, the light output of the semiconductor laser is not always controlled. Therefore, an external disturbance or the like may easily cause the light intensity of the semiconductor laser to vary. For example, the Do loop characteristics of a semiconductor laser may easily cause the light intensity of the semiconductor laser to include an error of several percent. As an attempt to restrict the Do loop characteristics of a semiconductor laser, a method has been proposed in which the heat time constant of the semiconductor laser is matched by the frequency characteristics of a semiconductor laser driving current and thus the Do loop characteristics are compensated. However, the heat time constant of a semiconductor laser varies among respective particular semiconductor lasers, and also, it varies due to an ambient condition. Therefore, such a method may not be effective.

For example, the applicant of the present invention proposed an improvement in consideration of such a problem in Japanese Laid-Open Patent Application No.2-205086 (corresponding U.S. Pat. No. 5,036,519). According to the proposed method, as shown in FIG. 1, a light reception device 2 monitors the light output of a semiconductor laser 1. A negative feedback loop 3 always controls the forward current of the semiconductor laser 1 so that an output signal of the light reception device 2 may be equal to a light emission instruction signal (DATA). A current driving unit 4 converts the light emission instruction signal (DATA) into the forward current of the semiconductor laser 1. The light output of the semiconductor laser 1 is controlled through the current which is the sum (or difference) of a control current of the negative feedback loop 3 and a driving current generated by the current driving unit 4. In the example shown in FIG. 1, the negative feedback loop 3 includes the semiconductor laser 1, the light reception device 2, a constant-current source 5 of a constant current $I_{DA1}$ and an inverting amplifier 6. The output of the inverting amplifier 6 is used to drive and control a driving transistor 7. The semiconductor laser 1, the driving transistor 7 and a resistor Re are connected in series as shown in the figure. The current driving unit 4 includes a constant-current source 8 of a constant current $I_{DA2}$.

In the circuit configuration, when light output corresponding to a current through which the current driving unit 4 directly drives the semiconductor laser 1 is referred to as $P_S$, the step response characteristics of the light output of the semiconductor laser can be approximated as follows:

$$P_{out} = P_0 + (P_S - P_0)\{1 - \exp(-2\pi f_0 t)\}.$$

When $P_S \approx P_0$, the light output of the semiconductor laser 1 immediately becomes equal to $P_0$. Therefore, $f_0$ may have a relatively small value in comparison to the case where there is only the negative feedback loop 3. FIG. 2A shows how the light output changes only through the negative feedback loop 3 (control unit). FIG. 2B shows how the light output changes in the case where the constant current $I_{DA2}$ is added by the current driving unit 4. In a practical case, $f_0$ may have a value of approximately 40 (MHz). Such an amount of cutoff frequency $f_0$ can be easily obtained.

The applicant of the present invention also disclosed a semiconductor laser control system in Japanese Laid-Open Patent Application No.5-67833 (corresponding U.S. Pat. No. 5,237,579). In the disclosed system, bipolar transistors are used as elements of the configuration of Japanese Laid-Open Patent Application No.2-205086 described above, and thus an IC is formed. Thereby, it is easy to design a negative feedback loop.

A one-dot multi-level method will now be described, in a case where a laser printer is taken as an example. A laser printer was developed as a non-impact printer for taking the place of a line printer. Because of a high speed printing characteristic and a high resolution characteristic of the laser printer, application of the laser printer to an image printer was attempted. As a result, various printing methods, which use a dither method as basic technology, have comes to be practically used in laser printers. Further, as a result of recent quick development of semiconductor technology, the amount of information which can be processed by a laser printer has quickly increased. AS a result, in a laser printer, a one-dot multi-level method is practically used, and thereby, a laser printer is effectively used as an image printer. In the one-dot multi-level method, in a high-end machine, the number of tone levels is that which can be obtained in the use of 8 bits. However, in a low-end machine, the number of tone levels is a low number (several levels). One reason is that the information amount to be processed increases when the number of tone levels increases. However, a main reason is that the scale and costs of the electrical circuit of a semiconductor laser control modulation unit increases when the number of tone levels increases.

Currently, the following three semiconductor laser control modulation methods have been proposed:

a light intensity modulation (power modulation) method;

a pulse width modulation method; and a pulse width and intensity combined modulation method.

The light intensity modulation (power modulation, which may be abbreviated to 'PM') method will now be described. In the method, light output itself is changed when a dot is printed. In this method, a middle exposure range is used for obtaining middle tone levels. Therefore, it is important that a printing process should be stabilized, and thus requirements for the printing process are strict. However, in this method, semiconductor laser control modulation can be easily performed.

The pulse width modulation (which may be abbreviated to 'PWM') method will now be described. In this method, there are two light output levels. A time of light emission is changed (that is, a pulse width of a light emission instruction signal is changed) when a dot is printed. Therefore, in comparison to the PM method, the middle exposure range is less used. Further, by coupling adjacent dots, it is possible to further decrease use of the middle exposure range. As a result, requirements for printing process stability are reduced. However, when pulse width setting is performed with 8-bit data and coupling of adjacent dots is performed, the configuration of a semiconductor laser control modulation unit is complex.

The pulse width and intensity combined modulation method (PWM+PM method) will now be described. As mentioned above, requirements for a printing process are strict in the PM method and a semiconductor laser control modulation unit is complex in the PWM method. In order to solve the problems, the pulse width and intensity combined method was considered. For example, the applicant of the present invention discloses this method in Japanese Laid-Open Patent Application No.6-347852 (corresponding U.S. patent application Ser. No. 08/253,322), now abandoned and refiled as U.S. Ser. No. 08/862,326.

This modulation method is basically a two-level printing method, and thus is a method using the PWM method, in which requirements for printing process stability are not strict, as a basic technology. The PM method is used for interpolate a change of a pulse width. When the same resolution is obtained, in comparison to a case of each separate modulation method (the PM and PWM methods), each of the number of pulse widths and the number of power levels can be reduced. This is because, in the combined modulation method, the resolution is provided as a result of combining the number of pulse widths and the number of power levels. As a result, it is possible to easily provide an arrangement required for each separate modulation method. Thereby, requirements for printing process stability are not strict, and also it is suitable to provide an integrated circuit which performs the combined modulation method. Thus, it is possible to miniaturize and reduce costs of an arrangement required for performing the combined modulation method.

FIG. 3 shows an example of an arrangement of a semiconductor laser control system which performs the combined modulation method. In the arrangement, image data and an input clock signal are input to a pulse width generating unit and data modulation unit 11. The pulse width generating unit and data modulation unit 11 outputs a light emission instruction signal (DATA) to a semiconductor laser control unit and semiconductor laser driving unit 12. The semiconductor laser control unit and semiconductor laser driving unit 12 has, for example, a circuit configuration such as that shown in FIG. 1. According to the input image data, the pulse width generating unit and data modulation unit 11 performs basically the PWM method, and the PM method for interpolating a change of a pulse width.

A basic concept of light output waveforms of the semiconductor laser 1 is shown in FIG. 4. For the sake of simplicity of description, in the example shown in FIG. 4, there are three pulse widths and six power levels. Thereby, a total of 18 tone levels are output. FIG. 4 typically shows light output waveforms in this case. As shown in the figure, in this combined modulation method, basically the PWM method is used. Power modulation using a middle exposure range is performed on a minimum pulse width. In order to obtain those light output waveforms, for example, as shown in FIGS. 5A and 5B, either a pulse 1 having a pulse width of T and a pulse 2 having a pulse width of T+δT (δT being the minimum pulse width) or a pulse 3 having a pulse width of T and a pulse 4 having a pulse width of δT are generated. For the pulse of the pulse width of T, each of the bits is of the H level, while, for the pulse of the pulse width δT (in the case of the pulse 2, during the time δT only the pulse 2 is at the high level), respective bits may be of either the H level or the L level according to the PM data. Thereby, the light output waveforms shown in FIG. 4 and FIGS. 5A, 5B can be provided. In the example shown in FIG. 5A, a pulse width starts from the left side, and, in the example shown in FIG. 5B, a pulse width starts from the right side.

For example, Japanese Laid-Open Patent Application No.6-347852 discloses that, for implementing such a pulse width and intensity combined modulation system within one dot, a pulse width generating unit is formed as an IC using C-MOS devices and thus the unit is easily provided, and also, a negative feedback loop unit is formed as an IC using bipolar transistors and is easily designed.

However, methods disclosed in Japanese Laid-Open Patent Application No.6-347852 may be further improved. It is considered that a current adding method by which a control amount of the negative feedback loop can be effectively reduced and a pulse width and intensity combined modulation method in a pulse (pulses) within one dot may be implemented by a further miniaturized and increased power saving configuration, and also may function at higher speed and with higher accuracy.

When harnesses or the like are used for data transfer, there are problems which will be described below. For example, in a case, disclosed in Japanese Laid-Open Patent Application No.6-347852, where a pulse width generating unit and a data modulation unit, to which input data is input, are formed as C-MOS devices, because the operational principle of C-MOS devices is generally a switching operation (that is, an turning on-turning off operation), it is necessary that the input level of the input data should be 0 to 5 volts or 0 to 3 volts. In a transmission path such as a harness or the like, characteristic impedance Z of the line is expressed as:

$$Z=(L/C)^{1/2}.$$

Assuming that L=10 (mH/cm) and C=0.7 (pF/cm), Z≈120 (Ω). FIG. 6 shows an example of input data using a harness 15 in a case of an integrated circuit 14 using a C-MOS device. For example, input data is input to the integrated circuit 14 via a connecting point at which voltage dividing resistors $R_A$ (330 Ω) and $R_B$ (220 Ω) are connected with one another. In the integrated circuit 14, a constant-current source 16 is included as shown in the figure. Assuming that the length of the harness 15 is 50 cm, a rising time constant τ of a data waveform of input data during data transfer through the harness 15 is expressed as:

$$\tau=CR=35(pF)\cdot120(\Omega)=4(ns).$$

Considering 10 to 90% of the full variation range of the data, as shown in FIG. 7, $$t\approx2.5\tau=10(ns).$$

Thereby, when data transfer is performed in a synchronization condition, it is possible to perform data transfer at 25 (MHz) (corresponding to 40 ns) at the highest, and it is difficult to perform data transfer at a higher speed than 25 (MHz). When the pulse width generating unit and data modulation unit are formed simply with bipolar transistors, generally speaking, an input level of input data is set to 0 to 5 volts or 0 to 3 volts in consideration of an interface in a case where such an electronic circuit may be connected with a C-MOS device. Therefore, the same problem may occur, and it is difficult to perform data transfer at higher speed. Further, because the amount of voltage swing of the input is large as mentioned above, taking EMI (Electro-Magnetic Interference) measures and achieving power saving may be difficult.

Further, in such a semiconductor laser control system, a current in a light emission instruction signal generating unit is, when considering only a direct current component, a monitoring current of a monitoring light reception device. Therefore, when the electronic circuit is formed as an integrated circuit, it is necessary that the current in the light emission instruction signal should be a current which does not vary depending on changes of the integrated circuit internal temperature. When no special measures are taken therefor, stabilization of the monitoring current may cause problems. When stabilization of the monitoring current is not ensured, the semiconductor laser control system cannot perform an adequate operation for a wide range of the monitoring current.

Further, when a control speed is uniformly set for a control system of the negative feedback loop, flexibility in designing the control system may be reduced and it is not possible to freely set the control speed to a desired speed.

For the purpose of obtaining, under high-speed control, an ideal waveform of light output which is always optimized, it is important to appropriately set the level $P_S$ shown in FIG. 2B, and thereby to cause the light output waveform to approximate that of a rectangular wave. This is important, in particular, in a case where modulation is performed for a larger number of tone levels using pulse width and intensity combined modulation method which was described with reference to FIGS. 4, 5A and 5B.

As general characteristics of a semiconductor laser, there is a current change due to a temperature change shown in FIG. 8, and also, there is a current change due to an elapsing time change (especially, a change of a differential quantum efficiency) shown in FIG. 9. For the characteristic of an operation current change due to temperature change, a semiconductor laser control system can appropriately respond thereto by causing a negative feedback loop 3 such as that shown in FIG. 1 to always operate, whereby, even when the oscillation threshold current Ith of the semiconductor laser varies, the control system follows it. Thereby, the control system causes the oscillation threshold current Ith to flow through the semiconductor laser 1 as its forward current.

However, as shown in FIG. 9, when there is a change of an operation current due to elapsing time, especially due to a differential quantum efficiency, the change in an operation current is larger than that in an operation current due to a temperature change. Such change characteristics due to a differential quantum efficiency affects the $P_S$ level shown in FIG. 2B. Thereby, actual light output is too high in comparison to a desired light output $P_{out}$, and thus an overshoot occurs, or actual light output is too low in comparison to a desired light output $P_{out}$, and thus an undershoot occurs. Thus, high-speed control cannot be achieved.

In the related art, a problem may be the lack of accuracy in detection of a differential quantum efficiency of a semiconductor laser, and adaptability thereto may be insufficient. Thereby, it may be difficult to provide a light output waveform which approximates that of a rectangular wave.

SUMMARY OF THE INVENTION

According to the present invention, a semiconductor laser control system comprises:

a pulse width modulation and intensity modulation signal generating unit which, based on input data, performs pulse width modulation and intensity modulation and thus generates a light emission instruction signal;

an error amplifier which forms a negative feedback loop with a semiconductor laser and a light reception device which monitors light output of the semiconductor laser, the error amplifier controlling forward current of the semiconductor laser so that a light reception signal proportional to the light output of the semiconductor laser is equal to the light emission instruction signal; and a current driving unit which provides a driving current, according to the light emission instruction signal, to flow through the semiconductor laser as the forward current thereof, the driving current being generated so as to control driving of the semiconductor laser with a current of the difference or sum with the control current of the negative feedback loop, wherein the pulse width modulation and intensity modulation signal generating unit, the error amplifier and the current driving unit are formed to be one chip of an integrated circuit.

All of the arrangement including a digital control system of the pulse width modulation and intensity modulation signal generating unit and an analog driving system of the error amplifier and current driving unit is formed to be one chip of an integrated circuit. Thereby, miniaturization and energy saving can be achieved while the combined pulse width and intensity modulation methods for one dot can be performed with high speed and high accuracy.

It is preferable that the pulse width modulation and intensity modulation signal generating unit comprises:

data converting means for converting the input data into pulse modulation data and intensity modulation data;

pulse width modulation means which, based on the pulse modulation data, generates a plurality of pulse-modulated pulses; and a light emission instruction signal generating unit which, based on the outputs of the data converting means and the pulse width modulation means, performs the pulse width modulation and intensity modulation and generates the light emission instruction signal for the semiconductor laser.

A detailed arrangement of the pulse width modulation and intensity modulation signal generating unit which forms the digital control system is clarified.

The one chip of the integrated circuit may be formed by bipolar transistors. Thereby, especially, an amplifier of the analog driving system such as the error amplifier and current driving unit can be easily formed. Further, an input level therefor can be freely set and can be advantageously reduced.

The one chip of the integrated circuit may be formed by C-MOS transistors. Thereby, the pulse width modulation and intensity modulation signal generating unit can be easily formed and it is possible to further miniaturize the integrated circuit.

The one chip of the integrated circuit may provided by a composite circuit of bipolar transistors and C-MOS transistors. Thereby, an amplifier of the analog driving system such as the error amplifier and current driving unit can be easily formed by bipolar transistor, while the digital control system such as the pulse width modulation and intensity modulation signal generating unit can be easily formed by C-MOS transistors. Thus, circuit design can be easily performed.

One object of the present invention is to achieve high-speed high-reliability data transfer by effectively using features of bipolar transistor circuits in forming a semiconductor laser control system to be an integrated circuit.

For this purpose, according to the present invention, a semiconductor laser control system, comprises:

pulse width modulation and intensity modulation generating unit which, based on input data, performs pulse width modulation and intensity modulation and generates a light emission instruction signal;

an error amplifier which forms a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal; and a current driving unit providing a driving current, according to the light emission instruction signal, to flow through the semiconductor laser as the forward current, the driving current being generated so as to control driving of the semiconductor laser with a current of the difference or sum with the control current of the negative feedback loop, wherein:

the pulse width modulation and intensity modulation signal generating unit, the error amplifier and the current driving unit are provided by bipolar transistor as one chip of an integrated circuit; and an emitter coupled logic circuit included in an input portion of the pulse width modulation and intensity modulation signal generating unit to receive the input data.

When an integrated circuit is formed by bipolar transistors, by providing the emitter coupled logic in the portion in which input data is received, a logic operation can be established, for example, with a voltage swing of approximately 500 mV. Thus, input voltage swing can be reduced, thereby a waveform rising time constant can be reduced, and high-speed transfer can be achieved. Further, input energy can be greatly reduced and measures against EMI, energy saving can be achieved.

Further, not only the pulse width modulation and intensity modulation signal generating unit, the error amplifier and the current driving unit are formed to be one chip of an integrated circuit by bipolar transistors but also an input portion of the pulse width modulation and intensity modulation signal generating unit to which the input data is transmitted is formed with an impedance matching circuit. Thereby, reflection at a data transfer portion can be avoided, and high-speed data transfer, and measures against EMI and energy saving can be achieved.

Not only the pulse width modulation and intensity modulation signal generating unit, the error amplifier and the current driving unit are formed to be one chip of an integrated circuit by bipolar transistors, but also the input data is input to the pulse width modulation and intensity modulation signal generating unit in a combination of a positive logic signal and a negative logic signal, through two lines in parallel. Thereby, the voltage swing at the input portion can be further reduced and measures against EMI and energy saving can be achieved. Even if noise is included in an input signal, the noise is canceled because both the positive logic signal and negative logic signal are similarly affected by the noise. Thus, noise-resistant data transfer can be achieved.

By appropriately combining the above-mentioned arrangement, the totality of the advantages thereof can be obtained.

Not only the pulse width modulation and intensity modulation signal generating unit, the error amplifier and the current driving unit are formed by bipolar transistors to be one chip of an integrated circuit, but also the pulse width modulation and intensity modulation signal generating unit comprises a light emission instruction signal generating unit which performs pulse width modulation and intensity modulation and generates the light emission instruction signal for the semiconductor laser, an external connection device being provided for setting the current value of the light emission instruction signal generating unit.

The current of the light emission instruction signal generating unit is equal to the monitor electric current of the light reception device in a steady state. Therefore, it is necessary to prevent the current from being affected by the temperature in the integrated circuit. However, by adjusting the external connection device for adapting the control system to the characteristics of the semiconductor laser and light reception device, the monitor current can be stabilized so that a desired light output is obtained. When the monitor current varies, it is possible to adapt the control system to the monitor current.

Not only the pulse width modulation and intensity modulation signal generating unit, the error amplifier and the current driving unit are formed by bipolar transistors to be one chip of an integrated circuit, but also an external connection device is provided for setting a control speed of the negative feedback loop.

Flexibility in the control system design is improved, and the control speed can be freely set to a desired value.

According to another aspect of the present invention, a semiconductor laser control system, comprises:

a pulse width modulation and intensity modulation signal generating unit which, based on input data, performs pulse width modulation and intensity modulation and generates a light emission instruction signal;

an error amplifier forms a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal; and a current driving unit for causing a driving current, according to the light emission instruction signal, to flow through the semiconductor laser as the forward current, the driving current being generated so as to control driving of the semiconductor laser with a current of the difference or sum with the control current of the negative feedback loop, a differential quantum efficiency detecting unit for detecting the differential quantum efficiency of the semiconductor laser;

a memory unit for storing a detection result of the differential quantum efficiency detecting unit;

an adding current setting unit for setting a current, corresponding to the light emission instruction signal, using the detection result stored in the memory unit; and a timing generating unit, wherein, in initialization, the timing generating units generates a timing signal sufficiently slower than the control speed of the error amplifier, the differential quantum efficiency detecting unit detects the differential quantum efficiency of the semiconductor laser based on the timing signal, the memory units stores a detection result at each timing, and the current corresponding to the light emission instruction signal is set using the stored detection results.

According to another aspect of the present invention, a semiconductor laser control system, comprises:

a pulse width modulation and intensity modulation signal generating unit which, based on input data, performs pulse width modulation and intensity modulation and generates a light emission instruction signal;

an error amplifier forms a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal; and a current driving unit providing a driving current, according to the light emission instruction signal, to flow through the semiconductor laser as the forward current, the driving current being generated so as to control driving of the semiconductor laser with a current of the difference or sum with the control current of the negative feedback loop, a differential quantum efficiency detecting unit for detecting the differential quantum efficiency of the semiconductor laser;

a timing generating unit for generating a timing signal which controls a detection operation of the differential quantum efficiency detecting unit in initialization;

a memory unit for storing a detection result of the differential quantum efficiency detecting unit at each timing; and an adding current setting unit for setting a current, corresponding to the light emission instruction signal, using the detection results stored by the memory unit.

If there is a change in the differential quantum efficiency of the semiconductor laser due to elapsing time of use, the change is detected and a current adding value can be again set to an optimum value when power supply is started or a reset operation is performed. Thereby, the amount of control performed by the control unit, that is, the negative feedback loop can be greatly reduced. Accordingly, the semiconductor laser light output waveform can be close to an ideal rectangular wave or substantially a rectangular wave without an overshoot or slow rising, and optimum light output can be always obtained.

It is possible that the pulse width modulation and intensity modulation signal generating unit, the error amplifier, the current driving unit, the differential quantum efficiency detecting unit, the memory unit, the adding current setting unit and the timing generating unit are formed to be one chip of an integrated circuit. Also, it is possible that the chip is formed by bipolar transistors. Thereby, energy saving and miniaturization of the system can be achieved.

It is preferable that:

the current driving unit comprises a voltage shifting unit in the error amplifier, includes a differential circuit for changing the amount of voltage shift, and is provided in the negative feedback loop;

the adding current setting unit sets a current of the differential circuit so that light output of the semiconductor laser is a desired maximum value when a current corresponding to the light emission instruction signal is maximum, and light output of the semiconductor laser is a desired minimum value when a current corresponding to the light emission instruction signal is minimum;

in initialization, light output of the semiconductor laser is set to the desired maximum value at a certain timing T0, light output of the semiconductor laser is set to the desired minimum value at a timing T1 after a fixed time has elapsed from the timing T0, the differential quantum efficiency detecting unit and the adding current setting unit are operated and the current is set between the timing T1 and a timing T2 after a fixed time has elapsed from the timing T1.

Thus, a desired maximum amount of the high-speed voltage shifting is detected, and a light output is achieved to be close to an ideal rectangular wave or a substantially a rectangular wave.

The timing generating unit may include an external connection device for generating timing signals. The timing generating unit includes, for example, delay circuits. Even in such a case, a timing signals can be generated using the external connection device. Therefore, the control speed of the negative feedback loop can be freely set. The timing signals may be generated using the external connection circuit taking the thus-set control speed of the negative feedback loop into consideration. The timing signals may be generated also taking the frequency characteristics of the semiconductor laser and light reception device into consideration so that light output without including influence of the frequency characteristics of the semiconductor laser and light reception device can be obtained in the initialization operation using the timing signals $T_0$, $T_1$, $T_2$, $T_3$, $T_4$, and $T_5$. By thus appropriately generating the timing signals, the time required for the initialization operation using the timing signals $T_0$, $T_1$, $T_2$, $T_3$, $T_4$, and $T_5$ can be set as being an optimum time.

The timing generating unit may include an oscillation circuit and may generate a plurality of timing signals based on the oscillation output of the oscillation circuit. By using an oscillation circuit in the timing generating unit, even if it is necessary to generate many timings, the timings can be freely set using only an external connection capacitor. Further, by appropriately setting the capacitance of the capacitor, it is not necessary to provide a circuit for compensating an adverse effect due to the frequency characteristics of the semiconductor and light reception device.

The timing generating unit may include an oscillation circuit and many stages of latch circuits, and the respective latch circuits may generates timing signals based on the oscillation output of the oscillation circuit. Thus, a combination of latch circuits, not flip-flops, are used for the oscillation circuit. Thereby, it is possible to effectively reduce the number of components.

In the related art, when performing the differential quantum efficiency detection, appropriate image data (that is, a specific light emission level instruction signal) should be input. Thus, setting of the light output Ps as a result of the differential quantum efficiency detection by only internal processing of the system without regard to input image data cannot be performed in the related art.

According to another aspect of the present invention, a semiconductor laser control system, comprises:

a pulse width modulation and intensity modulation signal generating unit which, based on input data, performs pulse width modulation and intensity modulation and generates a light emission instruction signal;

an error amplifier which forms a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal; and a current driving unit providing a driving current, according to the light emission instruction signal, to flow through the semiconductor laser as the forward current, the driving current being generated so as to control driving of the semiconductor laser with a current of the difference or sum with the control current of the negative feedback loop, a differential quantum efficiency detecting unit for detecting the differential quantum efficiency of the semiconductor laser;

a memory unit for storing a detection result of the differential quantum efficiency detecting unit;

an adding current setting unit for setting a current, corresponding to the light emission instruction signal, using the detection result stored in the memory unit;

a timing generating unit; and a switch unit, to which a forcible light emission instruction signal and a forcible light cessation instruction signal are selectively input, the switch unit providing an output selected from outputs including the light emission instruction signal based on input data;

wherein:

the pulse width modulation and intensity modulation signal generating unit, the error amplifier, the current driving unit, the differential quantum efficiency detecting unit, the memory unit, the adding current setting unit and the timing generating unit are formed with bipolar transistors as one chip of an integrated circuit; and in initialization, the timing generating units generates a timing signal sufficiently slower than the control speed of the error amplifier, the differential quantum efficiency detecting unit detects the differential quantum efficiency of the semiconductor laser based on the timing signal, the memory units stores a detection result at each timing, and the current corresponding to the light emission instruction signal or the forcible light emission instruction signal is set using the stored detection results.

According to another aspect of the present invention, a semiconductor laser control system, comprises:

a pulse width modulation and intensity modulation signal generating unit which, based on input data, performs pulse width modulation and intensity modulation and generates a light emission instruction signal;

an error amplifier forms a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal; and a current driving unit which causes a driving current, according to the light emission instruction signal, to flow through the semiconductor laser as the forward current, the driving current being generated so as to control driving of the semiconductor laser with a current of the difference or sum with the control current of the negative feedback loop, a switch unit, to which a forcible light emission instruction signal and a forcible light cessation instruction signal are selectively input, the switch unit providing an output selected from outputs including the light emission instruction signal based on input data;

a differential quantum efficiency detecting unit for detecting the differential quantum efficiency of the semiconductor laser based on a timing signal;

a timing generating unit for generating a timing signal which is sufficiently slower than the control speed of the error amplifier, for controlling a detection operation of the differential quantum efficiency detecting unit, in initialization;

a memory unit for storing a detection result of the differential quantum efficiency detecting unit at each timing; and an adding current setting unit for setting a current, corresponding to the light emission instruction signal or the forcible light emission instruction signal, using the detection results stored by the memory unit.

If there is a change in the differential quantum efficiency of the semiconductor laser due to an elapsing time of use, the change is detected and a current adding value can be again set to an optimum value when power supply is started or a reset operation is performed. An amount of control performed by the control unit, that is, the negative feedback loop can be greatly reduced. Accordingly, the semiconductor laser light output waveform can be close to an ideal rectangular wave or a substantially rectangular wave without an overshoot or slow rising, and optimum light output can be always obtained. Further, the switch unit is provided, to which one of the forcible light emission instruction signal and forcible light cessation instruction signal is selectively input, and the switch unit provides an output selected from outputs including the light emission instruction signal based on input data. When detecting the differential quantum efficiency, the semiconductor laser can be forcibly turned on and turned off. Thus, the differential quantum efficiency detection can be performed without needing input data. By using the switch unit, the differential quantum efficiency detection can be performed with only internal processing. Then, by using a result of the differential quantum efficiency detection, light output can be optimized.

It may be possible that the pulse width modulation and intensity modulation signal generating unit comprises:

a pulse generating means for generating a plurality of pulses having a frequency the same as the frequency of an input clock signal and having different phases, the phase difference being a fixed phase difference;

data converting means for converting input data into pulse width modulation data and power modulation data; and pulse width modulation means for generating a plurality of pulses which have undergone pulse width modulation, based on the pulse width modulation data, from the pulses generated by the pulse generating means.

In a relatively simple arrangement, the pulse width modulation and intensity modulation signal generating unit can be formed.

The pulse width modulation and intensity modulation signal generating unit, the error amplifier, the current driving unit, the switch unit, the differential quantum efficiency detecting unit, the timing generating unit, the memory unit and the adding current setting unit may be one chip of an integrated circuit.

In the related art, the current driving unit and error amplifier which is a part of the negative feedback loop (corresponding to the current driving unit 4 and inverting amplifier 6 shown in FIG. 1, for example), each controlling a current flowing to the semiconductor laser, are provided as separate portions. As a result, the number of required components is large. Accordingly, power consumption is also large. Therefore, it is difficult to further miniaturize the integrated circuit.

One object of the present invention is to improve an arrangement of the error amplifier and current driving unit so that further miniaturization may be accomplished, and to provide a peripheral arrangement for making the best use of the thus-improved arrangement of the error amplifier and current driving unit.

According to another aspect of the present invention, a semiconductor laser control system comprises:

a pulse width modulation and intensity modulation signal generating unit which, based on input data, performs pulse width modulation and intensity modulation and generates a light emission instruction signal;

an error amplifier which forms a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal; and a current driving unit which causes a driving current, according to the light emission instruction signal, to flow through the semiconductor laser as the forward current, the driving current being generated so as to control driving of the semiconductor laser with a current of the difference or sum with the control current of the negative feedback loop, wherein:

the pulse width modulation and intensity modulation signal generating unit, the error amplifier and the current driving unit are formed as one chip of an integrated circuit: and the current driving unit is provided in the negative feedback loop.

The current driving unit is integrated with the error amplifier and incorporated into the negative feedback loop. This portion can be miniaturized, and the integrated circuit can be further miniaturized. Especially, it is possible that a large current driving part is only one part. Thereby, energy saving can be performed and large-scale integration can be achieved. Because it is only needed to drive a small current, high-speed driving can be achieved.

In the related art, when a bipolar transistor arrangement suitable for an amplifier arrangement is used as a base of the system, it is required to make the best use of the features of the bipolar transistor arrangement. For this purpose, the above-described arrangement according to the present invention may be formed by bipolar transistors.

An external connection device may be provided for setting a current value of the pulse width modulation and intensity modulation signal generating unit. In a steady state, the current of the pulse width modulation and intensity modulation signal generating unit is equal to the monitor current of the light reception device. Therefore, it is necessary that the current of the pulse width modulation and intensity modulation signal generating unit is a current which is not affected by temperature variation in the integrated circuit. However, by adjusting the external connection device, it is possible to set the current of the pulse width modulation and intensity modulation signal generating unit, taking the characteristics of the semiconductor laser and light reception device into consideration. Thereby, a desired light output can be obtained. By appropriately changing the value of the external connection device, the system can be adapted to a wide range of the monitor current of the light reception device.

An external connection device may be provided for setting the control speed of the negative feedback loop. Thereby, flexibility in designing the control system can be improved, and it is possible to freely set the control speed negative feedback loop.

It is preferable that the current driving unit is a high-speed shifting unit in the error amplifier, and a differential circuit for changing the amount of voltage shifting of the high-speed shifting unit is included in the current driving unit. The current driving unit is provided in the negative feedback loop. Voltage driving using the high-speed voltage shifting unit enables further high-speed control of light output. Further, setting of the voltage is easily performed.

It is preferable that there are common components among a plurality of digital to analog converters in a light emission instruction signal generating unit of the pulse width modulation and intensity modulation signal generating unit. Thereby, the number of components can be effectively reduced, and further energy saving can be achieved.

An offset setting unit may be provided which includes an external connection device for setting an offset current which is used for causing light output of the semiconductor laser to be of a desired minimum value. In order to perform light output control in the negative feedback loop in real time, light output of the semiconductor laser should not be completely zero. Therefore, it is necessary to set the offset current for causing light output of the semiconductor laser to be of the desired minimum value. By using the external device, the desired offset current can be easily set.

A combined setting unit may be provided having an external connection device for combined setting of a maximum current of the pulse width modulation and intensity modulation signal generating unit and an offset current which causes light output of the semiconductor laser to be a minimum value. The offset current can be appropriately automatically set by only setting the maximum current of the pulse width modulation and intensity modulation signal generating unit using the external connection device.

An offset setting unit may be provided which has an external connection device for setting an offset current which is used for causing light output of the semiconductor laser to be a desired minimum value; and
 a combined setting unit may be provided having an external connection device for combined setting of a maximum current of the pulse width modulation and intensity modulation signal generating unit and the offset current.

The offset current can be automatically set appropriately by only setting the maximum current of the pulse width modulation and intensity modulation signal generating unit using the external connection device. Also, using the offset setting unit, the offset current can be freely adjusted.

A starting-up unit may be provided for allowing start a operation when a power source voltage reaches a predetermined voltage in power supply starting. If the initialization operation, current driving unit setting operation and so forth are performed before a power source voltage reaches a predetermined voltage in a power supply starting condition, a desired light output of the semiconductor laser may not be provided. The starting-up unit allows starting of these operations after the power supply voltage has reached the predetermined voltage. The initialization of the integrated circuit can be performed with high accuracy, and also, the semiconductor laser can be protected when the system is starting.

A light emission instruction signal generating unit which causes an absolute current determined by the light reception device to flow, may have a base current compensation unit for compensating base currents of transistors connected to a path of a reference current. Thereby, error currents due to base currents of transistors can be prevented from occurring, and transistor characteristic changes due to such error currents can be prevented. Thus, the current of the light emission instruction signal generating unit can be provided with high accuracy.

An external connection device may be provided for setting a current value of the pulse width modulation and intensity modulation signal generating unit; and
 a light emission instruction signal generating unit which causes an absolute current determined by the light reception device to flow, may have a base current compensation unit for compensating base currents of transistors connected to a path of a reference current.

The current of the pulse width modulation and intensity modulation signal generating unit can be adjusted taking the characteristics of the semiconductor laser and light reception device into consideration. Thus, a desired light output can be obtained. Furthermore, error currents due to base currents of transistors can be prevented from occurring, and transistor characteristic changes due to such error currents can be prevented. Thus, the current of the light emission instruction signal generating unit can be provided with high accuracy.

A plurality of the pulse width modulation and intensity modulation signal generating units may be provided. The system can be adapted to a wide range of the monitor current, and can be adapted to various types of semiconductor lasers and light reception devices having different specifications.

An input terminal of an external control voltage for changing a maximum current of the pulse width modulation and intensity modulation signal generating unit may be provided. The maximum current of the pulse width modulation and intensity modulation signal generating unit can be dynamically changed using an external control voltage. Thus, a shading correction operation during a normal operation of the system and slight adjustment of light intensity can be performed.

A starting-up unit may be provided for allowing a start of operation when a light emission instruction current corresponding to the light emission instruction signal reaches a predetermined current in power supply starting. Thereby, similar to case of the above-mentioned starting-up unit for the power source voltage, the initialization operation can be performed with high accuracy, and also, the semiconductor laser can be protected when the system is starting.

An adding current setting unit for setting a driving current corresponding to the light emission instruction signal and a combined changing unit for causing a maximum current of the pulse width modulation and intensity modulation signal generating unit and a maximum current of the adding current setting unit to change together may be provided. When performing the above-mentioned dynamic change of the maximum current of the pulse width modulation and intensity modulation signal generating unit for performing the shading correction operation, the maximum current of the addition current setting unit is automatically changed at the same time. It is possible that a light output waveform is close to an ideal rectangular wave, or is substantially a rectangular wave.

A starting-up unit for allowing an operation start when a light emission instruction current corresponding to the light emission instruction signal reaches a predetermined current in power supply starting, an adding current setting unit for setting a driving current corresponding to the light emission instruction signal and a combined changing unit for causing a maximum current of the pulse width modulation and intensity modulation signal generating unit and a maximum current of the adding current setting unit to change at the same time may be provided. When performing the above-mentioned dynamic change of the maximum current of the pulse width modulation and intensity modulation signal generating unit for performing the shading correction operation, the maximum current of the addition current setting unit is automatically changed at the same time. Thereby, it is possible that a light output waveform is close to an ideal rectangular wave, or is substantially a rectangular wave.

A first starting-up unit for allowing an operation start when a power source voltage reaches a predetermined voltage in power supply starting and a second starting-up unit for allowing an operation start when a light emission instruction current corresponding to the light emission instruction signal reaches a predetermined current in a starting power supply may be provided. Similar to the case of using only the above-mentioned starting-up unit for the power source voltage, and to the case of using only the above-mentioned starting-up unit for the light emission instruction current, the initialization operation can be performed with high accuracy, and also, the semiconductor laser can be protected when the system is starting.

In the related art, when the system is applied to a printer or a copier, a higher performance is demanded, for example, for achieving one-dot multi-level output.

For example, the monitor current of the light reception device for monitoring light output of the semiconductor laser varies depending on a particular product. Further, it is required to take the temperature characteristics of the device into consideration and flexibility in designing the control system, that is, the negative feedback loop should be improved. It is required that the control speed of the negative feedback loop is freely set. Accuracy in an initialization operation of an considerably overall miniaturized integrated circuit should be considered. Protection of the semiconductor laser should also be considered.

One object of the present invention is to provide one chip of an integrated circuit of a semiconductor laser control system which fulfills the above-described demands which arise when being applied to a printer, a copier or the like.

According to another aspect of the present invention, a semiconductor laser control system, comprises:

a pulse width modulation and intensity modulation signal generating unit which comprises data converting means for converting the input data into pulse modulation data and intensity modulation data, pulse width modulation means which, based on the pulse modulation data, generates a plurality of pulse-modulated pulses, and a light emission instruction signal generating unit which, based on the outputs of the data converting means and the pulse width modulation means, performs the pulse width modulation and intensity modulation and generates a light emission instruction signal for the semiconductor laser, the pulse width modulation and intensity modulation signal generating unit, based on input data, performing pulse width modulation and intensity modulation and generates the light emission instruction signal;

an error amplifier which forms a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal; and a current driving unit providing a driving current, according to the light emission instruction signal, to flow through the semiconductor laser as the forward current, the driving current being generated so as to control driving of the semiconductor laser with a current of the difference or sum with the control current of the negative feedback loop, wherein:
the pulse width modulation and intensity modulation signal generating unit, the error amplifier and the current driving unit are formed as one chip of an integrated circuit: and
an external connection device is provided for setting a current value of the light emission instruction signal generating unit.

In a steady state operation, the current of the light emission instruction signal generating unit is equal to the monitor current of the light reception device. Therefore, it is necessary that the current of the light emission instruction signal generating unit is a current which is not affected by temperature variation in the integrated circuit. However, by adjusting the external connection device, it is possible to set the current of the light emission instruction signal generating unit by taking the characteristics of the semiconductor laser and light reception device into consideration. A desired light output can be obtained. By appropriately changing the value of the external connection device, the system can be adapted to a wide range of the monitor current of the light reception device. Further, the system can be formed as an integrated circuit without any problems.

Not only the pulse width modulation and intensity modulation signal generating unit, the error amplifier and the current driving unit is formed as one chip of an integrated circuit, but also an external connection device may be provided for setting the control speed of the negative feedback loop.

Flexibility in designing the control system is improved, the control speed can be freely set, and the system can be formed as an integrated circuit without any problems.

A starting-up unit may be provided for allowing a start of operation when a power source voltage reaches a predetermined voltage in power supply starting, and the pulse width modulation and intensity modulation signal generating unit, the error amplifier, the current driving unit and the starting-up unit may be formed as one chip of an integrated circuit.

As described above, if the initialization operation, current driving unit setting operation and so forth are performed before a power source voltage reaches a predetermined voltage in a power supply starting condition, a desired light output of the semiconductor laser may not be provided. The starting-up unit allows starting of these operations after the power supply voltage has reached the predetermined voltage. Thereby, the initialization of the integrated circuit can be performed with high accuracy, and also, the semiconductor laser can be protected when the system is starting.

The starting-up unit may have a reset function for initializing the integrated circuit by a control signal external of the integrated circuit. By using the reset function, it is possible to again performing the initialization operation on the integrated circuit. Thus, it is possible to always provide a satisfactory light output.

The pulse width modulation and intensity modulation signal generating unit may include a plurality of light emission instruction signal generating units. The system can be adapted to a wide range of monitor current, and can be adapted to various types of semiconductor lasers and light reception devices having different specifications.

An input terminal may be provided for an external control voltage which changes a maximum current of the light emission instruction signal generating unit. The maximum current of the light emission instruction signal generating unit can be dynamically changed using an external control voltage. Thus, a shading correction operation during normal operation of the system and slight adjustment of light intensity can be performed.

A starting-up unit may be provided for allowing a start of operation when a light emission instruction current corresponding to the light emission instruction signal reaches a predetermined current in power supply starting. Similar to case of the above-mentioned starting-up unit for the power source voltage, the initialization operation can be performed with high accuracy, and also, the semiconductor laser can be protected when the system is starting.

An adding current setting unit for setting a driving current corresponding to the light emission instruction signal and a combined changing unit for causing a maximum current of the light emission instruction signal generating unit and a maximum current of the adding current setting unit to change together may be provided. Thereby, when performing the above-mentioned dynamic change of the maximum current of the light emission instruction signal generating unit for performing the shading correction operation, the maximum current of the addition current setting unit is automatically changed together. Thereby, it is possible that a light output waveform is close to an ideal rectangular wave, or is substantially a rectangular wave.

A starting-up unit for allowing a start of operation when a light emission instruction current corresponding to the light emission instruction signal reaches a predetermined current in power supply starting, an adding current setting unit for setting a driving current corresponding to the light emission instruction signal and a combined changing unit for causing a maximum current of the pulse width modulation and intensity modulation signal generating unit and a maximum current of the adding current setting unit to change together may be provided. When performing the above-mentioned dynamic change of the maximum current of the light emission instruction signal generating unit for performing the shading correction operation, the maximum current of the addition current setting unit is automatically changed therewith. It is possible that a light output waveform is close to an ideal rectangular wave, or is substantially a rectangular wave.

An offset setting unit having an external connection device for setting an offset current which causes light output of the semiconductor laser to be a desired minimum value may be provided. In order to perform light output control in the negative feedback loop in real time, light output of the semiconductor laser should not be completely zero. Therefore, it is necessary to set the offset current for causing light output of the semiconductor laser to be of the desired minimum value. By using the external device, the desired offset current can be easily set.

A combined setting unit having an external connection device for combined setting of both a maximum current of the light emission instruction signal generating unit and an offset current which causes light output of the semiconductor laser to be a minimum value may be provided. Thereby, the offset current can be automatically set appropriately by only setting the maximum current of the light emission instruction signal generating unit using the external connection device.

An offset setting unit which has an external connection device for setting an offset current which is used for causing light output of the semiconductor laser to be a desired minimum value, and a combined setting unit having an external connection device for combined setting of both a maximum current of the light emission instruction signal generating unit and the offset current may be provided. The offset current can be automatically set appropriately by only setting the maximum current of the pulse width modulation and intensity modulation signal generating unit using the external connection device. Also, using the offset setting unit, the offset current can be freely adjusted.

An abnormality detecting unit for detecting an abnormality in the signal of the output terminal of the semiconductor laser may be provided. When the semiconductor laser is degraded but the degradation is not serious, the degradation may be detected and corrected through the negative feedback loop and the current setting of the current driving unit. However, when the degradation is serious, a considerably large current may flow through the current driving unit. In such a case, the above-mentioned abnormality detecting unit detects the abnormality, and thus serious trouble may be prevented from occurring.

The light emission instruction signal generating unit may include a base current compensation unit for compensating base currents of transistors connected to a path of a reference current. Error currents due to base currents of transistors can be prevented from occurring, and transistor characteristic changes due to such error currents can be prevented. Thus, the current of the light emission instruction signal generating unit can be provided with high accuracy.

An external connection device is provided for setting a current value of the light emission instruction signal generating unit. The light emission instruction signal generating unit, which causes an absolute current determined by the light reception device to flow, has a base current compensation unit for compensating base currents of transistors connected to a path of a reference current. Thereby, the current of the light emission instruction signal generating unit can be adjusted taking the characteristics of the semiconductor laser and light reception device into consideration. Thus, a desired light output can be obtained. Furthermore, error currents due to base currents of transistors can be prevented from occurring, and transistor characteristic changes due to such error currents can be prevented. Thus, the current of the light emission instruction signal generating unit can be provided with high accuracy.

According to the pulse width and intensity combined modulation method disclosed in Japanese Laid-Open Patent Application No.6-347852, image forming is performed with a large number of tone levels. However, when an image is formed in a laser printer or a copier, a large number of tone levels are not always needed for one dot. For example, when forming character (letter) images, basically only two tone levels are needed. There are cases where higher writing density or higher writing speed is needed rather than larger tone levels for one dot.

A detect pulse may be needed for obtaining a main-scan synchronization signal for determining a writing starting position in a main scan direction in a laser printer or the like. Further, a straight line extending in a main scan line or a space extending in a main scan line may be required. In these cases, according to the method disclosed in Japanese Laid-Open Patent Application No.6-347852, a semiconductor laser is driven with a pulse signal having a one-dot multi-tone output. It is considered that, in the above-mentioned cases of obtaining the detect pulse, main-scan direction extending line or space, it is not necessary that the semiconductor laser is driven with one-dot multi-tone output pulse signal, but with a simpler signal.

One object of the present invention is to provide a semiconductor laser control system in which outputs suitable for particular image types can be obtained.

According to another aspect of the present invention, a semiconductor laser control system, comprises:

a pulse width modulation and intensity modulation signal generating unit which, based on input data, performs pulse width modulation and intensity modulation and generates a light emission instruction signal;

an error amplifier forming a negative feedback loop together with a semiconductor laser and a light reception device which monitors light output of the semiconductor laser, the error amplifier controls forward current of the semiconductor laser so that a light reception signal proportional to the light output of the semiconductor laser is equal to the light emission instruction signal;

a current driving unit providing a driving current, according to the light emission instruction signal, to flow through the semiconductor laser as the forward current, the driving current being generated so as to control driving of the semiconductor laser with a current of the difference or sum with the control current of the negative feedback loop; and output mode change-over means for selecting one of clock-frequency-different output modes according to a frequency selecting signal.

One of the clock-frequency-different output modes is selected according to a frequency selecting signal. Accordingly, for an image for which a large number of tone levels is needed, the above-mentioned pulse width and intensity level modulation method is effectively used. Thus, a high quality image having a large number of tone levels can be obtained. However, for an image for which a large number of tone levels are not needed, the number of tone levels is reduced and a clock frequency is increased. Thereby, pixel writing density in a main scan direction is increased, and a high-quality image can be obtained.

A plurality of the pulse modulation and intensity modulation signal generating units may be provided, the number of the pulse modulation and intensity modulation signal generating units being equal to the number of the different clock-frequency output modes, and the output mode change-over means may select one of the plurality of the pulse modulation and intensity modulation signal generating units according to the frequency selecting signal. Thereby, one of the different clock-frequency output modes can be freely set and selected.

The pulse width modulation and intensity modulation signal generating unit may comprise a plurality of modulation units for generating pulse width modulation data and intensity modulation data from input data, the number of the modulation units being equal to the number of the different clock-frequency output modes, and one output unit which performs pulse width modulation and intensity modulation based on the pulse modulation data and intensity modulation data, and generates the light emission instruction signal. The output mode change-over means may select one of the plurality of modulation units for the output unit according to the frequency selecting signal. Thereby, one of the different clock-frequency output modes can be freely set and selected. Further, only one light emission instruction signal generating means should be provided. Thereby, it is possible to reduce the number of necessary components and miniaturization can be achieved.

The pulse width modulation and intensity modulation signal generating unit may comprise pulse generating means for generating a plurality of pulses having a frequency the same as the frequency of an input clock signal and having different phases, the phase difference being a fixed phase difference, data converting means for converting input data into pulse width modulation data and intensity modulation data and pulse width modulation means for generating a plurality of pulses, which have undergone pulse width modulation based on the pulse width modulation data, from the pulses generated by the pulse generating means. Further, the output mode change-over means may cause the data converting means to generate modulation data according to the frequency selecting signal and output it to the pulse width modulation means. Thereby, one of the different clock-frequency output modes can be freely set and selected. The only necessary input terminals are those for the data converting means, and the only one pulse width modulation means and the only one light emission instruction signal generating means should be provided. Thus, the number of necessary components can be reduced and miniaturization can be achieved.

The clock frequencies of the output modes may comprise one which is equal to the clock frequency of the input clock signal and the other which is double the clock frequency of the input clock signal, one of which can be selected. Accordingly, for an image requiring a large number of tone levels, as one of the typical output modes, the above-mentioned pulse width and intensity level modulation method is effectively used. Thus, high quality images of a large number of tone levels can be obtained. However, for an image not requiring a large number of tone levels, the number of tone levels is reduced and a clock frequency is doubled. Thereby, pixel writing density in a main scan direction is doubled, and high-quality image can be obtained.

One of the different clock-frequency output modes may be an output mode which is selected based on a forcible light emission instruction signal which comprises the frequency selecting signal. Thereby, all of the image data is caused to be 0 and the forcible light emission instruction signal is applied. Thus, it is possible that writing is performed with a frequency of the forcible light emission instruction signal, which has no relation with the image data clock frequency. Such a mode of writing may be effectively used as in the case of obtaining the above-mentioned detect pulse.

One of the different clock-frequency output modes may be an output mode which is selected based on a forcible light cessation signal which comprises the frequency selecting signal. For a portion for which writing is not required and without causing all of the image data to be 0, mere use of the forcible light cessation signal is needed.

One object of the present invention is to provide a semiconductor laser control system in which the current addition method which is performed for effectively reducing an amount of control by the negative feedback loop and the one-dot pulse width and intensity combined modulation method is performed with a miniaturized arrangement and with a reduced power consumption, is performed with a large-scale-integration (LSI) integrated circuit, at high speed and with high accuracy, and outputs suitable for image types may be easily obtained.

According to another aspect of the present invention, a semiconductor laser control system, comprises:

a pulse width modulation and intensity modulation signal generating unit which, based on input data, performs pulse width modulation and intensity modulation and generates a light emission instruction signal;

an error amplifier which forms a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal;

a current driving unit providing a driving current, according to the light emission instruction signal, to flow through the semiconductor laser as the forward current, the driving current being generated so as to control driving of the semiconductor laser with a current of the difference or sum with the control current of the negative feedback loop; and output mode change-over means for selecting one of different clock-frequency output modes according to a frequency selecting signal, wherein the pulse width modulation and intensity modulation signal generating unit, the error amplifier, the current driving unit and the output mode change-over means are formed as one chip of an integrated circuit.

One of different clock-frequency output modes is selected according to the frequency selecting signal. For an image requiring a large number of tone levels, as one of the typical output modes, the in-one-dot pulse width and intensity level modulation method is effectively used. Thus, high quality images having a large number of tone levels can be obtained. However, for an image not requiring a large number of tone levels, the number of tone levels is reduced and a clock frequency is increased. Thereby, pixel writing density in a main scan direction is increased, and a high-quality image can be obtained. Furthermore, all of a digital control system of the pulse width modulation and intensity modulation signal generating unit, an analog driving system such as the error amplifier and current driving unit and the output mode change-over unit are formed as one chip of an integrated circuit. Miniaturization and energy saving can be achieved, and a high-speed, high accuracy operation can be achieved.

A plurality of the pulse modulation and intensity modulation signal generating units may be provided, the number of the pulse modulation and intensity modulation signal generating units being equal to the number of the different clock-frequency output modes, and the output mode change-over means may select one of the plurality of the pulse modulation and intensity modulation signal generating units according to the frequency selecting signal. Thereby, one of the different clock-frequency output modes can be easily set and selected.

The pulse width modulation and intensity modulation signal generating unit may comprise a plurality of modulation units for generating pulse width modulation data and intensity modulation data from input data, the number of the modulation units being equal to the number of the different clock-frequency output modes, and one output unit which performs pulse width modulation and intensity modulation based on the pulse modulation data and intensity modulation data, and generates the light emission instruction signal. The output mode change-over means may select one of the plurality of modulation units for the output unit according to the frequency selecting signal. Thereby, one of the different clock-frequency output modes can be easily set and selected. Further, only one light emission instruction signal generating means should be provided. It is possible to reduce the number of necessary components and further miniaturization of the integrated circuit can be achieved.

The pulse width modulation and intensity modulation signal generating unit may comprise pulse generating means for generating a plurality of pulses having a frequency the same as the frequency of an input clock signal and having different phases, the phase difference being a fixed phase difference, data converting means for converting input data into pulse width modulation data and intensity modulation data and pulse width modulation means for generating a plurality of pulses, which have undergone pulse width modulation based on the pulse width modulation data, from the pulses generated by the pulse generating means. The output mode change-over means may cause the data converting means to generate modulation data according to the frequency selecting signal and output it to the pulse width modulation means. Thereby, one of the different clock-frequency output modes can be easily set and selected. The only necessary input terminals are those for the data converting means, and the only one pulse width modulation means and the only one light emission instruction signal generating means should be provided. The number of necessary components can be reduced and further miniaturization of the integrated circuit can be achieved.

The clock frequencies of the output modes may comprise one which is equal to the clock frequency of the input clock signal and the other which is double the clock frequency of the input clock signal, one of which can be selected. For an image needing a large number of tone levels, as one of the typical output modes, the above-mentioned pulse width and intensity level modulation method is effectively used. Thus, high quality images having a large number of tone levels can be obtained. However, for an image not needing a large number of tone levels, the number of tone levels is reduced and a clock frequency is doubled. Thereby, pixel writing density in a main scan direction is doubled, and high-quality images can be obtained.

One of the different clock-frequency output modes may be an output mode which is selected based on a forcible light emission instruction signal which comprises the frequency selecting signal. All of the image data is caused to be 0 and the forcible light emission instruction signal is applied. Thus, it is possible that writing is performed with a frequency of the forcible light emission instruction signal, which has no relation with the image data clock frequency. Such a mode of writing may be effectively used in the case of obtaining the above-mentioned detect pulse.

One of the different clock-frequency output modes may be an output mode which is selected based on a forcible light cessation signal which comprises the frequency selecting signal. For a portion where writing is not required, without needing to cause all of the image data to be 0, mere use of the forcible light cessation signal is provided.

One object of the present invention is to provide a semiconductor laser control system, an arrangement of the pulse width modulation and intensity modulation signal generating unit of which is appropriate for forming the system as one chip of an integrated circuit, the arrangement of the pulse width modulation and intensity modulation signal generating unit being configured for selectively achieving both a large number of tone levels and a high-speed writing operation.

According to another aspect of the present invention, a semiconductor laser control system, comprises:

a pulse width modulation and intensity modulation signal generating unit comprising pulse generating means, including an pulse oscillator, for generating a plurality of pulses having a frequency the same as the frequency of an input clock signal and having different phases, the phase difference being a fixed phase difference, data converting means for converting input image data into pulse width modulation data and intensity modulation data and pulse width modulation means for generating a plurality of pulses, which have undergone pulse width modulation based on the pulse width modulation data, from the pulses generated by said pulse generating means, said pulse width modulation and intensity modulation signal generating unit performing pulse width modulation and intensity modulation and generating a light emission instruction signal;

an error amplifier which forms a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal;

a current driving unit providing a driving current, according to the light emission instruction signal, to flow through the semiconductor laser as the forward current, the driving current being generated so as to control driving of the semiconductor laser with a current of the difference or sum with the control current of the negative feedback loop; and wherein the pulse width modulation and intensity modulation signal generating unit, the error amplifier and the current driving unit are formed as one chip of an integrated circuit.

In the above-described arrangement, the pulse generating unit of the pulse width modulation and intensity modulation signal generating unit includes the pulse oscillator. The pulse width modulation means should have an arrangement merely for performing logic operations such as logical multiplication and logical sum on a plurality of pulses output from the pulse generating means. Accordingly, the arrangement of the pulse width modulation means can be easily formed and all of the system can be easily formed as one chip of an integrated circuit.

The pulse width modulation means may comprise n sets of two selectors for selecting pulses, based on mutually different pulse width modulation data, from pulses generated by the pulse generating means, two logic AND gates to which the outputs of the selectors and a non-inverted internal clock signal and an inverted internal clock signal are input, and a logic OR gate, to which the outputs of the logic AND gates are input, for outputting pulses. Thereby, a simple arrangement can be achieved. Such an arrangement is very suitable for a case in which freely selective output modes include only an equal mode where the output mode clock frequency is equal to the input clock frequency and a double mode where the output mode clock frequency is double of the input clock frequency. This is because, in the double mode, data (pulse modulation data) for each dot is a selecting signal for a respective one of the two selectors. Thus, a simple arrangement can be achieved.

The data converting means, based on the image data and a frequency selecting signal, may convert the image data into pulse width modulation data and intensity modulation data. According to this arrangement, even when the output mode is changed over according to the frequency selecting signal, the frequency selecting signal is processed by the data converting means. It is possible that the arrangement which follows the data converting means is common for a plurality of selective output modes. The arrangement is appropriate for forming the system as one chip of an integrated circuit.

The data converting means, based on the image data, a frequency selecting signal and a dot position control signal, may convert the image data into pulse width modulation data and intensity modulation data. In this arrangement, the dot position control signal is also processed by the data converting means. Accordingly, a dot phase (whether, for each dot, a waveform in which a pulse width starts from the left side or a waveform in which a pulse width starts from the right side) can be freely selected for each dot, and high-quality images can be obtained. The dot position control signal may comprise one bit. Thereby, the dot phase selection can be performed for each dot, or a dot concentration type wave form (in which two adjacent dots are in contact with one another) can be achieved with a minimum number of bits.

Means for generating the light emission instruction signal may comprise a digital to analog converter, a first current switch which allows or does not allow the non-inverted output current of the digital to analog converter according to one of the pulses output from the pulse width modulation means and a second current switch which allows or does not allow the inverted output current of the digital to analog converter according to the other of the pulses output from the pulse width modulation means, the total of the output currents of the first and second current switches being used as the light emission instruction signal.

The means for generating the light emission instruction signal can be formed in a simple arrangement, and all of the system can be easily formed as one chip of an integrated circuit. Especially, the intensity modulation data input to the digital to analog converter may be fixed during one dot (that is, during one input clock period). Thus, high-speed writing can be achieved.

Means for generating the light emission instruction signal may comprise a digital to analog converter, a first current switch which allows or does not allow the non-inverted output current of the digital to analog converter according to one of the pulses output from the pulse width modulation means and a second current switch which allows or does not allow the inverted output current of the digital to analog converter and a constant current equal to the least significant bit current of the digital to analog converter according to the other of the pulses output from the pulse width modulation means, the total of the output currents of the first and second current switches being used as the light emission instruction signal.

In this arrangement, a constant current equal to the least significant bit current is always caused to flow through the second current switch. Thereby, it is possible to increase the number of available tone levels without increasing the number of bits.

A third current switch may be provided for allowing or not allowing a constant current based on a full on signal. Thereby, the full on state output can also be provided.

The output mode clock frequencies may comprise one which is equal to the input clock signal and the other which is double the input clock signal, one of which can be selected, and means of generating the light emission instruction signal may comprise two digital to analog converters which convert two intensity modulation data into currents, two first current switches which allow or do not allow the non-inverted output currents of the two digital to analog converters according to respective ones of the pulses output from the pulse width modulation means and two second current switches which allow or do not allow the inverted output currents of the two digital to analog converters according to the other respective ones of the pulses output from the pulse width modulation means, the total of the output currents of the four current switches being used as the light emission instruction signal.

In this arrangement, even when the double mode is selected, the intensity modulation data may be changed for a period which is the same as the input clock period similar to the case of the intensity data modulation data changing in the equal mode. Thereby, high-speed writing can be achieved.

One object of the present invention is to provide a semiconductor laser control system in which, even when output mode change-over is performed as described above, the number of input terminals is effectively reduced and a large number of tone levels is achieved and the system is formed as one chip of an integrated circuit.

According to another aspect of the present invention, a semiconductor laser control system, comprises:

a pulse width modulation and intensity modulation signal generating unit comprising pulse generating means for generating a plurality of pulses having a frequency the same as the frequency of an input clock signal and having different phases, the phase difference being a fixed phase difference, a fixed amount by the fixed amount, data converting means for converting input image data into pulse width modulation data and intensity modulation data and pulse width modulation means for generating a plurality of pulses, which have undergone pulse width modulation based on the pulse width modulation data, from the pulses generated by the pulse generating means, the pulse width modulation and intensity modulation signal generating unit performing pulse width modulation and intensity modulation and generating a light emission instruction signal;

an error amplifier providing a negative feedback loop together with a semiconductor laser and a light reception device which monitors light output of the semiconductor laser, the error amplifier controlling forward current of the semiconductor laser so that a light reception signal proportional to the light output of the semiconductor laser is equal to the light emission instruction signal; and a current driving unit providing a driving current, according to the light emission instruction signal, to flow through the semiconductor laser as the forward current, the driving current being generated so as to control driving of the semiconductor laser with a current of the difference or sum with the control current of the negative feedback loop, wherein:

the plurality of pulses output from the pulse width modulation means have a predetermined mutual relationship; and the pulse width modulation and intensity modulation signal generating unit, the error amplifier and the current driving unit are formed as one chip of an integrated circuit.

In the arrangement, the plurality of pulses output from the pulse width modulation means have a predetermined mutual relationship. By using the mutual relationship, it is possible to cause some of modulation data to be commonly used. Thereby, the number of required signals can be reduced. As a result, the number of input terminals and the corresponding number circuit devices can be reduced. All of the system can be easily formed as one chip of an integrated circuit. Further, power consumption can be reduced.

One or a plurality of pulses of the plurality of pulses output from the pulse width modulation means may be always longer than the others by the fixed amount of phase difference. By using this mutual relationship, modulation data can be compressed and the number of required signals can be reduced. Thus, a simple arrangement can be achieved.

Output mode clock frequencies may comprise one which is equal to the input clock frequency and the other which is double the input clock frequency, one which can be selected according to the frequency selecting signal, ½ the bits of each image data being used for each dot writing and the number of tone levels being ½ that of an equal frequency mode case when a double frequency mode is selected.

Thereby, the number of necessary image data input terminals is equal in the case of the equal mode and the case of the double mode. Accordingly, it is possible to commonly use the pulse width modulation means of the pulse width modulation and intensity modulation signal generating unit. The number of input terminals and the corresponding number of circuit devices can be reduced. Thus, all of the system can be easily formed as one chip of an integrated circuit.

The data converting means may converts input image data into pulse width modulation data and intensity modulation data based on the image data, a dot position control signal and a frequency selecting signal. Further, output mode clock frequencies may comprise one which is equal to the input clock frequency and the other which is double the input clock frequency, one which can be selected according to the frequency selecting signal, each of two bits of input image data being used as the dot position control signal of a writing dot.

Accordingly, even in the double mode in which writing density has a higher priority than the number of tone levels, whether a waveform in which a pulse width starts from the left side or a waveform in which a pulse width starts from the right side can be freely selected for each dot. The dot position control can be performed for each dot. As a result, by alternately repeating a waveform in which a pulse width starts from the left side and a waveform in which a pulse width starts from the right side, the dot-concentration pulse modulation can be performed. Thus, a desired type of output can be obtained.

The image data may comprise N-bit data series for representing $2^N$ output states, that is, a one-dot full turn on state, one-dot full turn off state, and $2^{N-1}-1$ middle levels, each of which has two levels of dot phase states.

Accordingly, a predetermined number of tone levels can be obtained with one-bit-less data series. Therefore, the number of input terminals or the input transfer rate required for obtaining the predetermined number of tone levels can be reduced. Otherwise, a non one-bit-less data series is used, and the number of tone levels can be increased. As a result, this arrangement is advantageous when the available number of bits is relatively small.

Only in the double frequency mode, the image data may comprise two sets of M-bit data series, each for representing $2^M$ output states, that is, one-dot full turn on state, one-dot full turn off state, and $2^{M-1}-1$ middle levels, each of which has two levels of dot phase states.

Accordingly, in the double mode in which the available number of bits is small for each dot, the above-described advantage is effectively used, and, without increasing the number of signal lines, a predetermined number of tone levels can be obtained.

According to another aspect of the present invention, a semiconductor laser control system, comprises:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of the difference or sum with the control current of said negative feedback loop, a differential quantum efficiency detecting unit for detecting the differential quantum efficiency of said semiconductor laser;

a memory unit for storing a detection result of said differential quantum efficiency detecting unit;

an adding current setting unit for setting a current, corresponding to the light emission instruction signal, using the detection result stored in said memory unit; and a timing generating unit, wherein:

in initialization, said timing generating units generates a timing signal sufficiently slower than the control speed of said error amplifier, said differential quantum efficiency detecting unit detects the differential quantum efficiency of said semiconductor laser based on the timing signal, said memory units storing a detection result at each timing, and the current corresponding to the light emission instruction signal is set using the stored detection results;

said current driving unit comprises a high-speed voltage shifting unit in said error amplifier, includes a differential circuit for changing the amount of voltage shift, and is provided in said negative feedback loop.

output mode change-over means is provided for selecting one of different clock-frequency output modes according to a frequency selecting signal; and said pulse width modulation and intensity modulation signal generating unit, said error amplifier, said current driving unit, said differential quantum detecting unit, said memory unit, said adding current setting unit, said timing generating unit and said output mode change-over means are formed as one chip of an integrated circuit by bipolar transistors.

In this arrangement, some features of the above-described aspects of the present invention are combined. Thereby, various functions can be performed through the single semiconductor laser control system.

Other objects and further features of the present invention will become more apparent from the following detailed description when read in conjunction with the accompanying drawings.

BRIEF DESCRIPTION OF THE DRAWINGS

FIG. 4 shows typical views illustrating relationships between pulse width and intensity combined method light outputs and dot images;

FIG. 18 shows a circuit diagram of an example of an arrangement of a pulse width modulation and intensity modulation signal generating unit shown in FIG. 14;

DETAILED DESCRIPTION OF THE PREFERRED EMBODIMENTS

A first embodiment of the present invention will now be described with reference to the accompanying drawings. A semiconductor laser control system according to the present invention is applied as a control system, including a negative feedback loop, for controlling light output of a semiconductor laser which is used in optical writing in a laser printer or the like. Further, the above-described pulse width and intensity combined modulation method (PWM+PM method) is used as a method for obtaining a multi-tone-level output within one dot.

Figure 3:
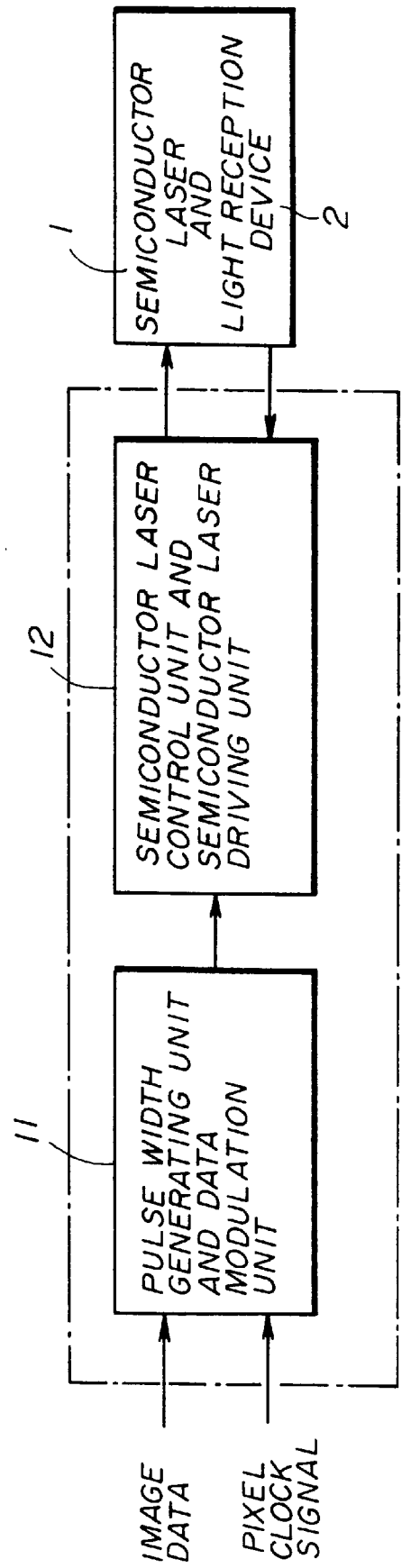
FIG. 3 shows a block diagram of an example of a pulse width and intensity combined modulation method arrangement.

For implementing the modulation method, a semiconductor laser control system 100 in the first embodiment has a general arrangement such as that shown in FIG. 3. In the arrangement, with reference to FIG. 3, image data and an input signal are input to pulse width generating unit and data modulation unit 11. The pulse width generating unit and data modulation unit 11 outputs a light emission instruction signal to a semiconductor laser control unit and semiconductor laser driving unit 12. A light reception device 2 is provided for a semiconductor laser 1, the light reception device 2 monitoring light output of the semiconductor laser 1. The semiconductor laser 1 and light reception device 2 are connected to the semiconductor laser control unit and semiconductor driving unit 12. According to the input image data, the pulse width generating unit and data modulation unit 11 perform the PWM method, and the PM method for interpolating a change of a pulse width.

Figure 5A:
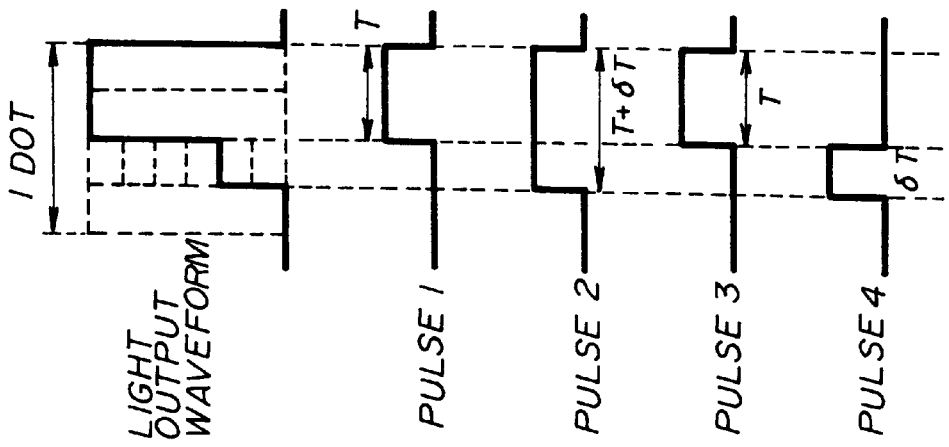
FIGS. 5A, 5B show time charts illustrating how to generate pulse width and intensity combined method waveforms.
Figure 5B:
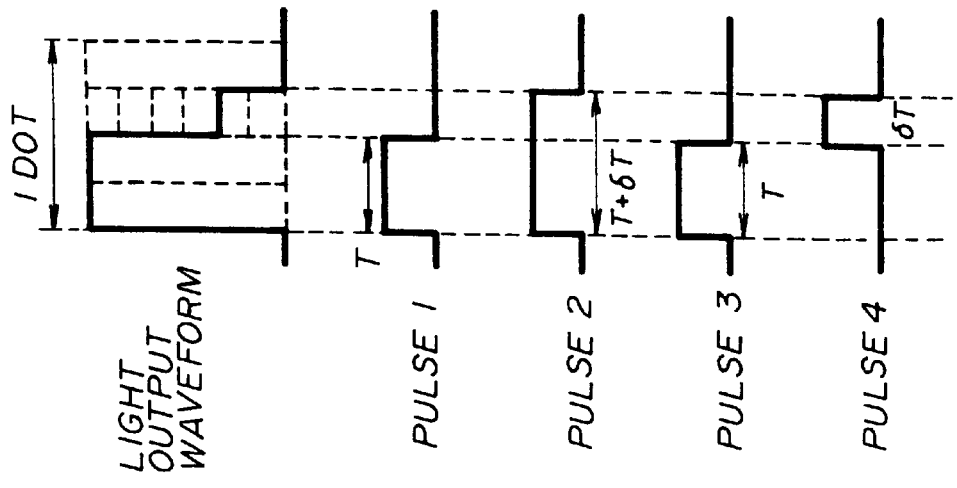

A basic concept of light output waveforms of the semiconductor laser 1 is shown in FIG. 4. For the sake of simplicity of description, in an example shown in FIG. 4, the number of pulse widths is three and the number of power levels is six. Thereby, a total of 18 tone levels are output. FIG. 4 typically shows light output waveforms in this case. As shown in the figure, in this combined modulation method, basically the PWM method is used. Power modulation using a middle exposure range is performed on a minimum pulse width. In order to obtain the light output waveforms, for example, as shown in FIGS. 5A and 5B, either a pulse 1 having a pulse width of T and a pulse 2 having a pulse width of T+δT (δT being the minimum pulse width) or a pulse 3 having a pulse width of T and a pulse 4 having a pulse width of δT are generated. For the pulse of the pulse width of T, each of the bits is of the H level, while, for the pulse of the pulse width δT (in the case of the pulse 2, during the time δT only the pulse 2 is at the high level), respective bits may be of either the H level or the L level according to input image data. Thereby, the light output waveforms shown in FIG. 4 and FIGS. 5A, 5B can be provided. In the example shown in FIG. 5A, a pulse width starts from the left side, and, in the example shown in FIG. 5B, a pulse width starts from the right side.

Figure 10:
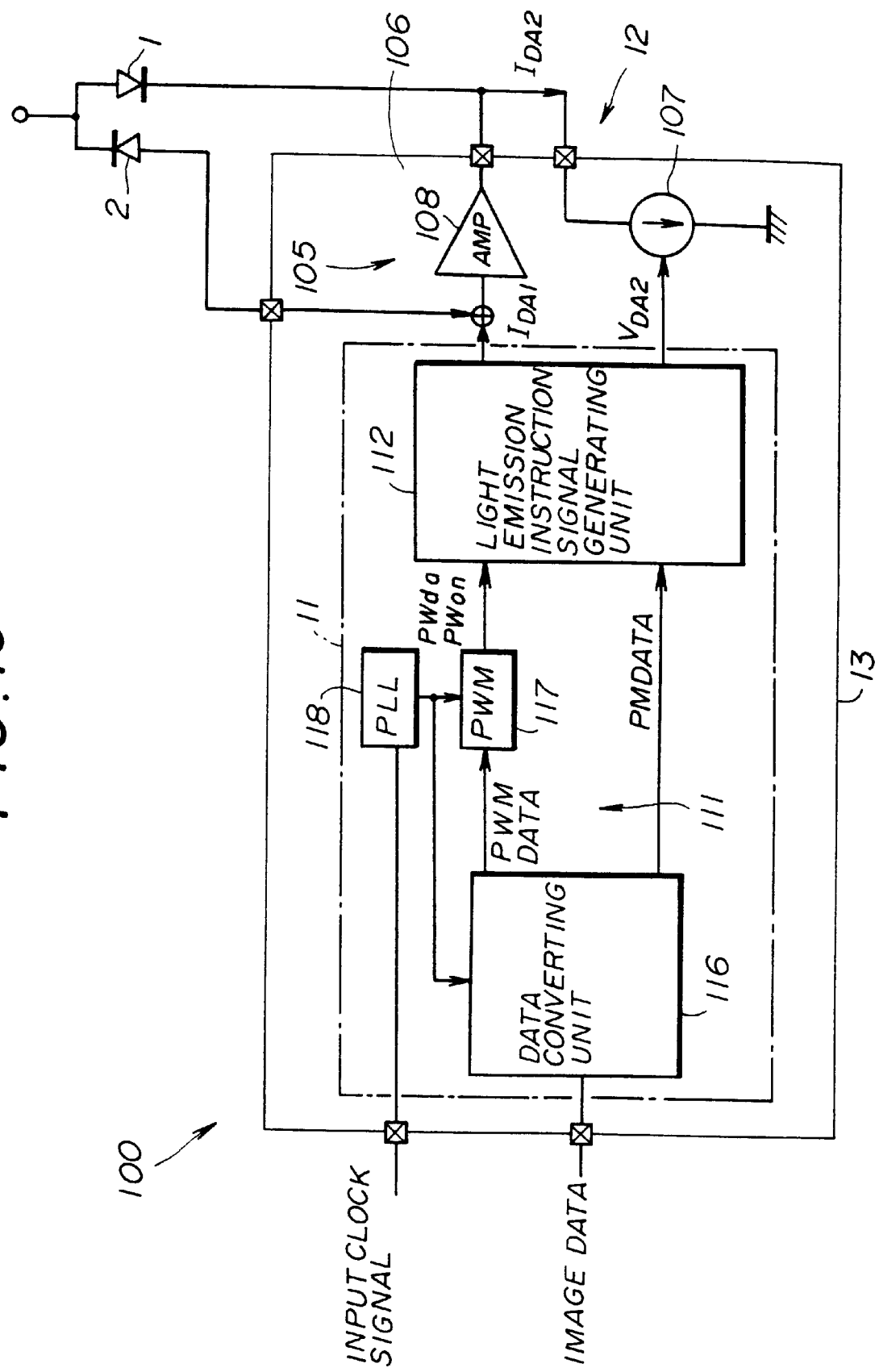
FIG. 10 shows a block diagram of a block arrangement of a semiconductor laser control system in a first embodiment of the present invention where the system is formed as one chip.

With reference to FIG. 10, a detailed block arrangement of the semiconductor laser control system in the first embodiment will now be described. The semiconductor laser control unit and semiconductor laser driving unit 12 includes a negative feedback loop 106 and a constant-current source 107 which forms a driving unit. The negative feedback loop 106 includes an error amplifier 108 which is connected with the semiconductor laser 1 and light reception device 2 to form a loop and forms an error amplifying unit. The negative feedback loop 106 monitors light output of the semiconductor laser 1 through the light reception unit 2, and always controls a forward current of the semiconductor laser 1 so that the monitored light output is equal to a light emission instruction signal ($I_{DA1}$) which is generated by the semiconductor laser control unit and semiconductor laser driving unit 12. The constant-current source 107 functions so as to cause a driving current $I_{DA2}$ according to a light emission instruction signal ($V_{DA2}$) to flow through the semiconductor laser 1 in its forward direction. In the semiconductor laser control unit and semiconductor laser driving unit 12, light output of the semiconductor laser 1 is controlled basically by a current of a sum (or a difference) of a control current of the negative feedback loop 106 and the driving current of the constant-current source 107.

In the circuit configuration, light output corresponding to a current through which the constant-current source 107 directly drives the semiconductor laser 1 is referred to as $P_S$, the step response characteristics of the light output of the semiconductor laser can be approximated, as follows:

$P_{out} = P_0 + (P_S - P_0)\{1 - \exp(-2\pi f_0 t)\}$.

Figure 2A:
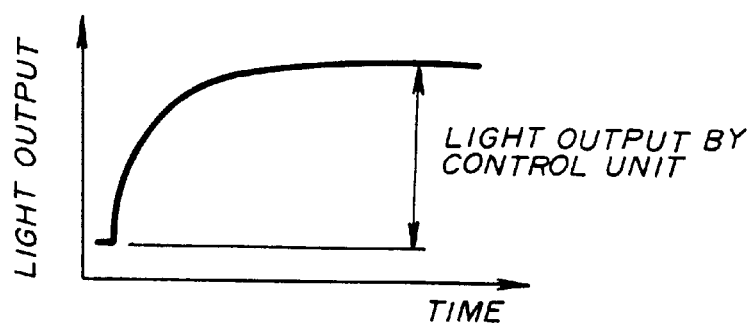
FIGS. 2A, 2B show characteristics graphs in a case where Ps by $I_{DA2}$ is not provided and in a case where Ps by $I_{DA2}$ is provided.
Figure 2B:
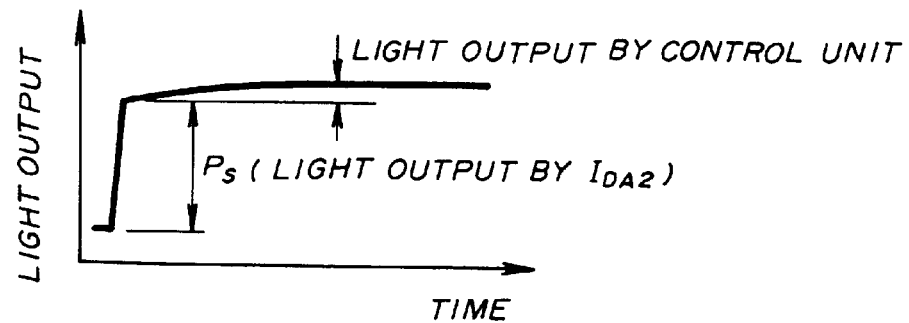

When $P_S \approx P_0$, the light output of the semiconductor laser 1 immediately becomes equal to $P_0$. Therefore, $f_0$ may have a relatively small value in comparison to the case where there is only the negative feedback loop 106. In a practical case, $f_0$ may have a value of approximately 40 (MHz). Such a cutoff frequency $f_0$ can be easily obtained. FIG. 2A shows how the light output changes only through the negative feedback loop 106 (control unit). FIG. 2B shows how the light output changes in the case where the constant current $I_{DA2}$ is added by the constant-current source 107. As shown in the figures, the light output waveform shown in FIG. 2B is similar to that of a rectangular wave.

Figure 13:
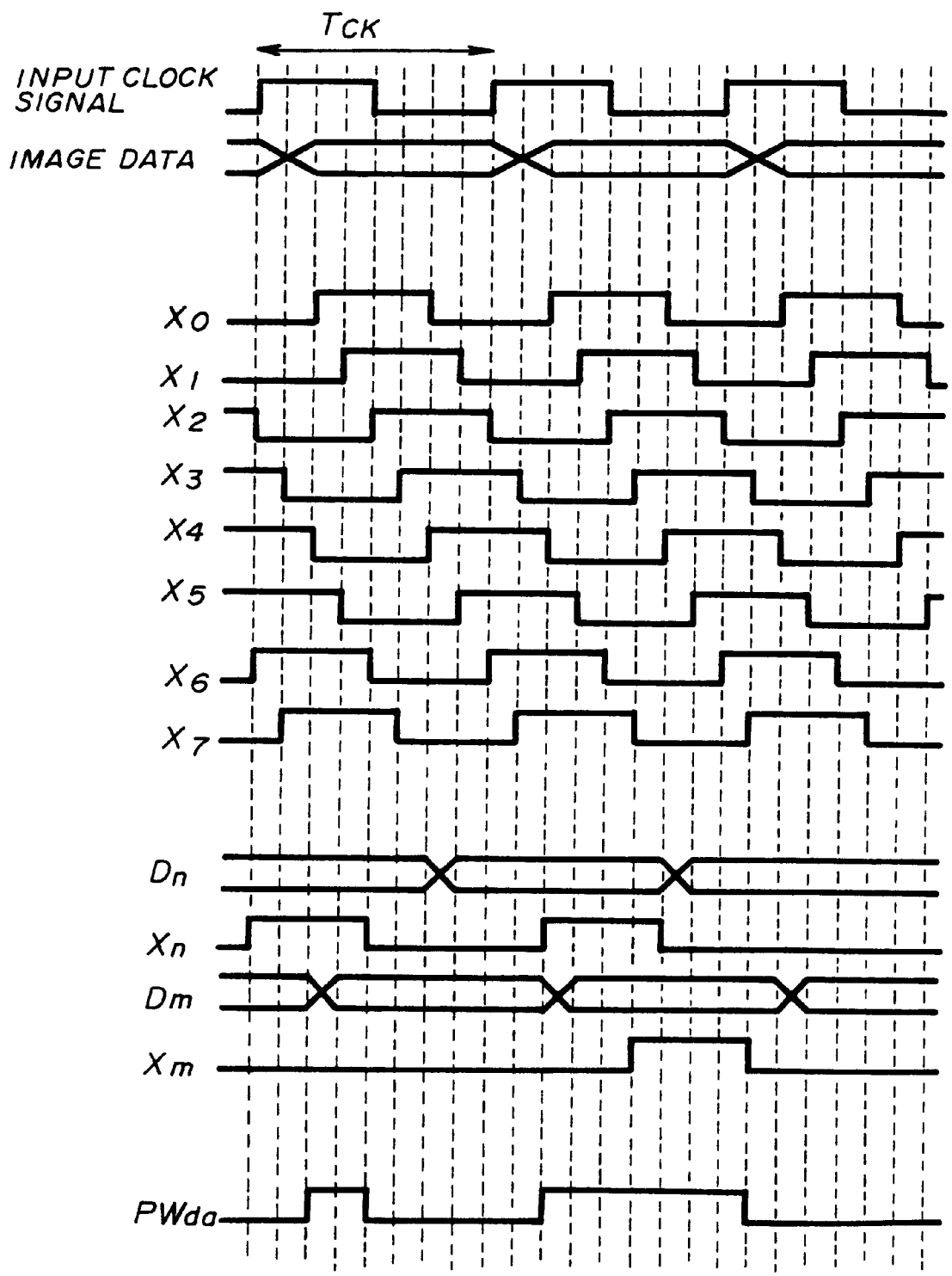
FIG. 13 shows time charts illustrating a pulse width generating method.
Figure 17:
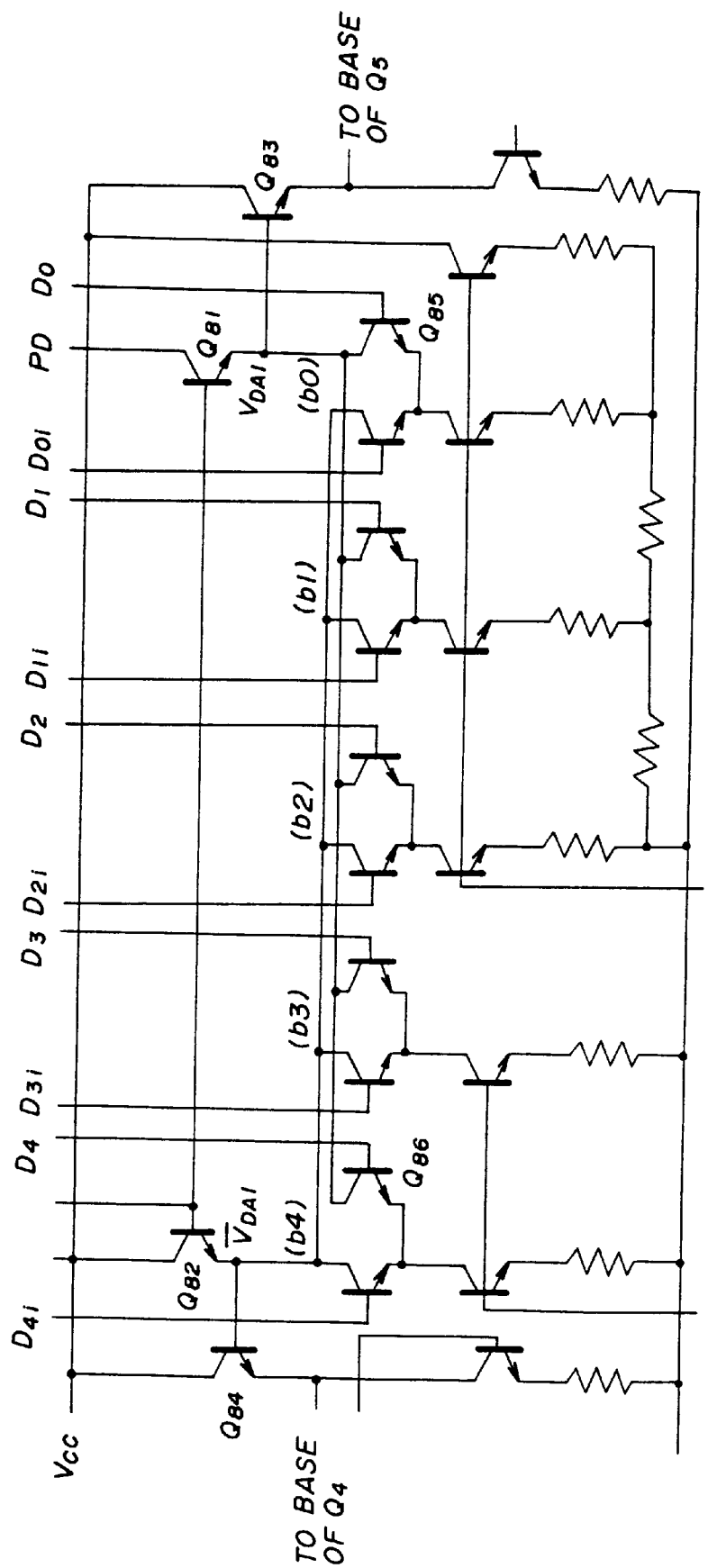
FIG. 17 shows a circuit diagram of an example of an arrangement of a light emission instruction signal generating unit shown in FIG. 14.

In the above-described semiconductor laser control system 100 in the first embodiment, the pulse width generating unit and data modulation unit 11 and the semiconductor laser control unit and semiconductor laser driving unit 12 are formed as one chip of an integrated circuit 13 by bipolar transistors. The negative feedback loop 106 portion including the error amplifier 108 can be formed as an integrated circuit, not shown, but as shown in FIG. 2 of Japanese Laid-Open Patent Application No.5-67833 (U.S. Pat. No. 5,237,579), for example, using a known bipolar transistor circuit. Also, the constant-current source 107 portion can be formed as an integrated circuit, not shown, but as shown in FIGS. 13 and 17 of Japanese Laid-Open Patent Application No.5-67833 (U.S. Pat. No. 5,237,579), for example, using a known bipolar transistor circuit.

In the integrated circuit 13, a more detailed arrangement and functions of the pulse width generating unit and data modulation unit 11 portion will now be described. In the first embodiment, pulse width modulation is performed with three bits (that is, eight levels), and intensity modulation is performed with five bits (that is, 32 levels). In total, it is possible to output 8-bit tone levels (that is, 256 levels). The pulse width generating unit and data modulation unit 11 include a pulse width modulation intensity modulation signal generating unit 111 and light emission instruction signal generating unit 112.

Figure 11:
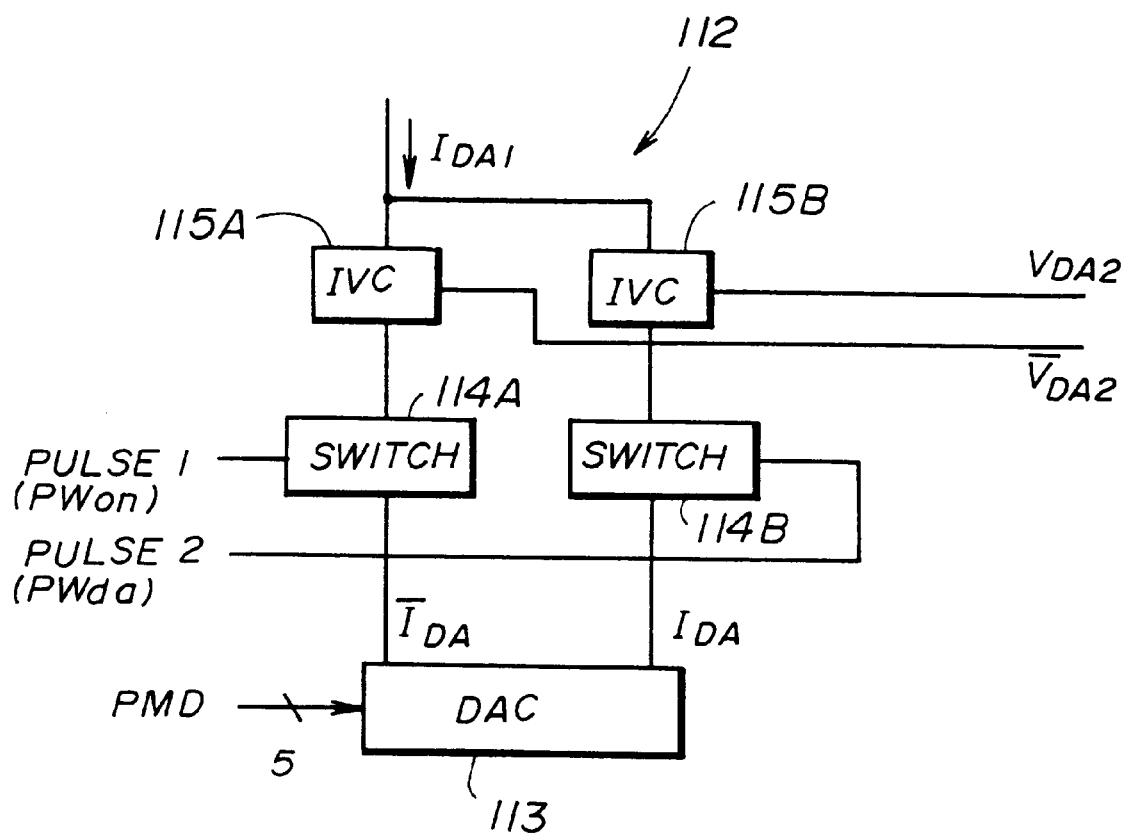
FIG. 11 shows a block diagram of a specific block arrangement of a light emission instruction signal generating unit shown in FIG. 10.

The light emission instruction signal generating unit 112 includes, as shown in FIG. 11, a digital to analog converter (DAC) 113 which generates the currents $I_{DA}$ and $\bar{I}_{DA}$ according to intensity modulation data PMDATA (PMD), a differential switch 114A which allows or does not allow the current $\bar{I}_{DA}$ to flow therethrough according to a pulse 1 ($PW_{on}$), a differential switch 114B which allows or does not allow the current $I_{DA}$ to flow therethrough according to a pulse 2 ($PW_{da}$), current to voltage converters (IVC) 115A, 115B which convert a currents flowing through the switches 114A, 114B into voltages, respectively. It is noted that $I_{DA} + \bar{I}_{DA} = I_{full}$. The value of $I_{full}$ is the value of $I_{DA}$ when all PMDATA is ON, and is the maximum current value of the light emission instruction signal. The differential switches 114A, 114B function so that, when each of the pulse 1 and pulse 2 is the H level, $I_{DA1} = I_{full}$. When the pulse 1 is the L level and the pulse 2 is the H level, $I_{DA1} = I_{DA}$. When each of the pulse 1 and pulse 2 is the L level, $I_{DA1} = 0$. When each of the pulse 1 and pulse 2 is the H level, $I_{DA1} = I_{full}$, without depending on the value of $I_{DA}$ (that is, without depending on PMDATA). Therefore, the intensity modulation data PMDATA can be fixed during one pixel clock period. This is advantageous in achieving a high-speed operation of the semiconductor. laser control system. Each of such differential switches as the switches 114A, 114B can be formed as a result of differential connection of a pair of bipolar transistors. The current to voltage converters 115A and 115B provide the light emission instruction signal $V_{DA2}$ of two voltages to the constant-current source 107 shown in FIG. 10. The constant-current source 107 generates the current $I_{DA2}$ according to the difference between the two voltages of the light emission instruction signal $V_{DA2}$. Each of the current to voltage converters 115A, 115B can also be formed of a bipolar transistor, a base of which is connected to the ground, for example. Consequently, the light emission instruction signal generating unit 112 itself can be easily formed to be an integrated circuit by bipolar transistors.

Figure 12A:
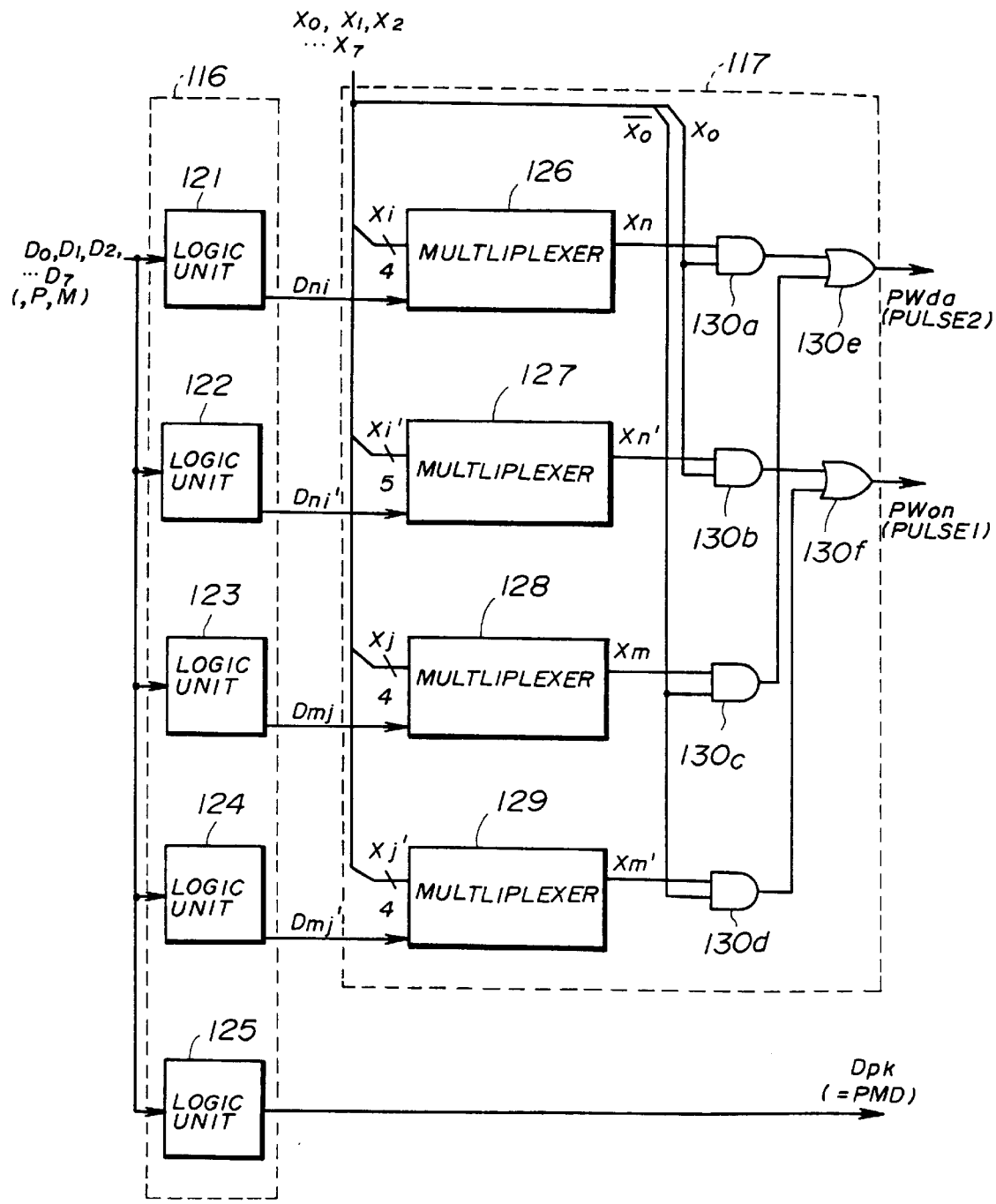
FIG. 12A shows a block diagram of a specific block arrangement of a data converting unit and a pulse width modulation unit shown in FIG. 10.

The pulse width modulation intensity modulation signal generating unit 111 of the pulse width generating unit and data modulation unit 11 includes, for example, a data converting unit 116 acting as data converting means, a pulse width modulation unit 117 acting as pulse width modulation means and a pulse generating oscillator 118 which is of a PLL configuration. The pulse generating oscillator 118 generates an internal clock signal $X_0$ which is in synchronization with an input clock signal, and a plurality of pulse signals $X_1, X_2, \ldots, X_k$. The plurality of pulse signals $X_1, X_2, \ldots, X_k$ have the same frequency as that of the internal clock signal, and have different phases from each other, the phase difference being a fixed phase difference. Thus, a pulse phase shifts by the fixed phase difference between the different phases (the fixed phase difference corresponding to the minimum pulse width δT), from $X_0$ to $X_7$, as shown in FIG. 13. When pulse width modulation is of 8 levels, k=7, and the uniform phase shift is $\frac{1}{8} \cdot T_{CK}$, as shown in FIG. 13, where $T_{CK}$ represents the period of the input clock signal. As shown in the figure, the signals $X_4$, $X_5$, $X_6$, $X_7$ are the inverted signals of the signals $X_0$, $X_1$, $X_2$, $X_3$, respectively. Any of the 8 pulse signals $X_0$, $X_1$, $X_2$, ..., $X_7$ can be a pulse signal which is actually in synchronization with the input clock signal. In the example shown in FIG. 13, the signal $X_6$ is actually in synchronization with the input clock signal. Actually, the internal clock signal $X_0$ is delayed ¼ period from the input clock signal, as shown in the figure. As shown in FIG. 12A (FIG. 12B will be described later), the eight pulse signals $X_0$, $X_1$, $X_2$, ..., $X_7$ are provided to the pulse width modulation unit 117. The data converting unit 116 converts input image data $D_0$, $D_1$, $D_2$, ..., $D_7$ into pulse width modulation data PWMDATA and intensity modulation data PMDATA. According to the pulse width modulation data PWDATA provided by the data converting unit 116, the pulse width modulation unit 117 generates two pulse signals, pulses $PW_{on}$ (pulse 1) and pulses $PW_{da}$ (pulse 2) from the output $X_0$, $X_1$, $X_2$, ..., $X_7$ of the pulse generating oscillator 118.

A logic operation for obtaining a light output waveform, started from the left side, such as that shown in FIG. 5A is expressed by the following equations (1) and (2):

$$PW_{da} = X_0 \cdot X_n + \overline{X_0} \cdot X_m, \quad (1)$$
$$PW_{on} = X_0 \cdot X_n' + \overline{X_0} \cdot X_m'.$$

$$X_n = X_5\overline{D_{n1}D_{n2}} + X_6D_{n1}\overline{D_{n2}} + X_7\overline{D_{n1}}D_{n2} + X_0D_{n1}D_{n2}, \quad (2)$$
$$X_m = X_1\overline{D_{m1}D_{m2}} + X_2D_{m1}\overline{D_{m2}} + X_3\overline{D_{m1}}D_{m2} + X_4 + D_{m1}D_{m2},$$
$$X_n' = X_4\overline{D_{n1}'D_{n2}'} + X_5D_{n1}'\overline{D_{n2}'} +$$
$$\qquad\qquad X_6\overline{D_{n1}'}D_{n2}' + X_7D_{n1}'D_{n2}' + X_0D_{n3}',$$
$$X_m' = X_0\overline{D_{m1}'D_{m2}'} + X_1D_{m1}'\overline{D_{m2}'} + X_2\overline{D_{m1}'}D_{m2}' + X_3D_{m1}'D_{m2}'.$$

$D_{n1}$, $D_{n2}$, $D_{m1}$, $D_{m1}$, $D_{n1}'$, $D_{n2}'$, $D_{m1}'$, $D_{m1}'$, are the pulse width modulation data PWMDATA. When the more significant rank three bits, that is, $D_7$, $D_6$, $D_5$ of the image data $D_7$ (MSB), $D_6$, $D_5$, ..., $D_0$ (LSB) are data for the pulse width modulation, the above-mentioned pulse width modulation data PWMDATA is expressed by the following equation (3):

$$D_{n1} = \overline{D_7}D_5 + D_7, \quad D_{n2} = \overline{D_7}D_6 + D_7, \quad (3)$$
$$D_{m1} = D_7D_5, \quad D_{m2} = D_7D_6,$$
$$D_{n1}' = \overline{D_7}D_5, \quad D_{n2}' = \overline{D_7}D_6, \quad D_{n3}' = D_7,$$
$$D_{m1}' = D_7D_5, \quad D_{m2}' = D_7D_6.$$

In order to perform the logic operation, the data converting unit 116 and pulse width modulation unit 117 are configured as shown in FIG. 12A. The data converting unit 116 includes logic units 121, 122, 123 and 124 which converts the image data $D_0$, $D_1$, $D_2$, ..., $D_7$ into the pulse width modulation data $D_{ni}$, $D_{ni}'$, $D_{mj}$, $D_{mj}'$ according to the above-mentioned equation (3). The data converting unit 116 further includes a logic unit 125 which outputs the data of the less significant five bits, that is, $D_4$, $D_3$, $D_2$, $D_1$ and $D_0$ of the image data $D_7$, $D_6$, $D_5$, ..., $D_0$ as the intensity modulation data $D_{pk}$ (PMD) as it is. These logic units 121, 122, 123 and 124 include means for holding modulation data such as latches or the like. The pulse width modulation unit 117 includes multiplexers 126, 127, 128, 129 (acting as selectors), each of which selects one of the pulse signals $X_0$, $X_1$, $X_2$, ..., $X_7$, using the pulse width modulation data $D_{ni}$, $D_{ni}'$, $D_{mj}$, $D_{mj}'$. These operations of the multiplexers 126, 127, 128 and 129 are equivalent to the logical operation of the above-mentioned equations (2). The pulse width modulation unit 117 further includes AND gates 30*a*, 30*b*, 30*c*, 30*d* and OR gates 30*e*, 30*f* which perform the logic operation shown in the above-mentioned equations (1). The OR gate 30*e* outputs the pulses $PW_{da}$ and the OR gate outputs the pulses $PW_{on}$. These data converting unit 116 and pulse width modulation unit 117 which mainly performs logic operation can also be formed to be an integrated circuit by bipolar transistors.

As a result, in the first embodiment, the entirety of the pulse width generating unit and data modulation unit 11 and the semiconductor laser control unit and semiconductor unit driving unit 12 can be formed as one chip of an integrated circuit 13 by bipolar transistors. Thereby, in driving and controlling the semiconductor laser in pulse width and intensity combined modulation method within one dot using the combination of the negative feedback loop 106 and the addition current value control system (such as that, advantage of which was described with reference to FIGS. 2A and 2B), it is possible to achieve miniaturization of the system and energy saving. Because all the necessary processing is performed within the one chip of the integrated circuit 13, the processing can be performed at high speed with high accuracy. By forming the one chip of the integrated circuit 13 using bipolar transistors, it is easy to form an analog driving amplifier such as the error amplifier 108 and constant-current source 107, input levels thereof can be freely set, and it is possible to set the input levels to low levels. Thereby, it is possible to improve functions of laser printer or the like.

In the first embodiment, the pulse width generating unit and data modulation unit 11 and semiconductor laser control unit and semiconductor laser driving unit 12 are formed as one chip of an integrated circuit using only bipolar transistors. However, it is also possible to form them to be one chip of an integrated circuit using only C-MOS transistors. It is also possible to form them to be one chip of an integrated circuit using both bipolar transistors and C-MOS transistors as a combined circuit. When one chip of an integrated circuit is formed using C-MOS transistors, it is easy to form the pulse width generating unit and data modulation unit 11 portion which is a digital control system. Further, it is possible to obtain a highly-integrated integrated circuit. When one chip of an integrated circuit is formed using both bipolar transistors and C-MOS transistors as a combined circuit, analog driving amplifiers such as the error amplifier 108 and constant-current source 107 can be easily formed using bipolar transistors and the pulse width generating unit and data modulation unit 11 which is a digital control system can be easily formed using C-MOS transistors. Thus, circuit designing can be more easily performed.

Figure 1:
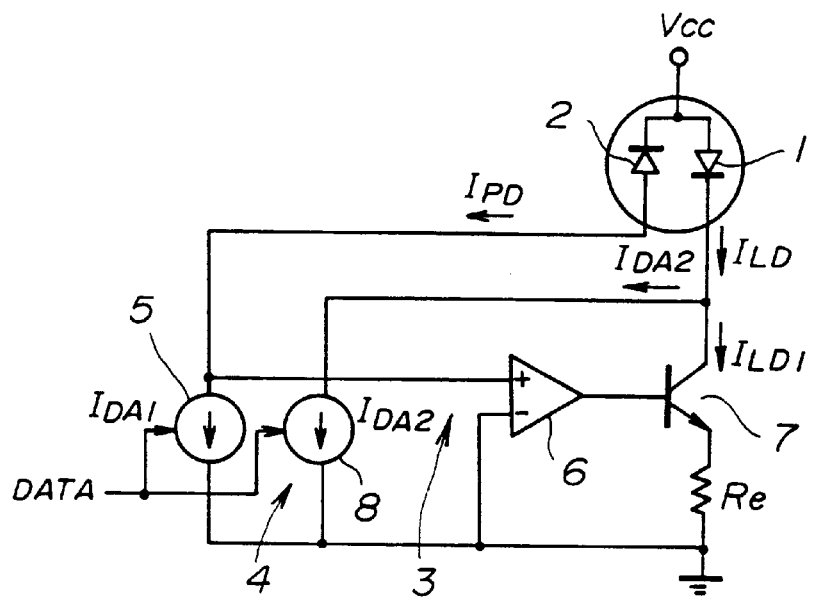
FIG. 1 shows an $I_{DA2}$ addition method with a current driving unit in the related art.

A second embodiment of the present invention will now be described with reference to the drawings. In the second embodiment, the above-described pulse width and intensity combined modulation method and combination of the negative feedback loop 106 and the addition current value control system, which combination effectively reduces the load of the negative feedback loop, are used. The same reference numerals as those shown in FIGS. 1 and 3 are given to identical components/parts in the second embodiment.

A semiconductor laser control system 213 in the second embodiment, in outline, includes, as shown in FIG. 3, the pulse width generating unit and data modulation unit 11 (pulse width modulation and intensity modulation signal generating unit) and semiconductor laser control unit and semiconductor laser driving unit 12 (semiconductor control and driving unit).

Figure 14:
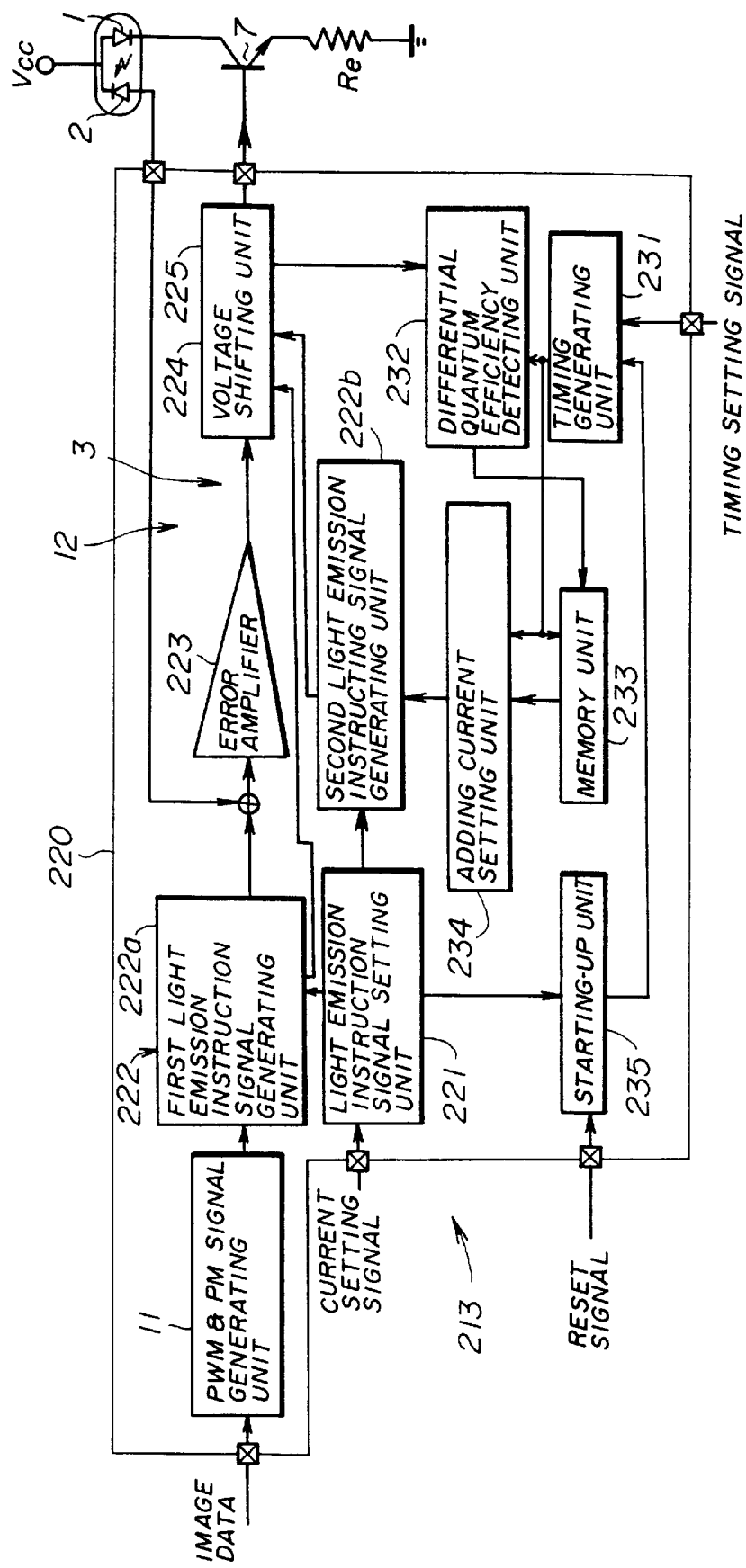
FIG. 14 is a general block diagram showing an overall arrangement of a second embodiment of the present invention.

FIG. 14 shows an example of a detailed arrangement of the semiconductor laser control system 213 in the second embodiment. In the second embodiment, almost all components/parts of the pulse width modulation and intensity modulation signal generating unit 11 and the semiconductor control and driving unit 12 are formed as one chip of an integrated circuit 220. In more detail, as examples of partial circuit arrangements will be shown, almost all of the components/parts are formed as one chip by bipolar transistors.

The semiconductor laser control and driving unit 12 will now be described. The negative feedback loop 3 includes a light emission instruction signal setting unit 221, a light emission instruction signal generating unit 222, an error amplifier 223 (corresponding to the inverting amplifier 6), a current driving unit 224, the semiconductor laser 1 and the light reception device 2. The light emission instruction signal generating unit 222 includes a first light emission instruction signal generating unit 222a and a second light emission instruction signal generating unit 222b. A current which is generated by the first light emission instruction signal generating unit 222a according to modulated data is compared with a monitor current which is output by the light reception device 2 and is in proportion to light output of the semiconductor laser 1. An error amount resulting from the comparison is converted into a forward current of the semiconductor laser 1 through the error amplifier 223 and current driving unit 224. When the monitor current is larger than the current from the first light emission instruction signal generating unit 222a, a forward current of the semiconductor laser 1 decreases, and, when the monitor current is smaller than the current from the first light emission instruction signal generating unit 222a, a forward current of the semiconductor laser 1 increases. Thus, the negative feedback loop 3 is configured. Generally speaking, the differential quantum efficiency of the semiconductor laser 1 and light-to-electricity conversion light reception sensitivity of the light reception device 2 may be different depending on particular products. It is necessary to set a current value according to particular characteristics. The light emission instruction signal setting unit 221 sets a value of the current $I_{DA1}$, that is, a value of a monitor current $I_{PD}$ of the light reception device 2 when considering a steady state, according to an external current setting signal so that the semiconductor laser 1 may provide desired light output. It is possible to set the current value so that characteristics variation depending on particular produces is considered and the semiconductor laser 1 may always provide a desired light output.

The current driving unit 224 is formed to be, for example, a differential switch arrangement, and acts as a high-speed voltage shifting unit 225 which instantaneously shifts output of the error amplifier 223 by a desired electric potential. This voltage shifting of the high-speed voltage shifting unit 225 instantaneously effects a corresponding change in a forward current of the semiconductor laser 1. Thus, high-speed modulation of the semiconductor laser 1 can be possible. The high-speed voltage shifting unit 225 which functions as the current driving unit 224 is included in a control system of the negative feedback loop 3 and has an output portion which is the same as an output portion of the negative feedback loop 3. In forming the integrated circuit 220, it is advantageous that the number of components/parts can be effectively reduced and power consumption of the circuit can also be effectively reduced.

Figure 15:
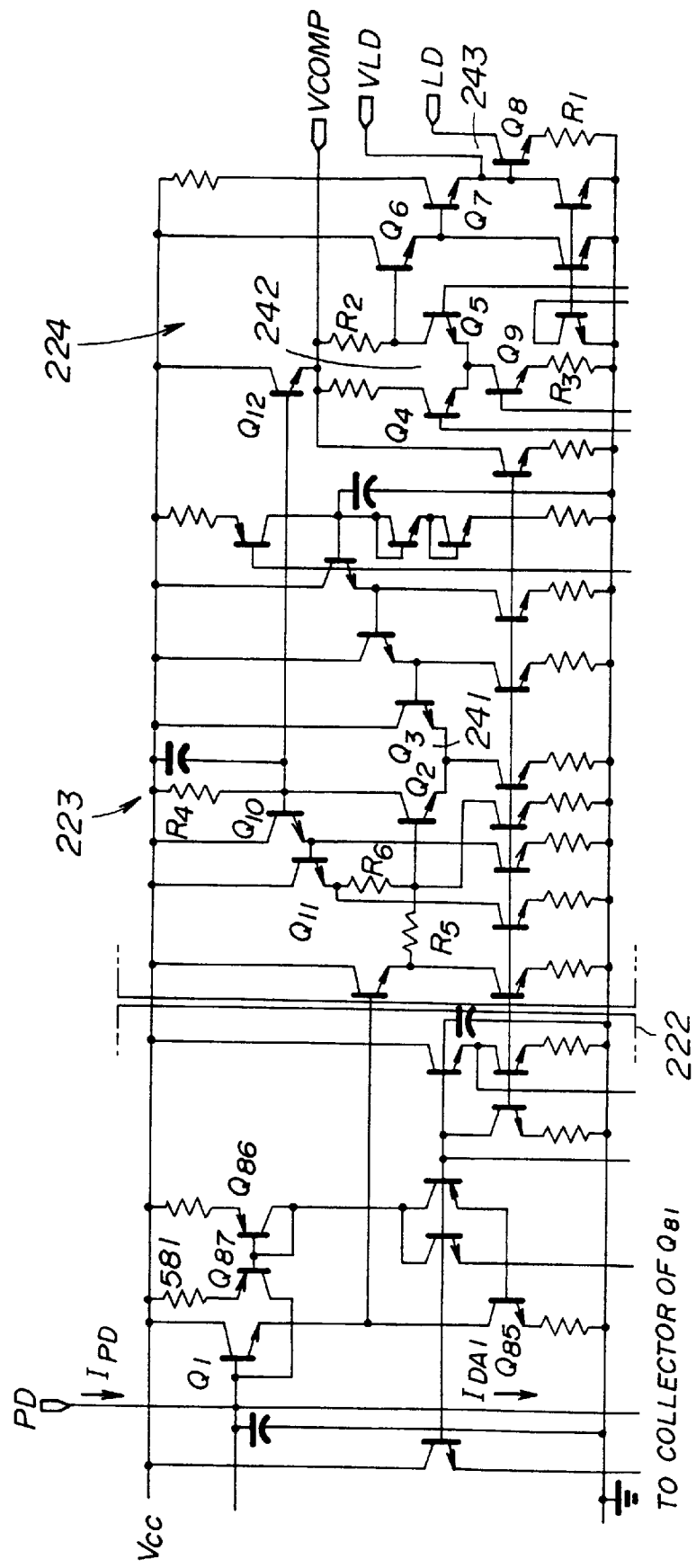
FIG. 15 shows a circuit diagram of an example of an arrangement of an error amplifier and a voltage shifting unit shown in FIG. 14.

FIG. 15 shows an example of a circuit arrangement using bipolar transistors of the error amplifier 223 and high-speed voltage shifting unit 225. The monitor current $I_{PD}$, which flows through the light reception device 2 in proportion to light output of the semiconductor laser 1, flows, via a PD terminal, to the base of a transistor $Q_1$ of the light emission instruction signal generating unit 222 (first light emission instruction signal generating unit 222a). A digital to analog converter, which will be described later, in the light emission instruction signal generating unit 22 converts input data into a current $I_{DA1}$, and the current $I_{DA1}$ flows out from the base of the transistor $Q_1$. A result of comparison between the currents $I_{PD}$ and $I_{DA1}$ is detected at the base of the transistor $Q_1$. A result of the detection is input to a differential amplifier 241 including transistors $Q_2$, $Q_3$. Output of the differential amplifier 241 is input to a base of a transistor $Q_8$ which is the same as the transistor 7 shown in FIG. 14. The transistor $Q_8$ causes a forward current to flow through the semiconductor laser 1, and the current also flows through a resistor $R_1$ which is the same as the resistor Re shown in FIG. 14. Thus, the negative feedback loop 3 is formed. Between the differential amplifier 241 to the terminal LD of the semiconductor laser 1, a differential switch 242 of a differential circuit including transistors $Q_4$, $Q_5$ and a resistor $R_4$ is connected. The high-speed voltage shifting unit 225 is formed, which instantaneously shifts the voltage of a signal transmitted from the differential switch 241 to the transistor $Q_8$. This voltage shifting instantaneously effects a corresponding change of a forward current of the semiconductor laser 1 via an emitter follower 243 including transistors $Q_6$, $Q_7$ and $Q_8$. In the embodiment, the driving transistor 7 and resistor Re which finally drive the semiconductor laser 1 are externally connected to the integrated circuit 220. It is necessary to provide a current of several tens to several hundred milli-amperes to flow to the semiconductor laser 1. However, in the circuit arrangement of the present invention, within the semiconductor laser control and driving unit 12, even at an output portion which is directly connected to a driving portion (the driving transistor 7), the maximum current value is merely several milli-amperes. Thereby, power consumption is reduced and forming the circuit as an integrated circuit (development of LSI circuit) is easy. In the circuit shown in FIG. 15, an amount of the voltage shift of the current driving unit 224 is determined by resistors $R_2$, $R_3$, a transistor $Q_9$ and so forth. However, as mentioned above, the differential quantum efficiency of the semiconductor laser 1 may vary according to a particular product, and the efficiency may be degraded according to time elapsing. In order to solve this problem, a differential quantum efficiency detecting unit 232 detects the differential quantum efficiency of the semiconductor laser 1, and, based on a result of the detection, the amount of the voltage shift is set. Thereby, improved light output resulting from light output Ps being added such as that shown in FIG. 2B can be obtained. The differential amplifier 241 including the transistors $Q_2$, $Q_3$ provides its output as a voltage drop from a power source voltage Vcc through a resistor $R_4$. The power source voltage Vcc may vary. However, because the negative feedback loop 3 controls light output of the semiconductor laser in real time, variation of the power source voltage Vcc can be automatically processed in the control, and does not finally adversely affect the control. Further, as a result of the detection at the PD terminal (the base of the transistor $Q_1$ in the first light emission instruction signal generating unit 22a) being input to the differential amplifier 241, a feedback is performed through transistors $Q_{10}$, $Q_{11}$ and a resistor $R_6$, the voltage gain of the differential amplifier 241 is determined by resistance values of resistors $R_5$, $R_6$, and the gain is reduced to a small level. Thereby, the cutoff frequency of the differential amplifier 241 is increased and control speed is improved. The resistors $R_5$, $R_6$ may be externally connected components. By changing the resistance values of the resistors $R_5$, $R_6$, control speed of the control system (negative feedback loop 3) can be changed.

In FIG. 14, a timing generating unit 231, the differential quantum efficiency detecting unit 232, a memory unit 233 and an adding current setting unit 234 form a block which detects the differential quantum efficiency of the semiconductor laser 1 and sets the amount of the voltage shift. Thereby, the timing generating unit 231 generates a timing signal, timing of which is sufficiently slower than the control speed of the error amplifier 223. In the timing, the differential quantum efficiency of the semiconductor laser 1 is detected by the differential quantum efficiency detecting unit 232. A result of the detection is stored in the memory unit 233. According to the data stored in the memory unit 233, a current value of the adding current setting unit 234 is set. These operations are performed as an initializing operation only in a predetermined initializing time such as a power supply starting time or a resetting time (a time when no light output is provided by the semiconductor laser 1). During a normal operation time, the current value of the adding current setting unit 234 is maintained. A starting-up unit 235, which is connected with the timing generating unit 231 in the integrated circuit 220, starts the initializing operation of the integrated circuit 220.

Figure 16:
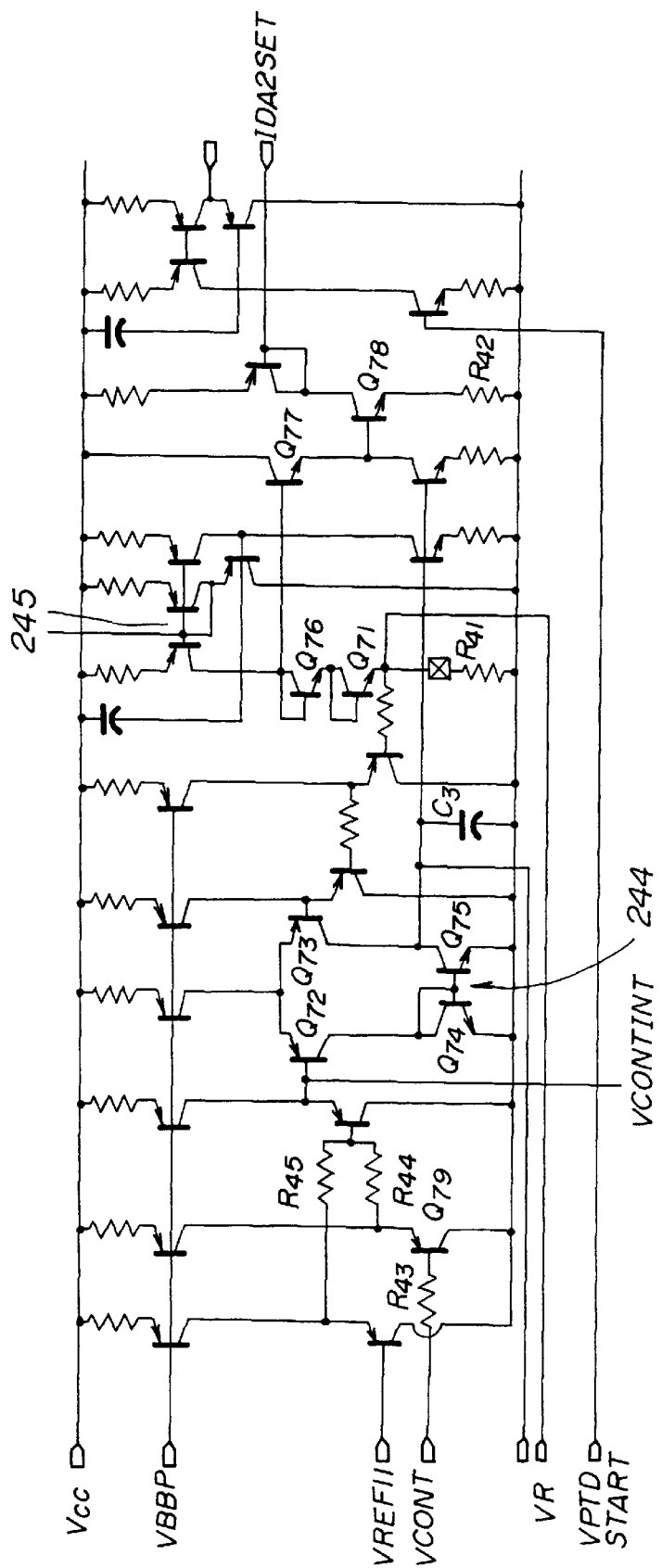
FIG. 16 shows a circuit diagram of an example of an arrangement of a light emission instruction signal setting unit shown in FIG. 14.

Examples of circuit arrangements of the light emission instruction signal setting unit 221 and light emission instruction signal generating unit 222 using bipolar transistors will be described with reference to FIGS. 16 and 17.

The light emission instruction signal setting unit 221 performs setting of a reference current of the light emission instruction signal generating unit 222, setting of a reference current of the adding current setting unit 234, a base current compensation of the current of the light emission instruction signal generating unit 222, and adjusting, with an external signal, the reference current of the light emission instruction signal generating unit 222 and the reference current of the adding current setting unit 234 together. With reference to FIG. 16, these functions will now be described.

The setting of a reference current of the light emission instruction signal generating unit 222 is performed by an emitter voltage of a transistor $Q_{71}$ and a resistor $R_{41}$. The current of the light emission instruction signal generating unit 222 $I_{DA1}$ is equal to the monitor current $I_{PD}$ of the light reception device 2 when considering a steady state. Therefore, the current should be one which is not affected by a temperature change occurring inside the integrated circuit 220 (LSI circuit). In other words, the emitter voltage of the transistor $Q_{71}$ should be a stable voltage and the resistor $R_{41}$ should be a resistor having an absolute accuracy. For this purpose, the emitter voltage of the transistor $Q_{71}$ is provided as a result of a voltage of a VREF11 terminal, which voltage is a stable voltage generated by a power source unit, being transmitted via a voltage follower 244 including transistors $Q_{72}$, $Q_{73}$, $Q_{74}$ and $Q_{75}$. In FIG. 16, the resistor $R_{41}$ is indicated as if the resistor is an internal resistor of the integrated circuit. However, actually, the resistor $R_{41}$ is an external resistor or an external variable resistor which has absolute accuracy and superior temperature characteristics, and is connected to the integrated circuit via an external terminal VR. By changing the resistance value of the resistor $R_{41}$, adjustment is possible so that influence of variation in the characteristics of the semiconductor laser 1 and light reception device 2 is removed and a desired light output can be obtained.

The setting of a reference current of the adding current setting unit 234 is performed by an emitter voltage of a transistor $Q_{78}$ and a resistor $R_{42}$, and the set reference current is output to the adding current setting unit 234 via an IDA2SET terminal. The emitter voltage of the transistor $Q_{78}$ is approximately equal to the emitter voltage of the transistor $Q_{71}$ as a result of the emitter voltage of the transistor $Q_{71}$ being transmitted to the emitter of the transistor $Q_{78}$ via the transistor $Q_{71}$, transistors $Q_{76}$, $Q_{77}$ and the transistor $Q_{78}$.

The base current compensation of the current of the light emission instruction signal generating unit 222 is performed by a base current of the transistor $Q_{77}$. As described above, the current $I_{DA1}$ of the light emission instruction signal generating unit 222 corresponds to the current $I_{PD}$ which is an absolute current determined by the external light reception device 2. A reference current thereof is determined by the emitter voltage of the transistor $Q_{71}$ and the resistor $R_{41}$ and is an absolute current. However, after the reference current passes through a current mirror circuit 245, the current passes through some transistors and the current $I_{DA1}$ flows out from the terminal PD. When passing through some transistors, base current errors occur. Such base current errors occur in each bit of a 5-bit digital to analog converter (b0, b1, b2, b3, b4). The base current of the transistor $Q_{77}$, which is appropriately adjusted, compensates the base current errors. Thereby, it is possible to easily perform base current compensation even when characteristics of the transistors vary. The electronic circuit shown in FIG. 17 corresponds to the block arrangement shown in FIG. 11. With reference to FIG. 11, the current $I_{DA}$ passes through the transistors of DAC 113, the transistor of the switch 114B and the transistor of the IVC 115B. The above-described base current compensation compensates base current errors occurring while the current $I_{DA}$ is passing through these transistors.

The adjusting, with an external signal, of the reference current of the light emission instruction signal generating unit 222 and the reference current of the adding current setting unit 234 together will now be described. As described above, the setting of the reference current of the light emission instruction signals generating unit 222 and the setting of the reference current of the adding current setting unit 234 are determined by the emitter voltage of the transistor $Q_{71}$ and the resistor $R_{41}$. Further, the emitter voltage of the transistor $R_{71}$ is provided from the VREF11 terminal voltage through the voltage follower 244 including the transistors $Q_{72}$, $Q_{73}$, $Q_{74}$, $Q_{75}$. In parallel with the input from the VREF11 terminal, a control voltage (external voltage) is input from a VCONT terminal through resistors $R_{43}$, $R_{44}$ and a transistor $Q_{79}$. By changing the control voltage of the VCONT terminal, the emitter voltage of the transistor $Q_{71}$ is changed. Thus, the reference current of the light emission instruction signal generating unit 222 and the reference current of the adding current setting unit 234 are increased/decreased together. Thereby, light output change by the negative feedback loop and light output change by the addition current value control system can be performed together. Therefore, light output change performed for shading correction can be properly performed while maintaining a waveform, similar to a rectangular wave, such as that shown in FIG. 2B.

With reference to FIG. 17, the light emission instruction signal generating unit 222 will now described. The light emission instruction signal generating unit 222 includes the 5-bit digital to analog converter (b0, b1, b2, b3, b4) and an electric current addition driving unit. 5 bits of digital data which is converted into analog data through the digital to analog converter of the light emission instruction signal generating unit 222 is PMDATA (intensity modulation signal) which is provided by the PWM & PM signal generating unit 11 shown in FIG. 14. However, when it is necessary to set light output with higher accuracy, it is possible to increase the number of bits of the digital to analog converter. When pulse width modulation is mainly used, it is possible to reduce the number of bits of the digital to analog converter. In the embodiment, the digital to analog converter includes a combination of current mirror circuits and a resistor ladder. However, another arrangement of the digital to analog converter having equivalent functions may be possible.

The current addition driving unit of the light emission instruction signal generating unit 22 detects the current $I_{DA1}$ and the inverted current as emitter voltages of transistors $Q_{81}$, $Q_{82}$, and inputs them to bases of the transistors $Q_4$, $Q_5$, through emitter followers of transistors $Q_{83}$, $Q_{84}$, respectively. The emitter voltages of the transistors $Q_{81}$, $Q_{82}$ are voltages reflect the current values of $I_{DA1}$ Thereby, in the differential switch 242 including the transistor $Q_4$, $Q_5$ shown in FIG. 15, when the digital to analog converter is of the 5-bit digital to analog converter, not merely ON/OFF two level output but 5-bit multi level current driving output can be provided at high speed.

FIG. 18 shows an arrangement of the pulse width modulation and intensity modulation signal generating unit 11. In the embodiment, 3-bit (that is, 8 levels) pulse width modulation and 5-bit (that is, 32 levels) intensity modulation are combined, and an 8-bit tone (256 levels) is output for each dot. The pulse width modulation and intensity modulation signal generating unit 11 includes, for example, a data converter 116, a pulse width modulation unit 117 and a pulse generating oscillator 118, which may be similar to the data converter 116, pulse width modulation unit 117 and pulse generating oscillator 118 of the first embodiment shown in FIG. 10. Duplicated descriptions of arrangements and functions thereof will be omitted.

Figure 19A:
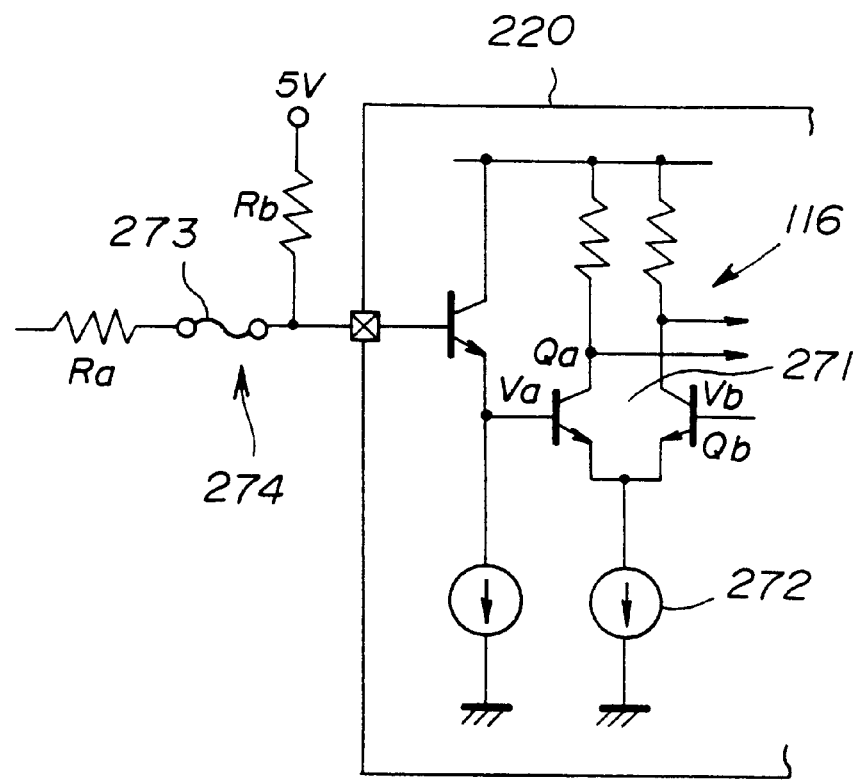
FIG. 19A shows a general arrangement of and around an input portion in the second embodiment of the present invention.

A portion in the integrated circuit 220 to which the image data $D_0$, $D_1$, $D_2$, . . . , $D_7$ is input will be described with reference to FIGS. 19A and FIG. 19B. The data converter 116 in the integrated circuit 220 of bipolar transistors includes an ECL (Emitter Coupled Logic) circuit 271 provided as shown in FIG. 19A at an input portion thereof. The ECL circuit 271 includes a pair of transistors Qa, Qb, emitters of which are connected as an differential arrangement, and a constant-current source 272 connected to the emitters. The ECL circuit 271 establishes a logic operation, that is, positively provides logic data when a difference between base voltages Va, Vb of the transistors Qa, Qb is approximately 200 mV. Therefore, when a voltage Vb is fixed, for example, a voltage Va should be larger than the voltage Vb by 200 mV, that is, Va≧Vb+200 (mV) or smaller than the voltage Vb by 200 mV, that is, Va≦Vb−200 (mV). Even when considering fluctuation of the voltages, the sufficient required voltage difference is 250 mV. Consequently, a sufficient required amount of swinging voltage Va with respect to the fixed voltage Vb is 500 mV. Normally, image data has a voltage swing of 0 to 5 volts. However, because the above-described ECL circuit 271, which merely required the 500 mV amount of voltage swing, is inserted at the input portion of the integrated circuit 220, the swing amount of the image data may be reduced to 0 to 500 mV. For this purpose, specifically, as show in FIG. 19A, a resistor Ra is provided in a transmission line such as harness 73 into which image data having an amount of voltage swing 0 to 5 volts is input, and a resistor Rb is provided between a power source terminal of 5 volts and the transmission line, where a resistance value ratio of Ra:Rb≈9:1, for example, Ra=1.5 (kΩ), Rb=165 (Ω). Such an electric circuit forms an impedance matching circuit 274.

Figure 7:
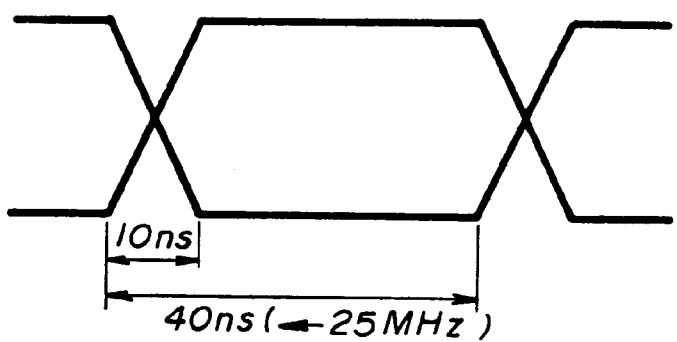
FIG. 7 illustrates data waveform rising characteristics.
Figure 8:
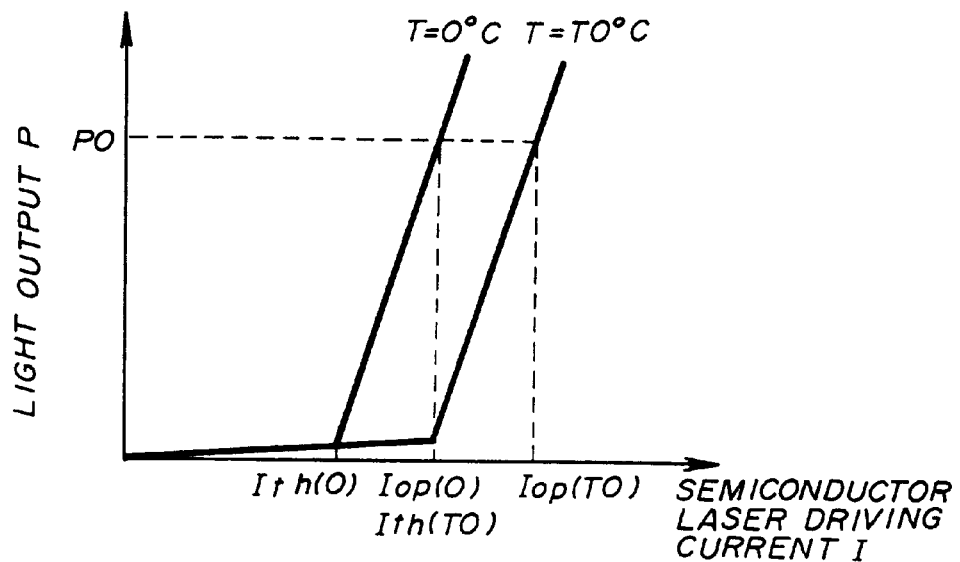
FIG. 8 is a characteristics graph showing operation current change characteristics due to temperature.

Through such an arrangement, when image data having a voltage swing of 0 to 5 volts is input to the resistor Ra, the voltage at a point (input point), at which the transmission line and the resistor Rb are connected, swings between 4.5 to 5 volts. Thus, the swing amount at the connected point is 0 to 500 mV, and image data is input to the ECL circuit 271 of the integrated circuit 220 after the amount of voltage swing is reduced to 1/10 of the original. When considering τ=CR=C·(V/I) for a time constant τ which was described above with reference to FIG. 7, it is possible to apparently reduce the time constant τ as a result of reducing an amount of input voltage swing and maintaining a current to be the same. That is, it is possible to achieve high-speed data transfer. High-speed data transfer is possible up to approximately 70 to 80 MHz. It is possible to reduce a driving amount by inputting image data after reducing the amount of voltage swing, and it is possible to reduce to 1/100 an original amount in energy. Thereby, energy saving can be achieved, and also, such an arrangement is advantageous in taking EMI measures. The input portion is formed as the impedance matching circuit 274, and reflection of input data is not likely to occur.

Figure 19B:
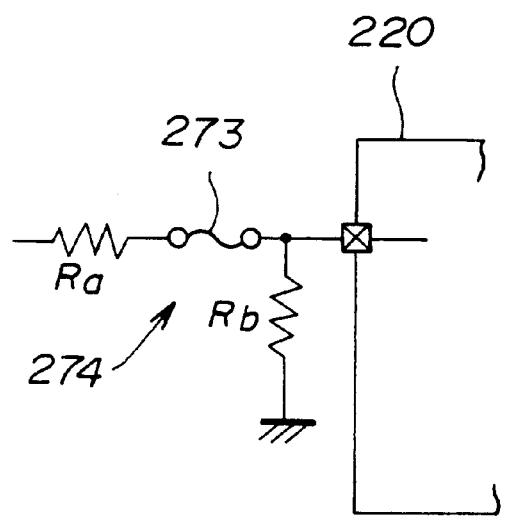
FIG. 19B shows a general arrangement of a variant embodiment of a portion of the arrangement shown in FIG. 19A.

When the input portion is formed as the impedance matching circuit 274, it is also possible that the resistor Rb is connected to the ground side as shown in FIG. 19B.

Figures 20A, 20B, 20C:
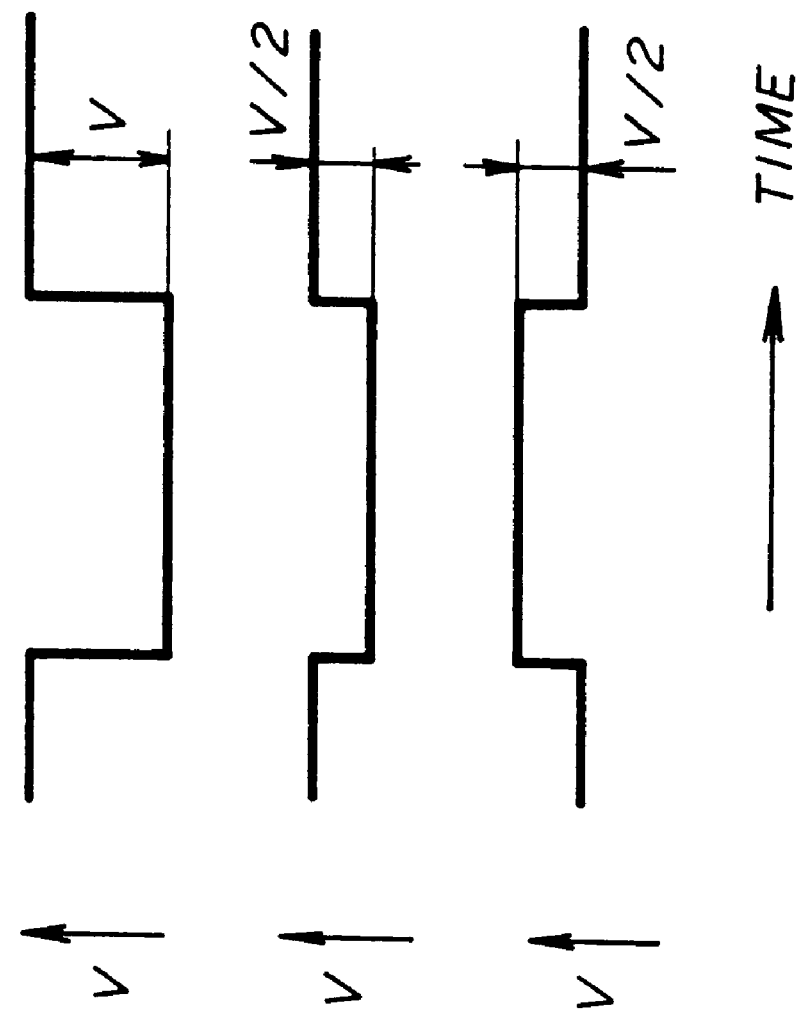
FIGS. 20A, 20B, 20C show time charts of a variant embodiment of an input method.

Further, assuming original image data to be a pulse of a voltage V as shown in FIG. 20A, it is possible to divide it into a combination of a positive logic data of a voltage V/2 such as that shown in FIG. 20B and negative (inverted) logic data of voltage V/2 such as that shown in FIG. 20C. These two logic types of image data are input in parallel to the integrated circuit 220 via two transmission lines. Specifically, the positive logic data such as that shown in FIG. 10B is input to the base of the transistor Qa, and the negative logic data such as that shown in FIG. 10C is input to the base of the transistor Qb. Thus, differential output of the two types of input data is provided by the ECL circuit 271. In this case, a transmission line circuit and an input transistor with a constant-current source the same as those connected to the base of the transistor Qa are connected to the base of the transistor Qb. In such a case, because the positive logic data and negative logic data are combined as mentioned above, a necessary swing amount at the input point for each type logic data is merely 250 mV.

In such an input arrangement, because energy is in proportion to (voltage)$^2$, the necessary energy is ¼ the necessary energy in the case of FIG. 19A using the single input image data shown in FIG. 20A. Further, if image data includes noise, because the noise affects to both the positive logic data and negative logic data the same and the different output thereof is provided, noise components may be canceled by one another. Thus, the input arrangement is a noise-resistant data transfer input arrangement.

As a result, also in the second embodiment, the entirety of the pulse width generating unit and data modulation unit (pulse width modulation and intensity modulation signal generating unit) 11 and the semiconductor laser control unit and semiconductor unit driving unit (semiconductor laser control and driving unit) 12 can be formed as one chip of an integrated circuit 20 by bipolar transistors. In driving and controlling the semiconductor laser in pulse width and intensity combined modulation method within one dot using the combination of the negative feedback loop and the addition current value control system (such as that, advantage of which was described with reference to FIGS. 2A and 2B), it is possible to achieve miniaturization of the system and energy saving. Because all the necessary processing is performed within the one chip of the integrated circuit 20, the processing can be performed at high speed with high accuracy.

A third embodiment of the present invention will now be described with reference to the drawings. In the third embodiment, the above-described pulse width and intensity combined modulation method and combination of the negative feedback loop and the addition current value control system, which combination effectively reduces a load carried by the negative feedback loop, are used. The same reference numerals as those shown in FIGS. 1 and 3 are given to identical components/parts in the third embodiment.

A semiconductor laser control system 313 in the third embodiment, in outline, includes, as shown in FIG. 3, the pulse width generating unit and data modulation unit 11 (pulse width modulation and intensity modulation signal generating unit) and semiconductor laser control unit and semiconductor laser driving unit 12 (semiconductor control and driving unit). The semiconductor laser control unit and semiconductor driving unit 12, as shown in FIG. 1, mainly includes the negative feedback loop 3 and current driving unit 4. With reference to FIG. 1, data which already has undergone PWM modulation through the pulse width generating unit and data modulation unit 11 are input to the constant-current sources 5 and 8. The current $I_{DA1}$ of the constant-current source 5 forms the negative feedback loop 3 together with the inverting amplifier 6, semiconductor laser 1 and light reception device 2. The current $I_{DA2}$ of the constant-current source 8 becomes a forward current of the semiconductor laser 1, and is converted into light output of the semiconductor laser 1 at high speed. Thereby, high-speed driving and control of the semiconductor laser 1 can be performed. In this case, by setting a value of the current $I_{DA2}$ of the constant-current source 8 which functions as the current driving unit 4, that is, a value of the light output Ps, to be a predetermined value, it is possible to perform high-speed PWM and PM modulation of light output of the semiconductor laser 1 as described above.

Figure 21:
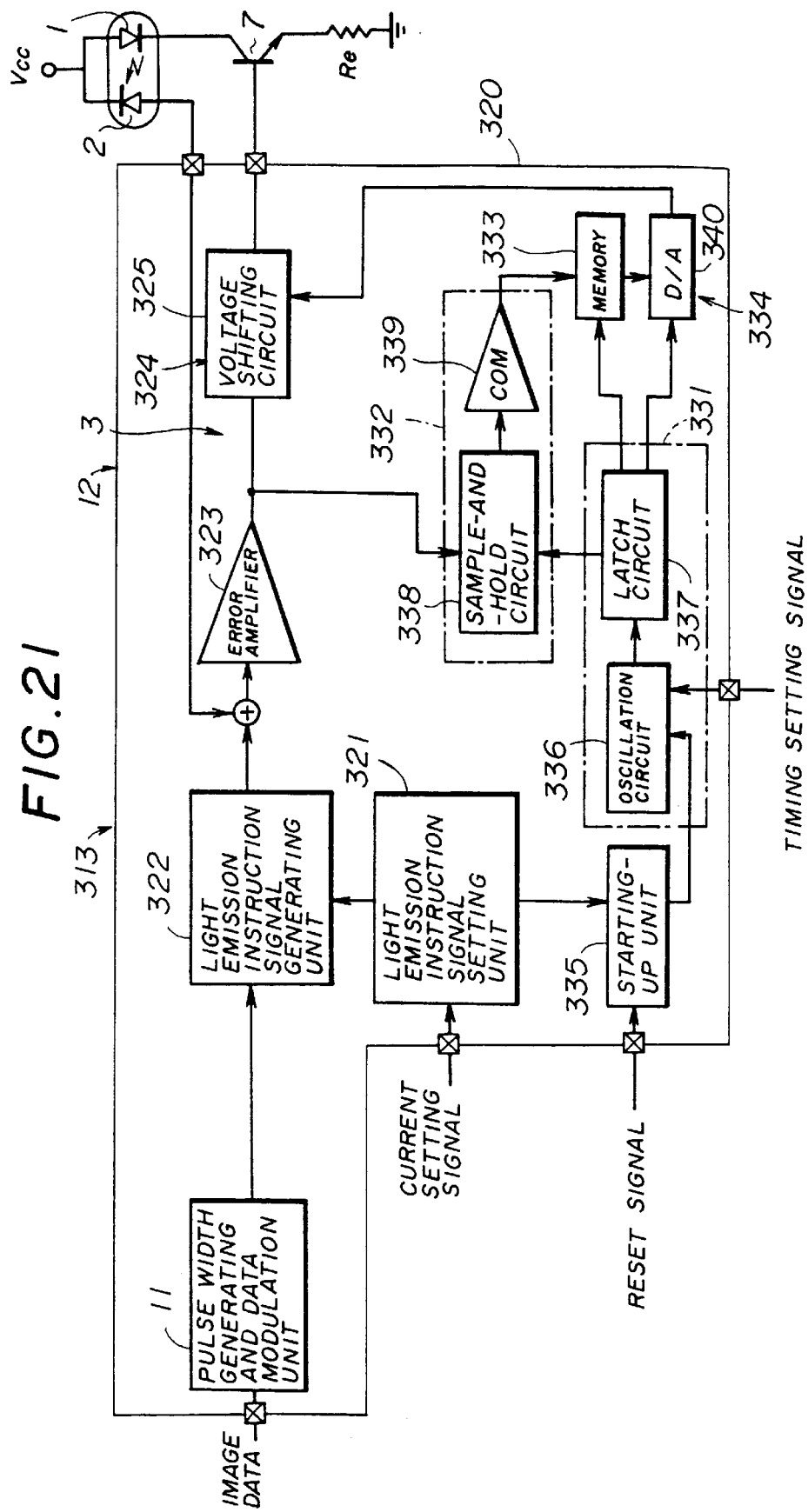
FIG. 21 shows a general block diagram of a third embodiment of the present invention.

FIG. 21 shows an example of a detailed arrangement of the semiconductor laser control system 313 in the third embodiment. Also in the third embodiment, almost all components/parts of the pulse width modulation and intensity modulation signal generating unit 11 and the semiconductor control and driving unit 12 are formed as one chip of an integrated circuit 320. In more detail, as examples of partial circuit arrangements will be shown, almost all of the components/parts are formed as one chip by bipolar transistors. The pulse width generating unit and data converting unit 11 of the third embodiment is similar to the pulse width generating unit and data converting unit 11 of the second embodiment shown in FIG. 18. Duplicated descriptions thereof will be omitted. The pulse width generating unit and data converting unit 11 in the third embodiment is also formed by bipolar transistors.

A light emission instruction signal setting unit 321, a light emission signal generating unit 322, an error amplifier 323, a current driving unit 324 (voltage shifting unit 325) of the semiconductor laser control unit and semiconductor driving unit 12 of the third embodiment are similar to the light emission instruction signal setting unit 221, a light emission signal generating unit 222, an error amplifier 223, a current driving unit 224 (voltage shifting unit 225) of the semiconductor laser control unit and semiconductor driving unit 12 in the second embodiment. Duplicated descriptions thereof will be omitted.

The error amplifier 323, voltage shifting unit 335 and light emission instruction signal generating unit 322 may include a bipolar transistor electronic circuit such as that, for example, shown in FIG. 15 of the error amplifier 223, voltage shifting unit 235 and light emission instruction signal generating unit 222 of the second embodiment. Duplicated description thereof will be omitted.

Further, a timing generating unit 331, a differential quantum efficiency detecting unit 332, a memory unit 333 and a adding current setting unit 334 of the third embodiment are similar to the timing generating unit 231, differential quantum efficiency detecting unit 232, memory unit 233 and adding current setting unit 234 of the second embodiment. Duplicated descriptions thereof will be omitted.

A starting-up unit 335 is connected with the timing generating unit 331. The starting-up unit 335 provides protection of the semiconductor laser 1 from being degraded or damaged due to an excess current flowing therethrough during the period to the time a power source voltage reaches a predetermined value. Further, the starting-up unit 335 generates an initialization starting signal which is necessary in the timing generating unit 331. The starting-up unit 335 sets a set voltage which is approximately the predetermined voltage of the power source voltage. For example, when the predetermined voltage of the power source voltage is 5.0 volts, the set voltage is set to be 4.5 volts. It is determined that all of the electronic circuit performs normal operations when the power source voltage reaches 4.5 volts. Then, the semiconductor laser 1 can be protected and the initialization starting signal can be positively generated. Specifically, the terminal voltage of the light reception device 2 is forcibly made to be at the H level, and thereby, the output of the error amplifier 323 is forced to the L level. Thus, a forward current is prevented from flowing through the semiconductor laser 1, and the semiconductor laser 1 is protected. Similarly, as described later, the voltage of a TDSTART terminal is forcibly set to the H level, and thereby an oscillator circuit (described later) in the timing generating unit 331 is prevented from performing oscillation. Then, when the power source voltage Vcc reaches the set voltage or above the set voltage, the protection of the semiconductor laser 1 is canceled, and the control circuit of the semiconductor laser 1 is in a normal operation state. Also, the oscillation prevention of the oscillation circuit in the timing generating circuit 331 is released, and an oscillation starting signal is generated. Similarly, a VPTDSTART terminal voltage which produces a current source of the timing generating circuit 331 is output.

It is possible that the timing generating circuit 331 is formed using a delay circuit. However, in the embodiment, the timing generating circuit 331 includes the oscillation circuit 336, a bias circuit (not shown in the figure) and a latch circuit 337. In outline, an oscillation signal generated by the oscillation circuit 336 is latched by the latch circuit 337, the latched data is forwarded to a subsequent stage, one by one. Thereby, for example, 6 timing signals T0, T1, . . . , T5 are generated. The oscillation circuit 336 is forcibly prevented from performing oscillation when the last timing signal is generated.

The differential quantum efficiency detecting unit 332 includes, for example, a sample-and-hold circuit 338 which detects a peak value of error output of the error amplifier 323, and a comparing circuit 339 which compares an output value of the sample-and-hold circuit with a predetermined value.

The memory unit 333 holds comparison results of the comparing circuit 339 in synchronization with the timing signals T1, T2, . . . , T5 of the timing generating circuit 331. The adding current setting unit 334 includes, for example, a 5-bit digital to analog converter 340.

Figure 22:
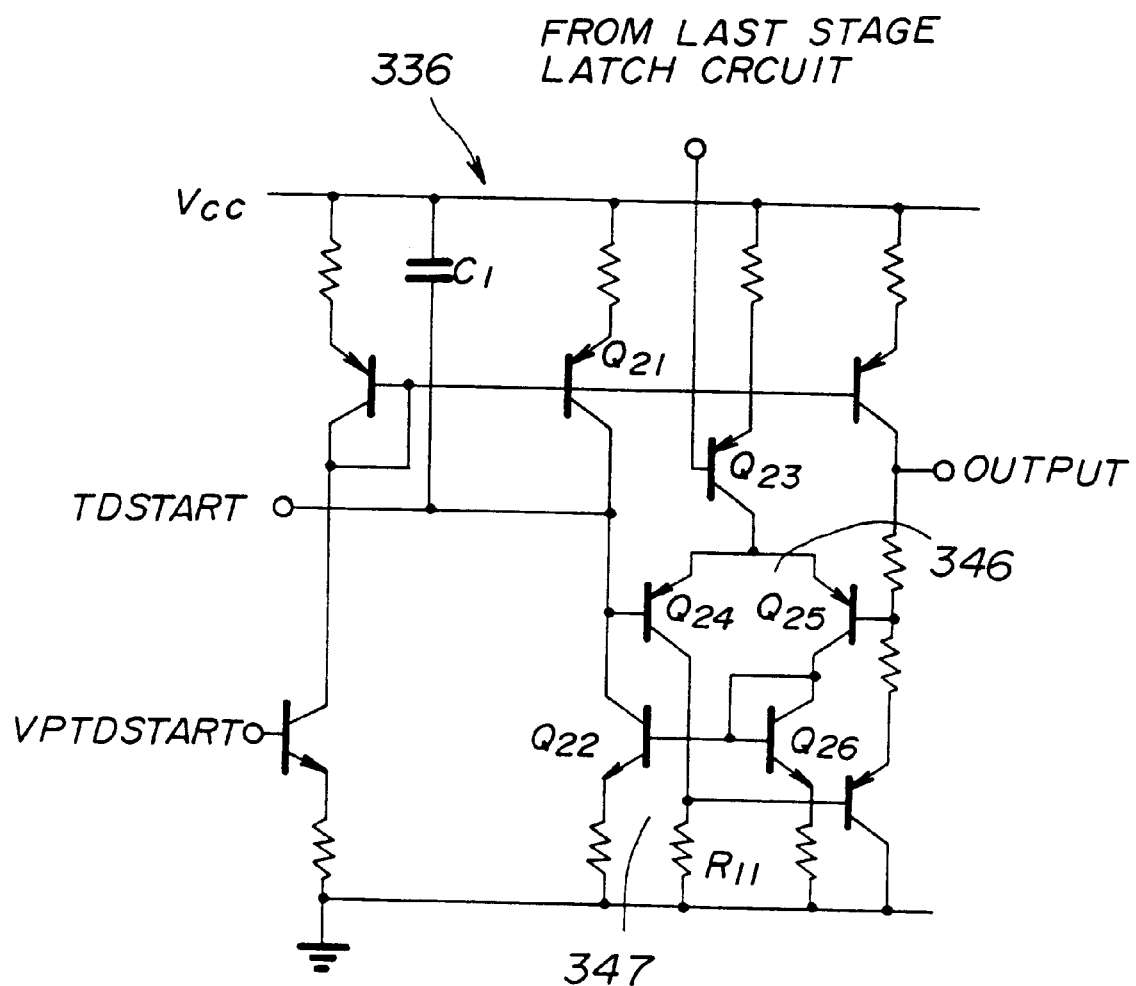
FIG. 22 shows a circuit diagram of an example of an arrangement of an oscillation circuit shown in FIG. 21.
Figure 24:
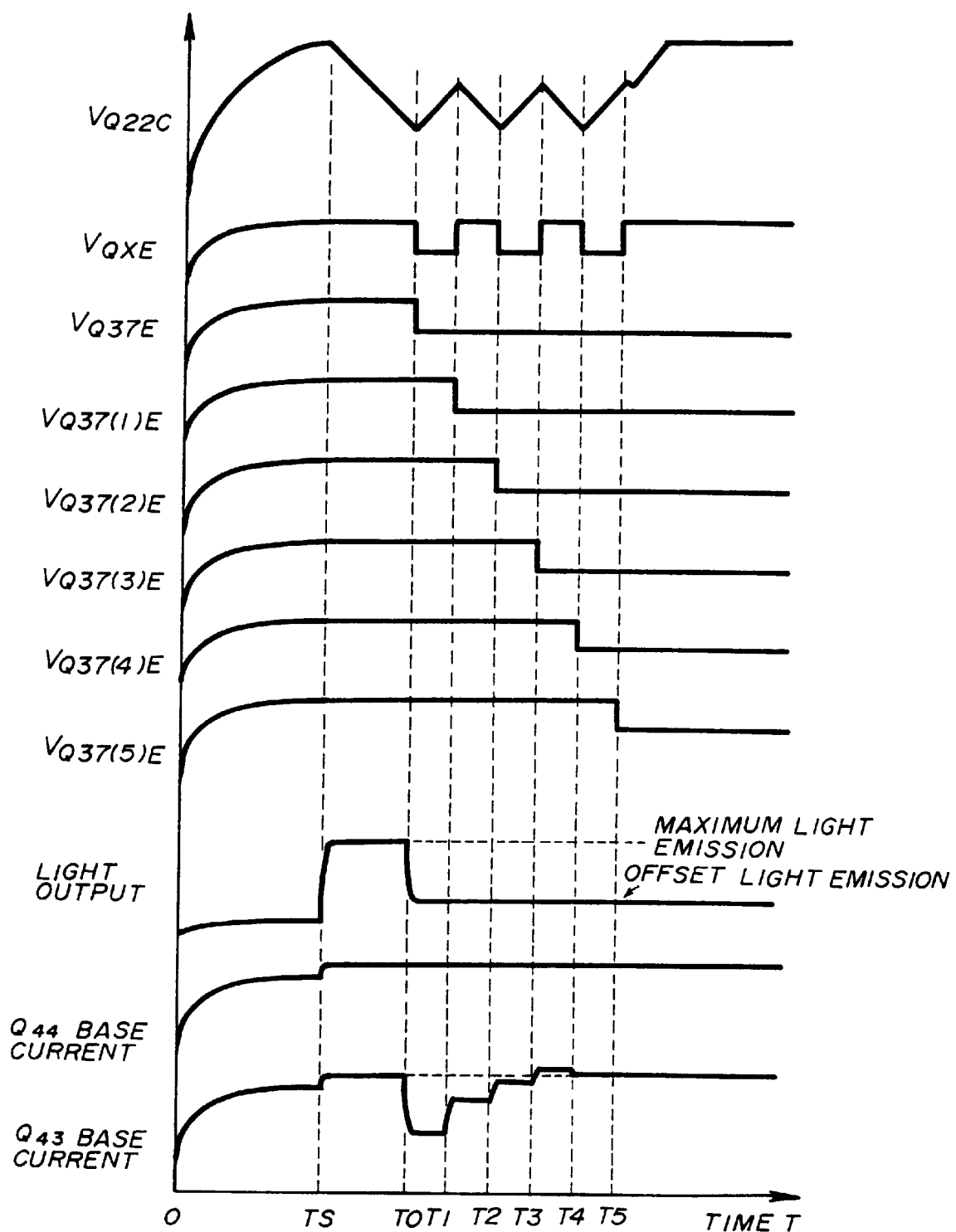
FIG. 24 shows time charts showing waveforms at respective portions.

Arrangements and functions of these units will now be described. FIG. 22 shows an example of circuit arrangement of the oscillation circuit 336 by bipolar transistors. FIG. 24 shows outline operation in an initialization time. A collector voltage $V_{Q22C}$ of a transistor $Q_{22}$ (a voltage of the terminal TDSTART) is shown as an oscillation operation in FIG. 5. A collector current of the transistor $Q_{22}$ is made to turn on and turn off by a differential switch including transistors $Q_{24}$, $Q_{25}$. In a case where the collector current of the transistor $Q_{22}$ is larger than a collector current of a transistor $Q_{21}$ when the collector current of the transistor $Q_{22}$ is turning on, the collector voltage $V_{Q22C}$ of the transistor $Q_{22}$ decreases as a result of a capacitor $C_1$ being discharged by the differential current of the collector currents of the transistors $Q_{21}$ and $Q_{22}$. When the collector current of the transistor $Q_{22}$ turns off, the capacitor $C_1$ is charged by the collector current of the transistor $Q_{21}$ and the collector voltage $V_{Q22C}$ increases. The changing and discharging of the capacitor $C_1$ is repeated alternately and oscillation is performed.

Figure 23A:
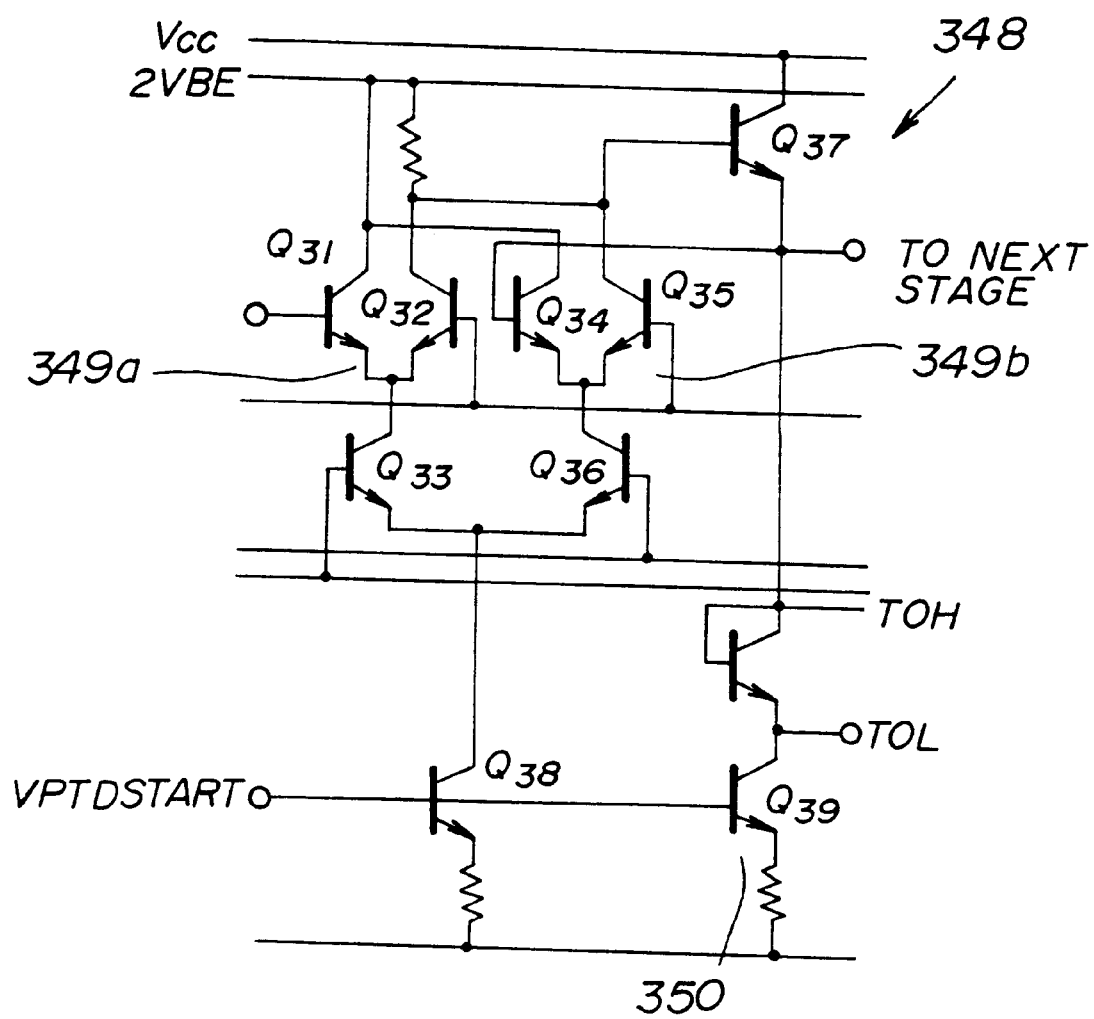
FIG. 23A shows a circuit diagram of an example of an arrangement of a first stage latch circuit of a latch circuit shown in FIG. 21.
Figure 23B:
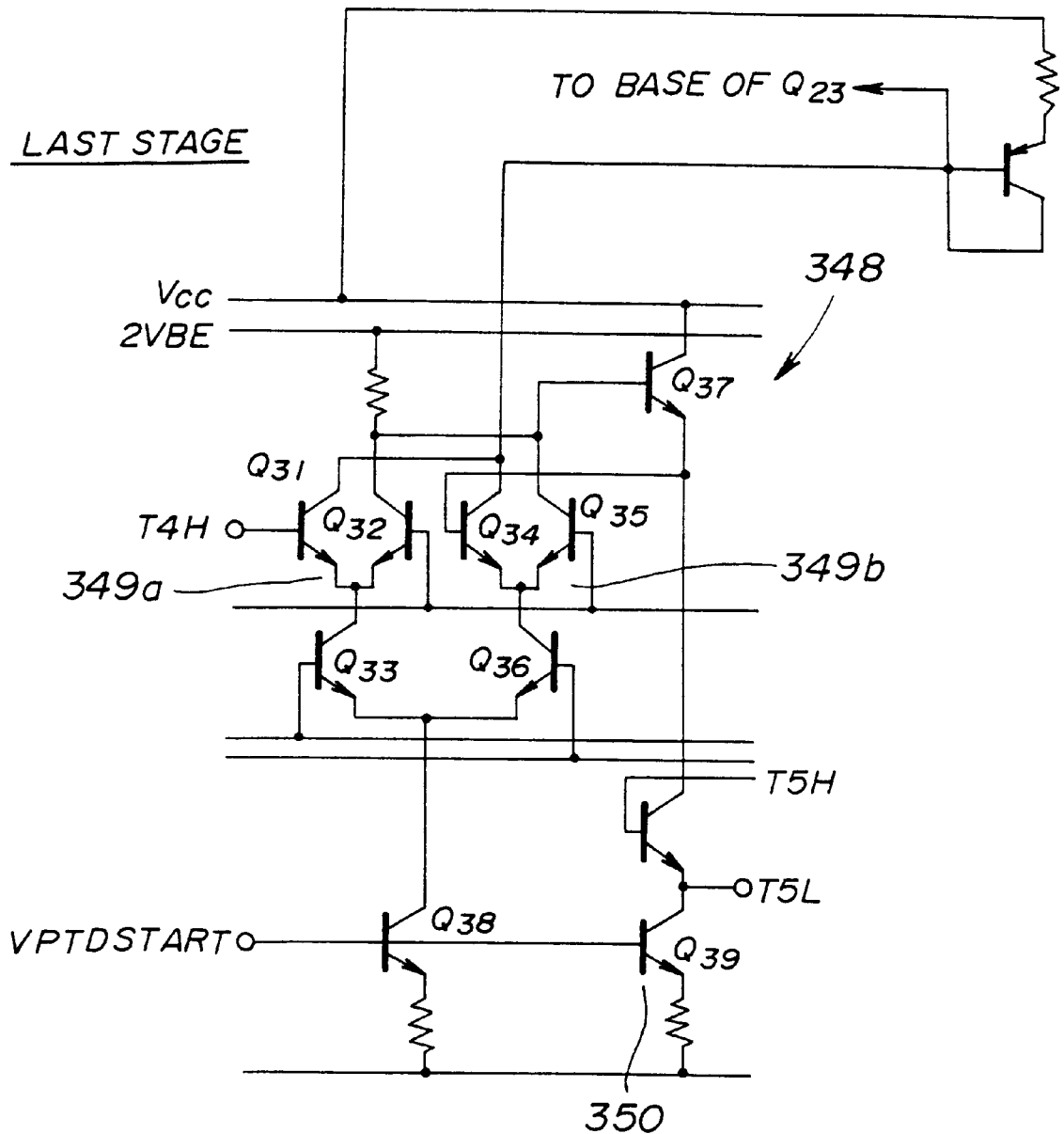
FIG. 23B shows a circuit diagram of an example of an arrangement of a last stage latch circuit of the latch circuit shown in FIG. 21.

A time from a timing 0, that is, from power source supply starting to an oscillation starting timing signal TS is sent from the starting-up unit 335, the voltage of the TDSTART terminal is forcibly set at the H level (approximately the same as Vcc), and the voltage of the VPTDSTART terminal is 0 volts. Thereby, a collector current of a transistor $Q_{23}$ is 0. With reference to FIG. 23B showing a last stage of a latch circuit 348, when the voltage of the VPTDSTART is 0, a collector current of a transistor $Q_{31}$ is 0. As result, a base of the transistor $Q_{23}$ is Vcc, and the collector current of the transistor $Q_{23}$ is 0. In the differential switch 346, because a collector current of a transistor $Q_{23}$ is 0 although the base of the transistor $Q_{25}$ is at the L level, the collector current of the transistor $Q_{22}$ is 0. Then, after the oscillation starting signal TS is sent and the voltage of the VPTDSTART terminal is at the H level, the collector current of the transistor $Q_{22}$ starts flowing. In the differential switch 346, because the base of the transistor $Q_{25}$ is at the L level, the collector current of the transistor $Q_{23}$ flows through the transistor $Q_{26}$. Through a current-mirror circuit 347 including transistors $Q_{26}$ $Q_{22}$ the same current flows through the transistor $Q_{22}$. At the timing TS, when the collector current of the transistor $Q_{22}$ is larger than the collector current of the transistor $Q_{21}$, the collector voltage $V_{Q22C}$ of the transistor $Q_{22}$, that is, the voltage of the terminal TDSTART terminal gradually decreases. Then, when the base voltage of the transistor $Q_{24}$ becomes equal to or lower than the base voltage of the transistor $Q_{25}$, the differential switch 346 operates instantaneously thus the transistor $Q_{24}$ turns on, the collector current of the transistor $Q_{26}$, and thus, the collector current of the transistor $Q_{22}$ turn off. The base voltage of the transistor $Q_{25}$ rises by a electrical potential which is determined by the collector current of the transistor $Q_{24}$ and a resistor $R_{11}$. This moment is the timing T0.

After the timing T0, because the collector current of the transistor $Q_{22}$ turns off, the collector voltage $V_{Q22C}$, that is, the voltage of the TDSTART terminal gradually increases. When the base voltage of the transistor $Q_{24}$ becomes equal to or higher than the base voltage of the transistor $Q_{25}$, the differential switch 346 operates inversely, and the collector current of the transistor $Q_{22}$ turns on. Thus, oscillation is performed. An amplitude of the oscillation is determined by the voltage determined by the collector current of the transistor $Q_{24}$ and the resistor $R_{11}$. The period of the oscillation is determined by the collector current of the transistor $Q_{21}$, the collector current of the transistor $Q_{22}$ and the capacity of the capacitor $C_1$. By determining these values, it is possible to obtain desired timing signals.

In this operation, when the collector current of the transistor $Q_{22}$ is exactly twice the collector current of the transistor $Q_{21}$, (the collector current of the transistor $Q_{21}$)= (the collector current of the transistor $Q_{22}$)–(the collector current of the transistor $Q_{21}$). Thereby, the change amounts per unit time in cases where the capacitor $C_1$ is charged and discharged are equal to one another. Therefore, as shown in FIG. 24, $V_{Q22C}$ varies to form a triangle wave such that the rising time is equal to the decaying time.

A rectangular wave is obtained at the base of the transistor $Q_{25}$ as oscillation output of the oscillation circuit 336. Then, after the rectangular wave undergoes voltage shifting, swing amount adjustment, and inverting, an output waveform, an emitter voltage $V_{QXE}$ of a transistor $Q_X$ (not shown in the figure) is obtained. The waveform the $V_{QXE}$ is obtained as a result of converting the triangle wave of $V_{Q22C}$ into a two-level signal through a known manner.

FIG. 23 shows an example of a circuit arrangement of a latch circuit 348 as one constituent unit of the latch circuit 337. The latch circuit 337 includes 6 stages of latch circuits 348 which are connected for generating the timing signals T0, T1, T2, . . . , T5. The latch circuit 348 as one constituent unit thereof generates the timing signal T0. The example of circuit arrangement is formed by a plurality of transistors and resistors. Transistors $Q_{31}$, $Q_{32}$, $Q_{33}$ form one switch 349a, and transistors $Q_{34}$, $Q_{35}$, $Q_{36}$ form another switch 349b. In the switch 349a, when the collector current of the transistor $Q_{33}$ turns on, the base voltage of the transistor $Q_{31}$, that is, input data is output as the base voltage and the emitter voltage of a transistor $Q_{37}$. In the switch 349b, when the collector current of the transistor $Q_{36}$ turns on, because the base voltage of the transistor $Q_{34}$ is connected to the emitter of the transistor $Q_{37}$, the output is maintained as it has been.

Assuming an input signal to the base of the transistor $Q_{33}$ is referred to as CLK, an input signal to the base of the transistor $Q_{36}$ is referred to as $\overline{CLK}$, an input data to the base of the transistor $Q_{31}$ is referred to as DATA0, and output at the emitter of the transistor $Q_{37}$ is referred to as Q, the following logic equation is obtained:

$$Q = CLK \cdot DATA0 + \overline{CLK} \cdot Q.$$

As described above, the emitter voltage $V_{QXE}$ of the transistor $Q_X$ is maintained as being at the H level between the timing TS and the timing T0, as shown in FIG. 24, and is the base voltage $\overline{CLK}$ of the transistor $Q_{36}$. Further, the current of a current source 350 including transistors $Q_{38}$, $Q_{39}$ is 0 until the timing TS, and it flows instantaneously from the timing TS. The output Q is at the H level until the timing T0 because the signal $\overline{CLK}$ is at the H level and the output Q is maintained as it has been. At the timing T0, the output Q is at the L level for the first time. This is because the signal $\overline{CLK}$ ($V_{QXE}$) is at the L level and the L level is input to the base of $Q_{31}$ as DATA0. After the timing T0, because the input data of the base of the transistor $Q_{31}$ is maintained to be at the L level, the output Q is maintained as being at the L level. This function of the emitter voltage $V_{Q37E}$ is shown as $V_{Q37E}$ (timing signal T0) in FIG. 24.

In the subsequent stage (not shown in the figure), the signals CLK and $\overline{CLK}$ are connected inversely, and the emitter voltage $V_{Q37E}$ is used as the input data DATA1. Then, the following logic equation is obtained for the output Q':

$$Q' = \overline{CLK} \cdot DATA1 + CLK \cdot Q'.$$

Thereby, the timing signal T1 shown as $V_{Q37(1)E}$ in FIG. 24 can be obtained. In fact, the switch 349a of the subsequent stage latches and outputs the input data DATA1 (L level) at the timing of the rising edge of $\overline{CLK}$, and the L level output is maintained because the L level of the input data of DATA1 is maintained.

Similarly, the timing signal T2, T3, T4 and T5 can be obtained and are shown as $V_{Q37(2)E}$, $V_{Q37(3)E}$, $V_{Q37(4)E}$ and $V_{Q37(5)E}$ in FIG. 24, respectively. 'n' in $V_{Q37(n)E}$ in FIG. 24 represents the stage number 1, 2, 3, 4, 5.

In the last stage of latch circuit 348 shown in FIG. 23B which generates the timing signal T5, the collector current of the transistor 31 is connected, via a transistor as shown in FIG. 23B, to the base of the transistor $Q_{23}$ in the oscillation circuit 336, and is used as a voltage for driving the oscillation circuit 336. The base voltage of the transistor $Q_{23}$ is provided from the timing TS to the timing T5. However, the base voltage of the transistor $Q_{23}$ is not provided, and the collector current of the transistor $Q_{23}$ is turned off at the moment of the timing T5.

Thus, oscillation circuit 336 performs oscillation only during a time when the necessary timing signals are generated. When generation of the necessary timing signals is finished, the oscillation is stopped simultaneously. Thereby, the oscillation operation of the oscillation circuit 336 does not adversely affect, through noise, current variation or the like, or other electronic circuits. It is also possible to use a delay circuit or the like for generating the timing signals T0, T1, T2, . . . , T5. However, by using the oscillation circuit 336, by merely externally connecting the capacitor $C_1$ to the LSI circuit (integrated circuit 320), timing of the oscillating circuit 336 can be freely set even in the case where many timing signals are generated. If the timing generating circuit 331 is formed using a delay circuit, an externally connecting component is needed for determining each timing when the timing is freely set. However, when the number of timing signals to be generated is small, using a delay circuit may be advantageous because the latch circuit is not required. Anyway, the control speed of the negative feedback loop 3 can be freely set, and also, it is possible to obtain light output without being affected by frequency characteristics of the semiconductor laser 1 and light reception device 2. Further, providing the timing generating unit 331 is advantageous for determining the initialization time of the integrated circuit 320 to be an optimum time.

Generally speaking, there are frequency characteristics between the semiconductor laser 1 and the light reception device 2. In a case where the frequency characteristics adversely affect operation of the negative feedback loop 3 and/or the above-described timing setting operation, it is necessary to add an electronic circuit for compensating the frequency characteristics. If such a compensating circuit is not added, it is necessary to set the above-described timing to be sufficiently delayed. However, by making the timing delayed, the initialization time of the integrated circuit 320 is elongated. If such a compensating circuit is added, the number of components of the integrated circuit 320 increases. By providing the timing generating unit 331 using the oscillation circuit 336, without needing such a compensating circuit, by merely changing the capacitance of the capacitor $C_1$, the timing can be effectively adjusted. Thus, efficient initialization can be performed without increasing the number of components. Further, in comparison to where flip-flops are used for generating such timing signals, by using the latch circuit 337 of the combination of the necessary stages of latch circuit 348 in the embodiment, it is possible to reduce the number of components.

Figure 6:
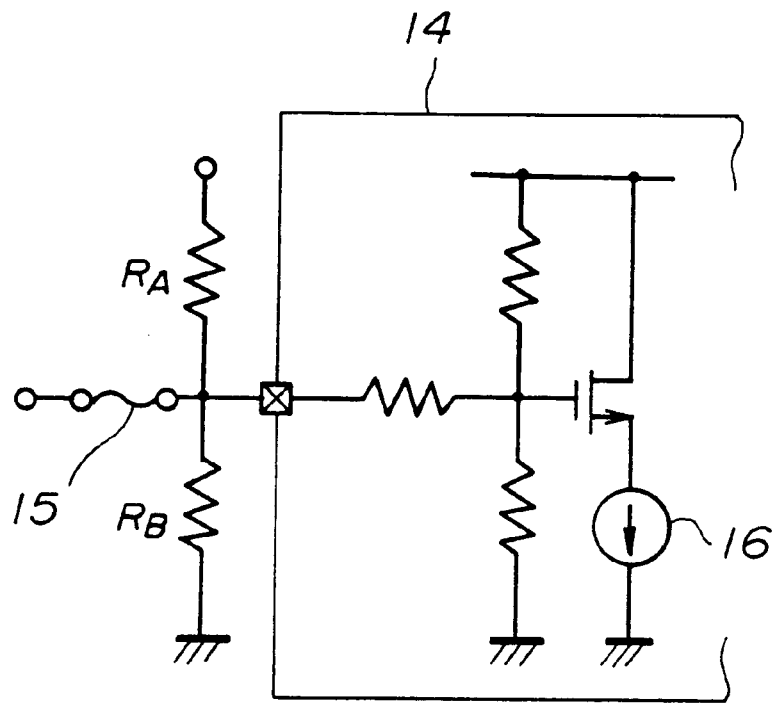
FIG. 6 shows an input method in the related art.

An outline of operations controlled by these timing signals in the initialization time will be described with reference to the time chart of FIG. 5 and FIG. 6 showing an example of a circuit arrangement of the differential quantum efficiency detecting unit 332. At the timing TS, light output of the semiconductor laser 1 is forcibly changed to a predetermined maximum light emission condition from an off condition. This maximum light emission value was already set in the light emission instruction signal generating unit 322. At the timing T0, all the input data is made to be 0, and thus, an offset light emission condition is set. This condition is maintained until the timing T5. After that, a normal operation condition is set where ordinary input data is accepted. In order to maintain an operation of the negative feedback loop 3, light output of the semiconductor laser 1 is not completely off, and it is necessary to set the offset light emission condition where a slight light output is provided. Actually, light output of the semiconductor laser 1 is controlled by the negative feedback loop 3 between the maximum light emission condition and the offset light emission condition.

In the initialization time, that is, in power source supply starting time or a reset time, a sequence operation such as that shown in FIG. 24 is performed. Thus, the differential quantum efficiency is detected each time, and suitable adding current value is set for light output of the semiconductor laser 1.

A ratio of the difference between the maximum light emission light output power and the offset light emission light output power shown in FIG. 24 to the difference, which is (operation current Iop)–(LD oscillation threshold current Ith), is the differential quantum efficiency. The sample-and-hold circuit 338 of the differential quantum efficiency detecting unit 332 detects the difference in the current. In outline, this difference corresponds to a difference of a voltage between the two terminals of the resistor Re shown in FIG. 21 between the cases of maximum light emission and offset light emission. When the voltage shifting unit 325 of the current driving unit 324 does not operate, the difference corresponds to a difference of an emitter voltage of a transistor $Q_{12}$ (shown in FIG. 15) of the error amplifier 324 (corresponding to the error amplifier 224 in the second embodiment) between the two cases. Therefore, the emitter voltage of the transistor $Q_{12}$ is sampled and held at the time of the maximum light emission. Then, the amount of voltage shift of the voltage shifting unit which is 0 at the timing T0 is gradually changed through the adding current setting unit 334, and the differential quantum efficiency is detected as a voltage difference in the resistor $R_2$ (shown in FIG. 15) in the voltage shifting unit.

Figure 25:
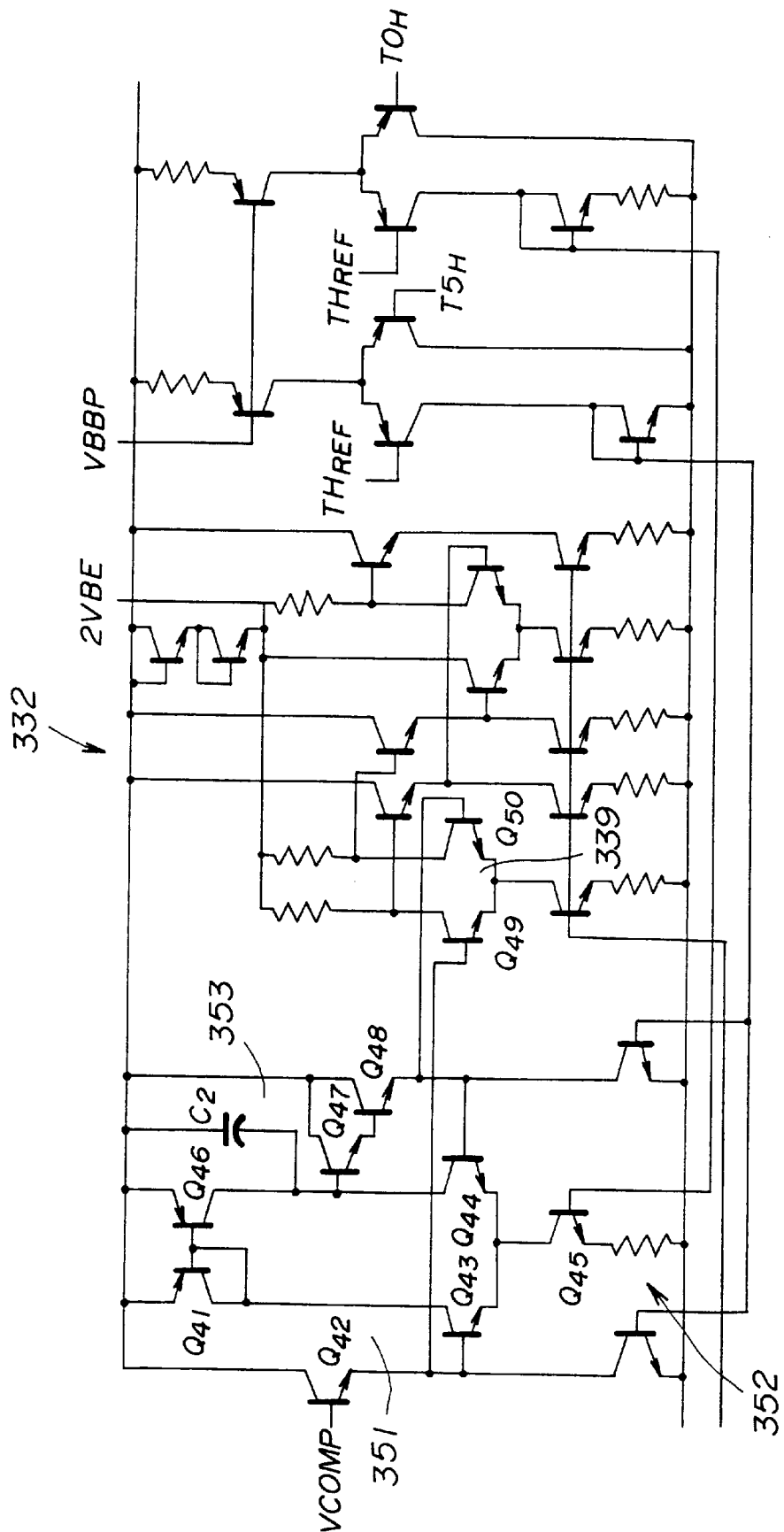
FIG. 25 shows a circuit diagram of an example of an arrangement of a differential quantum efficiency detecting unit shown in FIG. 21.

In detail, the emitter voltage of the transistor $Q_{12}$, that is, the voltage of a VCOMP terminal becomes the base voltage of a transistor $Q_{43}$ via an emitter follower 251 of a transistor $Q_{42}$ shown in FIG. 25. While a current of a current source 352 including a transistor $Q_{45}$ is flowing, the base voltage of the transistor $Q_{43}$ is equal to the base voltage of a transistor $Q_{44}$ via a voltage follower 353 including transistors $Q_{41}$, $Q_{46}$, $Q_{47}$, $Q_{48}$. At the timing T0, the current of the current source 352 is made to turn off. After that, a change in the base voltage of the transistor $Q_{43}$ indicates a change in the voltage of the VCOMP terminal. However, by using a large capacity of a capacitance $C_2$, the base voltage of the transistor $Q_{44}$ hardly changes, and it is possible to sample and hold the base voltage of the transistor $Q_{43}$ at the timing T0, that is, the emitter voltage of the transistor $Q_{12}$ at the time of maximum light emission. FIG. 24 shows outlines of waveforms of voltage variations of the base voltages of the transistors $Q_{43}$, $Q_{44}$.

These base voltages of the transistors $Q_{43}$, $Q_{44}$ are input to and compared by a comparator 339 including transistors $Q_{49}$, $Q_{50}$. Results of the comparisons are stored in the memory unit 333 in synchronization with the timing signals T1, T2, T3, T4 and T5. Not shown in the figures, the memory unit 333 has functions of storing the comparison results in synchronization with the timing signals T1, T2, T3, T4 and T5. For example, the memory unit 333 may include five stages of latch circuits such as those used in the timing generating unit 331. In this case, when the base voltage of the transistor $Q_{43}$ is higher than the base voltage of the transistor $Q_{44}$ in the comparison, the L level is output to a latch circuit.

The adding current setting unit 334 includes five sets of switches, each set including two stages of differential switches, current mirror circuits which supply currents to current sources of these switches, and a current mirror circuit which sums the respective sets of switches and output the summed result to the current driving unit (voltage shifting unit 325). The five sets of switches basically form a 5-bit digital to analog converter 340. The current source of each set of switches is set as follows: Assuming that the current for the least significant bit is I1, the currents for the subsequent bits are 2·I1, 4·I1, 8·I1, 16·I1, respectively, in the order of less significance. Thereby, the total output current of the all the switch sets is 31·I1 which is a maximum. The corresponding maximum current (voltage) of the current driving unit (voltage shifting unit 325) is set so that the maximum current is larger than the maximum value of the above-mentioned (operation current Iop)–(LD oscillation threshold current Ith).

At the timing T0, light output of the semiconductor laser 1 is changed from the maximum light emission condition to the offset light emission condition, and simultaneously, the current of the most significant bit of the above-mentioned switch set is forcibly output. Thereby, a voltage change occurs in the voltage shifting unit. Then the control system of the negative feedback loop 3 operates so that the light output should be the offset light emission condition although the voltage changes in the voltage shifting system. In other words, the negative feedback loop 3 operates so that such a voltage change in the voltage shifting unit due to the output of the current of the most significant bit of the switch set is canceled and the offset light emission condition results. Thus, the voltage of the VCOMP terminal changes. Such a change is detected by the differential quantum efficiency detecting unit 332, and the VCOMP terminal voltage at this time is compared with the VCOMP terminal voltage at the time of the maximum light emission. A result of the comparison is stored in the memory unit 233. The memory unit 233 latches the comparison result and sets the set of the switches for the most significant bit of the adding current setting unit 234. In the setting, when the VCOMP terminal voltage at the time of forcibly outputting the current is larger than that at the time of the maximum light emission, the setting is OFF. When the VCOMP terminal voltage at the time of forcibly outputting the current is smaller than that at the time of the maximum light emission, the setting is ON. The time T0 to T1 (also the time T1 to T2, . . . , the time T4 to T5) should be set so that operation of the control system of the negative feedback loop 3 becomes completely stable and thus a change in the output value completely converges.

At the timing T1, similar to the case at the timing T0, the current of the second significant bit of the set of switches of the adding current setting unit 334 is forcibly output. Then, at the time T2, comparison of the VCOMP terminal voltage at the time with that of the maximum light emission is performed, and the switch setting for the bit is set to be ON or OFF according to a result of the comparison. In this embodiment, the differential quantum efficiency detection is performed with an accuracy of 5-bit digital to analog conversion. Therefore, a similar operation is repeated five times. During these operations, the base voltage of the transistor $Q_{43}$ varies as shown in FIG. 24. Thus, the 5 bits of the set of switches of the addition current setting unit 334 are appropriately set. In the example of the figure, the setting result is as follows in the order of the bit significance:

1, 1, 1, 0, 1.

In the embodiment, detection accuracy of the differential quantum efficiency detection unit 332 and the addition current setting unit 334 is 5 bits. However, it is possible to increase the number of bits so as to improve the detection accuracy. Thereby, in the light output waveform shown in FIG. 2B, it is possible that the light output of Ps further approximates a desired light output. Thereby, the control operation of the control system of the negative feedback loop 3 is reduced, and the light output further approximates an ideal rectangular wave.

Figure 26:
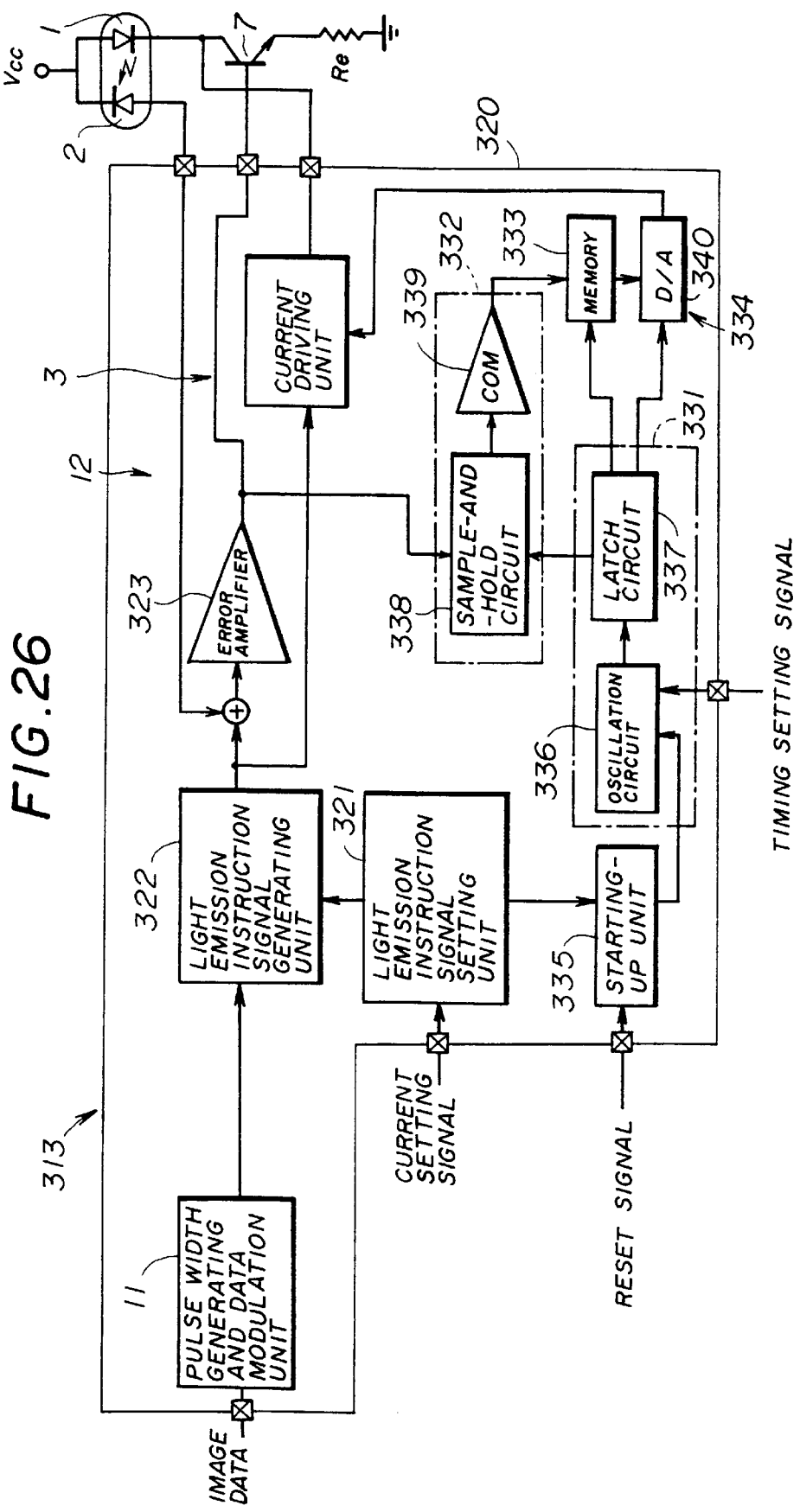
FIG. 26 shows a general block diagram of a variant embodiment of the third embodiment.
Figure 27:
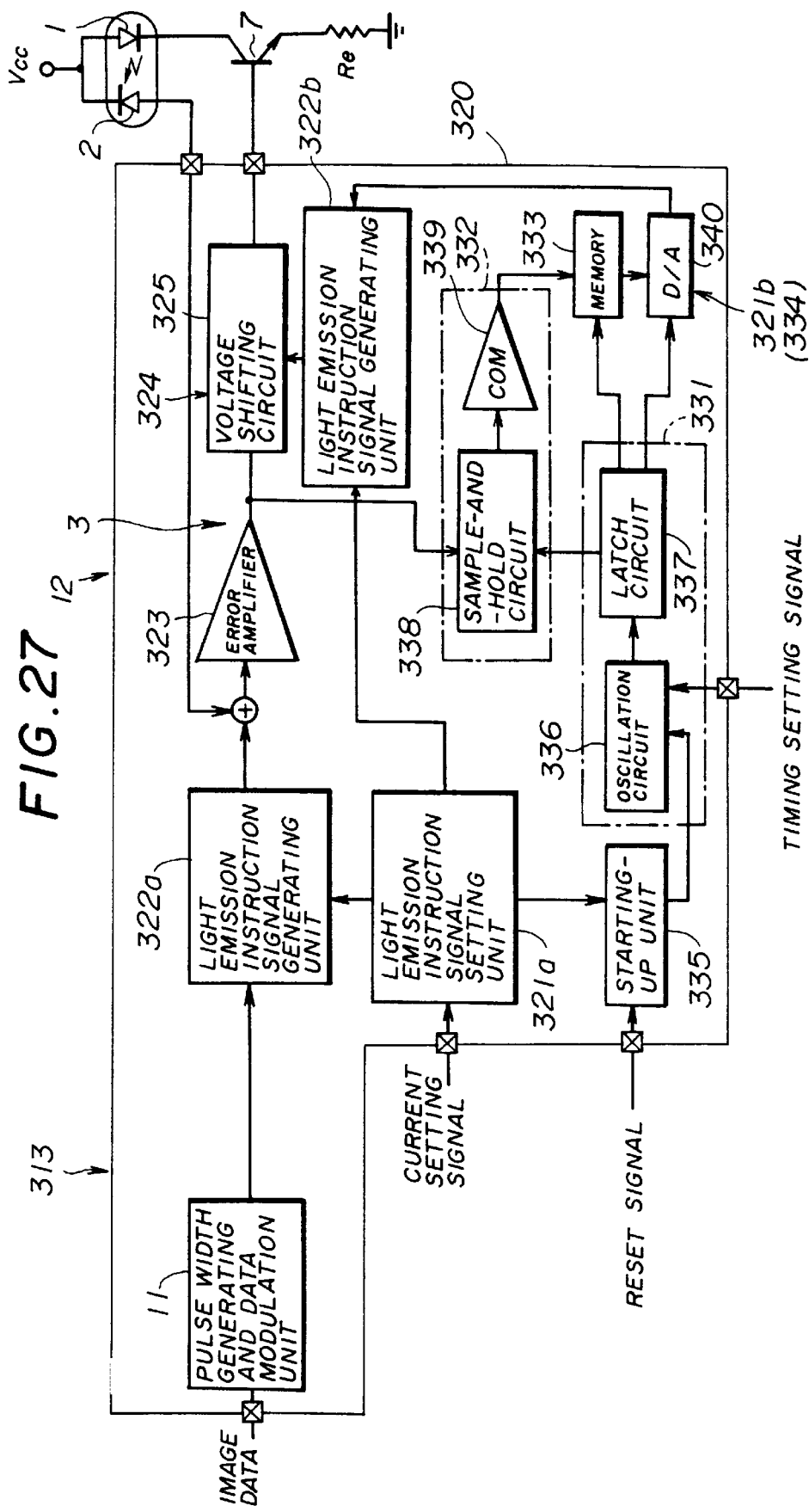
FIG. 27 shows a general block diagram of a different variant embodiment of the third embodiment.

Further, in the embodiment, the current driving unit 324 is formed by the voltage shifting unit 325 which is inserted in the negative feedback loop 3. However, it is also possible that, as shown in FIG. 26, the current driving unit 324 is separate from and independent of the negative feedback loop 3. Further, with regard to the light emission instruction signal generating unit and light emission instruction signal setting unit, as shown in FIG. 27, it is possible to separate them into the light emission instruction signal generating unit 322a and light emission instruction signal setting unit 321a for $I_{DA1}$ and the light emission instruction signal generating unit 322b and light emission instruction signal setting unit 321b for $I_{DA2}$. In this case, the light emission instruction signal setting unit 321b is the addition current setting unit 334.

Further, in the embodiment, almost all of the semiconductor laser control system 313 is formed as an integrated circuit 320 using bipolar transistors. However, it is also possible that the system is formed as an integrated circuit using C-MOS transistors. Further, it is also possible that the system is formed as an integrated circuit using a combination of bipolar transistors and C-MOS transistors. Furthermore, it is also possible that the system is formed as a non-integrated circuit.

A fourth embodiment of the present invention will now be described with reference to the drawings. The fourth embodiment is similar to the third embodiment described above. Duplicated descriptions will be omitted.

Figure 28:
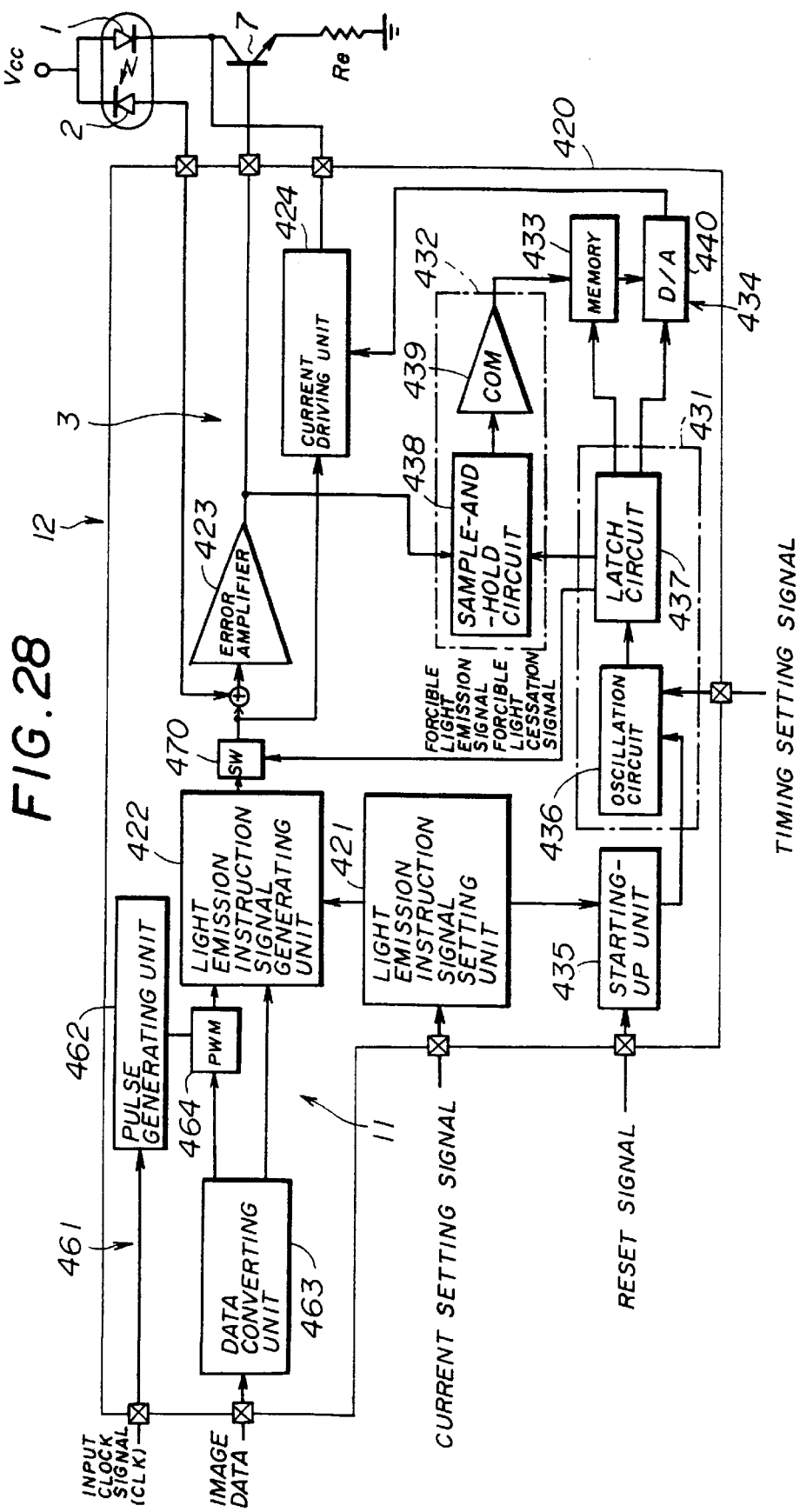
FIG. 28 shows a general block diagram of a fourth embodiment of the present invention.

FIG. 28 shows an example of a detailed arrangement of the semiconductor laser control system 413 in the fourth embodiment. The pulse width generating unit and data modulation unit 11 generate the light emission instruction signal which simultaneously performs pulse width modulation and intensity modulation according to image data (input data). The light emission instruction signal is a plurality of pulses which include pulse width modulation data and intensity modulation data.

With regard to the semiconductor laser control and driving unit 12, the negative feedback loop 3 generally includes a light emission instruction setting unit 421, a light emission instruction signal generating unit 422, an error amplifier 423, a current driving unit 424, the semiconductor laser 1 and the light reception device 2. This arrangement and operation is similar to that of the negative feedback loop 3 of the third embodiment including the light emission instruction setting unit 321, light emission instruction signal generating unit 322, an error amplifier 323, a current driving unit 324, the semiconductor laser 1 and the light reception device 2. However, in the fourth embodiment, as shown in FIG. 28, similar to FIG. 26, the current driving unit 424 is actually separate from and independent of the negative feedback loop 3.

Further, a timing generating unit 431, a differential quantum efficiency detecting unit 432 (including a sample-and-hold circuit 438 and a comparator 439), a memory unit 433, a adding current setting unit 434 (of a 5-bit digital to analog converter 440, for example) and a starting-up unit 435 of the fourth embodiment are similar to the timing generating unit 331, differential quantum efficiency detecting unit 332 (including the sample-and-hold circuit 338 and comparator 339), memory unit 333, adding current setting unit 334 (of the 5-bit digital to analog converter 340, for example) and starting-up unit 335 of the third embodiment. Duplicated descriptions thereof will be omitted.

Further, a oscillation circuit 436 and a latch circuit 437 of the fourth embodiment is similar to the oscillation circuit 336 and latch circuit 337 of the third embodiment. Duplicated description thereof will be omitted.

The pulse width generating unit and data modulation unit 11 will be now described. In the embodiment, the pulse width modulation uses 3 bits (that is, 8 levels) and the intensity modulation uses 5 bits (that is, 32 levels). By combining the two modulations, 8-bit tone (256 levels) can be output. In outline, the pulse width generating unit and data modulation unit 11 includes a pulse width modulation and intensity modulation signal generating unit 461 and a light emission instruction signal generating unit 422. In outline, the pulse width modulation and intensity modulation signal generating unit 461 includes a pulse generating unit 462 which includes a PLL and generates a plurality of pulses of different timing, a data converting unit 463 which includes logic units and converts input image data into pulse width modulation data and intensity modulation data, and a pulse width modulation unit 464 which selects pulses from pulses output from the pulse generating unit 462 according to the pulse width modulation data obtained from the data converting unit 463. The pulse width modulation and intensity modulation signal generating unit 461 performs the above-described logic operation and is formed of electronic circuits by bipolar transistors.

Figure 29A:
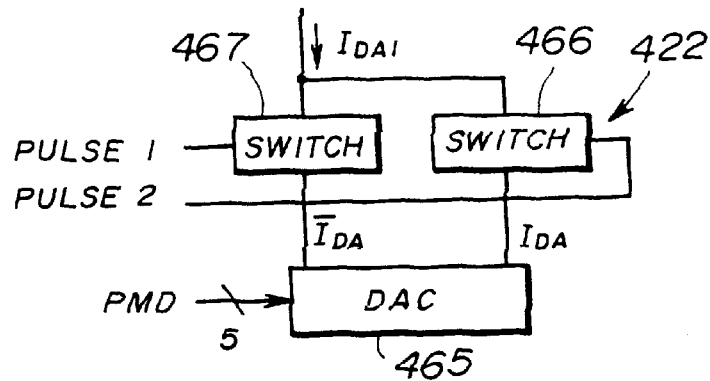
FIGS. 29A, 29B, 29C show block diagrams of an example arrangements of a light emission instruction signal generating unit shown in FIG. 28.

The light emission instruction signal generating unit 422 includes, as shown in FIG. 29A, a digital to analog converter (DAC) 465 which generates the currents $I_{DA}$ and $\bar{I}_{DA}$ according to intensity modulation data PMDATA (PMD), a differential switch 466 which allows or does not allow the current $\bar{I}_{DA}$ to flow therethrough according to a pulse 1, a differential switch 467 which allows or does not allow the current $I_{DA}$ to flow therethrough according to a pulse 2. It is noted that $I_{DA}+\bar{I}_{DA}=I_{full}$. The value of $I_{full}$ is the value of $I_{DA}$ when all of PMDATA is ON, and is the maximum current value of the light emission instruction signal. The differential switches 466, 467 function so that, when each of the pulse 1 and pulse 2 is at the H level, $I_{DA1}=I_{full}$. When the pulse 1 is at the L level and the pulse 2 is at the H level, $I_{DA1}=I_{DA}$. When each of the pulse 1 and pulse 2 is at the L level, $I_{DA1}=0$. When each of the pulse 1 and pulse 2 is at the H level, $I_{DA1}=I_{full}$, without depending on the value of $I_{DA}$ (that is, without depending on PMDATA). Therefore, the intensity modulation data PMDATA can be fixed during one pixel clock period. This is advantageous in achieving a high-speed operation of the semiconductor laser control system. Each of such differential switches as the switches 466, 467 can be formed as a result of differential connection of a pair of bipolar transistors. Therefore, the light emission instruction signal generating unit 422 itself can be easily formed as an integrated circuit by bipolar transistors.

Figure 29B:
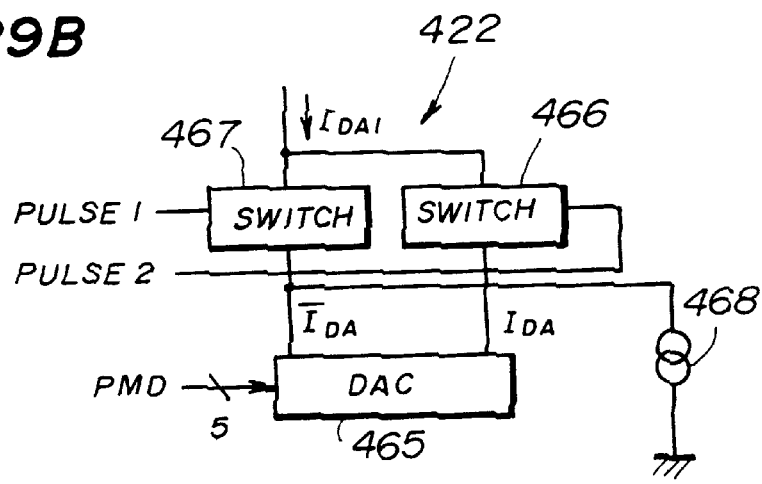
Figure 29C:
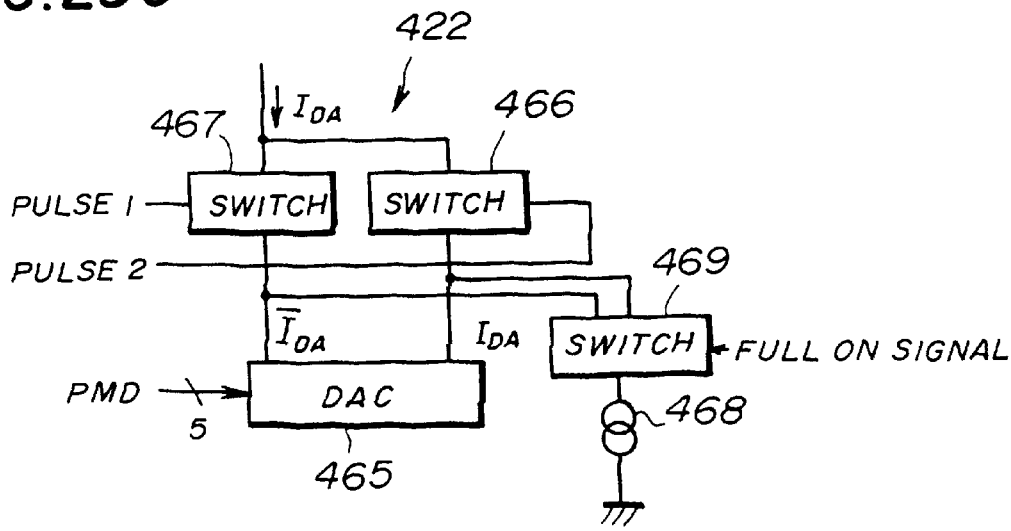

A case will now be considered where 8-bit tone (256 levels) is output for one dot and 5 bits (32 levels) are used for the intensity modulation. The maximum current supplied by the 5-bit digital to analog converter 465 is $31 \cdot I_0$ (where $I_0$ is a current flowing for the least significant bit). The current $31 \cdot I_0$ is set as the maximum current $I_{full}$. In the arrangement shown in FIG. 29A, data 31/256 and data 32/256 results in a same output. Similarly, data 63/256 and data 64/256 results in a same output, . . . , data 223/256 and data 224/256 results in a same output. As a result, the number of tone levels for one dot is 249. In order to solve this problem, as shown in FIG. 29B, a constant-current source 468 which always supplies the current $I_0$ to the differential switch 466 is added and setting such that $I_{full}=32 \cdot I_0$ is performed. Thereby, it is possible that 256 tone levels, 0/256 to 255/256 are obtained, and the number of tone levels increases. However, when all image data is at the H level, the semiconductor laser 1 does not fully turn on (256/256). (In the case of FIG. 29A, the semiconductor laser 1 fully turns on because data 255/256 and data 256/256 result in the same output.) In order to solve this problem, as shown in FIG. 29C, a differential switch 469 is provided. This switch 469 allows a current to flow to the switch 466 only when a full on signal which is at the H level only when all image data is at the H level. The switch 469 allows a current to flow to the switch 467 at all the other times. Thereby, although the number of devices increases, 256 tone levels, 0/256 to 254/256, 256/256 can be obtained. Thus, depending on a particular purpose, one of the three arrangements shown in FIGS. 29A, 29B and 29C may be selected.

As mentioned above, as shown in FIG. 28, the pulse width modulation and intensity modulation signal generating unit 461 includes the data converting unit 463 which is data converting means, the pulse width modulation unit 464 which is pulse width modulating means and the pulse generating unit 462 which includes a PLL and is pulse generating means. The pulse generating unit 462 has a function the same as the function of the above-described pulse generating oscillator 118 in the first embodiment, and supplies pulses $X_0, X_1, X_2, \ldots, X_7$ shown in FIG. 13. Duplicated description thereof will be omitted. The pulse generating unit 462 includes a phase frequency comparator, a voltage controlled oscillator and a lowpass filter.

The data converting unit 463 and the pulse width modulation unit 464 may have functions the same as those of the data converting unit 116 and pulse width modulation unit 117 of the first embodiment shown in FIG. 12A. The data converting unit converts input image data into pulse width modulation data PWMDATA and intensity modulation data PMDATA, and the pulse width modulation unit 464 generates two pulse signals $PW_{on}$ (pulse 2) and $PW_{da}$ (pulse 1) from $X_0, X_1, X_2, \ldots, X_7$ output from the pulse generating unit 462 according to the pulse width modulation data PWMDATA obtained from the data converting unit 463.

In the fourth embodiment, as shown in FIG. 28, a switch unit 470 is inserted between the light emission instruction signal generating unit 422 and the error amplifier 423, and current driving unit 424. This switch unit 470 is formed by bipolar transistors. The light emission instruction signal provided to the error amplifier 423 and current driving unit 424 from the light emission instruction signal generating unit 422 is changed. Thereby, it is possible that the semiconductor laser 1 is forcibly caused to emit light or forcibly caused to cease emitting light without regard to image data.

Figure 30:
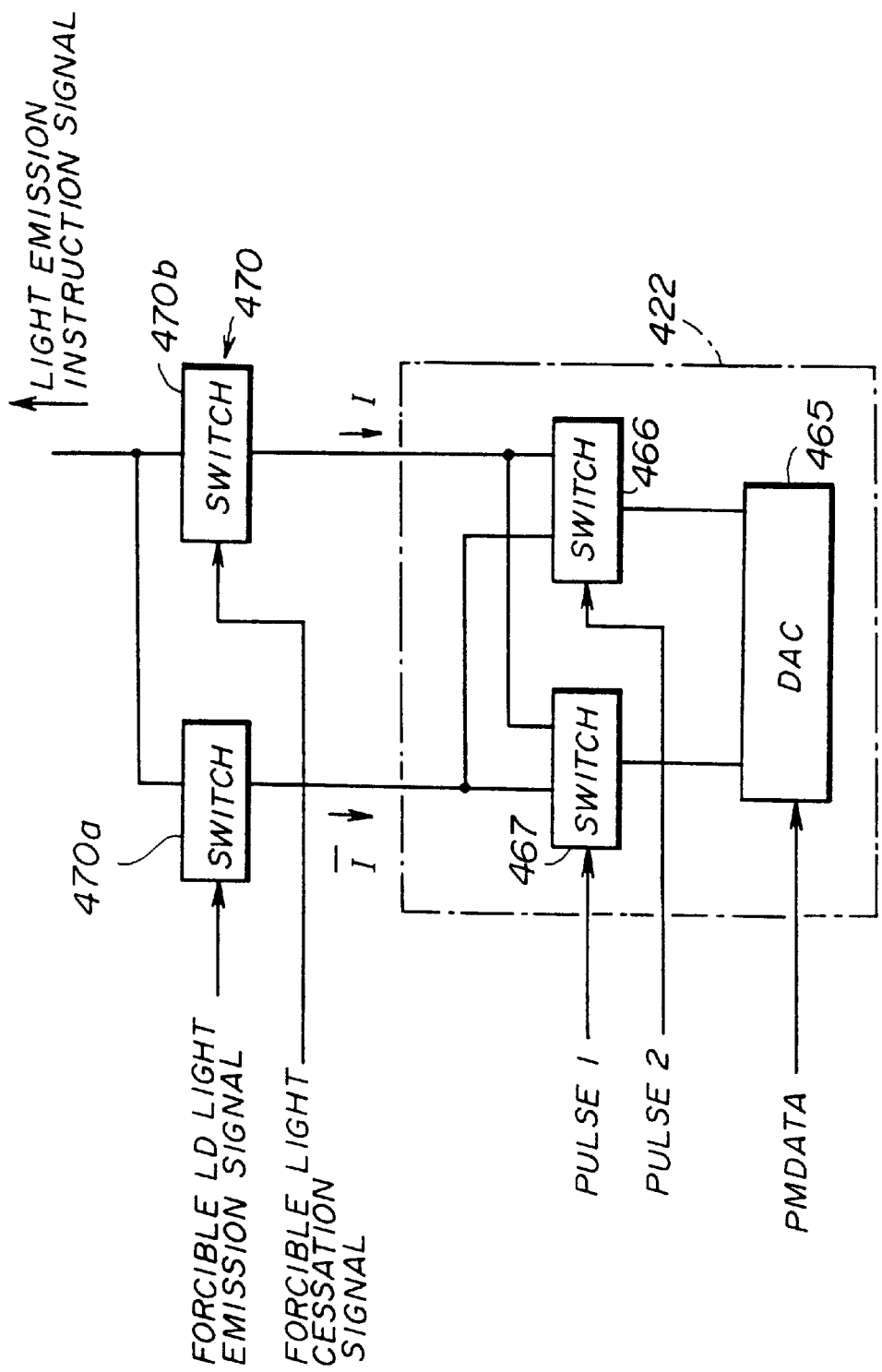
FIG. 30 shows a block diagrams of example arrangement of the light emission instruction signal generating unit and a switch unit shown in FIG. 28.

Specifically, in a case where the arrangement shown in FIG. 29A is selected as the light emission instruction signal generating unit 422, an arrangement shown in FIG. 30 is provided as the light emission instruction signal generating unit 422 and the switch unit 70. In the arrangement of FIG. 30, a switch 470a allows or does not allow a current to flow therethrough according to a forcible light emission instruction signal. A switch 470b allows or does not allow a current to flow therethrough according to a forcible light cessation instruction signal. The two switches 470a and 470b are connected to the switches 466 and 467 and change the light emission instruction signal to be provided to the error amplifier 423 and current driving unit 424. The switch 466 allows a current to flow therethrough either only to the switch 470a or only to the switch 470b, according to the pulse 2. The switch 467 allows a current to flow therethrough either only to the switch 470a or only to the switch 470b, according to the pulse 1. The forcible light emission instruction signal and forcible light cessation instruction signal are appropriately generated and output by the timing generating unit 431. In the embodiment, when the semiconductor laser 1 differential quantum efficiency detection operation is performed as mentioned above, the forcible light emission instruction signal and forcible light cessation instruction signal are generated. Thereby, without regard to image data (pulse 1, pulse 2), the semiconductor laser 1 is forcibly caused to emit light or forcibly caused to cease emitting light. However, the forcible light emission instruction signal and forcible light cessation instruction signal are not at the H level simultaneously. Further, each of the switches 466, 467, 470a and 470b is formed of a ECL (emitter coupled logic) circuit, where the emitters of a pair of transistors are connected to one another, by bipolar transistors.

In the arrangement shown in FIG. 30, in the above-described differential quantum efficiency detection operation, the forcible light cessation instruction signal is caused to be at the H level, and also, the forcible light emission instruction signal is caused to be at the L level. Thereby, the switches 470a and 470b allow neither a current I nor a current Ī, supplied via the switches 466 and 477, to flow therethrough. As a result, without regard to image data, the semiconductor laser 1 is forcibly caused to be the off condition. Then, the forcible light cessation instruction signal is caused to be at the L level, and also, the forcible light emission instruction signal is caused to be at the H level. The switches 470a and 470b allow both the current I and the current Ī, supplied via the switches 466 and 477, to flow therethrough. As a result, without regard to image data, the semiconductor laser 1 is forcibly caused to be at the maximum light emission condition. Thus, the condition of the semiconductor laser 1 is changed. Thereby, the semiconductor laser 1 differential quantum efficiency detection operation, described above with reference to FIG. 25, can be performed independently, arbitrarily, without regard to image data. In a normal condition, the forcible light cessation instruction signal is caused to be at the L level, and also, the forcible light emission instruction signal is caused to be at the L level. Thereby, the switches only 470b allows only the current I, supplied via the switches 466 and 477, to flow therethrough.

In the fourth embodiment, the switch unit 470 is provided between the light emission instruction signal generating unit 422 and the error amplifier 423. However, it is also possible that the switch unit 470 is provided between the light emission instruction signal generating unit 422 and pulse width modulation unit 464.

Further, in the embodiment, almost all of the semiconductor laser control system 413 is formed as an integrated circuit 420 using bipolar transistors. However, it is also possible that the system is formed as an integrated circuit using C-MOS transistors. It is also possible that the system is formed as an integrated circuit using a combination of bipolar transistors and C-MOS transistors. Furthermore, it is also possible that the system is formed as a non-integrated circuit.

A fifth embodiment of the present invention will now be described with reference to the drawings. The fifth embodiment is similar to the second embodiment described above. Duplicated descriptions will be omitted.

A semiconductor laser control system in the fifth embodiment, in outline, also includes, as shown in FIG. 3, the pulse width generating unit and data modulation unit 11 (pulse width modulation and intensity modulation signal generating unit) and semiconductor laser control unit and semiconductor laser driving unit 12 (semiconductor control and driving unit).

An example of the detailed arrangement of the semiconductor laser control system in the fifth embodiment is shown in FIG. 14 which also shows the detailed arrangement of the second embodiment described above. The pulse width generating unit and data modulation unit 11 includes a pulse generating unit such as the pulse generating unit 118 shown in FIG. 18, a data converting unit such as the data converting unit 116 shown in the figure and a pulse width modulation unit such as the pulse width modulation unit 117 shown in the figure.

With regard to the semiconductor laser control unit and semiconductor driving unit 12, similar to the arrangement of the second embodiment, as shown in FIG. 14, a negative feedback loop 3 includes a light emission instruction signal setting unit 221 and a light emission instruction signal generating unit 222, which form a pulse width modulation and intensity modulation signal generating unit, an error amplifier 223, a current driving unit 224 (high-speed voltage shifting unit 225), the semiconductor laser 1 and light reception device 2. These units/components in the fifth embodiment function in a manner similar to the corresponding units/components in the second embodiment functions.

An example of a circuit arrangement of the error amplifier 223 and high-speed voltage shifting unit 225 in the fifth embodiment is shown in FIG. 15 which also shows the example of the circuit arrangement of the error amplifier 223 and high-speed voltage shifting unit 225 in the second embodiment.

Further, a timing generating unit 231, a differential quantum detecting unit 232, a memory unit 233 and an addition current setting unit 234 in the fifth embodiment are similar to the corresponding units in the second embodiment, and function in a manner similar to the manner in which the units in the second embodiment function.

Further, in an integrated circuit 220 of the fifth embodiment, a starting-up unit 235 is connected to the timing generating unit 231, and a power source unit 561 (not shown in FIG. 14) is provided.

Figure 31:
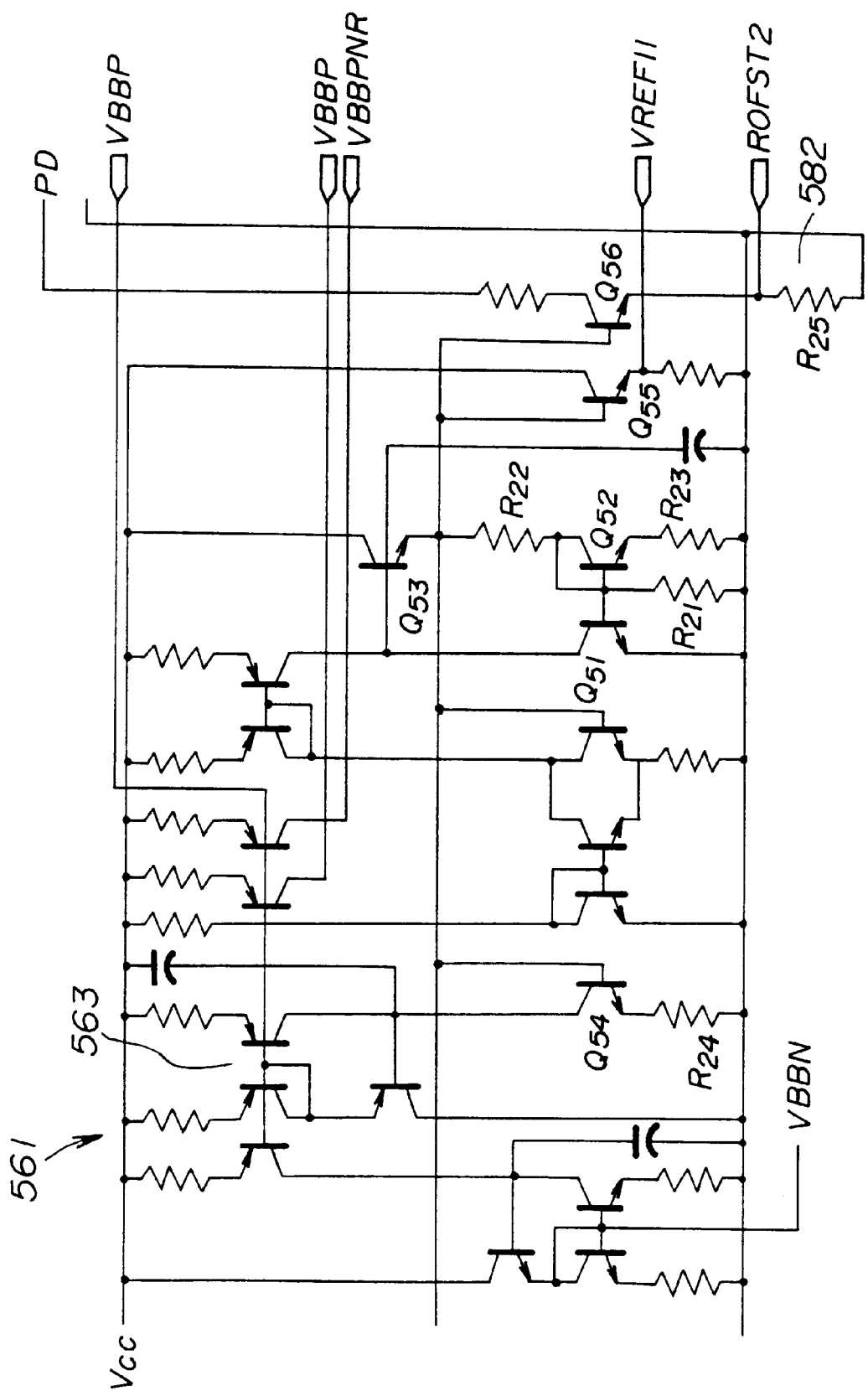
FIG. 31 shows a circuit diagram of an example arrangement of a power source unit in a fifth embodiment.

FIG. 31 shows an example of a circuit arrangement of the power source unit 561 using bipolar transistors. In the power source unit 561, a band gap reference is formed in a circuit including transistors $Q_{51}$, $Q_{52}$, resistors $R_{21}$, $R_{22}$, $R_{23}$, and emitter areas of transistors and resistance values are determined so that $$V=\text{(an emitter voltage of } Q_{53}\text{)}-V_{be},$$

(where $V_{be}$: a base-emitter voltage of a transistor) varies as little as possible due to temperature change. As a result, the emitter voltage of each of transistors $Q_{54}$, $Q_{55}$ and $Q_{56}$ is a stable voltage which does not have temperature characteristics. In the circuit shown in FIG. 31, a current the same as the current flowing through the transistor $Q_{54}$ and a resistor $R_{24}$ is obtained through a current mirror circuit 563. A current source can be produced, which is used in the integrated circuit 220. In the integrate circuit 220, currents which flow through PNP transistors, in the starting-up circuit 235 which will be described later, which have base voltages supplied by a VBBP terminal become currents of constant-current sources, respectively. Similarly, currents which flow through NPN transistors which have base voltages supplied by a VBBN terminal become currents of constant-current sources, respectively. Specific current values are determined by resistances which are connected to the emitters of the transistors, respectively.

Figure 32:
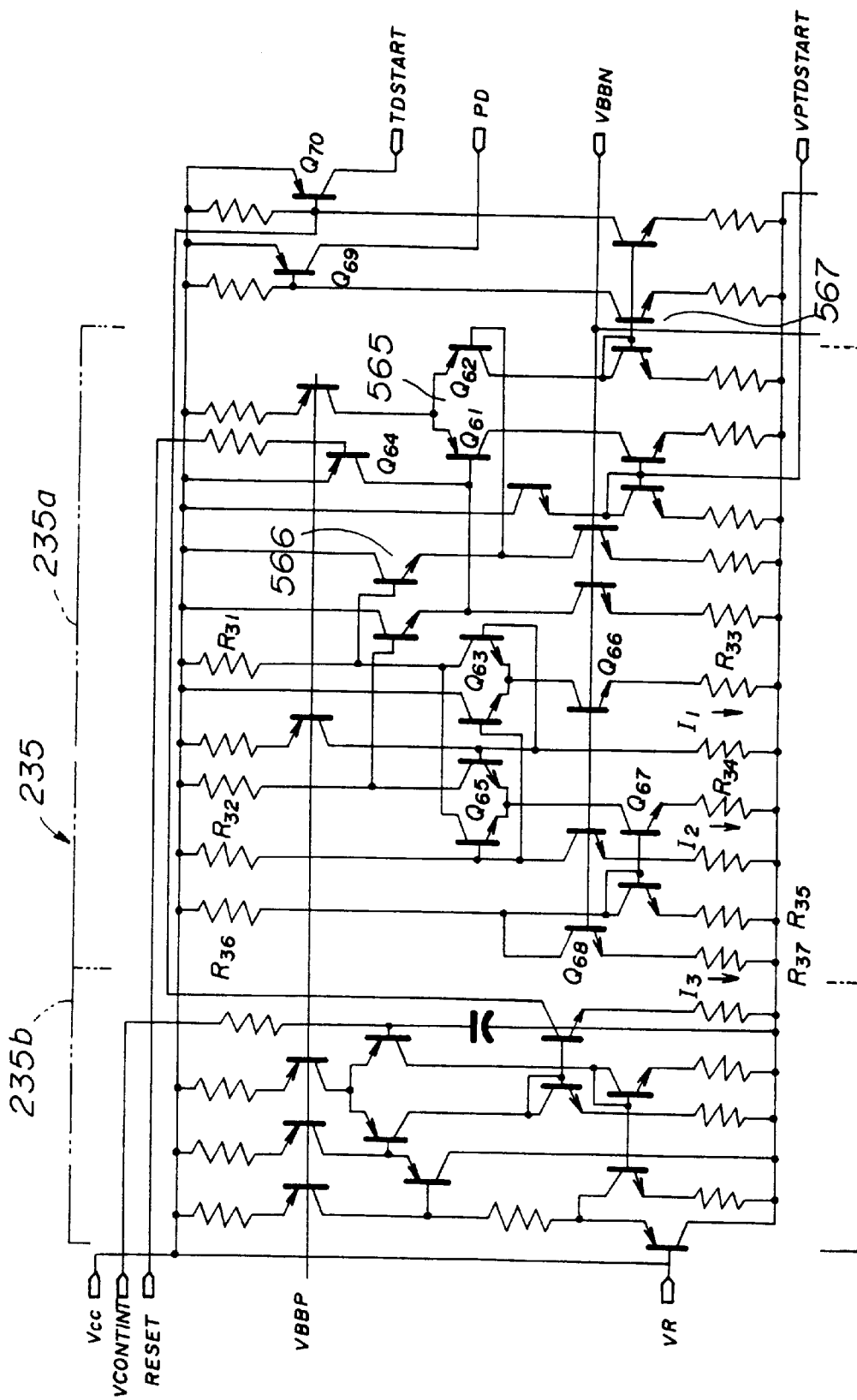
FIG. 32 shows a circuit diagram of an example arrangement of a starting-up unit in the fifth embodiment.

The starting-up unit 235 will now be described. The starting-up unit 235 protects the semiconductor laser 1 from being degraded or damaged due to an excessive current flowing therethrough during a time in which a power source voltage Vcc reaches a predetermined value after the power supply is started. The starting-up unit 235 generates an initialization starting signal which is necessary in the timing generating unit 231. As shown in FIG. 32, the starting-up unit 235 includes a first starting-up unit 235a and a second starting-up unit 235b. The second starting-up unit will be described later with a description of the light emission instruction signal setting unit 221. In the first starting-up unit 235a, resistances $R_{31}$ to $R_{37}$ and so forth are set so that, in a differential switch 565 including transistors $Q_{61}$ and $Q_{62}$, the transistor $Q_{62}$ is in its turning-on state from the time the power source voltage Vcc is 0 to the time Vcc reaches a certain set voltage, and the transistor $Q_{61}$ is in its turning-on state from the time Vcc exceeds the set voltage to the time Vcc becomes a predetermined voltage. The set voltage is set to be a voltage as near as possible to the predetermined voltage of the power source voltage Vcc. For example, a case will now be considered where the predetermined voltage of the power source voltage is 5.0 volts. In the case, when a power source voltage reaches 2 to 3 volts, the entire circuit is not considered to perform a predetermined operation. However, when a power source voltage reaches 4.5 volts, it is considered that almost the entire circuit performs the predetermined operation. Therefore, the above-mentioned set voltage is determined to be 4.5 volts, for example. After the power source voltage reaches a voltage very near to the predetermined voltage of the power source voltage, it is possible to effectively protect the semiconductor laser 1 and generate the initialization starting signal in a suitable condition.

In detail, with reference to FIG. 32, the base voltage of a transistor $Q_{62}$ is obtained as a result of performing voltage shifting on the collector voltage of a transistor $Q_{63}$ via an emitter follower 566. Thus, the base voltage of the transistor $Q_{62}$ is determined by the collector voltage of the transistor $Q_{63}$. Similarly, the base voltage of a transistor $Q_{61}$ is determined by the collector voltage of a transistor $Q_{65}$ as long as a transistor $Q_{64}$ is in its turning-off state. The collector voltage of the transistor $Q_{63}$ is determined by a current of a current source including a transistor $Q_{66}$ and a resistor $R_{33}$ and the power source voltage. The current of the current source of the transistor $Q_{66}$ and resistor $R_{33}$ is referred to as $I_1$, the power source voltage is referred to as $V_{Vcc}$, and the collector voltage of the transistor $Q_{63}$ is referred to as $V_{q63c}$. Then, $$V_{q63c} = V_{Vcc} - I_1 \cdot R_{31}.$$

The current $I_1$ is a current of a constant-current source having the base voltage supplied via the terminal VBBN. Therefore, $I_1 \cdot R_{31}$ is a constant current. The power source unit 561 is driven by a power source voltage. Therefore, when the power source voltage is 0 volts, the current $I_1$ is 0 amperes. However, because the above-mentioned set voltage is determined as near as possible to the predetermined voltage of the power source voltage, the power source unit 561 functions adequately and the current $I_1$ is a constant current, in a condition (time) where a differential switch 565 including the transistors $Q_{61}$, $Q_{62}$ performs a switching operation. Therefore, $V_{q63c}$ varies according to variation of the power source voltage $V_{Vcc}$.

The collector voltage $V_{q65c}$ of the transistor $Q_{65}$ is, similar to the above equation, expressed by:

$$V_{q65c} = V_{Vcc} - I_2 \cdot R_{32},$$

where the current of a current source including a transistor $Q_{67}$ and a resistor $R_{34}$ is referred to as $I_2$. Assuming that resistors $R_{34}$, $R_{35}$ have resistance values the same as one another, when considering a current flowing through a resistor $R_{36}$, $$V_{Vcc} = (I_2 + I_3) \cdot R_{36} + V_{be} + I_2 \cdot R_{35},$$

where the current $I_3$ is the current of a constant-current source including a transistor $Q_{68}$ and a resistor $R_{37}$, and $V_{be}$ is the base-emitter voltage of a transistor.

From the equations, $$V_{q65c} = I_3 \cdot R_{36} + V_{be} + I_2 \cdot (R_{36} + R_{35} - R_{32}).$$

$I_3$ is a constant current similar to $I_1$ and thus $I_3 \cdot R_{36}$ is a constant voltage. Further $V_{be}$ is approximately a constant voltage. Therefore, when $$R_{36} + R_{35} = R_{32},$$

the collector voltage $V_{q65c}$ of the transistor $Q_{65}$ is a constant voltage, independent of the power source voltage. Thus, the collector voltage $V_{q65c}$ of the transistor $Q_{65}$ is a constant voltage, and the collector voltage $V_{q63c}$ of the transistor $Q_{63}$ varies according to variation of the power source voltage $V_{Vcc}$. Therefore, by appropriately setting the two voltages, it is possible that the differential switch 565 including the transistors $Q_{61}$, $Q_{62}$ performs a switching operation at an appropriate timing according to variation of the power source voltage after the power supply is started. As a result, from the timing the power source voltage Vcc is 0 volts to the timing the Vcc reaches the set voltage, the transistor $Q_{62}$ is in its turning-on state. In this condition, a current the same as the collector current of the transistor $Q_{62}$ occurs through a current mirror circuit 567, and thereby, transistors $Q_{69}$, $Q_{70}$ turn on. Thereby, each of the voltage of a TDSTART terminal and the voltage of a PD terminal is forced to a voltage the same as the voltage of Vcc. Specifically, a control operation is performed such that the PD terminal of the light reception device 2 is forced to be at the H level, and the output of the error amplifier 223 is forced to be at the L level. Thereby, no forward current flows through the semiconductor laser 1. Thus, the semiconductor laser 1 is protected. As a result of the voltage of the TDSTART terminal being at the H level simultaneously, as described later, an oscillation circuit in the timing generating unit 231 is controlled so that the oscillation circuit does not oscillate. Then, when the power source voltage Vcc exceeds the set voltage, and the transistor $Q_{61}$ turns on, the above-mentioned semiconductor laser 1 protection is canceled, and a normal operational state occurs. Further, the control of the oscillation circuit of the timing generating unit 231 to prevent the oscillation circuit from oscillating is released. Thus, an oscillation starting signal is generated. Simultaneously, a VPTDSTART terminal voltage which creates a current source of the timing generating unit 231 is output.

The timing generating unit 231 in the fifth embodiment is similar to the timing generating unit 331 in the third embodiment. The differential quantum efficiency detecting unit 232 in the fifth embodiment is similar to the differential quantum efficiency detecting unit 332 in the third embodiment. The memory unit 233 in the fifth embodiment is similar to the memory unit 333 in the third embodiment. The adding current setting unit 234 in the fifth embodiment is similar to the adding current setting unit 334 in the third embodiment. A duplicate descriptions will be omitted. Each of these timing generating unit 231, differential quantum efficiency detecting unit 232, memory unit 233 and adding current setting unit 234 is formed as an integrated circuit by bipolar transistors.

FIG. 22 shows an example of the circuit arrangement of the oscillation circuit of the timing generating unit 231 in the fifth embodiment, which also shows the oscillation circuit 336 in the third embodiment. Power is supplied to the oscillation circuit from the power source unit 561 via the starting-up unit 235. FIG. 24 shows an outline operation in initializing in the fifth embodiment, which also shows the outline operation in initializing in the third embodiment. FIGS. 23A, 23B show examples of circuit arrangements of the first stage and the last stage of latch circuits of the timing generating unit 231 in the fifth embodiment, respectively, which also show the corresponding circuits in the third embodiment. FIG. 25 shows an example of a circuit arrangement of the differential quantum efficiency detecting unit 232 in the fifth embodiment, which also shows the example of the circuit arrangement of the differential quantum efficiency unit 332 in the third embodiment. The adding current setting unit 234 in the fifth embodiment is similar to the adding current setting circuit 334 in the third embodiment. Thus, the configuration and functions of the timing generating circuit 231 in the fifth embodiment are similar to those of the third embodiment. Duplicated description will be omitted.

Examples of circuit arrangements of the light emission instruction signal setting unit 221 and light emission instruction signal generating unit 222, which form a pulse width modulation and intensity modulation signal generating unit, using bipolar transistors in the fifth embodiment are similar to those in the second embodiment described with reference to FIGS. 16 and 17. Duplicated descriptions thereof will be omitted. A stable voltage of a VREF11 terminal generated by the power source unit 561 is supplied to the light emission instruction signal setting unit 221.

The base current compensation of the current of the light emission instruction signal generating unit 222, described in the description of the second embodiment, will now be specifically described, with respect to the least significant bit. The electronic circuit shown in FIG. 17 corresponds to the block arrangement shown in FIG. 11 of the first embodiment. The emitter current of a transistor $Q_{71}$ (shown in FIG. 16) is referred to as $I_{ref}$, the base current of a transistor $Q_{77}$ (shown in the figure) is referred to as $I_{q77b}$, the base current of the least significant bit transistor of DAC 113 (shown FIG. 11) corresponding to a transistor $Q_{85}$ (shown in FIG. 17) is referred to as $I_{DACb5}$, the base current, corresponding to the least significant bit current, of the transistor of switch 114B (shown in FIG. 11 but not shown in FIG. 16) is referred to as $I_{SWb5}$, the base current, corresponding to the least significant bit current, of the transistor of the IVC 115B (shown in FIG. 11) corresponding to a transistor $Q_{81}$ (shown in FIG. 17) is referred to as $I_{IVCb5}$. The least significant bit current flows through this path. In this condition, if a current mirror circuit 245 ideally provides an identical current, a current $I_{DA1-5}$ of the light emission instruction signal generating unit 22 corresponding to the least significant bit current is expressed as follows:

$$I_{DA1-5}=(I_{ref}+I_{q77b})/4-I_{DACb5}-I_{SWb5}-I_{IVCb5},$$

where the collector current $I_c$ flowing through the above-mentioned transistors of DAC 113, switch 114B and IVC 115B can be approximated as follows:

$$I_c=(I_{ref}+I_{q77b})/4.$$

Further, the relationship between a base current $I_b$ and a collector current $I_c$ is expressed as follows:

$$I_c=h_{fe} \cdot I_b,$$

where the current amplification factor is referred to as $h_{fe}$. Therefore, when approximation is performed so that $I_{DACb5}=I_{SWb5}=I_{IVCb5}$, $$I_{DA1-5}=(I_{ref}+I_{q77b})/4-(3/h_{fe})(I_{ref}+I_{q77b})/4.$$

Further, $$(3/h_{fe})(I_{q77b}/4)=(3/h_{fe})(\frac{1}{4})(I_c/h_{fe})$$

is sufficiently small in comparison to $I_c$, $$I_{DA1-5}=(I_{ref}+I_{q77b})/4-(3/h_{fe})(I_{ref}/4).$$

In order that:

$$I_{DA1-5}=I_{ref}/4,$$

it should be that:

$$I_{q77b}/4=(3/h_{fe})(I_{ref}/4).$$

Therefore, by causing the emitter current of the transistor $Q_{77}$ to be as much as three times the emitter current $I_{ref}$ of the transistor $Q_{71}$, $$I_{DA1-5} \approx I_{ref}/4.$$

Thus, the base current compensation for the transistors through which $I_{DA1-5}$ flows can be performed.

Further, base current compensation for all the bits are performed. For example, the most significant bit will now be considered. Similar to the case of considering the least significant bit, the base current of the most significant bit transistor of DAC 113 corresponding to a transistor $Q_{86}$ (shown in FIG. 17) is referred to as $I_{DACb1}$, the base current, corresponding to the most significant bit current, of the transistor of switch 114B is referred to as $I_{SWb1}$, the base current, corresponding to the most significant bit current, of the transistor of the IVC 115B corresponding to a transistor $Q_{81}$ is referred to as $I_{IVCb1}$, a current $I_{DA1-1}$ of the light emission instruction signal generating unit 22 corresponding to the most significant bit current is expressed as follows:

$$I_{DA1-1}=(I_{ref}+I_{q77b}) \cdot 4-I_{DACb1}-I_{SWb1}-I_{IVCb1}.$$

By approximation, $I_{DACb1}=I_{SWb1}=I_{IVCb1}$, $$I_{q77b} \cdot 4=(3/h_{fe}) \cdot I_{ref} \cdot 4.$$

Therefore, by causing the emitter current of the transistor $Q_{77}$ to be as much as three times the emitter current $I_{ref}$ of the transistor $Q_{71}$, $$I_{DA1-1} \approx I_{ref} 4.$$

Thus, the base current compensation for the transistors through which $I_{DA1-1}$ flows can be performed. By providing the additional current for the number of transistors through which the reference current flows, it is possible to prevent error currents from flowing due to the base currents of the transistors, and prevent a change in characteristics of the transistors from occurring due to the base currents. Thus, base current compensation can be performed easily.

The adjusting, with an external signal, of the reference current of the light emission instruction signal generating unit 222 and the reference current of the adding current setting unit 234 together was described above in the descriptions of the second embodiment.

In addition, for example, when resistors $R_{44}$, $R_{45}$ (shown in FIG. 16) have the same resistance values, a voltage $V_{VREF}$ of the terminal VREF11 is equivalent to a voltage $V_{VCONT}$ of the terminal VCONT. Therefore, the emitter voltage $V_{q71e}$ of the transistor $Q_{79}$ is expressed as follows:

$$V_{q71e} = (V_{VREF11} + V_{VCONT})/2.$$

For example, when the voltage $V_{VREF11}$ is 1 volts and the voltage $V_{CONT}$ is made to vary from 0 to 2 volts, the emitter voltage $V_{q71e}$ of the transistor $Q_{71}$ varies from 0.5 to 1.5 volts.

Figure 33A:
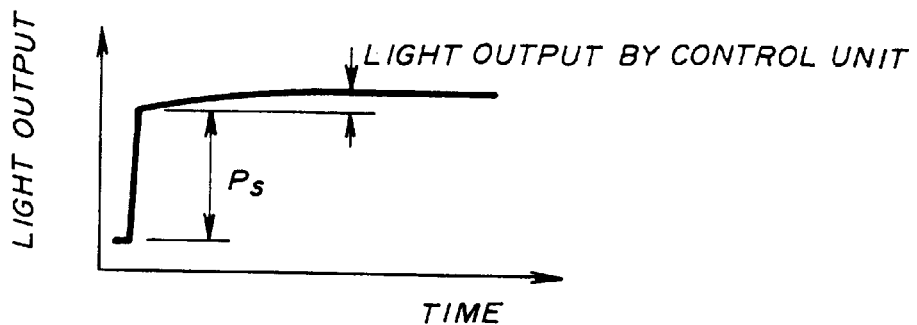
FIGS. 33A, 33B, 33C show characteristic graphs when a current of a light emission instruction signal generating unit and a current of a adding current setting unit are increased together and when a current of the light emission instruction signal generating unit and a current of the adding current setting unit are not increased together.
Figure 33B:
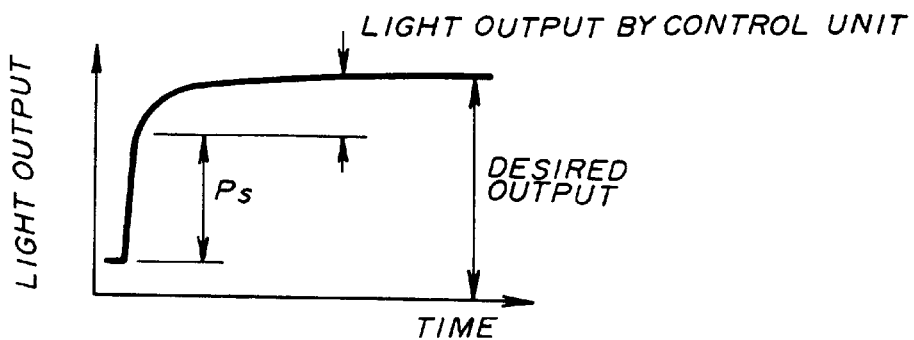
Figure 33C:
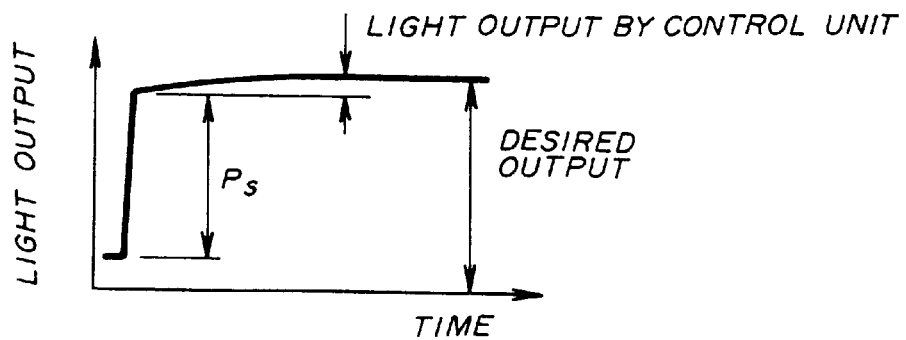

Generally speaking, in a laser printer or the like, a case will now be considered where scanning exposure is performed on a photosensitive element or the like through a polygon mirror or the like by light output of a the semiconductor laser 1. In such a case, due to a change of distance to the photosensitive element and a change of shape of a beam spot formed on the photosensitive element and so forth during scanning exposure, known shading occurs. In order to perform a correction operation so as to eliminate influence of shading (shading correction), it is necessary to slightly adjust light output of the semiconductor laser dynamically, or to perform a slight adjustment when light intensity is set. FIG. 33A shows a light output waveform at an initial state. FIG. 33B, 33C show light output waveforms after the current of the light emission instruction signal generating unit 222 is changed. FIG. 33B shows a case where only the current of the light emission instruction signal generating unit 222 is increased. In contrast to this, FIG. 33C shows a case where the current of the light emission instruction signal generating unit 222 and the current of the adding current setting unit 234 are increased together. In each case, a desired light output is obtained through control by the control system (negative feedback loop 3) finally as a steady state output. However, at a rising time, in the case of FIG. 33B, light output does not rise sharply. In contrast to this, in the case of FIG. 33C, light output rises sharply. In a case where a desired light output is lower than the original light output, when only the current of the light emission instruction signal generating unit 222 is decreased, light output sharply rises at first and overshooting occurs due to the current of the adding current setting unit 234, and then, light output decreased to be the desired output. When both the current of the light emission instruction signal generating unit 222 and adding current setting unit 234 are decreased together, such overshooting can be prevented. In the embodiment of the present invention, both the current of the light emission instruction signal generating unit 222 and adding current setting unit 234 are changed together. Specifically, as mentioned above, by changing the control voltage of the VCONT terminal (shown in FIG. 16), the emitter voltage of the transistor $Q_{71}$ is changed, and thus the reference current of the light emission instruction signal generating unit 222 and the reference current of the adding current setting unit 234 are increased/decreased together. Thereby, when the voltage of the VCONT terminal is changed, a waveform, similar to a rectangular wave, such as that shown in FIG. 33C can be obtained. Thus, the amount of control performed by the control system (negative feedback loop 3) can be reduced, and a quick response can be achieved. Such light output control is performed for the above-mentioned shading correction and the slight adjustment of the semiconductor laser 1 light output for other purposes.

The above-mentioned second starting-up unit 35b will now be described, in relation to the light emission instruction signal generating unit 222. As described above, the emitter voltage $V_{q71e}$ of the transistor $Q_{71}$ (shown in FIG. 16) is an output of the voltage follower 244, and a capacitor $C_3$ controls control speed and stability of the output. However, if, when power supply is started, the power source rises faster than rising of the voltage follower 244, a setting operation in the addition current setting unit 234 and so forth is performed before the emitter voltage of the transistor $Q_{71}$ reaches a predetermined voltage. If so, the semiconductor laser 1 may not provide a predetermined light output. The second starting-up unit 235b acts to solve this problem. Specifically, the second starting-up unit 235b, similar to the first starting-up unit 235a, prevents the timing generating unit 231 from starting through the TDSTART terminals and VPTDSTART terminal, until the emitter voltage of the transistor $Q_{71}$, that is, the voltage of a VR terminal exceeds a predetermined set voltage and thus the voltage follower 244 is made operational. Only when the emitter voltage of the transistor $Q_{71}$ reaches the predetermined set voltage, the second starting-up unit 235b allows the timing generating unit 231 to start through the TDSTART terminals and VPTDSTART terminal. In the starting-up unit 235, the first starting-up unit 235a and second starting-up unit 235b are connected to be logic AND connection. Thereby, only when both the power source voltage Vcc and the current of the light emission instruction signal generating unit 222 are in predetermined conditions, initialization and operations of all the electronic circuits are started.

The light emission instruction signal generating unit 222 will now be described. The light emission instruction signal generating unit 222 includes two 5-bit digital to analog converters connected with one another in parallel. One of the two 5-bit digital to analog converters is shown in FIG. 17 and the other is not shown in the figures. The light emission instruction signal generating unit 222 further includes a current addition driving unit, a current compensation unit for the light emission instruction signal generating unit 222 and an offset current generating unit. Each of the 5-bit digital to analog converter is similar to the 5-bit digital to analog converter of the light emission instruction signal generating unit 222 in the second embodiment. Similarly, the current addition driving unit is the same as the current addition driving unit in the light emission instruction signal generating unit 222 in the second embodiment. Duplicated description will be omitted.

The two 5-bit digital to analog converters have circuit arrangements almost the same as one another. Why the two similar digital to analog converters are provided will now be described. In principle, it is enough to provide only one digital to analog converter. However, by providing two digital to analog converter in parallel, the light emission instruction signal generating unit 222 can be applied for various types of light reception devices 2, the monitor currents PD of which vary, and/or for various types of semiconductor lasers 1. A case will now be considered where only one digital to analog converter is provided and the current of the light emission signal generating unit 222 is changed in a wide range for application to various types of light reception devices 2 and/or various types of semiconductor lasers 1. In such a case, the linearity of the digital to analog converter may be degraded, and/or, an error current may flow. By providing two digital to analog converters, it is possible to reduce a range for which the current of each digital to analog converter should be changed. One of the two digital to analog converters externally outputs the minimum voltage, which determines current sources of the digital to analog converter, via a DA1GND terminal. By causing the DA1GND terminal not to be externally connected, the one digital to analog converter does not work. When it is necessary to have a wider dynamic range, it is possible to provide more than two digital to analog converters in parallel.

The current compensation unit for the light emission instruction signal generating unit 222 will now be described. In the above-described base current compensation, a current is added for compensating base currents which are subtracted from the current $I_{DA1}$. However, in the current compensation unit for the light emission instruction signal generating unit 222, a current which is added to the current $I_{DA1}$ is canceled. In an example of a transistor $Q_1$ shown in FIG. 15, the transistor $Q_1$ draws the base current, and thus, the base current is added to the current $I_{DA1}$. In order to cancel the added current, a current mirror circuit 581 including transistors $Q_{86}$, $Q_{87}$ creates a current which is identical to the base current of a transistor $Q_{85}$, and the created current is caused to flow to the base (PD terminal) of the transistor $Q_1$. In fact, the emitter current of the transistor $Q_1$ is equal to the collector current of the transistor $Q_{85}$ which forms a current source, and therefore the base current of the transistor $Q_{85}$ is approximately the same as the base current of the transistor $Q_1$. As a result, by providing current approximately the same as the base current of the transistor $Q_1$ to flow to the base of the transistor $Q_1$, the base current of the transistor $Q_1$ added to the current $I_{DA1}$ is approximately canceled, and thus compensated.

The current amplification factor of an NPN transistor is referred to as $h_{fen}$, the current amplification factor of an PNP transistor is referred to as $h_{fep}$, the base current of the transistor $Q_1$ is referred to as $i_b$ and the collector current of the transistor $Q_{87}$ is referred to as I. Then, the emitter current $i_1$ of the transistor $Q_1$ is expressed as follows:

$$i_1 = (1+h_{fen}) \cdot i_b.$$

The base current $i_2$ of the transistor $Q_{85}$ is expressed as follows:

$$i_2 = (1+h_{fen}) \cdot i_b / h_{fen}.$$

The current passes through the current mirror circuit 581, and thus the collector current I of the transistor $Q_{87}$ is expressed as follows:

$$I = i_b / \{1+(2/h_{fep})\}.$$

For example, when the current amplification factor $h_{fep}$ is 100, $I \approx 0.98 i_b$. Current error of the current $I_{DA1}$ in a case where no compensation is performed is $i_b$. Therefore, the error is 1/50 as a result of the compensation being performed. By providing a similar circuit arrangement, the base current of a transistor $Q_{83}$ can be similarly compensated.

When it is necessary to improve the accuracy of this compensation, by using a base current compensated current mirror circuit, $$I = i_b / \{1+(2/h_{fep}^2)\}.$$

Thereby, the error is further decreased by the factor 1/50 (in the case where $h_{fep}$ is 100).

Figure 34:
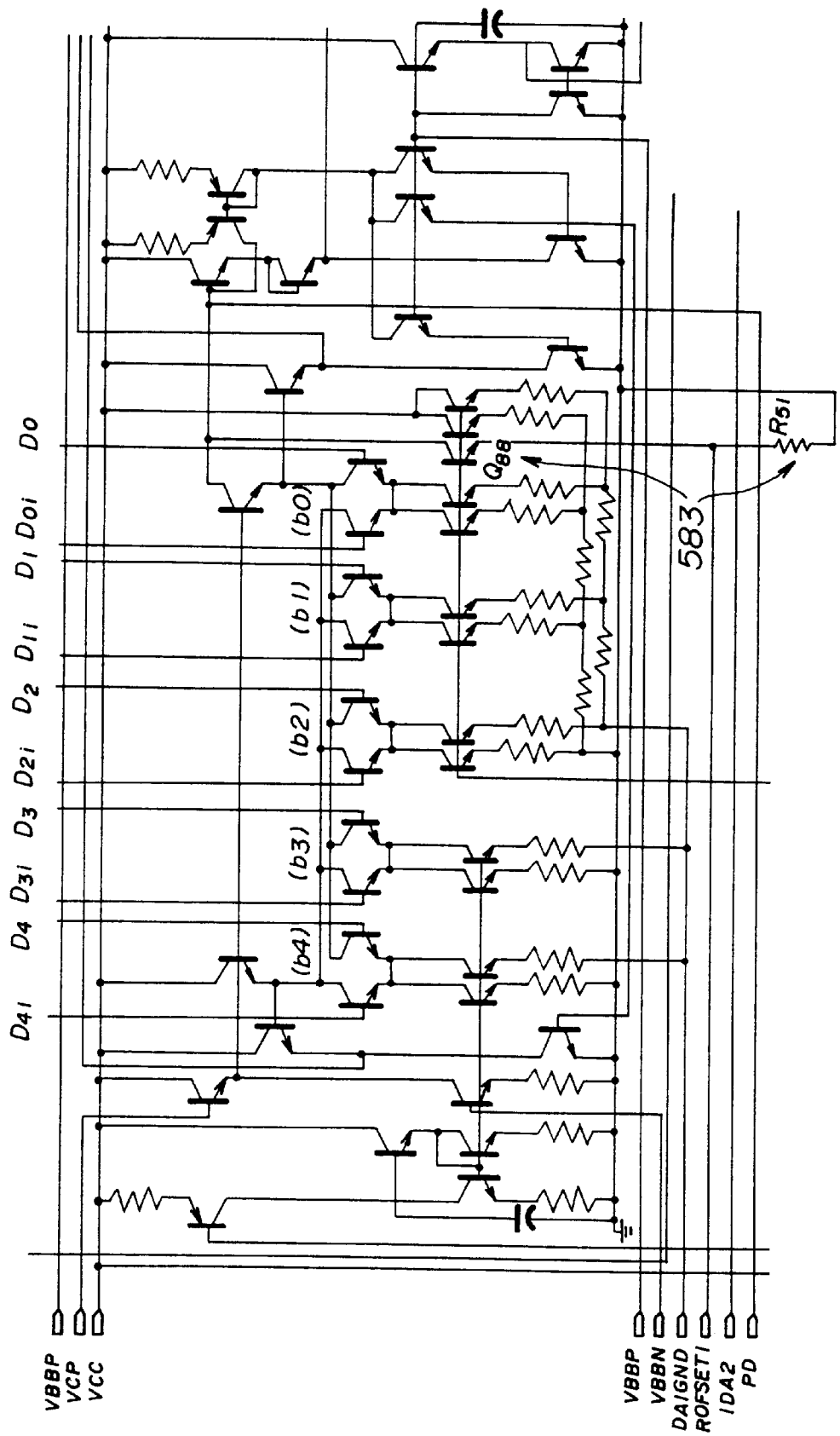
FIG. 34 shows a circuit diagram of a variant embodiment of the light emission instruction signal generating unit.

The above-mentioned offset current generating unit will now be described. As described above, in order to control light output of the semiconductor laser 1 in real time in the negative feedback loop 3, it is not possible to cause light output of the semiconductor laser 1 to be completely 0. Therefore, it is necessary to set a minimum value of light output of the semiconductor laser 1. The offset current generating unit sets the minimum value of light output of the semiconductor laser 1. The offset current generating unit 583 is provided in a light emission instruction signal generating unit 222' as shown in FIG. 34 which is a variant of the above-described light emission instruction signal generating unit 222 and will be described later. Another offset current setting unit 582 is provided in the power source unit 561 shown in FIG. 31. An offset current generated by these offset current generating units 582, 583 is compared with a monitor current of the light reception device 2 at the PD terminal, and thus a forward current of the semiconductor laser 1 is generated through the error amplifier 223. By the forward current, an offset light emission intensity of the semiconductor laser 1 can be set.

The offset current generating unit 582 includes a transistor $Q_{56}$ and a resistor $R_{25}$, and the emitter voltage of the transistor $Q_{56}$ is a stable voltage in the integrated circuit 220 (LSI circuit) as described in the descriptions of the power source unit 561. By providing the resistor $R_{25}$ as an externally connected resistor or a variable resistor, it is possible to externally set a desired current.

The offset current generating unit 583 in the light emission instruction signal generating unit 222' includes a transistor $Q_{88}$ and a resistor $R_{51}$. By providing the resistor $R_{51}$ as an externally connected resistor or a variable resistor, it is possible to externally set a desired current. The base voltage of the transistor $Q_{88}$ is a voltage which is previously set through current setting means (specifically, as described above, the emitter voltage of the transistor $Q_{71}$ and the resistor $R_{41}$ shown in FIG. 16) of the light emission instruction signal generating unit 222 to be appropriate to the monitor current of the light reception device 2 and so forth. Thereby, in a case where the light reception device 2 of a larger monitor current is used, an offset current generated by the offset current generating unit 583 automatically becomes larger. In a case where the light reception device 2 of a smaller monitor current is used, an offset current generated by the offset current generating unit 583 automatically becomes smaller. Thus, the offset current is automatically set according to a previously set condition of the above-mentioned current setting means of the light emission instruction signal generating unit 222. Thus, by setting the maximum current of the light emission instruction signal generating unit 222, the offset current is automatically set.

The final offset current is obtained as the total of the offset currents generated by the offset current generating units 582 and 583. The resistance values of the external resistors $R_{25}$, $R_{51}$ may be previously set to adequate values. Then, it is not necessary to change the set resistance values even if monitor current characteristics of the light reception device 2 varies.

As described above, the offset current is automatically set corresponding to the set condition of the above-mentioned current setting means of the light emission instruction signal generating unit 222, thus an appropriate offset current can be obtained and appropriate offset light output of the semiconductor laser 1 can be obtained, automatically. Thus, an adjustment process can be performed automatically.

In the embodiment, the light emission instruction signal generating unit 222 includes the two digital to analog converters connected in parallel. However, it is also possible that certain components, which are included in each of the two digital to analog converters are to be commonly used. Thus, the variant 222' of the above-described light emission instruction signal generating unit 222, shown in FIG. 34, is obtained. In the circuit arrangement of the light emission instruction signal generating unit (variant) 222' shown in FIG. 34, the certain components which perform identical functions are commonly used. Thereby, the number of components can be effectively reduced.

In the fifth embodiment, almost all of the semiconductor laser control system 213 is formed as the integrated circuit 220 using bipolar transistors. It is also possible that the system is formed as an integrated circuit using C-MOS transistors. It is also possible that the system is formed as an integrated circuit using a combination of bipolar transistors and C-MOS transistors. It is also possible that the system is formed as a non-integrated circuit.

Figure 35:
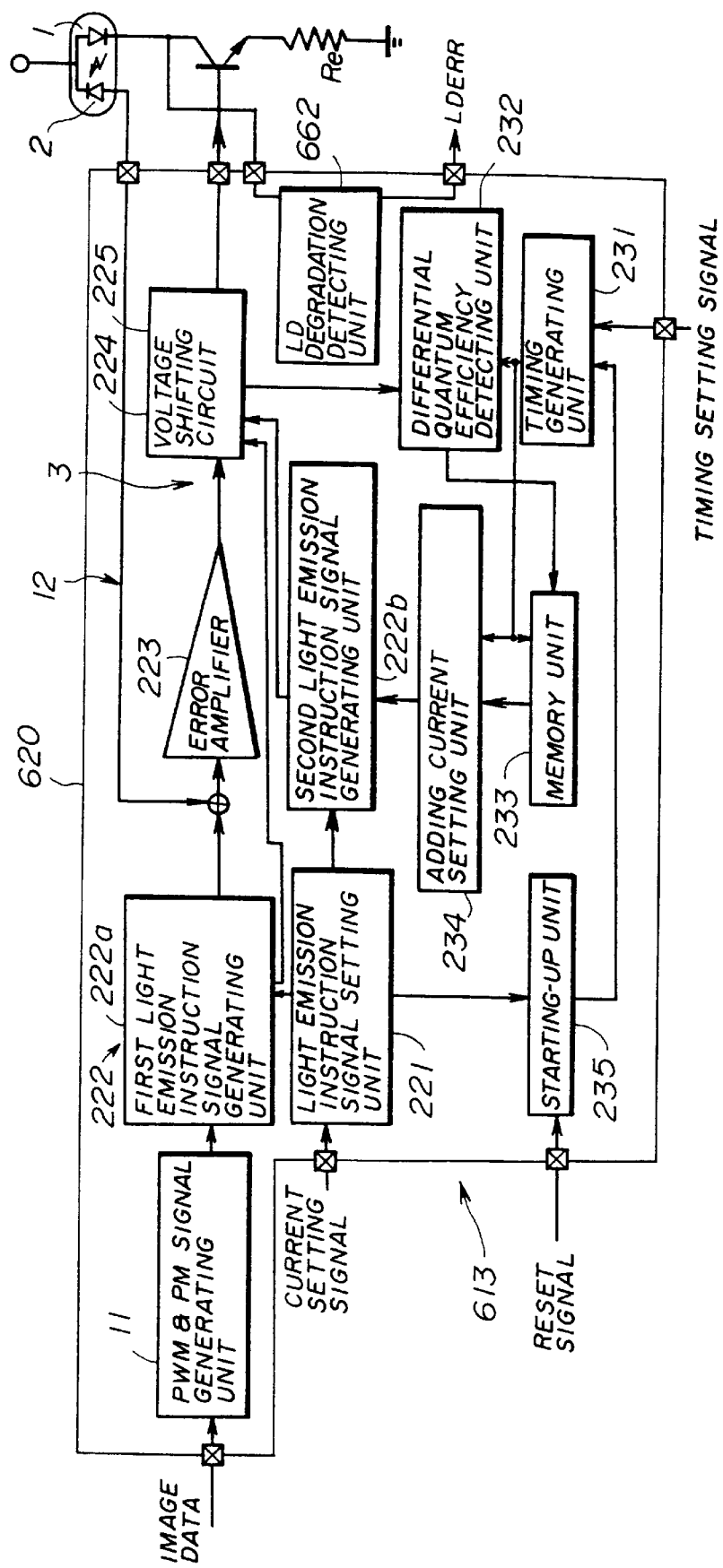
FIG. 35 shows a general block diagram of a sixth embodiment of the present invention.

A sixth embodiment of the present invention will now be described with reference to the drawings. FIG. 35 shows an example of a detailed arrangement of the semiconductor laser control system in the sixth embodiment. The sixth embodiment is similar to the fifth embodiment described above. The same reference numerals are given to blocks of the sixth embodiment which are substantially identical to those of the fifth embodiment. Duplicated descriptions will be omitted.

Figure 9:
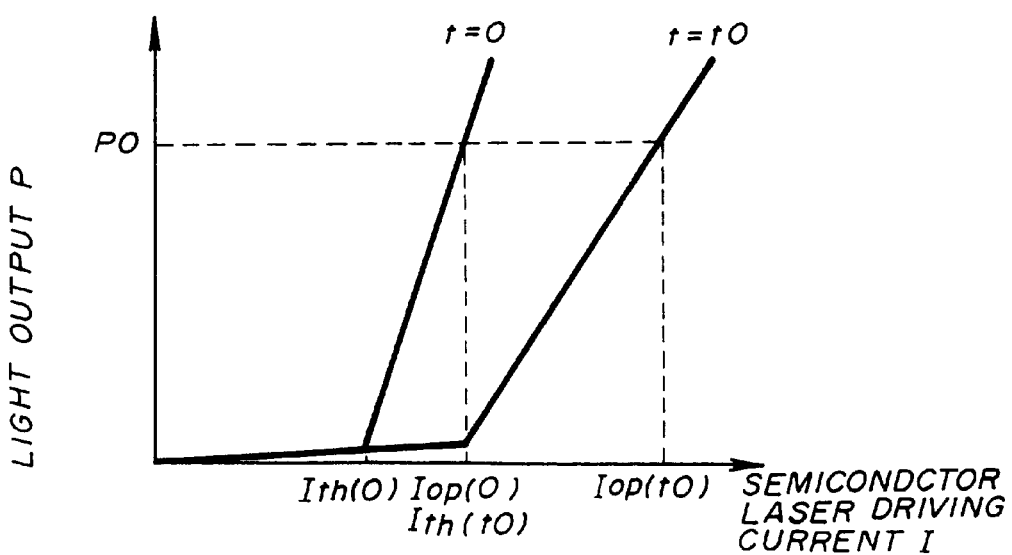
FIG. 9 is a characteristics graph showing operation current change characteristics due to elapsing time of use.

As common characteristics of a semiconductor laser such as the semiconductor laser 1, there is a change of the operation current due to a change of temperature, a change (degradation) of the operation current and the differential quantum efficiency due to elapsing time. FIG. 9 shows a change (degradation) of the operation current and the differential quantum efficiency due to elapsing time. When the time t=0, the operation current Iop(0) is required for driving the semiconductor laser 1 and causing the semiconductor laser 1 to emit a light output P0. When the time t=t0, that is, after the time t0 has elapsed, the operation current Iop(t0) is required for driving the semiconductor laser 1 and causing the semiconductor laser 1 to emit the same light output P0. With regard to a change of the operation current, by causing the negative feedback loop 3 to always operate, even if the oscillation threshold current Ith changes due to a change of temperature, the control system (negative feedback loop 3 follows the change, and the control system always causes the oscillation threshold current to flow through the semiconductor laser 1 as a forward current. In order for the negative feedback loop 3 to always operate, light output of the semiconductor laser 1 is not completely 0. It is necessary for the semiconductor laser 1 to provide a slight light output, that is, to perform offset light emission. Actually, light output of the semiconductor laser is controlled between a set maximum light emission and the offset light emission by the negative feedback loop 3.

When the semiconductor laser 1 is degraded as shown in FIG. 9 due to elapse of time, in a case where the degradation is not serious, the degradation is detected and an appropriate current setting is performed to compensate the degradation.

Figure 36:
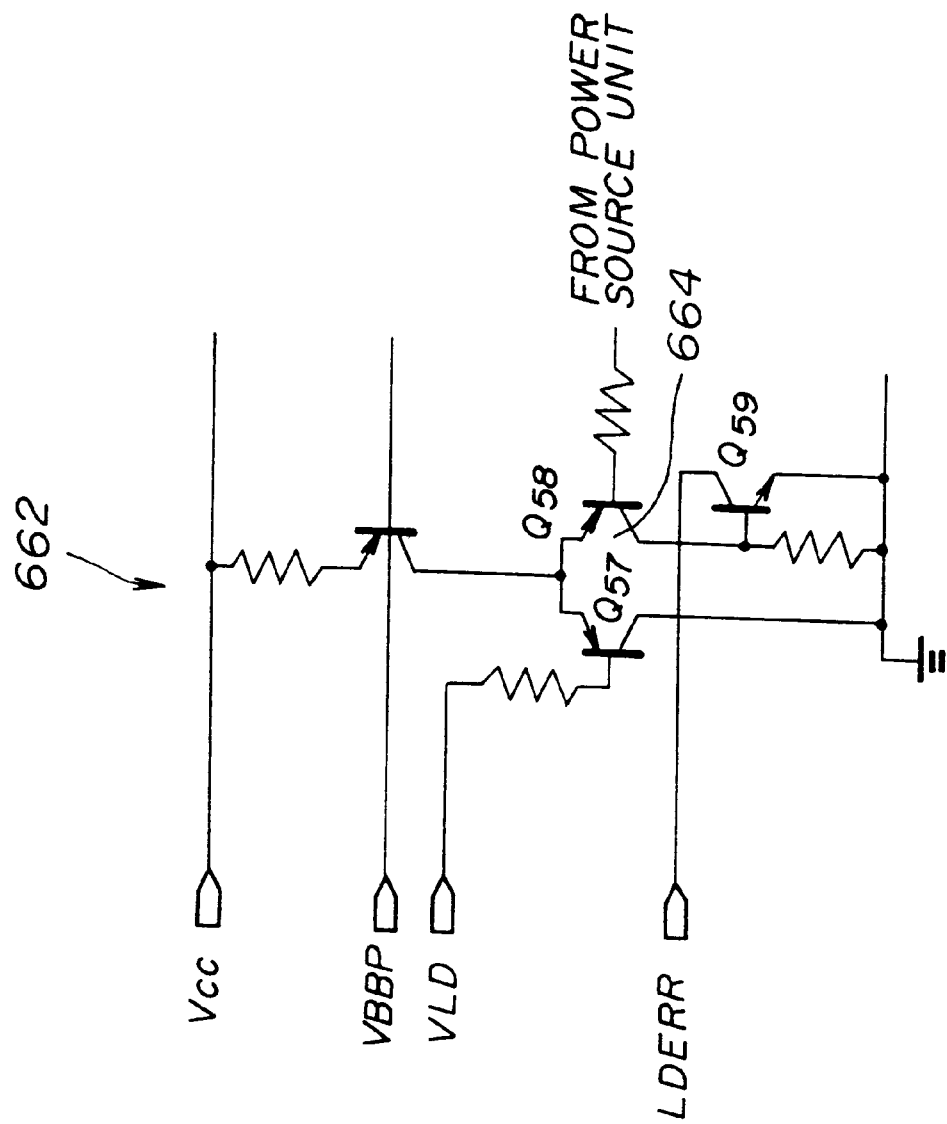
FIG. 36 shows a circuit diagram of an example arrangement of a semiconductor degradation detecting unit shown in FIG. 35.

Such an operation was described above as the detection of the differential quantum efficiency and voltage shifting amount is set according to a result of the detection, with reference to FIG. 24 (time charts). However, if the degradation is serious and an excessive current flows through the semiconductor laser 1 driving circuit, it is necessary to stop operation of the semiconductor laser control system so as to protect the integrated circuit 220 (LSI circuit). For this purpose, a semiconductor laser degradation detecting unit 662 is provided as shown in FIG. 35. FIG. 36 shows an example of a circuit arrangement using bipolar transistors in the semiconductor laser degradation detecting unit 662. In this circuit arrangement, a voltage VLD of the LD terminal is always monitored, and when the voltage VLD exceeds a certain reference voltage, an error signal is output from an error terminal LDERR. In the circuit shown in the figure, transistors $Q_{57}$, $Q_{58}$ form a differential switch 664. The certain reference voltage which is applied to the base of the transistor $Q_{58}$ is generated in the power source unit 561 shown in FIG. 31. When the voltage VLD of the LD terminal exceeds the reference voltage, the transistor $Q_{58}$ turns on, and as a result, a current is drawn to the collector of a transistor $Q_{59}$ via an LDERR terminal. Thus, an open collector output is provided.

When the semiconductor laser 1 is degraded or some other trouble occurs therein, the semiconductor laser 1 provides excess light output, and the voltage VLD of the LD terminal excessively increases. The semiconductor laser degradation detecting unit 662 detects the increased voltage and outputs the error signal. Thereby, the semiconductor laser control system is not used in this condition, and further serious trouble can be prevented from occurring.

In the starting-up circuit 235 shown in FIG. 32, the base of a transistor $Q_{64}$ which is connected to the base of a transistor $Q_{61}$ is connected to a reset terminal RESET. The transistor $Q_{64}$ turns on or off according to a reset signal which is a control signal and is given to the reset terminal RESET externally. When the reset signal is given to the reset terminal REST, the transistor $Q_{64}$ turns on, and, the above-described starting up operation of the starting-up unit 235a is discontinued, and the initialization operation of the integrated circuit 620 is forcibly performed. Thereby, the initialization operation of the integrated circuit 620 can be performed at any time. Therefore, protection of the semiconductor laser 1 can be positively performed.

Figure 37:
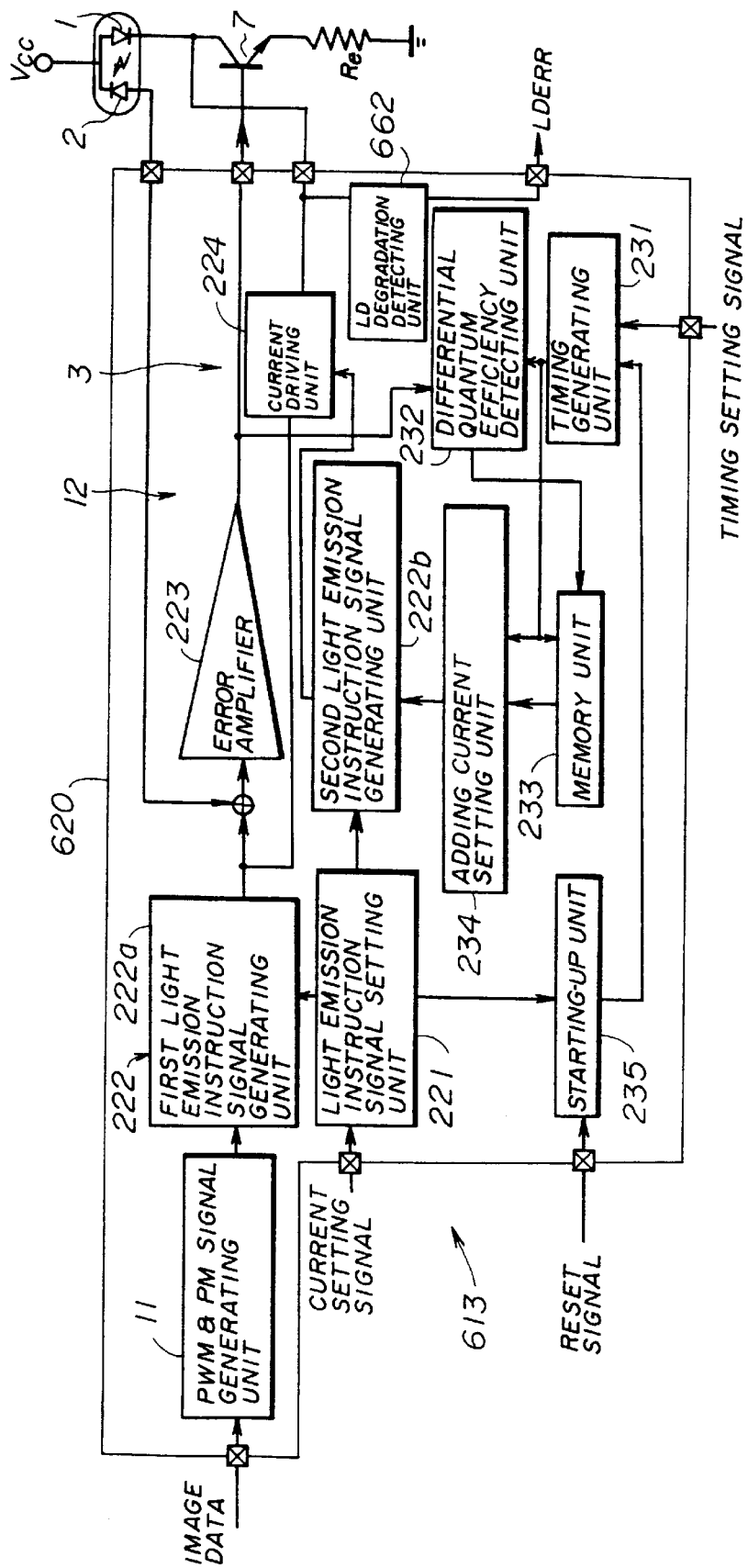
FIG. 37 shows a block diagram of a variant embodiment of the sixth embodiment.

In the embodiment, the current driving unit 224 is incorporated in the error amplifier 223 provided in the path of the negative feedback loop 3, as the voltage shifting unit 225, as shown in FIG. 15. However, as shown in FIG. 37, it is also possible to provide the current driving unit 224 in a path separate from the negative feedback loop 3.

Further, in the sixth embodiment, almost all of the semiconductor laser control system 613 is formed as an integrated circuit 620 using bipolar transistors. It is also possible that the system is formed as an integrated circuit using C-MOS transistors. It is also possible that the system is formed as an integrated circuit using a combination of bipolar transistors and C-MOS transistors. It is also possible that the system is formed as a non-integrated circuit.

A semiconductor laser control system in a seventh embodiment of the present invention is used, in a laser printer or the like, as a control system including the negative feedback loop which controls light output of the semiconductor laser, the light output being used for optical writing. A basic configuration and function of the semiconductor laser control system is the same as the semiconductor laser control system in the related art shown in FIG. 3. Image data and pixel clock signal are input to the pulse width generating unit and data modulation unit 11 which outputs a light emission instruction signal. The light reception device 2 monitors light output of the semiconductor laser 1. The semiconductor laser 1 and light reception device 2 are connected with the semiconductor laser control unit and semiconductor laser driving unit 12. The light emission instruction signal generated by the pulse width generating unit and data modulation unit 11 is given to the semiconductor laser control unit and semiconductor laser driving unit 12.

As in the above-described embodiments, the pulse width and intensity combined modulation method is used for obtain multiple tone levels in one dot. Specifically, according to input image data, the pulse width generating unit and data modulation unit 11 performs basically the PWM method and also performs the PM method for compensating for a change of pulse width.

The basic concept of the pulse width and intensity combined modulation method was described above with reference to FIGS. 4, 5A and 5B. Duplicated descriptions will be omitted.

An example of an arrangement, functions and advantages of the semiconductor laser control unit and semiconductor laser driving unit 12 are substantially the same as those which were described with reference to FIGS. 1, 2A and 2B. Duplicated descriptions thereof will be omitted.

Figure 38:
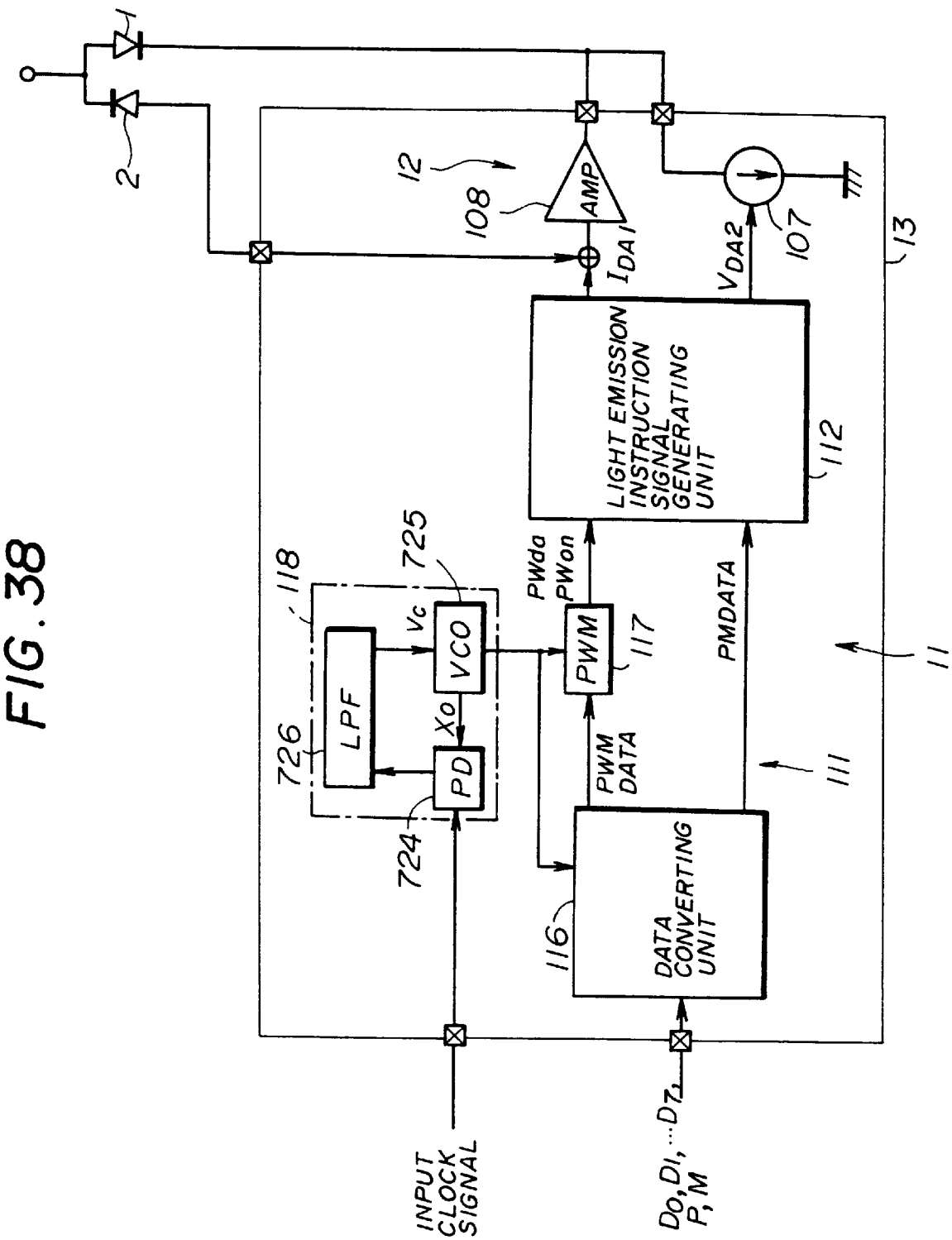
FIG. 38 shows a block diagram of a basic arrangement of seventh, eighth, ninth and tenth embodiments of the present invention.

FIG. 38 shows a specific block arrangement of the semiconductor laser control system in the seventh embodiment. The semiconductor laser control system in the seventh embodiment is similar to the semiconductor laser control system in the first embodiment. In fact, the block arrangement of the seventh embodiment shown in FIG. 38 is similar to the block arrangement of the first embodiment shown in FIG. 10. The same reference numerals are given to components which correspond to those of the first embodiment. Duplicated descriptions will be described.

The specific arrangement and functions of the pulse width generating unit and data modulation unit 11 are substantially the same as those of the first embodiment. Duplicated descriptions will be omitted.

The arrangement and functions of the light emission instruction signal generating unit 112 are substantially the same as those of the light emission instruction signal generating unit 422 of the fourth embodiment. Descriptions thereof were provided with reference to FIGS. 29A, 29B and 29C. Duplicated descriptions will be omitted.

The pulse width modulation and intensity modulation signal generating unit 11 includes a data converting unit 116 which is data converting means, a pulse width modulation unit 117 which is pulse width modulating means and a pulse generating unit 118 which includes PLL and is pulse generating means. The data converting unit 116, pulse width modulation unit 117 and pulse generating unit 118 are substantially the same as the data converting unit 463, pulse width modulation unit 464 and pulse generating unit 462 of the fourth embodiment shown in FIG. 28. Duplicated descriptions will be omitted. The pulse generating unit 118 includes a phase frequency comparator (PD) 624, a voltage controlled oscillator (VCO) 725 and a lowpass filter (LPF) 726.

Logic of obtaining a light output waveform such as that shown in FIG. 5A, for example, is the same as described above with reference to the equations (1), (2) and (3) in the descriptions of the first embodiment. Duplicated descriptions will be omitted.

Specific arrangements and functions of the data converting unit 116 and pulse width modulation unit 117 are substantially the same as those of the data converting unit 116 and pulse width modulation unit 117 in the first embodiment shown in FIG. 12A. Duplicated descriptions will be omitted.

The pulse width modulation unit 117 can be formed by a combination of AND, OR gates which perform logic operations on a plurality of pulses provided by the pulse generating unit 118, and can be easily formed by a logic circuit arrangement.

For the sake of simplification of equations, for example, the first equation of the equations (2) is expressed as the following equation (4):

$$X_n = X_i D_{ni}, \qquad (4)$$

where $$X_i = (X_5, X_6, X_7, X_8), \qquad (5)$$
$$D_{ni} = (\overline{D_{n1} D_{n2}}, D_{n1}\overline{D_{n2}}, \overline{D_{n1}} D_{n2}, D_{n1} D_{n2}).$$

Further, $x_n$, $X_m$, $X_n'$, $X_m'$ may be produced as follows:

$$\begin{aligned}
X_n &= X_i D_{ni}, & X_i &= (X_5, X_6, X_7, X_H), \\
X_m &= X_j D_{mj}, & X_j &= (X_1, X_2, X_3, X_H), \\
X_n' &= X_i' D_{ni}', & X_i' &= (X_L, X_5, X_6, X_7, X_H), \\
X_m' &= X_j' D_{mj}', & X_j' &= (X_L, X_1, X_2, X_3).
\end{aligned} \qquad (6)$$

Therein, $X_H$ and $X_L$ are signals which always have the H level and L level, respectively. By substituting $X_H$ or $X_L$ for $X_0$, $X_4$ in the equations (2), linearity of the signal can be improved. This is because, for example, when $X_0$ is selected as being $X_n$, the equations (1) include the terms, $X_0 \cdot X_0$. As a result, rising and decaying coincide. The resulting rising and decaying are delayed in comparison to other cases. Accordingly, when the clock signal is of a high frequency, linearity of produced pulse widths is degraded.

The above-shown equations (1), (2) and (3) indicate logic equations for obtaining a waveform in which a pulse width starts from the left side such as that shown in FIG. 5A at the top. However, when the pulse width modulation unit 117 and the data converting unit 116 are configured so as to perform a logic operation shown in the following equations (7), (8) and (9), one of a waveform in which a pulse width starts from the left side (such as that shown in FIG. 5A) and a waveform in which a pulse width starts from the right side (such as that shown in FIG. 5B) can be selected by using input position control data P.

$$PW_{da} = X_0(X_n \cdot D_{n3} + X_n' \cdot \overline{D_{n3}}) + \overline{X_0}(X_m \cdot D_{m3} + X_m' \cdot \overline{D_{m3}}), \qquad (7)$$
$$PW_{on} = X_0(X_n \cdot \overline{D_{n3}} + X_n' \cdot D_{n3}) + \overline{X_0}(X_m \cdot \overline{D_{m3}} + X_m' \cdot D_{m3}).$$

$$X_n = X_i D_{ni} D_{n3} D_{n4} + \overline{X_i D_{ni} D_{n3} D_{n4}} + D_{n3} D_{n4}, \qquad (8)$$
$$X_i = (X_5, X_6, X_7, X_H),$$
$$D_{ni} = (\overline{D_{n1} D_{n2}}, D_{n1}\overline{D_{n2}}, \overline{D_{n1}} D_{n2}, D_{n1} D_{n2});$$
$$X_m = X_j D_{mj} D_{m3} D_{m4} + X_j D_{mj} D_{m3} D_{m4} + D_{m3} D_{m4},$$
$$X_j = (X_1, X_2, X_3, X_H),$$
$$D_{mj} = (\overline{D_{m1} D_{m2}}, D_{m1}\overline{D_{m2}}, \overline{D_{m1}} D_{m2}, D_{m1} D_{m2});$$
$$X_n' = X_i' D_{ni} D_{n3} D_{n4} + \overline{X_i' D_{ni} D_{n3} D_{n4}} + D_{n3}\overline{D_{n4}},$$
$$X_i' = (X_L, X_5, X_6, X_7);$$
$$X_m' = X_j' D_{mj} D_{m3} D_{m4} + \overline{X_j' D_{mj} D_{m3} D_{m4}} + \overline{D_{m3}} D_{m4},$$
$$X_j' = (X_L, X_1, X_2, X_3).$$

-continued $$D_{n1} = PD_5 + \overline{PD_5}, \quad D_{n2} = PD_6 + \overline{PD_6}, \quad (9)$$
$$D_{n3} = P, \quad D_{n4} = \overline{D_7}$$
$$D_{m1} = PD_5 = \overline{PD_5}, \quad D_{m2} = PD_6 + \overline{PD_6},$$
$$D_{m3} = P, \quad D_{m4} = \overline{D_7}.$$

Thus, dot position control (that is, whether a waveform in which a pulse width starts from the left side (such as that shown in FIG. 5A) or a waveform in which a pulse width starts from the right side (such as that shown in FIG. 5B) is selected) can be performed for each dot. By alternately repeating a waveform in which a pulse width starts from the left side and a waveform in which a pulse width starts from the right side, dot concentration pulse width modulation can be performed. The pulses $PW_{on}$, $PW_{da}$ have a relationship such that a pulse $PW_{on}$ is always shorter than a pulse $PW_{da}$ by the minimum pulse width. Therefore, part of the modulation data is common and it is assumed that $D_{ni}=D_{ni}'$, $D_{mj}=D_{mj}'$. Accordingly, for example, in FIG. 12A, the logic units 28, 30 can be omitted, the number of components of the data converting unit 116 can be reduced, and the number of data lines to the pulse width modulation unit 117 can be reduced.

Figure 12B:
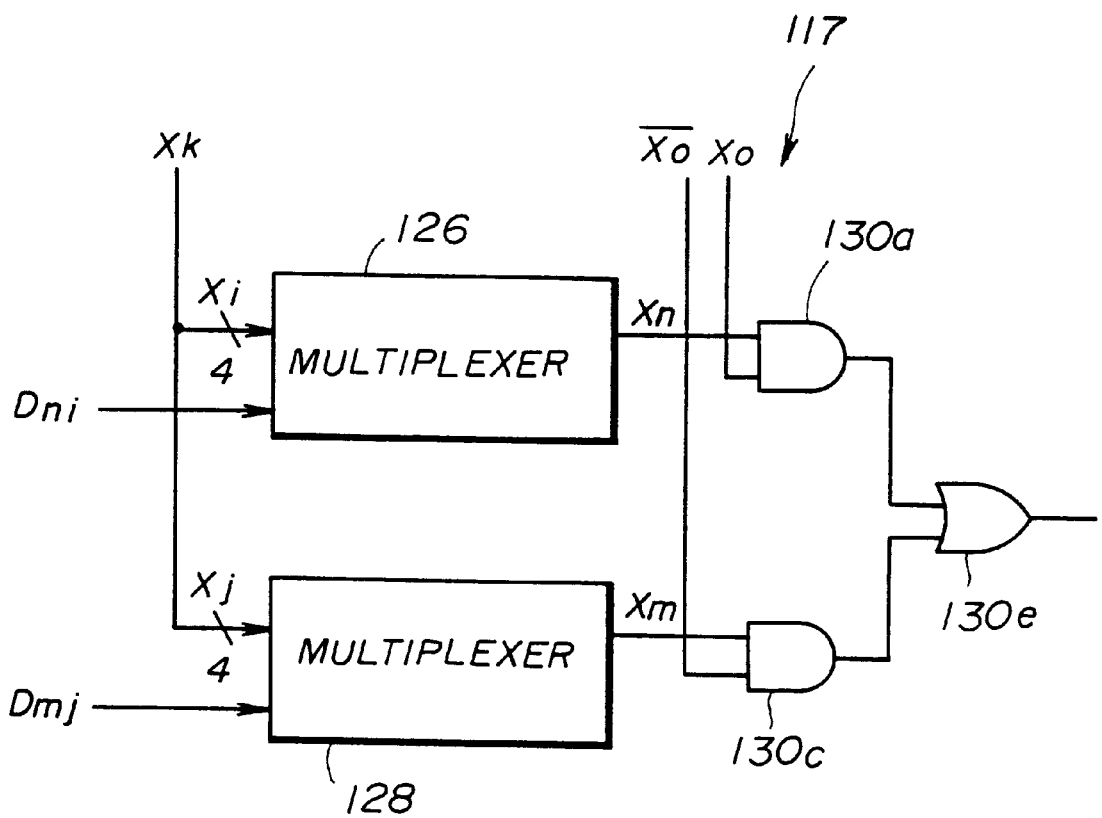
FIG. 12B shows a block diagram resulting from partially rewriting a circuit diagram of the pulse width modulation unit.

The arrangement of the pulse width modulation unit 117 will now be considered with reference to FIG. 12B which is obtained as a result of partially rewriting the arrangement of the unit 117. In the arrangement shown in FIG. 12B, the multiplexers 130a, 130c select pulses $X_n$, $X_m$ from pulses $X_i$, $X_j$ provided by the pulse generating unit 118 based on pulse width modulation data $D_{ni}$, $D_{mj}$, respectively. The output $X_n$ from the multiplexer 126 and the internal clock $X_0$ are input to the AND (logical multiplication) gate 130a. The output $X_m$ from the multiplexer 128 and the inverted internal clock $\overline{X}_0$ are input to the AND (logic multiplication) gate 130c. The outputs of the AND gates 130a, 130c are input to the OR (logic sum) gate 130e. A number n of such arrangement units are provided. In the case of FIG. 12A, 2 such arrangements are provided. In the pulse width modulation unit 117 in which such an arrangement unit is used as a base, $X_n$, $X_m$ are selected independently. Therefore, the circuit arrangement the same as that used in the case of an equal mode (described later) can also be used in the case of double mode (described later). Thus, such an arrangement of the pulse width modulation unit 117 is advantageous.

In the seventh embodiment, output modes which have different writing frequencies can be selected. That is, for example, for image data such as that of a photographic image, which needs multiple tone levels for one dot, the above-described pulse width and intensity combined modulation method is used and writing is performed at a speed equal to that of an input clock signal (such a writing or output mode will be referred to as "equal mode"). However, for image data such as character image, which needs higher writing density than multiple tone levels for one dot, writing frequency is increased to, for example, double that of an input clock signal (such a writing mode will be referred to as "double mode"). One of these two writing modes can be selected. For this purpose, a frequency selecting signal M for selecting output modes is input to the data converting unit 116 of the pulse width modulation and intensity modulation signal generating unit 111 shown in FIG. 12A. The signal M is equal to 1 when the pixel writing clock frequency is equal to the input clock frequency, and the signal M is equal to 0 when the pixel writing clock frequency is double that of the input clock frequency.

Figure 39:
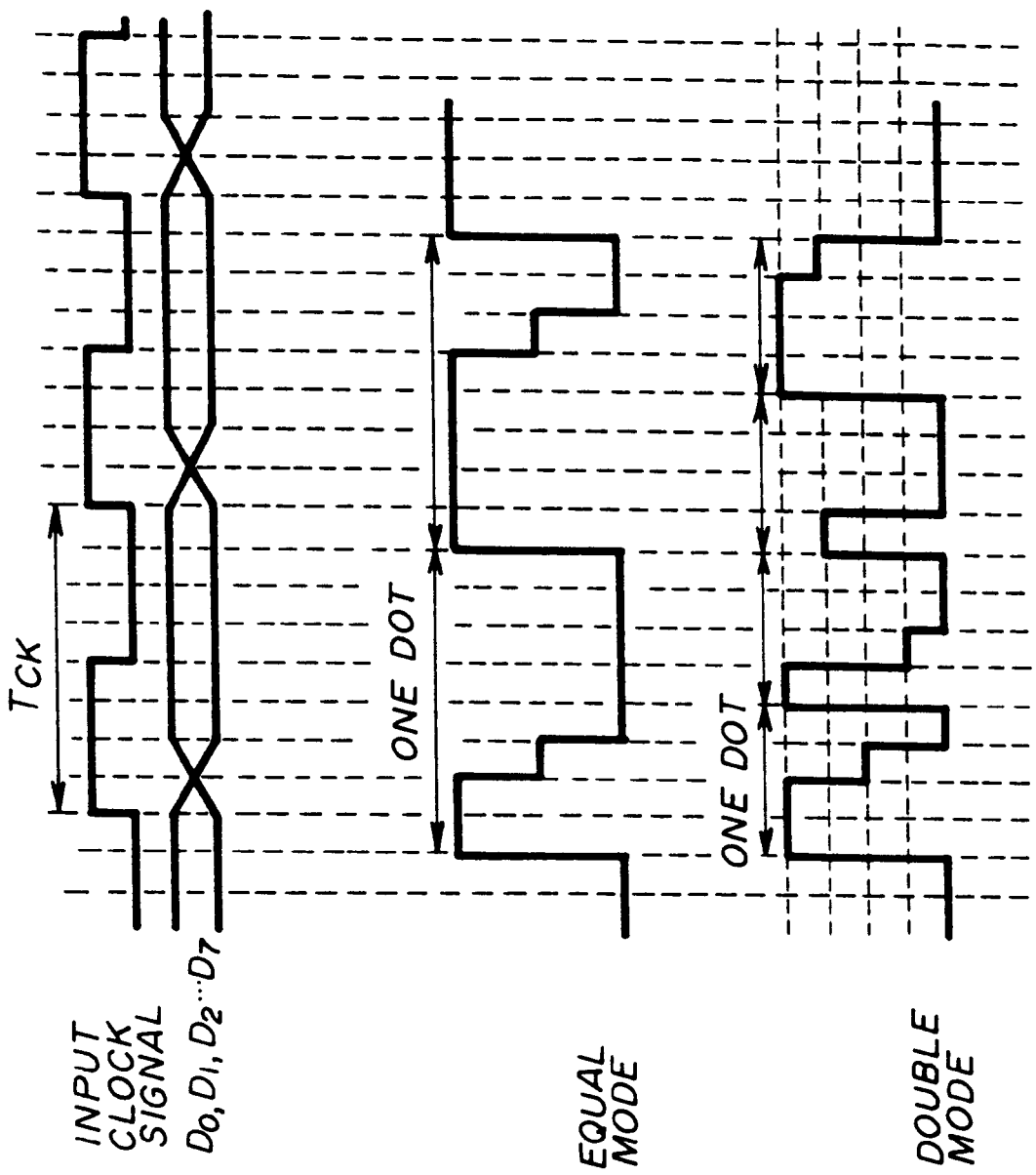
FIGS. 39A, 39B, 39C show time charts showing cases where a writing clock frequency is changed.

FIGS. 39A, B and C show a basic concept of light output waveforms when the pixel writing clock frequency is changed. FIG. 39B shows an example of a light output waveform in the case where the pixel writing clock frequency is the same as the input clock frequency (the period: $T_{CK}$). According to the above-described pulse width and intensity combined modulation method in one dot, pulse width modulation uses 3 bits, and intensity modulation uses 5 bits, and a 8-bit tone is obtained on the other hand, FIG. 39C shows an example of a light output waveform when the pixel writing clock frequency is double that of the input clock frequency, that is, the period is ½. In this double mode, a 4-bit (pulse width modulation using 2 bits and intensity modulation using 2 bit) tone for one dot is obtained. Thus, the number of the available tone levels is reduced. However, image writing density in a main scanning direction can be double. In this case, in addition to doubling the pixel writing clock frequency, the scanning rate of a laser beam emitted by the semiconductor laser 1, for example, the rotation speed of a polygon mirror is doubled, and the line velocity of a rotating photosensitive body is doubled. Thereby, the writing speed is increased to be doubled.

As shown in the time charts FIGS. 39A, 39B, 39C, in the equal mode in which the pixel writing clock frequency is equal to the input clock frequency, an N-bit tone (pulse width modulation using M bits and intensity modulation using (N–M) bits) for one dot is obtained. In the double mode in which the pixel writing clock frequency is double that of the input clock frequency, an N/2-bit tone (pulse width modulation using M–1 bits and intensity modulation using (N/2–M+1) bits) for one dot is obtained. Thus, the number of image data input terminals can be the same. That is, in the double mode, image data for two dots is input in parallel. Production by the converting unit 116 of modulation data according to the frequency selecting signal M enables common use of the pulse width modulation unit 117 because the minimum pulse width is also common as shown in FIGS. 39B, 39C. Thus, the above-described processing can be achieved by use of the circuit shown in FIG. 12A, the frequency selecting signal is input to the data converting unit 116 as mentioned above, and, in the double mode, $D_{ni}$, $D_{mj}$ are produced as respective dot modulation data.

It is assumed that the data converting unit 116 shown in FIG. 12A is configured to perform a logic operation of the equations (10) shown below, and thus the data converting unit 116 acts as mode change-over means. In the example of the equation (10), in the double mode, the first dot is written in accordance with the more significant four bits ($D_7$, $D_6$, $D_5$, $D_4$) of input image data $D_7$ to $D_0$ and the second dot is written in accordance with the less significant four bits ($D_3$, $D_2$, $D_1$, $D_0$). Further, intensity modulation data is obtained as a result of performing a logic operation in the equation (11) shown below.

$$D_{n1} = M(PD_5 + \overline{PD_5}) + \overline{M}D_6, \quad (10)$$
$$D_{n2} = M(PD_6 + \overline{PD_6}) + \overline{M}D_7,$$
$$D_{n3} = MP + \overline{M},$$
$$D_{n4} = M\overline{D_7} + M,$$
$$D_{m1} = M(PD_5 + \overline{PD_5}) + \overline{M}D_2,$$
$$D_{m2} = M(PD_6 + \overline{PD_6}) + \overline{M}D_3,$$
$$D_{m3} = MP + \overline{M},$$
$$D_{m4} = MD_7 + \overline{M}.$$

-continued $$D_{pk} = MD_k + \overline{M}(X_0D_4 + \overline{X_0}D_0) \quad (k = 0, \cdots, 3), \quad (11)$$
$$D_{p4} = MD_4 + \overline{M}(X_0D_5 + \overline{X_0}D_1).$$

The pulse width modulation unit 117 (shown in FIG. 12A) can be commonly used when the pixel writing clock frequency varies, and thus performs the logic operation of the above-shown equations (7) and (8). By substituting the equations (12), (13), shown below, for the equations (10), (11), even when the pixel writing clock frequency is doubled, one of a waveform in which a pulse width starts from the left side and a waveform in which a pulse width starts from the right side is selected for each dot.

$$D_{n1} = M(PD_5 + \overline{PD_5}) + \overline{M}(D_7D_4 + \overline{D_7D_4}), \quad (12)$$
$$D_{n2} = M(PD_6 + \overline{PD_6}) + \overline{M}(D_7D_5 + \overline{D_7D_5}),$$
$$D_{n3} = MP + \overline{M}(D_7 + \overline{D_7}D_6),$$
$$D_{n4} = M\overline{D_7} + \overline{M}D_7\overline{D_6},$$
$$D_{m1} = M(PD_5 + \overline{PD_5}) + \overline{M}(D_3D_0 + \overline{D_3D_0}),$$
$$D_{m2} = M(PD_6 + \overline{PD_6}) + \overline{M}(D_3D_1 + \overline{D_3D_1}),$$
$$D_{m3} = MP + \overline{M}(D_3 + \overline{D_3}D_2),$$
$$D_{m4} = MD_7 + \overline{M}D_3\overline{D_2}.$$

$$D_{pk} = MD_k \quad (k = 0, \cdots, 4). \quad (13)$$

Specifically, when the pixel writing clock frequency is doubled, one bit (in this case, $D_7$) of the more significant four bits is used as position control (whether a waveform in which a pulse width starts from the left side or a waveform in which a pulse width starts from the right side) data, and the remaining three bits are used for pulse width modulation (5-value output, 0 to 4). Similarly, one bit (in this case, $D_3$) of the less significant four bits is used as position control data, and the remaining three bits are used for the pulse width modulation. Further, when M=0 (that is, when double mode is selected), all of the intensity modulation data is at the L level.

Generally, when an input data series is an N-bit image data series, the number of tone levels which can be output is $2^N$. Therefore, one or several levels are still needed to complete the $2^N+1$ output states, $0/2^N$ to $2^N/2^N$. When one bit is added as the position control (whether a waveform in which a pulse width starts from the left side or a waveform in which a pulse width starts from the right side) signal, $2^N$ tone output is obtained for each modes of a mode in which a pulse width starts from the left side and a mode in which a pulse width starts from the right side. In this case, one state is still needed in each mode to obtain the complete output states. In order to obtain $2^N+1$ tone completely, N+1 bits are needed as image data and one bit is needed as the position control signal. However, each of the full turning off output state (that is, one dot full turning off: $0/2^N$) and the full turning on output state (that is, one dot full turning on: $2^N/2^N$) is common between a waveform in which a pulse width starts from the left side and a waveform in which a pulse width starts from the right side. Therefore, when the full OFF state, full ON state, states of a waveform in which a pulse width starts from the left side and a waveform in which a pulse width starts from the right side of middle levels $\frac{1}{2}^N$ to $(2^N-1)/2^N$ are output. The number of the states of a waveform in which a pulse width starts from the left side and a waveform in which a pulse width starts from the right side of $\frac{1}{2}^N$ to $(2^N-1)/2^N$ is $2 \cdot (2^N-1)$. Accordingly, output of the total $2^{N+1}$ states enables output of $2^N+1$ tone output including the position control (whether a waveform in which a pulse width starts from the left side or a waveform in which a pulse width starts from the right side) from the data series of N+1 bits.

For example, the data series is assumed to be a 4-bit data series, and it is also assumed that 9-level tone is obtained. That is, nine values, 0/8 to 8/8 are obtained, and a total of 16 states are obtained, 0/8 (always turning off), 8/8 (always turning on), ⅛ to ⅞ for each of a waveforms in which a pulse width starts from the left side and a waveform in which a pulse width starts from the right side. In order to achieve this output, the following truth table is used.

| D7 | D6 | D5 | D4 | OUTPUT STATE | D7 | D6 | D5 | D4 | OUTPUT STATE |
| D3 | D2 | D1 | D0 |  | D3 | D2 | D1 | D0 |  |
|---|---|---|---|---|---|---|---|---|---|
| 0 | 0 | 0 | 0 | 0 | 1 | 0 | 0 | 0 | LEFT 1 |
| 0 | 0 | 0 | 1 | RIGHT 1 | 1 | 0 | 0 | 1 | LEFT 2 |
| 0 | 0 | 1 | 0 | RIGHT 2 | 1 | 0 | 1 | 0 | LEFT 3 |
| 0 | 0 | 1 | 1 | RIGHT 3 | 1 | 0 | 1 | 1 | LEFT 4 |
| 0 | 1 | 0 | 0 | RIGHT 4 | 1 | 1 | 0 | 0 | LEFT 5 |
| 0 | 1 | 0 | 1 | RIGHT 5 | 1 | 1 | 0 | 1 | LEFT 6 |
| 0 | 1 | 1 | 0 | RIGHT 6 | 1 | 1 | 1 | 0 | LEFT 7 |
| 0 | 1 | 1 | 1 | RIGHT 7 | 1 | 1 | 1 | 1 | 8 |

Input of such data series and use of such a logic enables output of a desired tone level number with the input data series of the number of bits which is short of one bit. Thereby, an input data transfer rate can be reduced and the number of input terminals can be reduced. Further, the number of buffer memories which are generally provided before the data converting unit 116 can be reduced. In another view point, when the number of input data lines is fixed, by using such data series and such logic, the tone level number can be effectively increased. This method is advantageous especially when the number of bits allocated for one dot is not large.

Specifically, a case will now be considered, where the pixel writing clock frequency is doubled, and the input data series includes the more significant four bits and the less significant four bits which represent a 9-level tone including dot position control (whether a waveform in which a pulse width starts from the left side or a waveform in which a pulse width starts from the right side) for each dot (see the above-shown truth table). In such a case, without increasing the number of input data lines, the number of tone levels can be increased and thus high quality images can be obtained.

For this purpose, the equations (14), (15), (16) shown below are substituted for the above-shown equations (7), (12), (13). In the equations (14), $X_n$, $X_n'$, $X_m$, $X_m'$ are in accordance with the above-shown equations (8). Further, when M=0, all of the intensity modulation data $D_{pk}$ is at the L level except $D_{p4}$ which is at the H level.

$$PW_{da} = X_0(X_n\overline{D_{n5}} + X_n'D_{n5}) + \overline{X_0}(X_m\overline{D_{m5}} + X_m'D_{m5}), \quad (14)$$
$$PW_{on} = X_0(X_nD_{n6} + X_n'\overline{D_{n6}}) + \overline{X_0}(X_mD_{m6} + X_m'\overline{D_{m6}}).$$

$$D_{n1} = M(PD_5 + \overline{PD_5}) + \overline{M}(D_7D_5 + \overline{D_7D_5}), \quad (15)$$
$$D_{n2} = M(PD_6 + \overline{PD_6}) + \overline{M}(D_7D_6 + \overline{D_7D_6}),$$
$$D_{n3} = MP + \overline{M}D_7,$$
$$D_{n4} = M\overline{D_7} + \overline{M}D_7,$$
$$D_{n5} = M\overline{P} + \overline{M}D_7D_4,$$
$$D_{n6} = M\overline{P} + \overline{M}D_7\overline{D_4},$$
$$D_{m1} = M(PD_5 + \overline{PD_5}) + \overline{M}(D_3D_0 + \overline{D_3D_0}),$$
$$D_{m2} = M(PD_6 + \overline{PD_6}) + \overline{M}(D_3D_1 + \overline{D_3D_1}),$$
$$D_{m3} = MP + \overline{M}D_3,$$
$$D_{m4} = MD_7 + \overline{M}D_3,$$
$$D_{m5} = M\overline{P} + \overline{M}D_3D_0,$$
$$D_{m6} = M\overline{P} + \overline{M}D_3\overline{D_0}.$$

-continued $$D_{p4} = MD_4 + \overline{M},$$ (16)
$$D_{pk} = MD_k \quad (k = 0, \cdots, 3).$$

Figure 40:
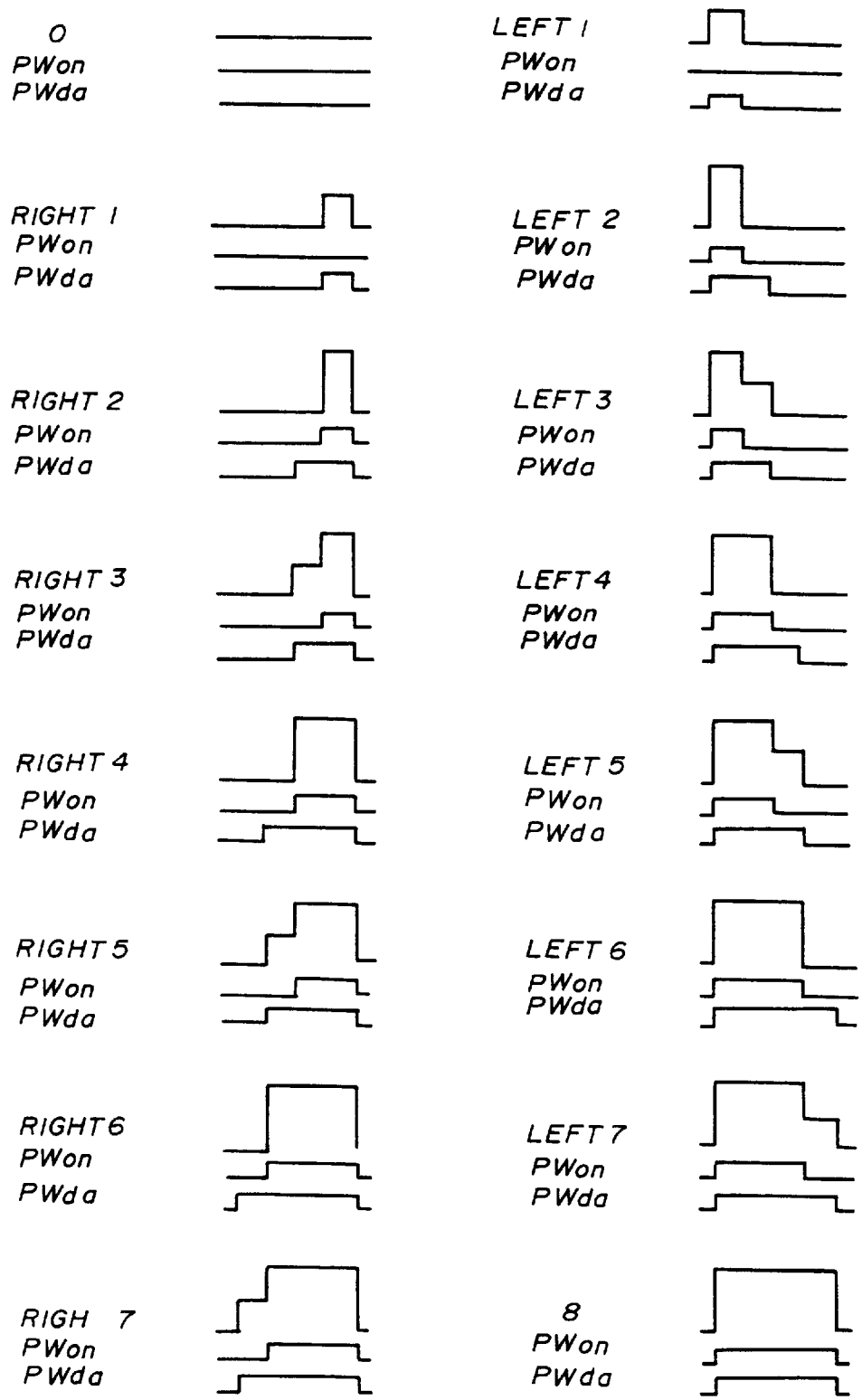
FIG. 40 shows examples of waveforms of light outputs and $PW_{on}$, $PW_{da}$ corresponding to a logic of the above-shown truth table.

FIG. 40 shows examples of waveforms of light outputs and $PW_{on}$, $PW_{da}$ corresponding to the logic of the above-shown truth table. In the seventh embodiment, as shown in FIG. 40, in the double mode, according to input image data, $PW_{da}$ is either a pulse having a pulse width the same as a pulse width of $PW_{on}$ or a pulse having a pulse width longer than a pulse width of $PW_{on}$ by the minimum pulse width, and intensity modulation data is fixed to be half the maximum light output intensity. Then, when only the pulse $PW_{da}$ is at the H level and the pulse $PW_{on}$ is at the L level, intensity modulation is performed, that is, the light intensity is halved as shown in the figure. Thereby, it is not necessary to change intensity modulation data for each half of an input clock pulse as in the above-shown equations (11). Thus, it is possible to achieve high-speed data writing. In the example of FIG. 40, $PW_{da}$ is always a pulse having a pulse width longer than a pulse width of $PW_{on}$ by the minimum pulse width. When only the pulse $PW_{da}$ is at the H level and the pulse $PW_{on}$ is at the L level but the PMD (power modulation data) is 0, the output is 0. For example, in the case of RIGHT2 where $PW_{da}$ is longer than $PW_{on}$, when only the pulse $PW_{da}$ is at the H level and the pulse $PW_{on}$ is at the L level but the PMD (power modulation data) is 0, the output is 0.

An eighth embodiment of the present invention will now be described. The eighth embodiment is similar to the above-described seventh embodiment. Duplicated descriptions will be omitted.

Figure 41:
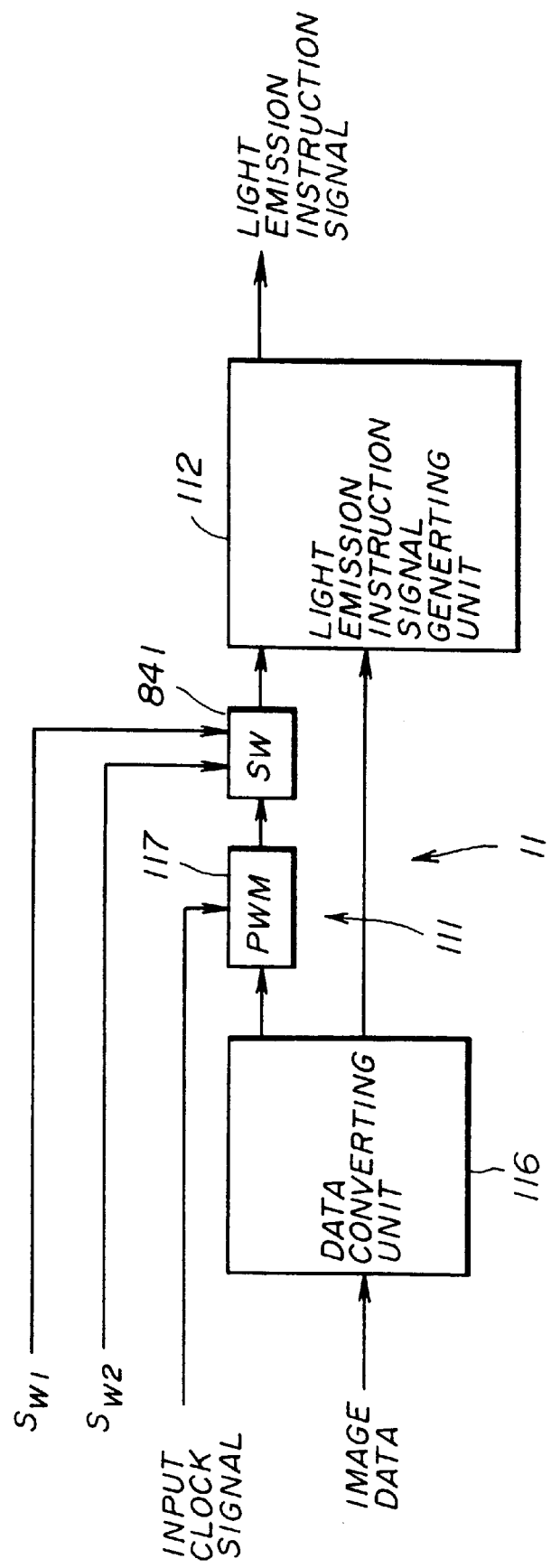
FIG. 41 shows a general block diagram of the eighth embodiment of the present invention.

In the eighth embodiment, as shown in FIG. 41, a switch unit 841 which functions as part of the output mode change-over means is inserted between the pulse width modulation unit 117 and light emission instruction signal generating unit 112. The switch unit 841 performs change-over operations according to a forcible light cessation instruction signal $S_{W1}$ and a forcible light emission instruction signal $S_{W2}$. Specifically, the pulse width modulation unit 117 and switch unit 841 perform logic operations of the logic equations (17), shown below, instead of the logic equations (14).

$$PW_{da} = \{X_0(X_n\overline{D_{n5}} + X_n'D_{n5}) + X_0(X_mD_{m5} + X_m'D_{m5})\}\overline{S_{W1}}\overline{S_{W2}} + \overline{S_{W1}}S_{W2},$$ (17)

$$PW_{on} = \{X_0(X_nD_{n6} + X_n'\overline{D_{n6}}) + X_0(X_mD_{m6} + X_m'\overline{D_{m6}})\}\overline{S_{W1}}\overline{S_{W2}} + \overline{S_{W1}}S_{W2}.$$

Thereby, without regard to input image data, the semiconductor laser 1 is forcibly turned off or forcibly turned on. It is noted that there is no case where the forcible light cessation instruction signal $S_{W1}$ and forcible light emission instruction signal $S_{W2}$ are at the H level simultaneously.

According to the arrangement shown in FIG. 41, when the forcible light cessation instruction signal $S_{W1}$ is ON (is at the H level), all of the pulse width modulation output is OFF. This condition is equivalent to the condition where all of the image data is 0. Therefore, when data writing is not needed continuously, the forcible light cessation instruction signal $S_{W1}$ is caused to be ON, and it is not necessary to cause all of image data to be 0. Thus, in such a case, control is easy. On the other hand, when all of the image data is 0 and the forcibly light emission instruction signal $S_{W1}$ is ON, light emission can be performed in any manner in a full-turning-on pulse width modulation method in a frequency of the forcibly light emission instruction signal $S_{W1}$ which has no relation to the input clock frequency. Such light emission control can be effectively used for generating a detect pulse or the like.

Figure 42:
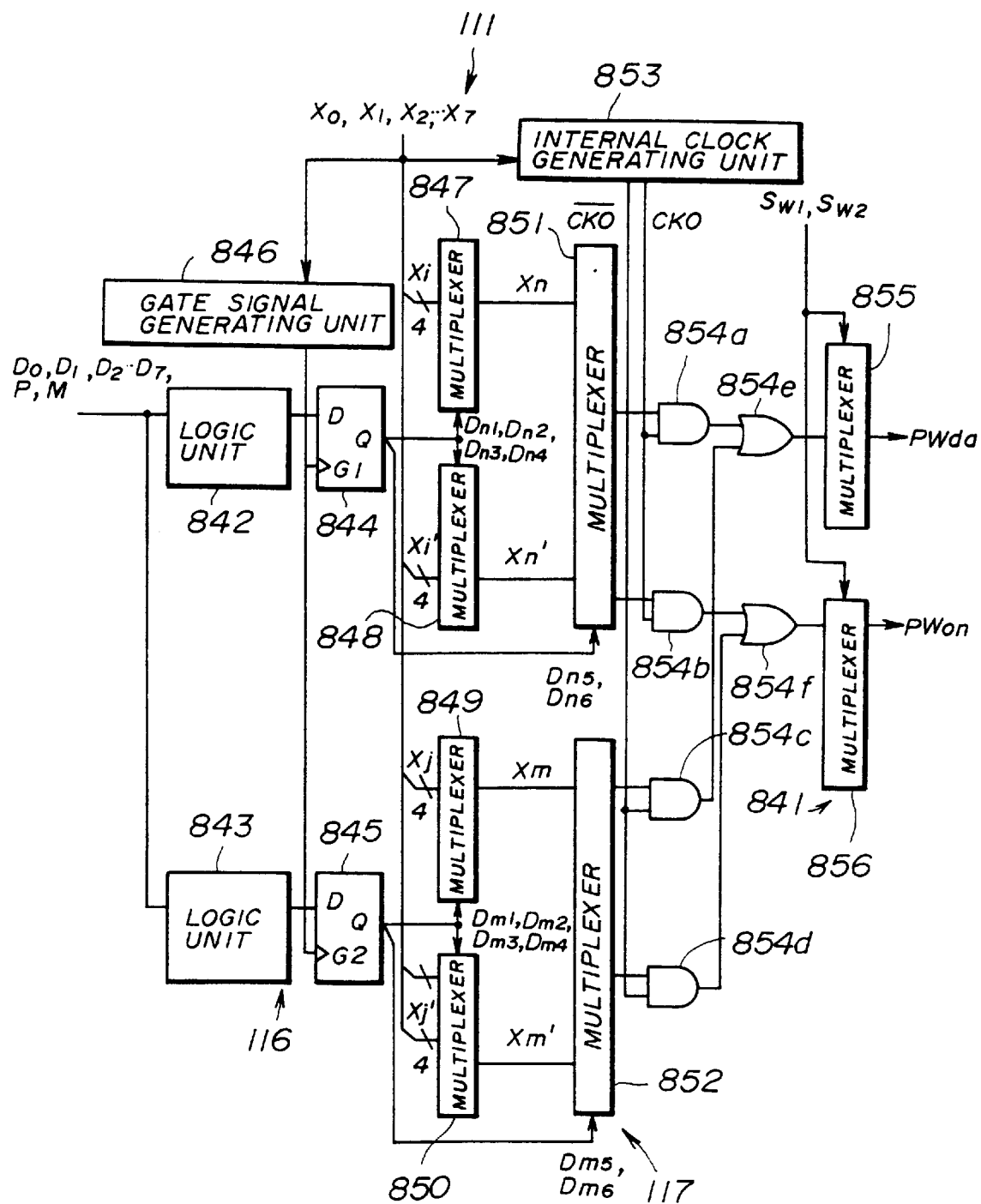
FIG. 42 shows a block diagram of a specific arrangement example of an arrangement shown in FIG. 41.

FIG. 42 shows an example of a block arrangement of the data converting unit 116, pulse width modulation unit 117 and switch unit 841 which are configured to perform pulse width modulation in accordance with the logic equations (17), (8), (15). The data converting unit 116 includes two logic units 842, 843 which perform the logic operations of the equations (15) and produce pulse width modulation data based on input image data $D_0, D_1, \ldots, D_7$, position control data P and frequency selecting signal M. The output sides of the logic units are connected with means for temporarily holding the produced data, for example, latch circuits 844, 845. A gate signal generating circuit 846, which generates a gate signal based on output of the pulse generating unit 118, is connected to the latch circuits 844, 845.

The pulse width modulation unit 117 includes multiplexers 847, 848, 849 and 850. Four ($X_i$) of different phase pulses $X_0, X_1, \ldots, X_7$ are input to the first multiplexer 847, which selects one or inverted one of the input pulses $X_i$, a constant H level signal, or a constant L level signal, in accordance with the pulse width modulation signals $D_{n1}$, $D_{n2}$, $D_{n3}$, $D_{n4}$ which act as selecting signals. The other multiplexers 848, 849, 850 have similar functions, as shown in FIG. 42. Multiplexers 851, 852 are connected to the output sides of the multiplexers 847, 848, 849, 850, as shown in the figure. The multiplexer 851 selects one of $X_n$, $X_n'$ which are outputs of the multiplexers 847, 848 in accordance with the pulse width modulation signals $D_{n5}$, $D_{n6}$ which act as selecting signals. The multiplexer 851 has a similar function as shown in the figure. An internal clock generating unit 853 generates an internal clock signal, and outputs $X_0$ as it is or via a buffer. AND gates 854a, 854b, 854c, 854d, OR gates 854e, 854f are provided, which generate pulses $PW_{da}$, $PW_{on}$ according to the logic equations (17) using the outputs of the multiplexers 851, 852 and the internal clock signal from the internal clock generating unit 853. Multiplexers 855, 856 which form the switch unit 841 are inserted to the output sides of the OR gates 854e, 854f. The multiplexers 855, 856 performs change-over operations and output the outputs of the OR gates as they are, outputs the constant L level signal or outputs the constant H level signal.

Figure 43:
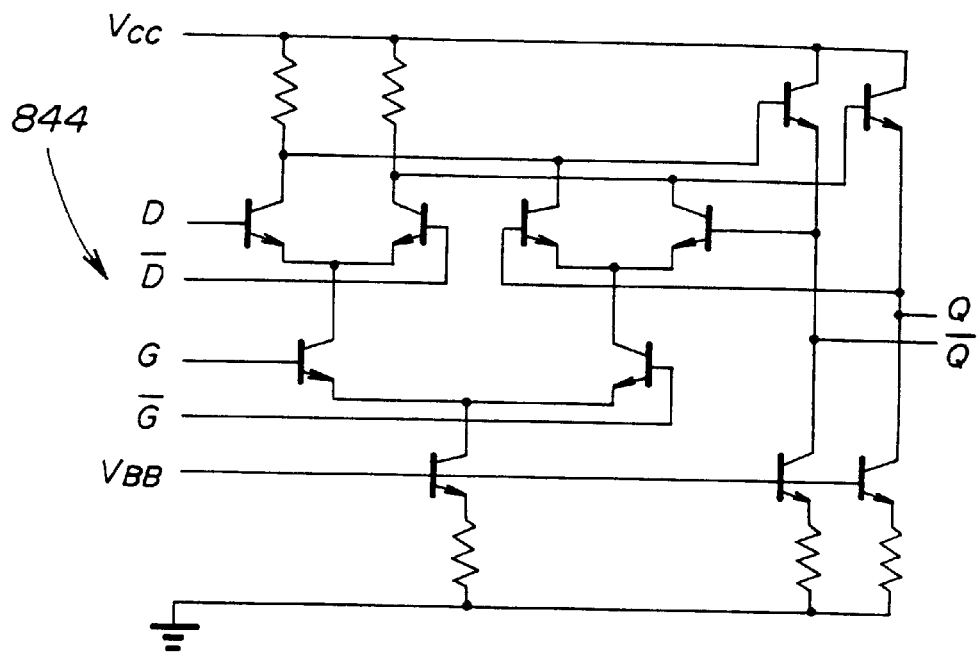
FIG. 43 shows a circuit diagram of an arrangement example of a latch circuit shown in FIG. 42.

The data converting unit 116, pulse width modulation unit 117 and switch unit 841 can be easily formed as an integrated circuit by bipolar transistor or the like. FIG. 43 shows an example of a circuit arrangement of the latch circuit 44 which is an example of data holding means which holds input image data or modulation data. When input data is D, $\overline{D}$ (differential inputs), and held data is Q, $\overline{Q}$.

$$Q = DG + Q\overline{G}.$$

When the latch gate signal G is at the H level, the input signal D is output. When the latch gate signal is at the L level, the previous data is held. The latch gate signal G can be easily generated through the gate signal generating unit 846 based on pulses generated by the pulse generating unit 118 or using a combination of these pulses. For example, with reference to the timing charts of FIG. 13, a latch gate signal $G_1$ which holds the modulation data $D_n$ for selecting $X_n$ is obtained as follows: $G_1 = X_2 \cdot X_4$. A latch gate signal $G_2$ which holds the modulation data $D_m$ for selecting $X_m$ is obtained as follows: $G_2 = X_6 \cdot X_0$.

Further, two latch circuits, each circuit being the latch circuit 844 such as that shown in FIG. 43, are connected in a cascade connection, and a latch gate signal for the second latch circuit is a signal which is obtained as a result of inverting the latch gate signal for the first latch circuit or a H level signal for a certain fixed period within a period during which the latch gate signal for the first latch circuit is at the L level. Thus, a flip-flop is formed. When the data holding means is formed by a flip-flop, data present immediately before decaying of the latch gate signal of the first latch circuit is held for one clock period. However, only by the latch circuit 44, when input data varies while the latch gate signal is at the H level, output also varies. Therefore, the data holding means formed by a flip-flop is suitable as data holding means for holding intensity modulation data.

Figure 44:
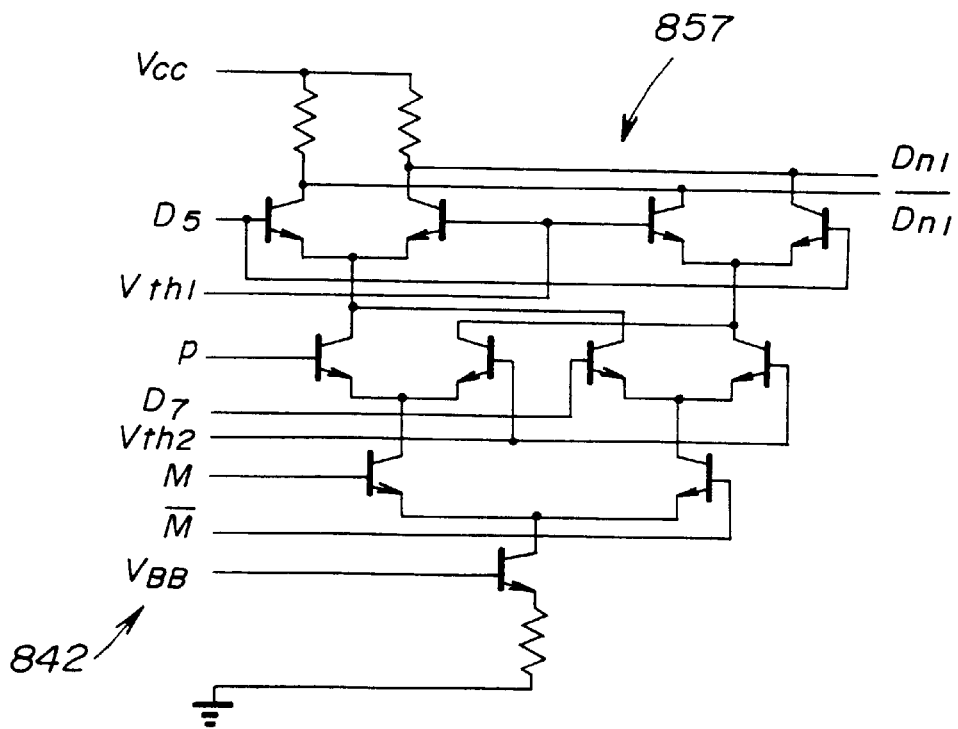
FIG. 44 shows a circuit diagram of an arrangement example for performing logic operations of a portion of an arrangement shown in FIG. 42.

FIG. 44 shows an example of a logic circuit 857 which is formed by bipolar transistors, is part of the logic unit 842 and is configured to perform the first equation for $D_{n1}$ in the equations (15). An output of the logic circuit 857 may be held by the latch circuit 844 such as that shown in FIG. 43.

Figure 45:
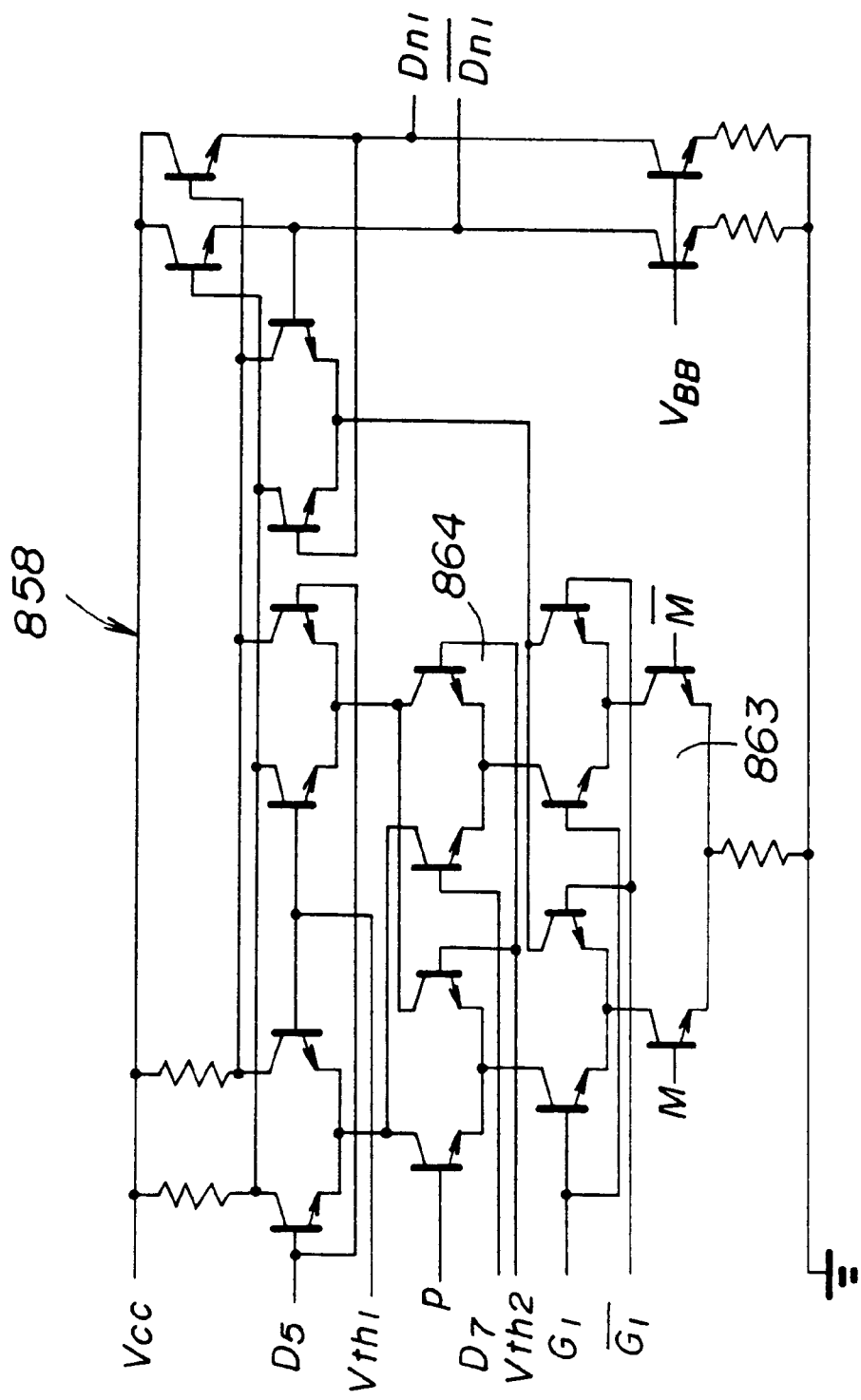
FIG. 45 shows a circuit diagram of an arrangement example for performing logic operations of a portion of the arrangement shown in FIG. 42.

However, as shown in FIG. 45, it is also possible to form a logic circuit 858 which generates the pulse width modulation data $D_{n1}$ and also holds it. Thereby, the number of components can be effectively reduced. The logic circuit 858 shown in FIG. 45 performs the logic operation of the following equation (18):

$$D_{nI} = G_1\{M(PD_5 + \overline{PD_5}) + \overline{M}(D_7D_5 + \overline{D_7D_5})\} + G_1D_{nI} \quad (18)$$

$$= M\{G_1(PD_5 + \overline{PD_5}) + G_1D_{nI}\} +$$

$$\overline{M}\{G_1(D_7D_5 + \overline{D_7D_5}) + \overline{G_1}D_{nI}\}.$$

Figure 46:
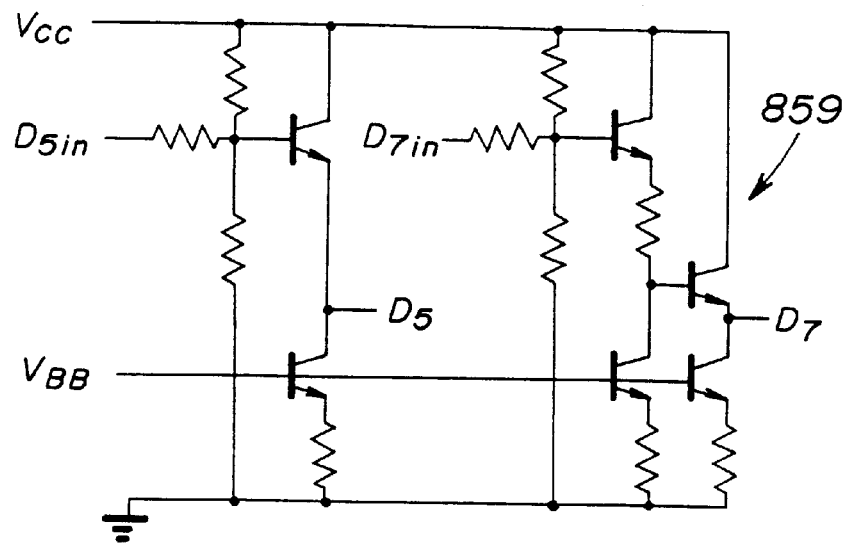
FIG. 46 shows a circuit diagram of a level shift circuit.

In FIG. 45, G1 represents a latch gate signal. Further, $V_{th1}$, $V_{th2}$ represent threshold voltages of respective logic levels, respectively. Further, input signals such as $D_5$ are obtained as a result of converting externally input data such as $D_{5in}$ into internal level signals, for example, through a level shift circuit 859 such as shown in FIG. 46. Such level shift circuits perform voltage shift using emitter followers, diodes, resistors, and so forth, appropriately.

Figure 47:
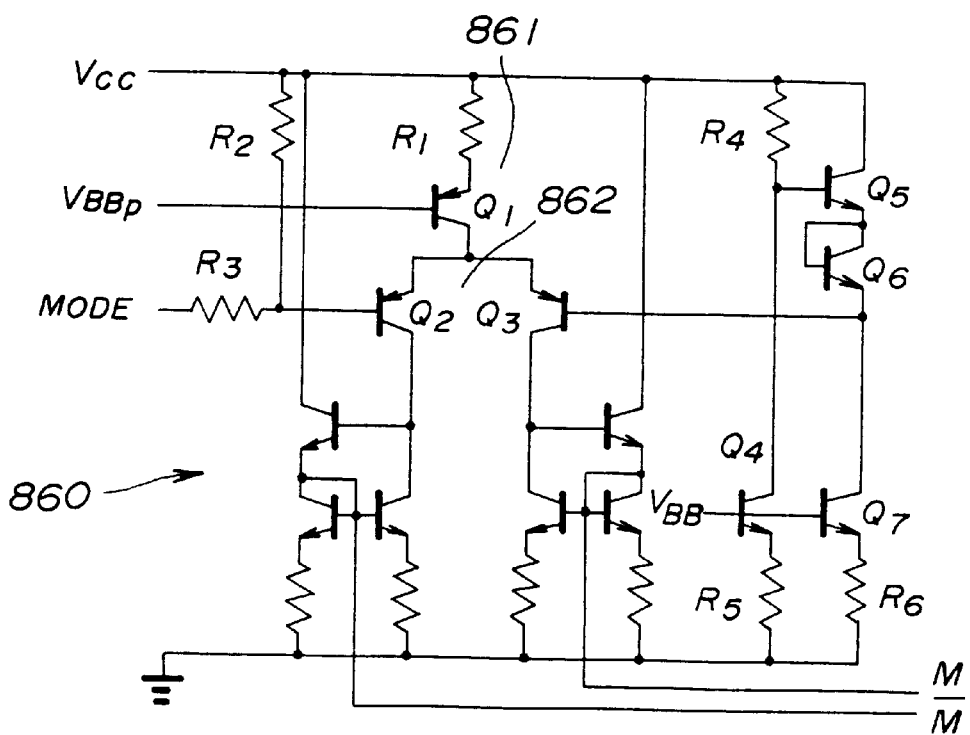
FIG. 47 shows a circuit diagram of a frequency selecting signal generating circuit.

The frequency selecting signal M, $\overline{M}$ are generated from an external frequency selecting signal mode through a selecting signal generating circuit 860 such as that shown in FIG. 47. In FIG. 47, a transistor $Q_1$ having a reference voltage $V_{BBp}$ applied to its base and a resistor $R_1$ forms a constant-current source 861 for providing a current $I_1$. Transistors $Q_2$, $Q_3$ form a differential switch 862. The external frequency selecting signal mode is converted into an internal level signal and then applied to the base of the transistor $Q_2$. Transistor $Q_4$, $Q_5$, $Q_6$, $Q_7$, resistors $R_4$, $R_5$, $R_6$ generate a threshold voltage which is applied to the base of the transistor $Q_3$. When the external frequency selecting signal mode is at the H level, the transistor $Q_3$ turns on and the collector current thereof is the current $I_1$. Thus, the voltage of the selecting signal M is $I_1 \cdot R_1 + V_{BE}$, where $V_{BE}$ is the base-emitter voltage of a transistor, and the selecting signal M is in the ON state. On the other hand, because the collector current of the transistor $Q_2$ is approximately 0, the selecting signal $\overline{M}$ is in the OFF state. When the external frequency selecting signal is at the L level, the opposite operation is performed. When the selecting signals M, $\overline{M}$ are applied to the bases of transistors of a current switch (for example, a current switch 863 shown in FIG. 45), the collector current of either one of the transistors flows.

For the other equations of the equations (15), logic circuits which perform the logic operations of the equations can be formed by bipolar transistors. For the other logic equations, logic circuits which perform the logic operations of the equations can be formed as an integrated circuit by bipolar transistors. For example, in the case of the first equation of the equations (9), a current source is used instead of the current switch 863 and a circuit 864 which is located at a higher level is removed.

Figure 48:
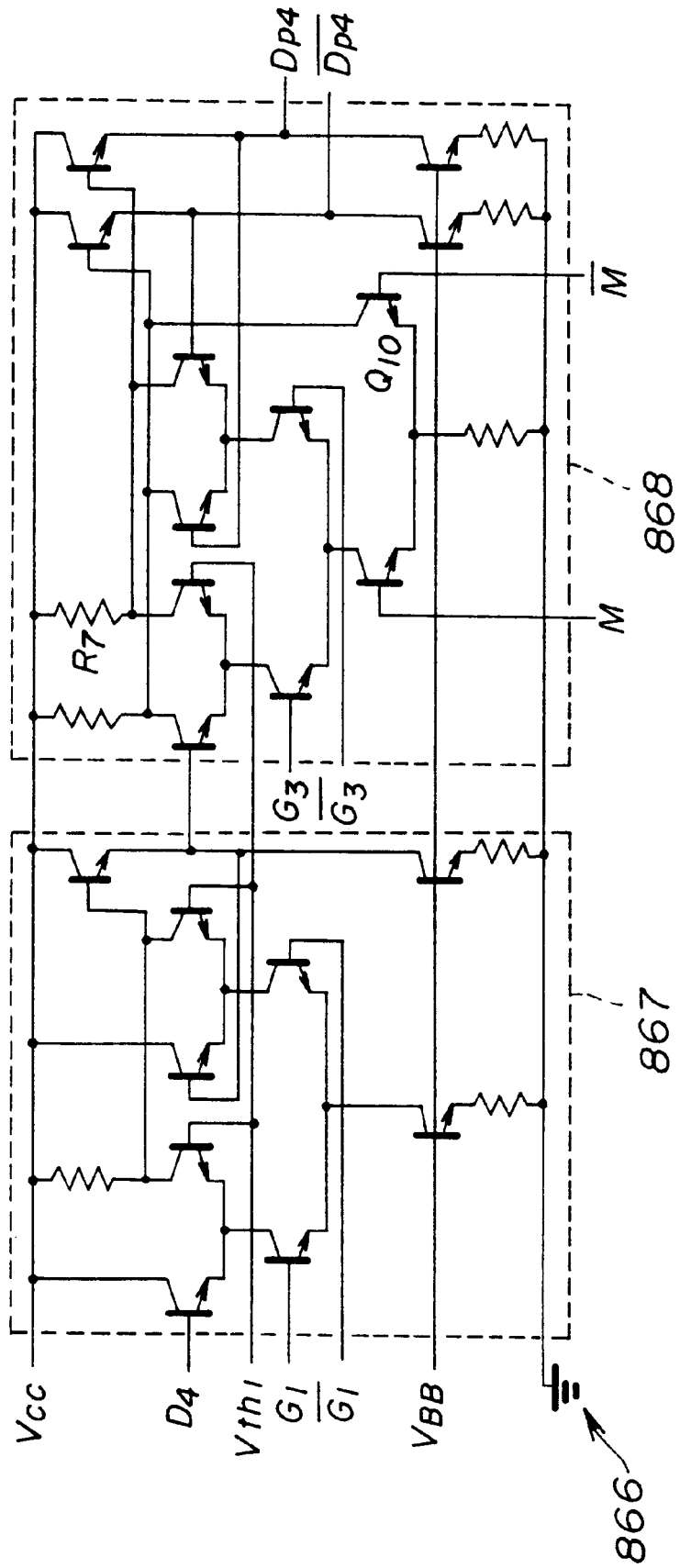
FIG. 48 shows a circuit diagram of an arrangement example for obtaining intensity modulation signal.

For purpose of obtaining intensity modulation data $D_{PK}$, latch circuits are connected cascade. FIG. 48 shows an example of a circuit arrangement of a $D_{p4}$ generating unit 866 for obtaining $D_{p4}$ of the first equation of the equations (16). In a second latch circuit 868 of two latch circuits 867, 868, configurations of data holding and also data generating logic operation are incorporated. The first latch circuit 867 is similar to the circuit arrangement shown in FIG. 43 but is configured so as to provide only a non-inverted output. Thus, the number of components can be reduced. In FIG. 48, $D_4$ is obtained as a result of being converted into an internal level signal through a level shift circuit such as that shown in FIG. 46. $V_{th1}$ represents a threshold voltage. M and $\overline{M}$ are generated by the circuit shown in FIG. 47. $G_1$ and $G_3$ are respective latch gate signals. $G_1$ was described above. $G_3=X_0$. In FIG. 48, by connecting the collector of a transistor $Q_{10}$ to a resistor $R_7$, $D_{p3}$, $D_{p2}$, $D_{p1}$, $D_{p0}$ in the equations (16) can be generated.

Figure 49:
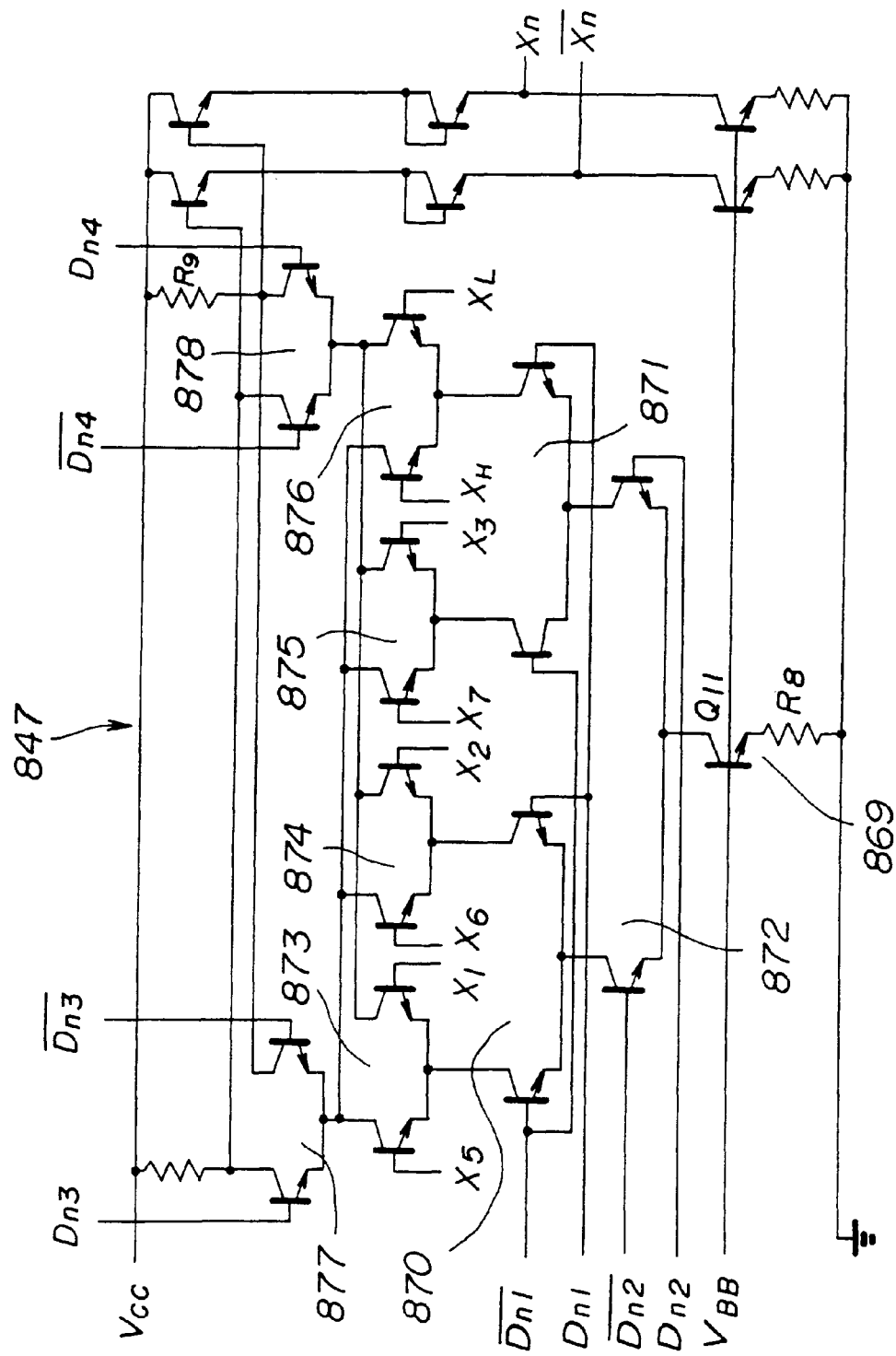
FIG. 49 shows a circuit diagram of an arrangement example of a multiplexer in a pulse width modulation unit.
Figure 50:
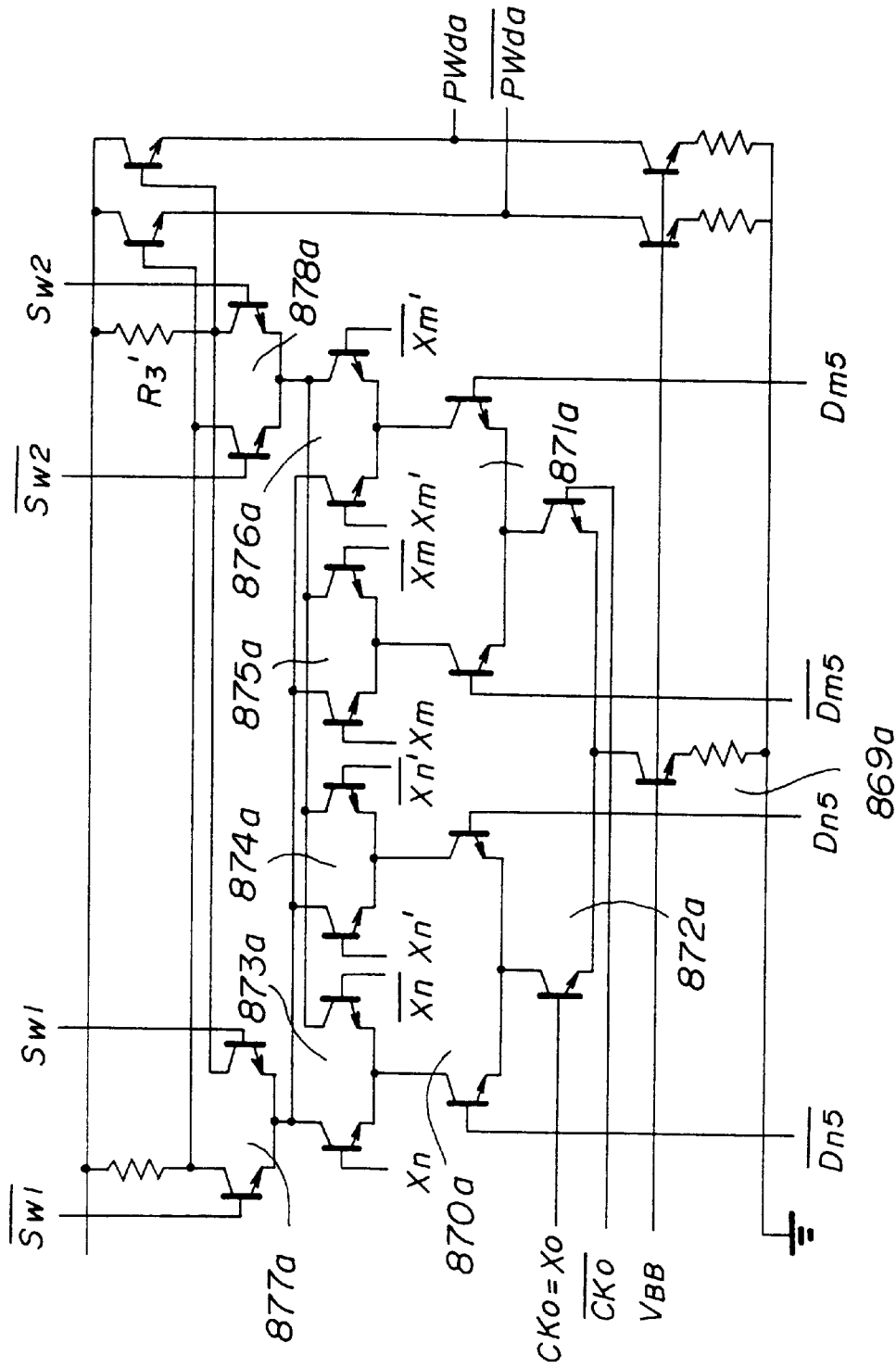
FIG. 50 shows a circuit diagram of an arrangement example of another portion in the pulse width modulation unit.

The pulse width modulation unit 117 shown in FIG. 42 can be formed as shown in FIGS. 49, 50 by bipolar transistors. FIG. 49 shows a circuit which performs the logic operation of the first equation of the equations (8), and corresponds to the multiplexer 847 shown in FIG. 42. FIG. 50 shows a circuit which performs the logic operation of the first equation of the equations (17), and corresponds to the multiplexer 851, 852, 855, AND gates 854a, 854c, OR gates 854e shown in FIG. 42.

In FIG. 49, a transistor $Q_{11}$ having a reference voltage $V_{BB}$ applied to the base thereof and a resistor $R_8$ form a current source 869 which provides a current I. There are differential switches 870, 871, 872. One of the transistors of the differential switches 870, 871 turns on by pulse width modulation data $D_{n1}$, $D_{n2}$. Thereby, current flows through one of differential switches 873, 874, 845, 876, to which the collector of the transistor, which turns on, is connected. Phase different pulses which are generated by the pulse generating unit 118 are applied to the differential switches 873, 874, 875, 876. In each of the differential switches 873, 874, 875, 876, the right side transistor has a pulse $X_i$ (i=1, 2, 3, 4, from the left, as shown in the figure) applied thereto, and the left side transistor has the inverted signal thereof. It is also possible that a certain fixed voltage is applied to the left side transistor. However, by using differential inputs as shown in the figure, a swing voltage required for switching can be effectively reduced. Therefore, in a case such as that of FIG. 49 in which transistors are stacked in multiple layers, use of differential inputs are advantageous.

In inputting of $X_i$, linearity of pulse width modulation data to be generated is improved. For example, a case where $D_{n2}=0$, $D_{n1}=1$ will now be described. In this case, the right side transistor of the differential switch 870 turns on and a current flows through the differential switch 874, and no current flows through each of the other three differential switches 843, 875, 876. Thus, the pulse $X_6$ is selected. When $X_6$ is at the H level, a current flows through a differential switch 877. When $X_6$ is at the L level, a current flows through a differential switch 878. Respective pulse width modulation data $D_{n3}$ and $D_{n4}$ is applied to the differential switches 877 and 878. When both $D_{n3}$ and $D_{n4}$ are at the H level, a terminal voltage of a resistor $R_9$ is a signal equal to $X_6$. When both $D_{n3}$ and $D_{n4}$ are at the L level, the terminal voltage of the resistor $R_9$ is a signal equal to $X_2$ (the inverted signal of $X_6$). When $D_{n3}=0$, $D_{n4}=1$, the terminal voltage of the resistor $R_9$ is always at the L level without regard to $X_6$. When $D_{n3}=1$, $D_{n4}=0$, the terminal voltage of the resistor $R_9$ is always at the H level without regard to $X_6$. The signal becomes $X_n$ via an emitter follower and a diode. Similarly, the inverted signal $\overline{X}_n$ is generated. For $X_n'$, $X_m$, $X_m'$, circuits for generating the signals can be obtained by appropriately changing input signals in accordance with the equations (8). Further, circuits for generating of $X_n$ through the other equations can also be obtained in a similar manner.

A circuit arrangement shown in FIG. 50 is similar to the circuit arrangement shown in FIG. 49. Therefore, descriptions thereof will be simply presented. An internal clock signal $CK_0$ is obtained as a result of performing voltage shift on $X_0$. For correspondence with the above-shown logic equations, the internal clock signal will be referred to as $X_0$. When $X_0$ is at the H level, a current flows through the left side transistor of a differential switch 872a. Then, a current resulting from logic multiplication (AND) of $X_n$ and $X_0$ flows through a differential switch 877a when $D_{n5}=0$. A current resulting from logic multiplication (AND) of $X_n'$ and $X_0$ flows through a differential switch 877a when $D_{n5}=1$. When $X_0$ is at the L level, in accordance with $D_{m5}$, a current resulting from logic multiplication (AND) of $X_m$ and $\overline{X}_0$ or $X_m'$ and $\overline{X}_0$ flows through the differential switch 877a. Therefore, a current resulting from logic sum (OR) thereof flows through the differential switch 877a. The inverted current thereof flows through a differential switch 878a. Then, when both the forcible light cessation instruction signal $S_{W1}$ and forcible light emission instruction signal $S_{W2}$ are at the L level, the logic sum signal becomes a terminal voltage of a resistor $R_3'$, and then becomes $PW_{da}$ via an emitter follower. When only the forcible light cessation instruction signal $S_{W1}$ is at the H level, $PW_{da}$ is always at the L level without regard to pulse width modulation data. In this case, $PW_{on}$ is also always at the L level. Thereby, the semiconductor laser 1 is forcibly turned off. When only the forcible light emission instruction signal $S_{W2}$ is at the H level, $PW_{da}$ is always at the H level. In this case, the semiconductor laser 1 is forcibly turned on. A circuit for generating $PW_{on}$ can be obtained as a result of appropriately changing the input signals in the circuit arrangement shown in FIG. 50.

With reference to FIG. 1, functions of the semiconductor laser control unit and semiconductor laser driving unit 12 will be described in connection with the arrangement of the pulse width generating unit and data modulation unit 11, in outline. The constant-current source 5 in the negative feedback loop 3 provides a current generated in accordance with modulated data (pulse width modulated two pulses $PW_{on}$, $PW_{on}$ and intensity modulated data PMDATA). This current is compared with the monitor current which is output by the light reception device 2 and is proportional to light output of the semiconductor laser 1. An error resulting from the comparison is converted into a forward current of the semiconductor laser 1 through the error amplifier 6 and the transistor 7. Thus, the negative feedback loop 3 is formed. The current source 4 provides a current which is generated in accordance with the two pulse width modulated pulses $PW_{on}$, $PW_{da}$ and intensity modulation signal PMDATA (that is, a current proportional to the current $I_{DA1}$), the current directly being a forward current of the semiconductor laser 1.

Generally, the differential quantum efficiency of the semiconductor laser 1 and the light to electricity conversion sensitivity of the light reception device 2 vary depending on particular products. Therefore, it is necessary to set a current value in consideration with these characteristics. In consideration with such variation of these characteristics, an external current setting signal is used to set the current $I_{DA1}$ so that a desired light output is emitted from the semiconductor laser 1. Thus, it is possible set the current so that characteristic variation depending on particular products is compensated and the semiconductor laser 1 always emits a desired light output in a steady state. When the constant-current source 5 has the arrangement shown in FIG. 7A, 7B or 7C, $I_{full}$ is set so that a desired maximum light emission can be obtained. The differential quantum efficiency and oscillation threshold current vary greatly depending on the time the semiconductor laser 1 has been used and temperature. By detecting each value for a condition of use, and driving the semiconductor laser 1 by a forward current so that a desired light intensity is provided, a light output waveform shown in FIG. 2B can be obtained.

The constant-current source 8 may have the arrangement shown in FIG. 7A, 7B or 7C. In this case, the maximum current value of the digital to analog converter will be referred to as $I_{full2} \cdot I_{full2}$ should be set. How to set $I_{full2}$ will now be described in outline. A forward current of the semiconductor laser 1 when a desired maximum light emission is provided will be referred to as $I_{max}$, and a forward current of the semiconductor laser 1 when a offset light emission is provided will be referred to as $I_{min}$. As described above, for the purpose of causing the negative feedback loop 3 to always operate, the semiconductor laser 1 should not be completely turned off and it is necessary for the semiconductor laser 1 to slightly emit light. Such a condition of light emission where the semiconductor laser 1 slightly emits light is referred to as offset light emission. Then, the difference $I_{max}-I_{min}$ should be equal to $I_{full2}$. For this purpose, first, the semiconductor laser 1 provides the maximum light emission where $I_{DA2}=0$ (that is, $I_{full2}=0$). At that time, only the control current is used to provide a forward current of the semiconductor laser 1. Therefore, $I_{max}=I_{DA1}$. Then, with the maximum light emission condition maintained, $I_{DA2}$ is gradually increase (the light emission instruction signal is ON and $I_{full2}$ is caused to increase). Then, when $I_{DA1}=I_{min}$, $I_{full2}=I_{max}-I_{min}$. Such a setting operation is performed for a predetermined time as an initialization operation when the power supply is started or a reset operation is performed. Then, during a normal operation condition, the value of $I_{full2}$ is held.

Figure 51:
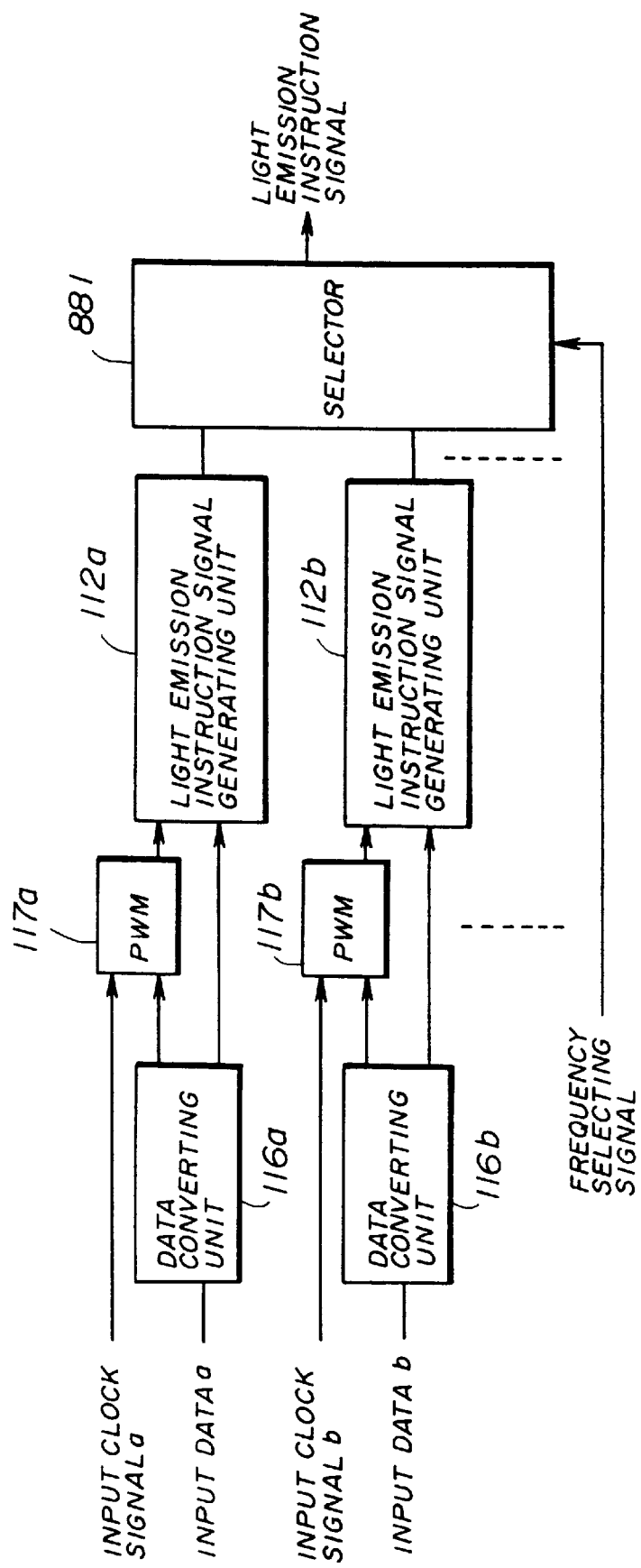
FIG. 51 shows a general block diagram of the ninth embodiment of the present invention.

FIG. 51 shows a ninth embodiment of the present invention. In the embodiment, a plurality of data converting units, pulse width modulation units and light emission instruction signal generating units, which form pulse width modulation and intensity modulation signal generating units, are provided, the number of which is the number of available different writing clock frequency output modes. Specifically, a pulse width modulation unit 117a and a data converting unit 116a, to which an input clock signal 'a' and input data 'a' are input, and a light emission instruction signal generating unit 112a are provided. Similarly, a pulse width modulation unit 117b and a data converting unit 116b, to which an input clock signal 'b' and input data 'b' are input, and a light emission instruction signal generating unit 112b are provided. n sets of such arrangements are provided. To the output sides of the light emission instruction signal generating units 112a, 112b, . . . , a selector 881, which selects one of the outputs thereof in accordance with the frequency selecting signal, and outputs the selected output, is connected. The selector acts as output mode selecting means. The input clock signals 'a', 'b', . . . set frequencies of the outputs, respectively, independently.

Thus, by selecting the output of one of the light emission instruction signal generating units, a light output waveform of a different writing clock frequency can be obtained. For example, the pulse width modulation unit 117*a* and data converting unit 116*a* are configured in accordance with the above-described basic arrangements of the corresponding units, and the output of the relevant light emission instruction signal generating unit 112*a* is selected. Thereby, a multiple tone high quality image can be obtained. Further, the input clock signal 'b' has a frequency which is double the frequency of the input clock signal 'a', the pulse width modulation unit 117*b* and data converting unit 116*b* are configured for reducing the number of tone levels, and the output of the relevant light emission instruction signal generating unit 112*b* is selected. Thereby, a high quality image, in which the number of tone levels is relatively small but writing density is double, can be obtained. Other than this, by setting a frequency of an input clock signal and a pulse width modulation unit and configuring a data converting unit appropriately, any light output waveform can be obtained.

Figure 52:
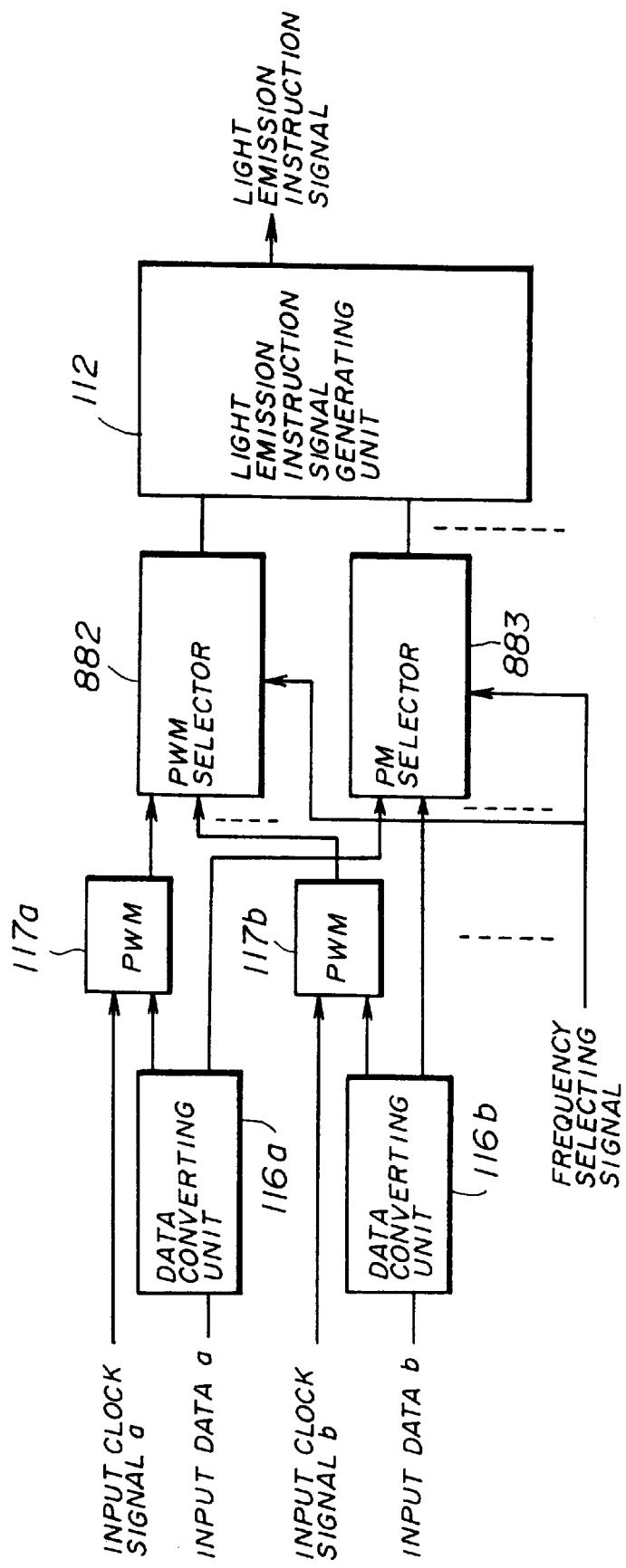
FIG. 52 shows a general block diagram of the tenth embodiment of the present invention.

FIG. 52 shows a tenth embodiment of the present invention. In the embodiment, a pulse width modulation and intensity modulation signal generating unit is formed of a plurality of modulation units and the single light emission instruction signal generating unit 112 which is an output unit. The number of the modulation units is the number of different available clock frequency output modes. Each of the modulation units generates pulse width modulation data and intensity modulation data based on input data. Specifically, a pulse width modulation unit 117*a* and a data converting unit 116*a*, to which an input clock signal 'a' and input data 'a' are input, and a pulse width modulation unit 117*b* and a data converting unit 116*b*, to which an input clock signal 'b' and input data 'b' are input, are provided. n sets of such arrangements are provided. To the output sides of these modulation units, a PWM selector 882 and a PM selector are connected. Respective pulse width modulation signals $PW_{on}$, $PW_{da}$ are input to the PWM selector 882, and respective intensity modulation signals PMDATA are input to the PM selector 883. The selectors 882 selects the pulse width modulation signals $PW_{on}$, $PW_{da}$ of one of the pulse width modulation units 117*a*, 117*b*, . . . , and the selector 883 selects the pulse intensity modulation signal PMDATA of one of the data converters 116*a*, 116*b*, . . . , according to the frequency selecting signal. These selectors 882, 883 output the selected signals to the light emission instruction signal generating unit 112.

Also in the embodiment, by selecting the output of one of the modulation units, a light output waveform of a different writing clock frequency can be obtained. Especially, in comparison to the arrangement shown in FIG. 51, only the single light emission instruction signal generating unit 112 is used, and the number of components can be effectively reduced in this embodiment. Accordingly, this embodiment is advantageous when such an arrangement is formed as an integrated circuit or is miniaturized.

In the arrangement shown in FIG. 41, not only the forcible light emission instruction signal $S_{W2}$ but also the forcible light cessation instruction signal $S_{W1}$ can be input. However, it is also possible to form a similar arrangement to which only the forcible light emission instruction signal $S_{W2}$ can be input. Such an arrangement is sufficiently effective for obtaining a detect pulse or the like.

Figure 53:
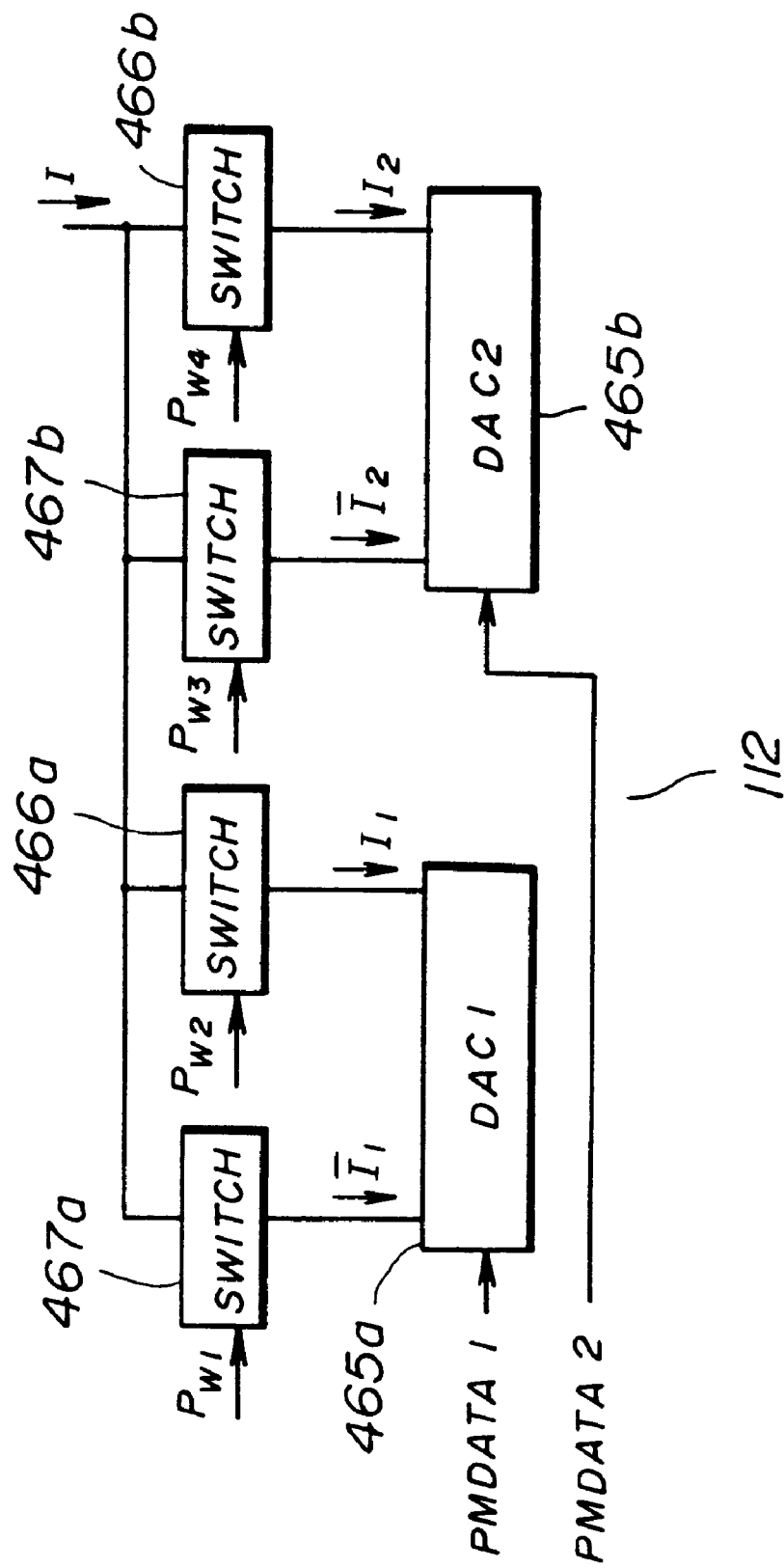
FIG. 53 shows a general block diagram of an eleventh embodiment of the present invention.
Figure 54:
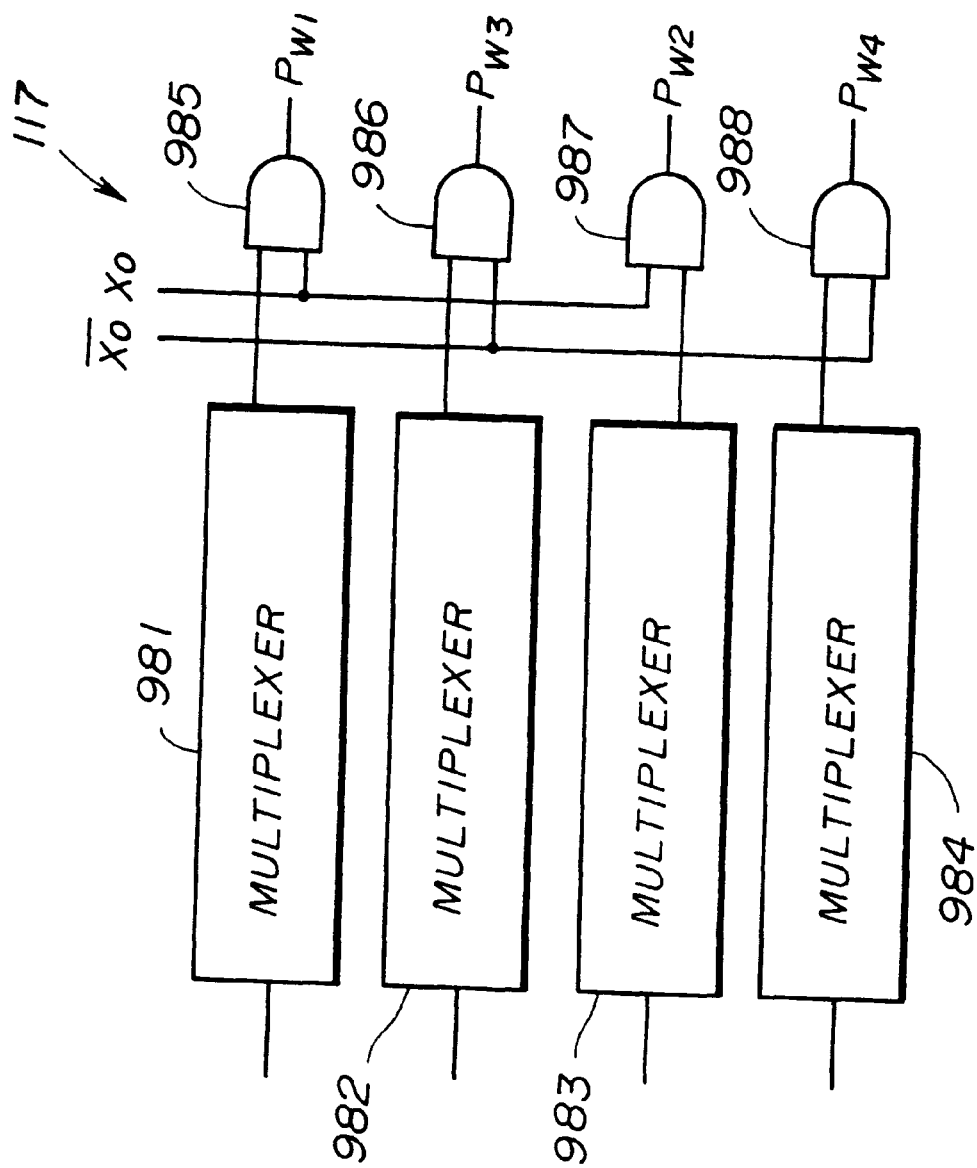
FIG. 54 shows a block diagram of an arrangement example of a pulse modulation unit of the eleventh embodiment.
Figure 55:
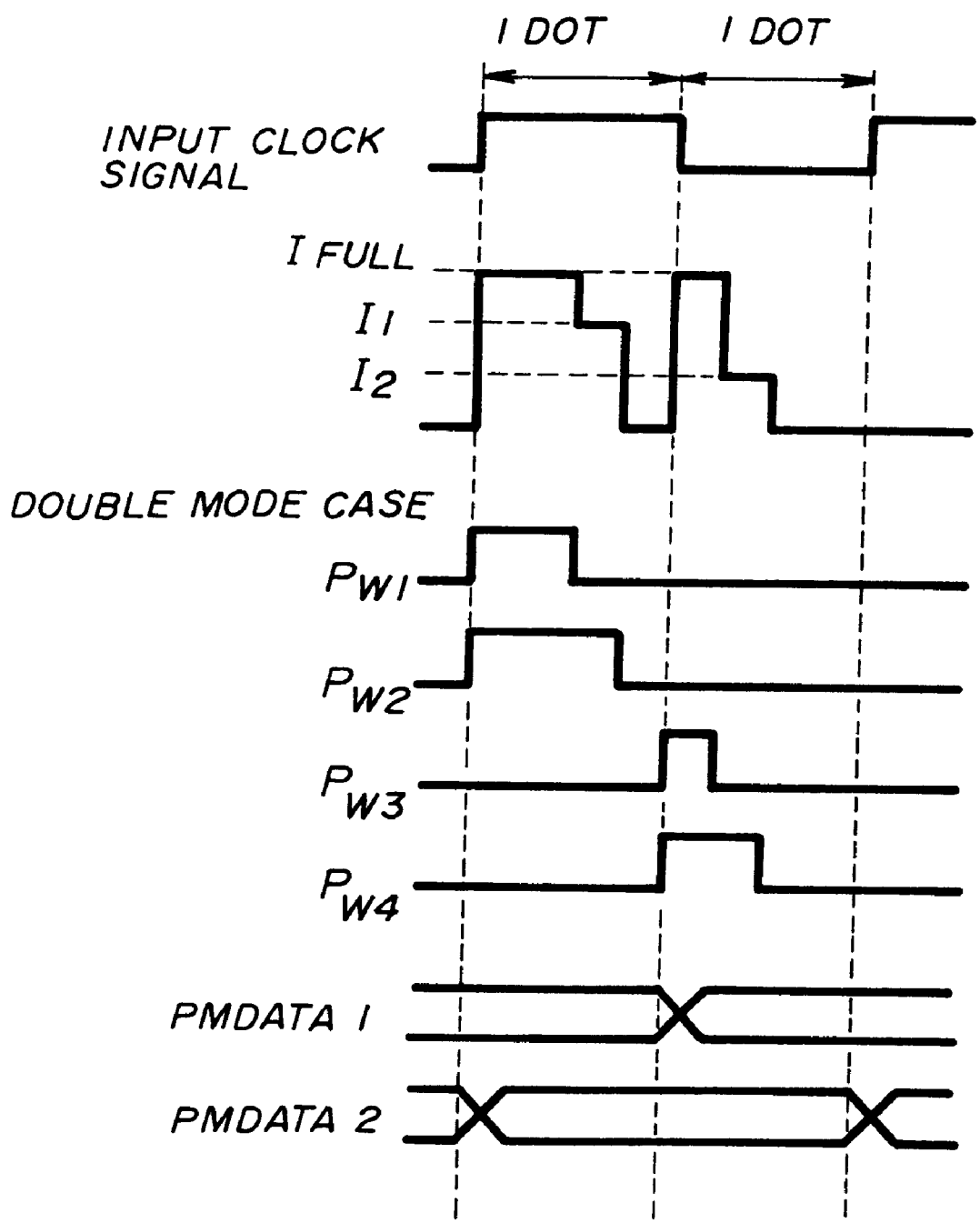
FIG. 55 shows time charts showing an operation example of a double mode case.

FIGS. 53, 54, 55 show an eleventh embodiment of the present invention. In the embodiment, selection can be performed between the equal mode and double mode as described above. The light emission instruction signal generating unit 112 has an arrangement such as that shown in FIG. 53. The arrangement shown in FIG. 53 is obtained using the arrangement shown in FIG. 29A as a base. In the arrangement shown in FIG. 53, a first digital to analog converter 465*a* converts intensity modulation data PMDATA1 into a current. A non-inverted output current $I_1$ of the digital to analog converter 465*a* is input to a first differential switch (current switch) 466*a* which allows or does not allows the non-inverted output current $I_1$ flowing therethrough in accordance with one pulse $P_{W2}$. An inverted output current $\bar{I}_1$ of the digital to analog converter 465*a* is input to a second differential switch (current switch) 467*a* which allows or does not allows the inverted output current $\bar{I}_1$ flowing therethrough in accordance with another pulse $P_{W1}$. Similarly, a second digital to analog converter 465*b* converts intensity modulation data PMDATA2 into a current. A non-inverted output current $I_2$ of the digital to analog converter 465*b* is input to a first differential switch (current switch) 466*b* which allows or does not allows the non-inverted output current $I_2$ flowing therethrough in accordance with one pulse $P_{W4}$. An inverted output current $\bar{I}_2$ of the digital to analog converter 465*b* is input to a second differential switch (current switch) 467*b* which allows or does not allows the inverted output current $\bar{I}_2$ flowing therethrough in accordance with another pulse $P_{W3}$. Thus, the light emission instruction signal generating unit 112 includes the two digital to analog converts 465*a*, 465*b* and the four differential switches 466*a*, 466*b*, 467*a*, 467*b*. The total current I of the output currents of the four differential switches 466*a*, 466*b*, 467*a*, 467*b* is a light emission instruction signal. There, $\bar{I}_1 = I_{full} - I_1$, $\bar{I}_2 = I_{full} - I_2$, and each of the digital to analog converters 465*a*, 465*b* is set so that the maximum current value is $I_{full}$.

The pulse width modulation unit 117 which outputs the respective pulses $P_{W1}$, $P_{W2}$, $P_{W3}$ and $P_{W4}$ includes, for example, as shown in FIG. 54, four multiplexers (selectors) 981, 982, 983, 984, and four AND gates 985, 986, 987, 988 to which the outputs of the multiplexers 981, 982, 983, 984 and the internal clock signal $X_0$ and the inverted internal clock signal $\bar{X}_0$ are input as shown in the figure.

In the above-described arrangement, an example of operation control in the double mode case will now be described with reference to time charts of FIG. 55. In the embodiment, during the first half of one input clock period, one dot of the light emission instruction signal is generated using the differential switches 466*a*, 467*a* and the digital to analog converter 465*a*. The differential switches 466*a*, 467*a* are controlled by the pulses $P_{W1}$, $P_{W2}$ which are obtained from the AND gates 985, 987. The intensity modulation data PMDATA1 is input to the digital to analog converter 465*a*. During the second half of one input clock period, one dot of the light emission instruction signal is generated using the differential switches 466*b*, 467*b* and the digital to analog converter 465*b*. The differential switches 466*b*, 467*b* are controlled by the pulses $P_{W3}$, $P_{W4}$ which are obtained from the AND gates 986, 988. The intensity modulation data PMDATA2 is input to the digital to analog converter 465*b*. Thus, two digital to analog converters 465*a*, 465*b* are used, and each of the intensity modulation data PMDATA1, PMDATA2 is used for a respective one of the two different dots. Even in the double mode case, the intensity modulation data PMDATA1, PMDATA2 is changed in a period the same as the period of the input clock signal, as shown in FIG. 55. Thus, the intensity modulation data PMDATA1, PMDATA2 is changed in a period the same as a period in which the intensity modulation data is changed in the equal mode. Thereby, high-speed data processing can be achieved.

In the above-described seventh, eighth, ninth, tenth and eleventh embodiments, the arrangement is formed as the integrated circuit 13 in one chip, and each part thereof is formed as an integrated circuit by bipolar transistors. However, it is not necessary to form them as an integrate circuit. When the arrangement is formed as an integrated circuit, it is not necessary to use bipolar transistors.

The present invention is not limited to the above-described embodiments, and variations and modifications may be made without departing from the scope of the claims.

Any features of the above-described first, second, third, fourth, fifth, sixth, seventh, eighth, ninth and eleventh embodiments may be combined in any manner as long as they do not contradict each other. Specifically, for example, features of the pulse width generating unit and data modulation unit 11 and features of the semiconductor laser control unit and semiconductor laser driving unit 12 can be combined. In other words, for particular applications, features of respective embodiments may be appropriately used together and thus another suitable embodiment may be obtained.

What is claimed is:

1. A semiconductor laser control system, comprising:
   a pulse width modulation and intensity modulation signal generating unit which, based on input data, performs pulse width modulation and intensity modulation and generates a light emission instruction signal;
   an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and
   a current driving unit providing a driving current, according to the light emission instruction signal, to flow through said semiconductor laser as a forward current, the driving current being generated so as to control driving of said semiconductor laser with a current of one of a difference and sum with the control current of said negative feedback loop,
   wherein said pulse width modulation and intensity modulation signal generating unit, said error amplifier and said current driving unit are formed as one chip of an integrated circuit.

2. The semiconductor laser control system according to claim 1, wherein said pulse width modulation and intensity modulation signal generating unit comprises:
   data converting means for converting the input data into pulse modulation data and intensity modulation data;
   pulse width modulation means which, based on the pulse modulation data, generates a pulse-modulated plurality of pulses; and
   a light emission instruction signal generating unit which, based on the outputs of said data converting means and said pulse width modulation means, performs the pulse width modulation and intensity modulation and generates the light emission instruction signal for said semiconductor laser.

3. The semiconductor laser control system according to claim 1, wherein said one chip of the integrated circuit is formed by bipolar transistors.

4. The semiconductor laser control system according to claim 1, wherein said one chip of the integrated circuit is formed by C-MOS transistors.

5. The semiconductor laser control system according to claim 1, wherein said one chip of the integrated circuit is formed of by a composite of bipolar transistors and C-MOS transistors.

6. A semiconductor laser control system, comprising:
   a pulse width modulation and intensity modulation generating unit which, based on input data, performs pulse width modulation and intensity modulation and generates a light emission instruction signal;
   an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and
   a current driving unit providing a driving current, according to the light emission instruction signal, to flow through said semiconductor laser as a forward current, the driving current being generated so as to control driving of said semiconductor laser with a current of one of a difference and sum with the control current of said negative feedback loop,
   wherein:
      said pulse width modulation and intensity modulation signal generating unit, said error amplifier and said current driving unit are formed as one chip of an integrated circuit by bipolar transistors; and
      an emitter coupled logic circuit included in an input portion of said pulse width modulation and intensity modulation signal generating unit into which the input data is input.

7. A semiconductor laser control system, comprising:
   a pulse width modulation and intensity modulation generating unit which, based on input data, performs pulse width modulation and intensity modulation and generates a light emission instruction signal;
   an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and
   a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop,
   wherein:
      said pulse width modulation and intensity modulation signal generating unit, said error amplifier and said current driving unit are formed as one chip of an integrated circuit by bipolar transistors; and
      an input portion of said pulse width modulation and intensity modulation signal generating unit into which the input data is input is an impedance matching circuit.

8. A semiconductor laser control system, comprising:
   a pulse width modulation and intensity modulation generating unit which, based on input data, performs pulse width modulation and intensity modulation and generates a light emission instruction signal;
   an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:
said pulse width modulation and intensity modulation signal generating unit, said error amplifier and said current driving unit are formed as one chip of an integrated circuit by bipolar transistors; and
the input data is input to said pulse width modulation and intensity modulation signal generating unit in a combination of a positive logic signal and a negative logic signal, in parallel through two lines.

9. A semiconductor laser control system, comprising:

a pulse width modulation and intensity modulation generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:
said pulse width modulation and intensity modulation signal generating unit, said error amplifier and said current driving unit are formed as one chip of an integrated circuit by bipolar transistors; and
an emitter coupled logic circuit is included in an input portion of said pulse width modulation and intensity modulation signal generating unit to receive the input data, and an input portion of said emitter coupled logic circuit is an impedance matching circuit.

10. A semiconductor laser control system, comprising:

a pulse width modulation and intensity modulation generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:
said pulse width modulation and intensity modulation signal generating unit, said error amplifier and said current driving unit are formed as one chip of an integrated circuit by bipolar transistors; and
an input portion of said pulse width modulation and intensity modulation signal generating unit into which the input data is input is an impedance matching circuit, and the input data is input to said pulse width modulation and intensity modulation signal generating unit in a combination of a positive logic signal and a negative logic signal, in parallel through two lines.

11. A semiconductor laser control system, comprising:

a pulse width modulation and intensity modulation generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:
said pulse width modulation and intensity modulation signal generating unit, said error amplifier and said current driving unit are formed as one chip of an integrated circuit by bipolar transistors; and
an emitter coupled logic circuit included in an input portion of said pulse width modulation and intensity modulation signal generating unit to receive the input data, an input portion of said emitter coupled logic circuit is an impedance matching circuit, and the input data is input to said emitter coupled logic circuit in a combination of a positive logic signal and a negative logic signal, in parallel through two lines.

12. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current to flow through said semiconductor laser as the forward current, the driving current being generated so as to control driving of said semiconductor laser with a current of one of a difference and sum with the control current of said negative feedback loop, wherein:

said pulse width modulation and intensity modulation signal generating unit, said error amplifier and said current driving unit are formed as one chip of an integrated circuit by bipolar transistors; and said pulse width modulation and intensity modulation signal generating unit comprises a light emission instruction signal generating unit which performs pulse width modulation and intensity modulation and generates the light emission instruction signal for said semiconductor laser, an external connection device being provided for setting a current value of said light emission instruction signal generating unit.

13. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:

said pulse width modulation and intensity modulation signal generating unit, said error amplifier and said current driving unit are formed as one chip of an integrated circuit by bipolar transistors; and an external connection device is provided for setting a control speed of said negative feedback loop.

14. A semiconductor laser control system comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, a differential quantum efficiency detecting unit for detecting the differential quantum efficiency of said semiconductor laser;

a memory unit for storing a detection result of said differential quantum efficiency detecting unit;

an adding current setting unit for setting a current corresponding to the light emission instruction signal, using the detection result stored in said memory unit; and a timing generating unit, wherein, in initialization, said timing generating unit generates a timing signal slower than a control speed of said error amplifier, said differential quantum efficiency detecting unit detects the differential quantum efficiency of said semiconductor laser based on said timing signal, said memory unit stores a detection result at each timing, and the current corresponding to the light emission instruction signal is set using the stored detection results, and wherein said pulse width modulation and intensity modulation signal generating unit, said error amplifier, said current driving unit, said differential quantum efficiency detecting unit, said memory unit, said adding current setting unit and said timing generating unit are formed as one chip of an integrated circuit.

15. The semiconductor laser control system according to claim 14, wherein said timing generating unit includes an external connection device, said timing generating unit generating the timing signal set by said external connection device.

16. The semiconductor laser control system according to claim 14, wherein said timing generating unit includes an oscillation circuit, said timing generating unit generating a plurality of timing signals based on an oscillation output of said oscillation circuit.

17. The semiconductor laser control system according to claim 14, wherein said timing generating unit includes an oscillation circuit and multiple stages of latch circuits, each latch circuit generating the timing signal based on an oscillation output of said oscillation circuit.

18. A semiconductor laser control system comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, a differential quantum efficiency detecting unit for detecting the differential quantum efficiency of said semiconductor laser;

a timing generating unit for generating a timing signal which controls a detection operation of said differential quantum efficiency detecting unit in initialization;

a memory unit for storing a detection result of said differential quantum efficiency detecting unit at each timing; and an adding current setting unit for setting a current, corresponding to the light emission instruction signal, using the detection results stored by said memory unit, wherein said pulse width modulation and intensity modulation signal generating unit, said error amplifier, said current driving unit, said differential quantum efficiency detecting unit, said timing generating unit, said memory unit, and said adding current setting unit are formed as one chip of an integrated circuit.

19. The semiconductor laser control system according to claim 18, wherein:

said current driving unit comprises a voltage shifting unit in said error amplifier, includes a differential circuit for changing an amount of voltage shift, and is provided in said negative feedback loop;

said adding current setting unit sets a current of said differential circuit so that light output of said semiconductor laser is a maximum value when a current corresponding to the light emission instruction signal is maximum, and light output of said semiconductor laser is a minimum value when a current corresponding to the light emission instruction signal is minimum;

in initialization, light output of said semiconductor laser is set to said maximum value at a certain timing T0, light output of said semiconductor laser is set to said minimum value at a timing T1 after a fixed time has elapsed from said timing T0, said differential quantum efficiency detecting unit and said adding current setting unit operate and the current is set between said timing T1 and a timing T2 after a fixed time has elapsed from said timing T1.

20. The semiconductor laser control system according to claim 18, wherein said timing generating circuit includes an external connection device, said timing generating unit generating the timing signal set by said external connection device.

21. The semiconductor laser control system according to claim 18, wherein said timing generating unit includes an oscillation circuit which generates a plurality of timing signals based on an oscillation output.

22. The semiconductor laser control system according to claim 18, wherein said timing generating circuit includes an oscillation circuit and multiple stages of latch circuits which generate respective timing signals based on an oscillation output of said oscillation circuit.

23. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, a differential quantum efficiency detecting unit for detecting the differential quantum efficiency of said semiconductor laser;

a memory unit for storing a detection result of said differential quantum efficiency detecting unit;

an adding current setting unit for setting a current, corresponding to the light emission instruction signal, using the detection result stored in said memory unit; and a timing generating unit, wherein:

said pulse width modulation and intensity modulation signal generating unit, said error amplifier, said current driving unit, said differential quantum efficiency detecting unit, said memory unit, said adding current setting unit and said timing generating unit are formed as one chip of an integrated circuit by bipolar transistors; and in initialization, said timing generating unit generates a timing signal slower than a control speed of said error amplifier, said differential quantum efficiency detecting unit detects the differential quantum efficiency of said semiconductor laser based on the timing signal, said memory units stores a detection result at each timing, and the current corresponding to the light emission instruction signal is set using the stored detection results.

24. The semiconductor laser control system according to claim 23, wherein said timing generating unit includes an external connection device, said timing generating unit generating the timing signal set by said external connection device.

25. The semiconductor laser control system according to claim 23, wherein said timing generating unit includes an oscillation circuit, said timing generating unit generating a plurality of timing signals based on an oscillation output of said oscillation circuit.

26. The semiconductor laser control system according to claim 23, wherein said timing generating unit includes an oscillation circuit and multiple stages of latch circuits, each latch circuit generating the timing signal based on an oscillation output of said oscillation circuit.

27. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal; to flow through said semiconductor laser as the forward current, the driving current being generated so as to control driving of said semiconductor laser with a current of one of a difference and sum with the control current of said negative feedback loop, a differential quantum efficiency detecting unit for detecting the differential quantum efficiency of said semiconductor laser;

a timing generating unit for generating a timing signal which controls a detection operation of said differential quantum efficiency detecting unit in initialization;

a memory unit for storing a detection result of said differential quantum efficiency detecting unit at each timing; and an adding current setting unit for setting a current, corresponding to the light emission instruction signal, using the detection results stored by said memory unit, wherein said pulse width modulation and intensity modulation signal generating unit, said error amplifier, said current driving unit, said differential quantum efficiency detecting unit, said timing generating unit, said memory unit, and said adding current setting unit are formed as one chip of an integrated circuit by bipolar transistors.

28. The semiconductor laser control system according to claim 27, wherein:

said current driving unit comprises a voltage shifting unit in said error amplifier, includes a differential circuit for changing an amount of voltage shift, and is provided in said negative feedback loop;

said adding current setting unit sets a current of said differential circuit so that light output of said semiconductor laser is a maximum value when a current corresponding to the light emission instruction signal is maximum, and light output of said semiconductor laser is a minimum value when a current corresponding to the light emission instruction signal is minimum;

in initialization, light output of said semiconductor laser is set to said maximum value at a certain timing T0, light output of said semiconductor laser is set to said minimum value at a timing T1 after a fixed time has elapsed from said timing T0, said differential quantum efficiency detecting unit and said adding current setting unit operate and the current is set between said timing T1 and a timing T2 after a fixed time has elapsed from said timing T1.

29. The semiconductor laser control system according to claim 27, wherein said timing generating unit includes an external connection device, said timing generating unit generating the timing signal set by said external connection device.

30. The semiconductor laser control system according to claim 27, wherein said timing generating unit includes an oscillation circuit which generates a plurality of timing signals based on an oscillation output.

31. The semiconductor laser control system according to claim 27, wherein said timing generating unit includes an oscillation circuit and multiple stages of latch circuits which generates the timing signal based on an oscillation output of said oscillation circuit.

32. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, a differential quantum efficiency detecting unit for detecting the differential quantum efficiency of said semiconductor laser;

a memory unit for storing a detection result of said differential quantum efficiency detecting unit;

an adding current setting unit for setting a current, corresponding to the light emission instruction signal, using the detection result stored in said memory unit;

a timing generating unit; and a switch unit, to which one of a forcible light emission instruction signal and a forcible light cessation instruction signal is selectively input, said switch unit providing an output selected from outputs including the light emission instruction signal based on input data;

wherein:

said pulse width modulation and intensity modulation signal generating unit, said error amplifier, said current driving unit, said differential quantum efficiency detecting unit, said memory unit, said adding current setting unit and said timing generating unit are formed as one chip of an integrated circuit by bipolar transistors; and in initialization, said timing generating unit generates a timing signal slower than a control speed of said error amplifier, said differential quantum efficiency detecting unit detects the differential quantum efficiency of said semiconductor laser based on the timing signal, said memory unit stores a detection result at each timing, and the current corresponding to one of the light emission instruction signal and the forcible light emission instruction signal is set using the stored detection results.

33. A semiconductor laser control system comprising:

a pulse modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, a switch unit, to which a forcible light emission instruction signal and a forcible light cessation instruction signal are selectively input, said switch unit providing an output selected from outputs including the light emission instruction signal based on input data;

a differential quantum efficiency detecting unit for detecting the differential quantum efficiency of said semiconductor laser based on a timing signal;

a timing generating unit for generating a timing signal which is slower than a control speed of said error amplifier, for controlling a detection operation of said differential quantum efficiency detecting unit, in initialization;

a memory unit for storing a detection result of said differential quantum efficiency detecting unit at each timing; and an adding current setting unit for setting a current, corresponding to one of the light emission instruction signal and the forcible light emission instruction signal, using the detection results stored by said memory unit;

wherein said pulse width modulation and intensity modulation signal generating unit, said error amplifier, said current driving unit, said switch unit, said differential quantum efficiency detecting unit, said timing generating unit, said memory unit and said adding current setting unit are formed as one chip of an integrated circuit.

34. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:

said pulse width modulation and intensity modulation signal generating unit, said error amplifier and said current driving unit are formed as one chip of an integrated circuit; and said current driving unit is provided in said negative feedback loop.

35. The semiconductor laser control system according to claim 34, wherein an external connection device is provided for setting a current value of said pulse width modulation and intensity modulation signal generating unit.

36. The semiconductor laser control system according to claim 34, wherein an external connection device is provided for setting a control speed of said negative feedback loop.

37. The semiconductor laser control system according to claim 34, wherein:

said current driving unit comprises a high-speed voltage shifting unit in said error amplifier, includes a differential circuit for changing an amount of voltage shift, and is provided in said negative feedback loop.

38. The semiconductor laser control system according to claim 34, wherein, in said pulse width modulation and intensity modulation signal generating unit, a plurality of digital to analog converting circuit have a common circuit portion.

39. The semiconductor laser control system according to claim 34, wherein an offset setting unit is provided which has an external connection device for setting an offset current used for setting light output of said semiconductor laser to be a minimum value.

40. The semiconductor laser control system according to claim 34, wherein a simultaneous setting unit is provided having an external connection device for setting, simultaneously, a maximum current of said pulse width modulation and intensity modulation signal generating unit and an offset current which sets light output of said semiconductor laser to a minimum value.

41. The semiconductor laser control system according to claim 34, wherein;

an offset setting unit is provided which has an external connection device for setting an offset current used for setting a light output of said semiconductor laser to a minimum value; and a simultaneous setting unit is provided having an external connection device for setting, simultaneously, a maximum current of said pulse width modulation and intensity modulation signal generating unit and the offset current.

42. The semiconductor laser control system according to claim 34, wherein a starting-up unit is provided for allowing operation start when a power source voltage reaches a predetermined voltage in power supply starting.

43. The semiconductor laser control system according to claim 34, wherein a light emission instruction signal generating unit, providing an absolute current determined by said light reception device, has a base current compensation unit for compensating base currents of transistors connected to a path of a reference current.

44. The semiconductor laser control system according to claim 34, wherein:

an external connection device is provided for setting a current value of said pulse width modulation and intensity modulation signal generating unit; and a light emission instruction signal generating unit, providing an absolute current determined by said light reception device, has a base current compensation unit for compensating base currents of transistors connected to a path of a reference current.

45. The semiconductor laser control system according to claim 34, wherein a plurality of said pulse width modulation and intensity modulation signal generating units are provided.

46. The semiconductor laser control system according to claim 34, wherein an input terminal of an external control voltage for changing a maximum current of said pulse width modulation and intensity modulation signal generating unit is provided.

47. The semiconductor laser control system according to claim 46, wherein a starting-up unit is provided for allowing operation start when a light emission instruction current corresponding to the light emission instruction signal reaches a predetermined current in power supply starting.

48. The semiconductor laser control system according to claim 46, wherein an adding current setting unit for setting a driving current corresponding to the light emission instruction signal and a simultaneous changing unit for causing a maximum current of said pulse width modulation and intensity modulation signal generating unit and a maximum current of said adding current setting unit to change simultaneously are provided.

49. The semiconductor laser control system according to claim 46, wherein a starting-up unit for allowing operation start when a light emission instruction current corresponding to the light emission instruction signal reaches a predetermined current in power supply starting, an adding current setting unit for setting a driving current corresponding to the light emission instruction signal and a simultaneous changing unit for causing a maximum current of said pulse width modulation and intensity modulation signal generating unit and a maximum current of said adding current setting unit to change simultaneously are provided.

50. The semiconductor laser control system according to claim 46, wherein a first starting-up unit for allowing operation start when a power source voltage reaches a predetermined voltage in power supply starting and a second starting-up unit for allowing operation start when a light emission instruction current corresponding to the light emission instruction signal reaches a predetermined current in power supply starting are provided.

51. A semiconductor laser control system, comprising:
   a pulse width modulation and intensity modulation signal generating unit which, based on input data, performs pulse width modulation and intensity modulation and generates a light emission instruction signal;
   an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and
   a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop,
   wherein:
      said pulse width modulation and intensity modulation signal generating unit, said error amplifier and said current driving unit are formed as one chip of an integrated circuit by bipolar transistors; and
      said current driving unit is provided in said negative feedback loop.

52. The semiconductor laser control system according to claim 51, wherein an external connection device is provided for setting a current value of said pulse width modulation and intensity modulation signal generating unit.

53. The semiconductor laser control system according to claim 51, wherein an external connection device is provided for setting a control speed of said negative feedback loop.

54. The semiconductor laser control system according to claim 51, wherein:
   said current driving unit comprises a high-speed voltage shifting unit in said error amplifier, includes a differential circuit for changing an amount of voltage shift, and is provided in said negative feedback loop.

55. The semiconductor laser control system according to claim 51, wherein, in said pulse width modulation and intensity modulation signal generating unit, a plurality of digital to analog converting circuit have a common circuit portion.

56. The semiconductor laser control system according to claim 51, wherein an offset setting unit is provided which has an external connection device for setting an offset current which is used for setting light output of said semiconductor laser to a minimum value.

57. The semiconductor laser control system according to claim 51, wherein a simultaneous setting unit is provided having an external connection device for setting, simultaneously, a maximum current of said pulse width modulation and intensity modulation signal generating unit and an offset current setting light output of said semiconductor laser to a minimum value.

58. The semiconductor laser control system according to claim 51, wherein;
   an offset setting unit is provided which has an external connection device for setting an offset current used for setting light output of said semiconductor laser to a minimum value; and
   a setting unit is provided having an external connection device for setting, simultaneously, a maximum current of said pulse width modulation and intensity modulation signal generating unit and the offset current.

59. The semiconductor laser control system according to claim 51, wherein a starting-up unit is provided for allowing operation start when a power source voltage reaches a predetermined voltage in power supply starting.

60. The semiconductor laser control system according to claim 51, wherein a light emission instruction signal generating unit, providing an absolute current determined by said light reception device, has a base current compensation unit for compensating base currents of transistors connected to a path of a reference current.

61. The semiconductor laser control system according to claim 51, wherein:
   an external connection device is provided for setting a current value of said pulse width modulation and intensity modulation signal generating unit; and
   a light emission instruction signal generating unit, providing an absolute current determined by said light reception device, has a base current compensation unit for compensating base currents of transistors connected to a path of a reference current.

62. The semiconductor laser control system according to claim 51, wherein a plurality of said pulse width modulation and intensity modulation signal generating units are provided.

63. The semiconductor laser control system according to claim 51, wherein an input terminal of an external control voltage for changing a maximum current of said pulse width modulation and intensity modulation signal generating unit is provided.

64. The semiconductor laser control system according to claim 63, wherein a starting-up unit is provided for allowing operation start when a light emission instruction current corresponding to the light emission instruction signal reaches a predetermined current in power supply starting.

65. The semiconductor laser control system according to claim 63, wherein an adding current setting unit for setting a driving current corresponding to the light emission instruction signal and a simultaneous changing unit for causing a maximum current of said pulse width modulation and intensity modulation signal generating unit and a maximum current of said adding current setting unit to change simultaneously are provided.

66. The semiconductor laser control system according to claim 63, wherein a starting-up unit for allowing operation start when a light emission instruction current corresponding to the light emission instruction signal reaches a predetermined current in power supply starting, an adding current setting unit for setting a driving current corresponding to the light emission instruction signal and a simultaneous changing unit for causing a maximum current of said pulse width modulation and intensity modulation signal generating unit and a maximum current of said adding current setting unit to change simultaneously are provided.

67. The semiconductor laser control system according to claim 63, including a first starting-up unit for allowing operation start when a power source voltage reaches a predetermined voltage in power supply starting and a second starting-up unit for allowing operation start when a light emission instruction current corresponding to the light emission instruction signal reaches a predetermined current in power supply starting.

68. A semiconductor laser control system, comprising:

a pulse width modulation and intensity modulation signal generating unit which comprises data converting means for converting input data into pulse modulation data and intensity modulation data, pulse width modulation means which, based on the pulse modulation data, generates a plurality of pulse-modulated pulses, and a light emission instruction signal generating unit which, based on outputs of said data converting means and said pulse width modulation means, performs the pulse width modulation and intensity modulation and generates a light emission instruction signal for said semiconductor laser, said pulse width modulation and intensity modulation signal generating unit, based on input data, performing pulse width modulation and intensity modulation so as to generate the light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:
said pulse width modulation and intensity modulation signal generating unit, said error amplifier and said current driving unit are formed as one chip of an integrated circuit: and an external connection device provided for setting a current value of said light emission instruction signal generating unit.

69. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:
said pulse width modulation and intensity modulation signal generating unit, said error amplifier and said current driving unit are formed as one chip of an integrated circuit: and an external connection device is provided for setting a control speed of said negative feedback loop.

70. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal;

a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop; and a starting-up unit for allowing operation start when a power source voltage reaches a predetermined voltage in power supply starting, wherein said pulse width modulation and intensity modulation signal generating unit, said error amplifier, said current driving unit and said starting-up unit are formed as one chip of an integrated circuit.

71. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal;

a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop; and a starting-up unit for allowing operation start when a power source voltage reaches a predetermined voltage in power supply starting, wherein:
said pulse width modulation and intensity modulation signal generating unit, said error amplifier, said current driving unit and said starting-up unit are formed as one chip of an integrated circuit; and said starting-up unit has a reset function for initializing said integrated circuit by a control signal external of said integrated circuit.

72. A semiconductor laser control system, comprising:

a pulse width modulation and intensity modulation signal generating unit comprising a plurality of light emission instruction signal generating units which, based on input data, perform pulse width modulation and intensity modulation and generate a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop;

wherein said pulse width modulation and intensity modulation signal generating unit, said error amplifier and said current driving unit are formed as one chip of an integrated circuit.

73. A semiconductor laser control system, comprising:

a pulse width modulation and intensity modulation signal generating unit which comprises data converting means for converting input data into pulse modulation data and intensity modulation data, pulse width modulation means which, based on the pulse modulation data, generates a plurality of pulse-modulated pulses, and a light emission instruction signal generating unit which, based on the outputs of said data converting means and said pulse width modulation means, performs the pulse width modulation and intensity modulation and generates a light emission instruction signal for said semiconductor laser, said pulse width modulation and intensity modulation signal generating unit, based on input data, performing pulse width modulation and intensity modulation and generates the light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:
said pulse width modulation and intensity modulation signal generating unit, said error amplifier and said current driving unit are formed as one chip of an integrated circuit: and
an input terminal is provided for an external control voltage which changes a maximum current of said light emission instruction signal generating unit.

74. The semiconductor laser control system according to claim 73, wherein a starting-up unit is provided for allowing operation start when a light emission instruction current corresponding to the light emission instruction signal reaches a predetermined current in power supply starting.

75. The semiconductor laser control system according to claim 73, wherein an adding current setting unit for setting a driving current corresponding to the light emission instruction signal and a simultaneous changing unit for causing a maximum current of said light emission instruction signal generating unit and a maximum current of said adding current setting unit to change simultaneously are provided.

76. The semiconductor laser control system according to claim 73, wherein a starting-up unit for allowing operation start when a light emission instruction current corresponding to the light emission instruction signal reaches a predetermined current in power supply starting, an adding current setting unit for setting a driving current corresponding to the light emission instruction signal and a simultaneous changing unit for causing a maximum current of said pulse width modulation and intensity modulation signal generating unit and a maximum current of said adding current setting unit to change simultaneously are provided.

77. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal;

a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop; and an offset setting unit having an external connection device for setting an offset current which sets light output of said semiconductor laser to a minimum value, wherein said pulse width modulation and intensity modulation signal generating unit, said error amplifier, said current driving unit and said offset setting unit are formed as one chip of an integrated circuit.

78. A semiconductor laser control system, comprising:

a pulse width modulation and intensity modulation signal generating unit which comprises data converting means for converting input data into pulse modulation data and intensity modulation data, pulse width modulation means which, based on the pulse modulation data, generates a plurality of pulse-modulated pulses, and a light emission instruction signal generating unit which, based on the outputs of said data converting means and said pulse width modulation means, performs the pulse width modulation and intensity modulation and generates a light emission instruction signal for said semiconductor laser, said pulse width modulation and intensity modulation signal generating unit, based on input data, performing pulse width modulation and intensity modulation and generates the light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal;

a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop; and a simultaneous setting unit having an external connection device for setting, simultaneously, a maximum current of said light emission instruction signal generating unit and an offset current which causes light output of said semiconductor laser to be a minimum value, wherein said pulse width modulation and intensity modulation signal generating unit, said error amplifier, said current driving unit and said together setting unit are formed as one chip of an integrated circuit.

79. A semiconductor laser control system, comprising:

a pulse width modulation and intensity modulation signal generating unit which comprises data converting means for converting input data into pulse modulation data and intensity modulation data, pulse width modulation means which, based on the pulse modulation data, generates a plurality of pulse-modulated pulses, and a light emission instruction signal generating unit which, based on the outputs of said data converting means and said pulse width modulation means, performs the pulse width modulation and intensity modulation and generates a light emission instruction signal for said semiconductor laser, said pulse width modulation and intensity modulation signal generating unit, based on input data, performing pulse width modulation and intensity modulation and generates the light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal;

a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop;

an offset setting unit having an external connection device for setting an offset current which sets light output of said semiconductor laser to a minimum value; and a simultaneous setting unit having an external connection device for setting, simultaneously, a maximum current of said light emission instruction signal generating unit and the offset current, wherein said pulse width modulation and intensity modulation signal generating unit, said error amplifier, said current driving unit, said offset setting unit and said together setting unit are formed as one chip of an integrated circuit.

80. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal;

a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop; and an abnormality detecting unit for detecting an abnormality in a signal from an output terminal of said semiconductor laser, wherein said pulse width modulation and intensity modulation signal generating unit, said error amplifier, said current driving unit and said abnormality detecting unit are formed as one chip of an integrated circuit.

81. A semiconductor laser control system, comprising:

a pulse width modulation and intensity modulation signal generating unit which comprises data converting means for converting input data into pulse modulation data and intensity modulation data, pulse width modulation means which, based on the pulse modulation data, generates a plurality of pulse-modulated pulses, and a light emission instruction signal generating unit which, based on outputs of said data converting means and said pulse width modulation means, performs the pulse width modulation and intensity modulation and generates a light emission instruction signal for said semiconductor laser, said pulse width modulation and intensity modulation signal generating unit, based on input data, performing pulse width modulation and intensity modulation and generates the light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:
said pulse width modulation and intensity modulation signal generating unit, said error amplifier and said current driving unit are formed as one chip of an integrated circuit; and said light emission instruction signal generating unit comprises a base current compensation unit for compensating base currents of transistors connected to a path of a reference current.

82. A semiconductor laser control system, comprising:

a pulse width modulation and intensity modulation signal generating unit which comprises data converting means for converting input data into pulse modulation data and intensity modulation data, pulse width modulation means which, based on the pulse modulation data, generates a plurality of pulse-modulated pulses, and a light emission instruction signal generating unit which, based on the outputs of said data converting means and said pulse width modulation means, performs the pulse width modulation and intensity modulation and generates a light emission instruction signal for said semiconductor laser, said pulse width modulation and intensity modulation signal generating unit, based on input data, performing pulse width modulation and intensity modulation and generates the light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said,semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:

said pulse width modulation and intensity modulation signal generating unit, said error amplifier and said current driving unit are formed as one chip of an integrated circuit;

an external connection device is provided for setting a current value of said light emission instruction signal generating unit; and said light emission instruction signal generating unit, providing an absolute current determined by said light reception device, has a base current compensation unit for compensating base currents of transistors connected to a path of a reference current.

83. A semiconductor laser control system, comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal;

a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop; and output mode change-over means for selecting one of different clock-frequency output modes according to a frequency selecting signal, wherein said pulse width modulation and intensity modulation signal generating unit, said error amplifier, said current driving unit and said output mode change-over means are formed as one chip of an integrated circuit.

84. The semiconductor laser control system according to claim 83, wherein:

a plurality of said pulse modulation and intensity modulation signal generating units are provided, the number of said plurality of said pulse modulation and intensity modulation signal generating units being equal to the number of said different clock-frequency output modes;

and said output mode change-over means selecting one of said plurality of said pulse modulation and intensity modulation signal generating units according to the frequency selecting signal.

85. The semiconductor laser control system according to claim 83, wherein:

said pulse width modulation and intensity modulation signal generating unit comprises a plurality of modulation units for generating pulse width modulation data and intensity modulation data from input data, the number of said plurality of said modulation units being equal to the number of said different clock-frequency output modes, and one output unit which performs pulse width modulation and intensity modulation based on the pulse modulation data and intensity modulation data, and generates the light emission instruction signal; and said output mode change-over means selecting one of said plurality of modulation units for said output unit according to the frequency selecting signal.

86. The semiconductor laser control system according to claim 83, wherein said pulse width modulation and intensity modulation signal generating unit comprises pulse generating means for generating a plurality of pulses having a frequency equal to a frequency of an input clock signal and having different phases, the phase difference being a fixed phase difference, data converting means for converting input data into pulse width modulation data and intensity modulation data and pulse width modulation means for generating a plurality of pulses, which have undergone pulse width modulation based on the pulse width modulation data, from the pulses generated by said pulse generating means; and said output mode change-over means causes said data converting means to generate modulation data according to the frequency selecting signal and output said modulation data to said pulse width modulation means.

87. The semiconductor laser control system according to claim 86, wherein the clock frequencies of the output modes comprise a first clock frequency which is equal to the clock frequency of the input clock signal and a second clock frequency which is double the clock frequency of the input clock signal, one of said first clock frequency and said second clock frequency being selectable.

88. The semiconductor laser control system according to claim 83, wherein one of said different clock-frequency output modes is an output mode selected based on a forcible light emission instruction signal which comprises the frequency selecting signal.

89. The semiconductor laser control system according to claim 83, wherein one of said different clock-frequency output modes is an output mode selected based on a forcible light cessation signal which comprises the frequency selecting signal.

90. A semiconductor laser control system, comprising:
a pulse width modulation and intensity modulation signal generating unit comprising pulse generating means, including a pulse oscillator, for generating a plurality of pulses having a frequency the same as the frequency of an input clock signal and having different phases, the phase difference being a fixed phase difference, data converting means for converting input image data into pulse width modulation data and intensity modulation data and pulse width modulation means for generating a plurality of pulses, which have undergone pulse width modulation based on the pulse width modulation data, from the pulses generated by said pulse generating means, said pulse width modulation and intensity modulation signal generating unit performing pulse width modulation and intensity modulation and generating a light emission instruction signal;
an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal;
a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop; and
wherein said pulse width modulation and intensity modulation signal generating unit, said error amplifier and said current driving unit are formed as one chip of an integrated circuit.

91. The semiconductor laser control system according to claim 90, wherein said pulse width modulation means comprises n sets of two selectors for selecting pulses, based on mutually different pulse width modulation data, from pulses generated by said pulse generating means, two logic AND gates to which the outputs of said selectors and a non-inverted internal clock signal and an inverted internal clock signal are input, and a logic OR gate, to which the outputs of said logic AND gates are input, for outputting pulses.

92. The semiconductor laser control system according to claim 91, wherein clock frequencies of output modes comprise a first clock frequency which is equal to an input clock frequency and a second clock frequency which is double said input clock frequency, one of said first clock frequency and said second clock frequency being selectable.

93. The semiconductor laser control system according to claim 90, wherein said data converting means, based on the image data and a frequency selecting signal, converts the image data into pulse width modulation data and intensity modulation data.

94. The semiconductor laser control system according to claim 90, wherein said data converting means, based on the image data, a frequency selecting signal and a dot position control signal, converts the image data into pulse width modulation data and intensity modulation data.

95. The semiconductor laser control system according to claim 94, wherein said dot position control signal comprises one bit.

96. The semiconductor laser control system according to claim 90, wherein means for generating the light emission instruction signal comprises a digital to analog converter, a first current switch which controls a non-inverted output current of said digital to analog converter flowing therethrough according to one of the pulses output from said pulse width modulation means and a second current switch which controls an inverted output current of said digital to analog converter flowing therethrough according to another of said pulses output from said pulse width modulation means, total output currents of said first and second current switches being used as the light emission instruction signal.

97. The semiconductor laser control system according to claim 90, wherein means for generating the light emission instruction signal comprises a digital to analog converter, a first current switch which controls a non-inverted output current of said digital to analog converter flowing therethrough according to one of the pulses output from said pulse width modulation means and a second current switch which controls an inverted output current of said digital to analog converter and a constant current equal to the least significant bit current of said digital to analog converter flowing therethrough according to another of said pulses output from said pulse width modulation means, total output currents of said first and second current switches being used as the light emission instruction signal.

98. The semiconductor laser control system according to claim 97, wherein a third current switch is provided for controlling a constant current flowing therethrough based on a full on signal.

99. The semiconductor laser control system according to claim 90, wherein:
output mode clock frequencies comprise a first clock frequency which is equal to the input clock signal and a second clock frequency which is double said input clock signal, one of said first clock frequency and said second clock frequency being selectable; and
means for generating the light emission instruction signal comprising two digital to analog converters which convert two intensity modulation data into currents, two first current switches which control non-inverted output currents of said two digital to analog converters flowing therethrough according to respective ones of the pulses output from said pulse width modulation means and two second current switches which control inverted output currents of said two digital to analog converters flowing therethrough according to other respective ones of said pulses output from said pulse width modulation means, total output currents of the current switches being used as the light emission instruction signal.

100. A semiconductor laser control system, comprising:
a pulse width modulation and intensity modulation signal generating unit comprising pulse generating means for generating a plurality of pulses having a frequency equal to a frequency of an input clock signal and having different phases, the phase difference being a fixed phase difference, data converting means for converting input image data into pulse width modulation data and intensity modulation data and pulse width modulation means for generating a plurality of pulses, which have undergone pulse width modulation based on the pulse width modulation data, from the pulses generated by said pulse generating means, said pulse width modulation and intensity modulation signal generating unit performing pulse width modulation and intensity modulation and generating a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:

the plurality of pulses output from said pulse width modulation means have a predetermined mutual relationship; and said pulse width modulation and intensity modulation signal generating unit, said error amplifier and said current driving unit are formed as one chip of an integrated circuit.

101. A semiconductor laser control system, comprising:

a pulse width modulation and intensity modulation signal generating unit comprising pulse generating means for generating a plurality of pulses having a frequency equal to a frequency of an input clock signal and having different phases, the phase difference being a fixed phase difference, data converting means for converting input image data into pulse width modulation data and intensity modulation data and pulse width modulation means for generating a plurality of pulses, which have undergone pulse width modulation based on the pulse width modulation data, from the pulses generated by said pulse generating means, said pulse width modulation and intensity modulation signal generating unit performing pulse width modulation and intensity modulation and generating a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:

at least one pulse of the plurality of pulses output from said pulse width modulation means is always longer than others of said plurality of pulses by said fixed phase difference; and said pulse width modulation and intensity modulation signal generating unit, said error amplifier and said current driving unit are formed as one chip of an integrated circuit.

102. A semiconductor laser control system, comprising:

a pulse width modulation and intensity modulation signal generating unit comprising pulse generating means for generating a plurality of pulses having a frequency equal to a frequency of an input clock signal and having different phases, the phase difference being a fixed phase difference, data converting means for converting input image data into pulse width modulation data and intensity modulation data based on the image data, a dot position control signal and a frequency selecting signal, and pulse width modulation means for generating a plurality of pulses, which have undergone pulse width modulation based on the pulse width modulation data, from the pulses generated by said pulse generating means, said pulse width modulation and intensity modulation signal generating unit performing pulse width modulation and intensity modulation and generating a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:

output mode clock frequencies comprise a first clock frequency which is equal to the input clock frequency and second clock frequency which is double the input clock frequency, one of said first clock frequency and said second clock frequency being selected according to the frequency selecting signal, ½ the bits of each image data being used for each dot writing and the number of tone levels being ½ that of an equal frequency mode case when a double frequency mode is selected; and said pulse width modulation and intensity modulation signal generating unit, said error amplifier and said current driving unit are formed as one chip of an integrated circuit.

103. The semiconductor laser control system according to claim 102, wherein, only in said double frequency mode, the image data comprises two sets of M-bit data series, each of said two sets representing $2^M$ output states which include a one-dot full turn on state, a one-dot full turn off state, and $2^{M-1}-1$ middle levels, each of said middle levels having two levels of dot phase states.

104. A semiconductor laser control system, comprising:

pulse width modulation and intensity modulation signal generating unit comprising pulse generating means for generating a plurality of pulses having a frequency equal to a frequency of an input clock signal and having different phases, the phase difference being a fixed phase difference, data converting means for converting input image data into pulse width modulation data and intensity modulation data based on the image data, a dot position control signal and a frequency selecting signal, and pulse width modulation means for generating a plurality of pulses, which have undergone pulse width modulation based on the pulse width modulation data, from the pulses generated by said pulse generating means, said pulse width modulation and intensity modulation signal generating unit performing pulse width modulation and intensity modulation and generating a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:
output mode clock frequencies comprise a first clock frequency which is equal to the input clock frequency and a second clock frequency which is double the input clock frequency, one of said first clock frequency and said second clock frequency being selected according to the frequency selecting signal, each of two bits of input image data being used as the dot position control signal of writing dot; and said pulse width modulation and intensity modulation signal generating unit, said error amplifier and said current driving unit are formed as one chip of an integrated circuit.

105. A semiconductor laser control system, comprising:

pulse width modulation and intensity modulation signal generating unit comprising pulse generating means for generating a plurality of pulses having a frequency equal to a frequency of an input clock signal and having different phases, the phase difference being a fixed phase difference, data converting means for converting input image data into pulse width modulation data and intensity modulation data and pulse width modulation means for generating a plurality of pulses, which have undergone pulse width modulation based on the pulse width modulation data, from the pulses generated by said pulse generating means, said pulse width modulation and intensity modulation signal generating unit performing pulse width modulation and intensity modulation and generating a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, wherein:

the image data comprises an N-bit data series for representing $2^N$ output states which include a one-dot full turn on state, a one-dot full turn off state, and $2^{N-1}-1$ middle levels, each of said middle levels having two levels of dot phase states; and said pulse width modulation and intensity modulation signal generating unit, said error amplifier and said current driving unit are formed as one chip of an integrated circuit.

106. A semiconductor laser control system comprising:

a pulse width modulation and intensity modulation signal generating unit which, based on input data, performs pulse width modulation and intensity modulation and generates a light emission instruction signal;

an error amplifier providing a negative feedback loop together with a semiconductor laser and a light reception device which monitors light output of said semiconductor laser, said error amplifier controlling forward current of said semiconductor laser so that a light reception signal proportional to the light output of said semiconductor laser is equal to the light emission instruction signal; and a current driving unit providing a driving current, according to the light emission instruction signal, to flow through said semiconductor laser as the forward current, the driving current being generated so as to control driving of said semiconductor laser with a current of one of a difference and sum with the control current of said negative feedback loop, a differential quantum efficiency detecting unit for detecting the differential quantum efficiency of said semiconductor laser;

a memory unit for storing a detection result of said differential quantum efficiency detecting unit;

an adding current setting unit for setting a current, corresponding to the light emission instruction signal, using the detection result stored in said memory unit; and a timing generating unit, wherein:
in initialization, said timing generating unit generates a timing signal slower than a control speed of said error amplifier, said differential quantum efficiency detecting unit detects the differential quantum efficiency of said semiconductor laser based on the timing signal, said memory units storing a detection result at each timing, and the current corresponding to the light emission instruction signal is set using the stored detection results;

said current driving unit comprises a high-speed voltage shifting unit in said error amplifier, includes a differential circuit for changing an amount of voltage shift, and is provided in said negative feedback loop;

output mode change-over means is provided for selecting one of different clock-frequency output modes according to a frequency selecting signal; and said pulse width modulation and intensity modulation signal generating unit, said error amplifier, said current driving unit, said differential quantum detecting unit, said memory unit, said adding current setting unit, said timing generating unit and said output mode change-over means are formed as one chip of an integrated circuit by bipolar transistors.

* * * * *

UNITED STATES PATENT AND TRADEMARK OFFICE
CERTIFICATE OF CORRECTION

PATENT NO. : 5,946,334
DATED : Aug. 31, 1999
INVENTOR(S) : Hidetoshi EMA, et al.

It is certified that error appears in the above-indentified patent and that said Letters Patent is hereby corrected as shown below:

On the title page, [73], the Assignee data, is incorrect. It should read as follows:

--[73] Assignee: Ricoh Company, Ltd., Tokyo, Japan--

Signed and Sealed this

Twentieth Day of March, 2001

Attest:

NICHOLAS P. GODICI

*Attesting Officer*       *Acting Director of the United States Patent and Trademark Office*